(12) United States Patent
Bulucea

(10) Patent No.: US 7,838,369 B2
(45) Date of Patent: Nov. 23, 2010

(54) FABRICATION OF SEMICONDUCTOR ARCHITECTURE HAVING FIELD-EFFECT TRANSISTORS ESPECIALLY SUITABLE FOR ANALOG APPLICATIONS

(75) Inventor: Constantin Bulucea, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 342 days.

(21) Appl. No.: 11/981,355

(22) Filed: Oct. 31, 2007

(65) Prior Publication Data
US 2008/0311717 A1  Dec. 18, 2008

Related U.S. Application Data

(63) Continuation-in-part of application No. 11/215,537, filed on Aug. 29, 2005, now Pat. No. 7,419,863.

(51) Int. Cl.
*H01L 27/088* (2006.01)

(52) U.S. Cl. .................. 438/290; 438/197; 257/E27.06

(58) Field of Classification Search .................. 438/290
See application file for complete search history.

(56) References Cited

U.S. PATENT DOCUMENTS

| | | | |
|---|---|---|---|
| 5,364,807 A | 11/1994 | Hwang | |
| 5,963,801 A | 10/1999 | Aronowitz et al. | |
| 6,078,082 A | 6/2000 | Bulucea | |
| 6,127,700 A | 10/2000 | Bulucea | |
| 6,548,842 B1 | 4/2003 | Bulucea et al. | |
| 6,566,204 B1 | 5/2003 | Wang et al. | |
| 6,576,966 B1 | 6/2003 | Bulucea et al. | |
| 6,621,125 B1* | 9/2003 | Wang | 257/355 |
| 6,927,116 B2 | 8/2005 | Arai | |
| 7,145,191 B1* | 12/2006 | Teng et al. | 257/288 |

(Continued)

OTHER PUBLICATIONS

Buti et al., "Asymmetrical Halo Source GOLD drain (HS-GOLD) Deep Sub-half Micron n-MOSFET Design for Reliability and Performance", *IEDM Tech. Dig.*, Dec. 3-6, 1989, pp. 26.2.1-26.2.4.

(Continued)

*Primary Examiner*—Thao P. Le
(74) *Attorney, Agent, or Firm*—Ronald J. Meetin

(57) ABSTRACT

An insulated-gate field-effect transistor (100, 100V, 140, 150, 150V, 160, 170, 170V, 180, 180V, 190, 210, 210W, 220, 220U, 220V, 220W, 380, or 480) is fabricated so as to have a hypoabrupt vertical dopant profile below one (104 or 264) of its source/drain zones for reducing the parasitic capacitance along the pn junction between that source/drain zone and adjoining body material (108 or 268). In particular, the concentration of semiconductor dopant which defines the conductivity type of the body material increases by at least a factor of 10 in moving from that source/drain zone down to an underlying body-material location no more than 10 times deeper below the upper semiconductor surface than that source/drain zone. The body material is preferably provided with a more heavily doped pocket portion (120 or 280) situated along the other source/drain zone (102 or 262). The combination of the hypoabrupt vertical dopant profile below the first-mentioned source/drain zone, normally serving as the drain, and the pocket portion along the second-mentioned source/drain zone, normally serving as the source, enables the resultant asymmetric transistor to be especially suitable for high-speed analog applications.

26 Claims, 69 Drawing Sheets

U.S. PATENT DOCUMENTS

| | | | |
|---|---|---|---|
| 7,176,530 | B1 * | 2/2007 | Bulucea et al. ............. 257/369 |
| 7,235,450 | B2 | 6/2007 | Kim |
| 2004/0188767 | A1 | 9/2004 | Weber et al. |

OTHER PUBLICATIONS

Chai et al., "A Cost-Effective 0.25 μm $L_{eff}$ BiCMOS Technology Featuring Graded-Channel CMOS (GCMOS) and a Quasi-Self-Aligned (QSA) NPN for RF Wireless Applications", *Procs. 2000 Bipolar/BiCMOS Circs. and Tech. Meeting*, Sep. 24-26, 2000, pp. 110-113.

Cheng et al., "Channel Engineering for High Speed Sub-1.0 V Power Supply Deep Submicron CMOS", *1999 Symp. VLSI Tech., Dig. Tech. Paps.*, Jun. 14-16, 1999, pp. 69 and 70.

Deshpande et al., "Channel Engineering for Analog Device Design in Deep Submicron CMOS Technology for System on Chip Applications", *IEEE Trans. Elec. Devs.*, Sep. 2002, pp. 1558-1565.

Dolny et al., "Enhanced CMOS for Analog-Digital Power IC Applications", *IEEE Trans. Elec. Devs.*, 1986, pp. 1985-1991.

Gray et al., *Analysis and Design of Analog Integrated Circuits* (4th ed., John Wiley & Sons), 2001, pp. 49-65.

Hiroki et al, "A High Performance 0.1 μm MOSFET with Asymmetric Channel Profile", *IEDM Tech. Dig.*, Dec. 1995, pp. 17.7.1-17.7.4.

Lamey et al., "Improving Manufacturability of an RF Graded Channel CMOS Process for Wireless Applications", *SPIE Conf. Microelec. Dev. Tech. II*, Sep. 1998, pp. 147-155.

Ma et al., "Graded-Channel MOSFET (GCMOSFET) for High Performance, Low Voltage DSP Applications", *IEEE Trans. VLSI Systs. Dig.*, Dec. 1997, pp. 352-358.

Matsuki et al., "Laterally-Doped Channel (LDC) Structure for Sub-Quarter Micron MOSFETs", *1991 Symp. VLSI Tech., Dig. Tech. Paps.*, May 28-30, 1991, pp. 113 and 114.

Odanaka et al., "Potential Design and Transport Property of 0.1-μm MOSFET with Asymmetric Channel Profile", *IEEE Trans. Elec. Devs.*, Apr. 1997, pp. 595-600.

Shimizu et al., "High Drivability CMOSFETs with Asymmetrical Source-Drain (ASD) Structure for Low Supply Voltage ULSIs", *Ext'd Abstrs, 21st Conf. Solid State Devs. and Mats.*, 1989, pp. 125-128.

Su et al., "A High-Performance Scalable Submicron MOSFET for Mixed Analog/Digital Applications", *IEDM Tech. Dig.*, Dec. 1991, pp. 367-370.

* cited by examiner

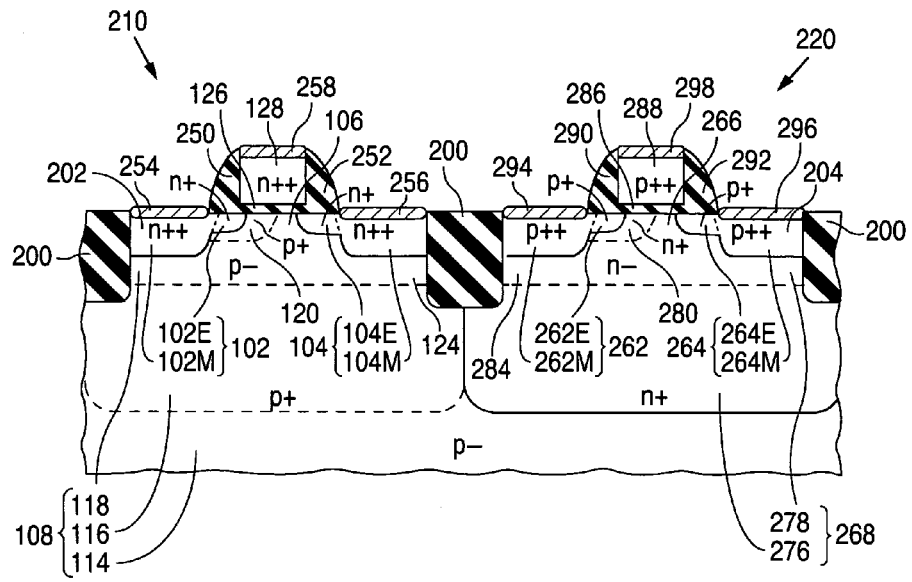
Fig. 29.1
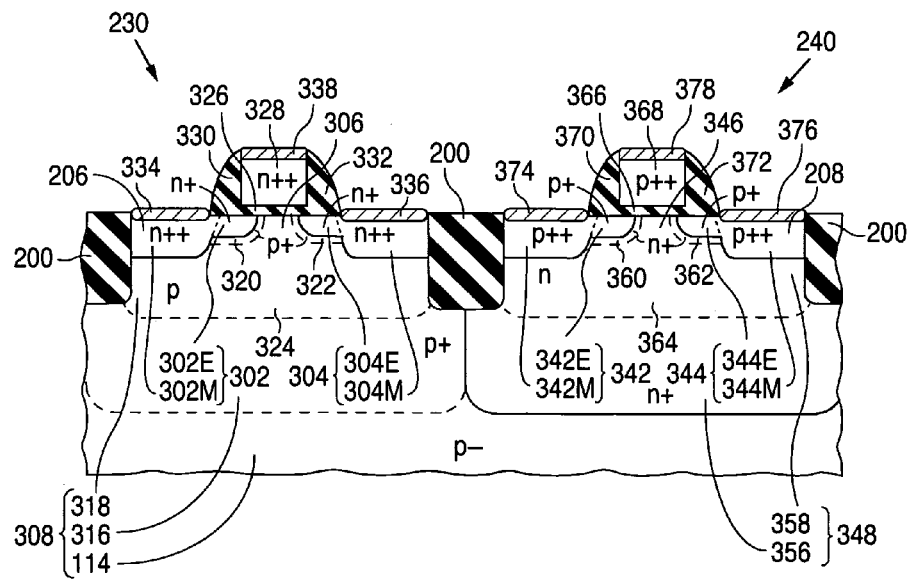
Fig. 29.2

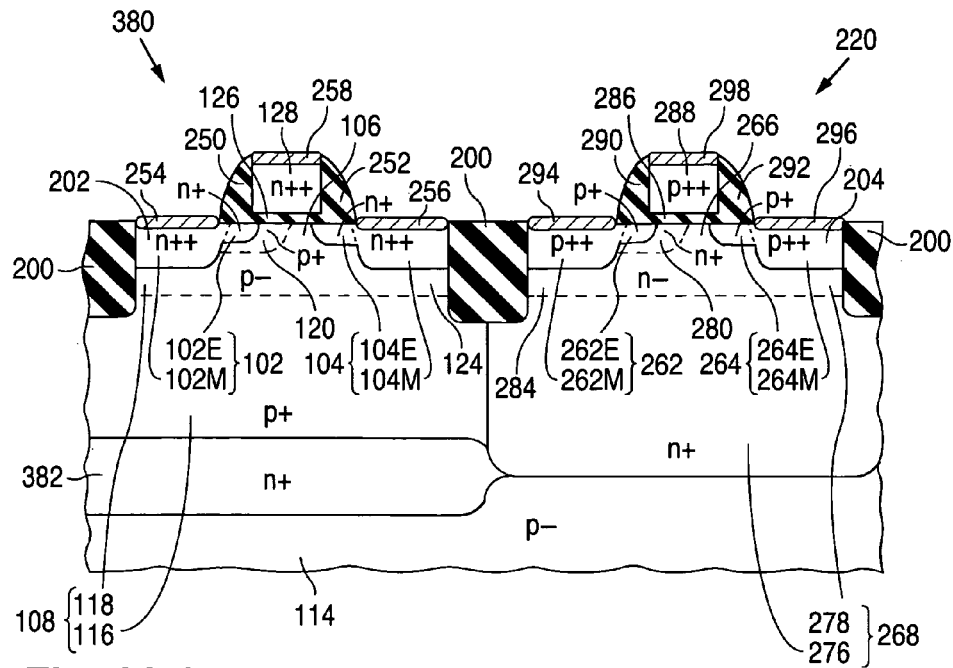
Fig. 30.1
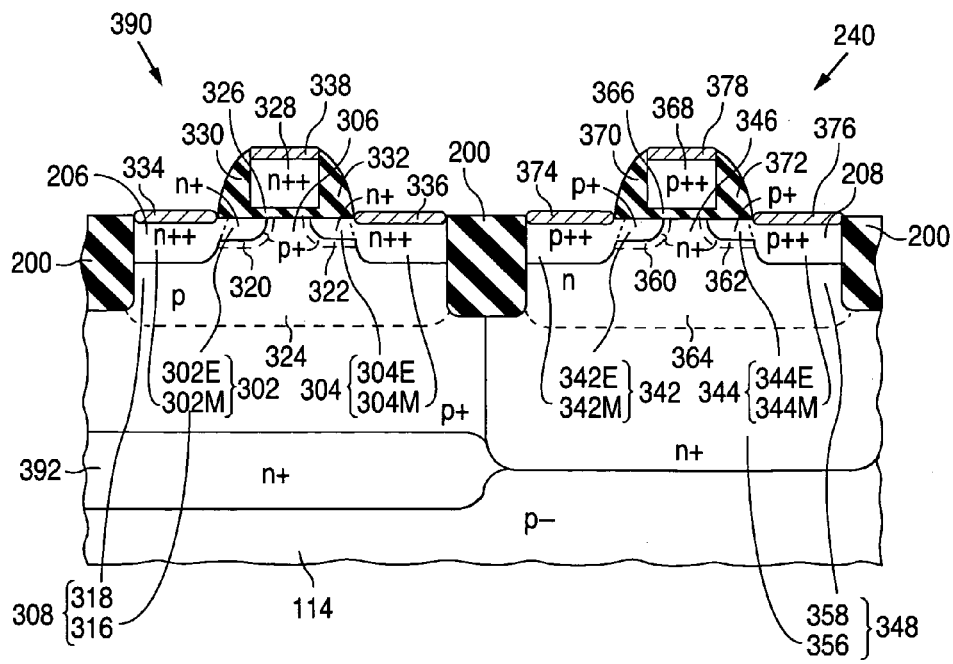
Fig. 30.2

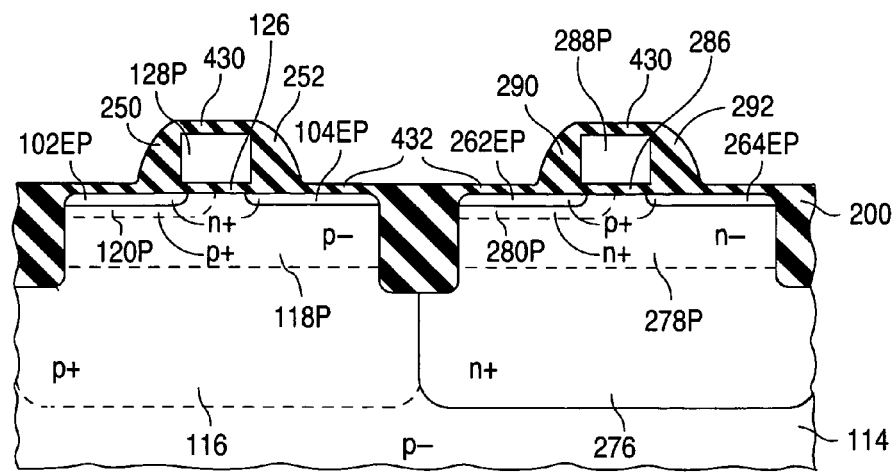
Fig. 31p.1
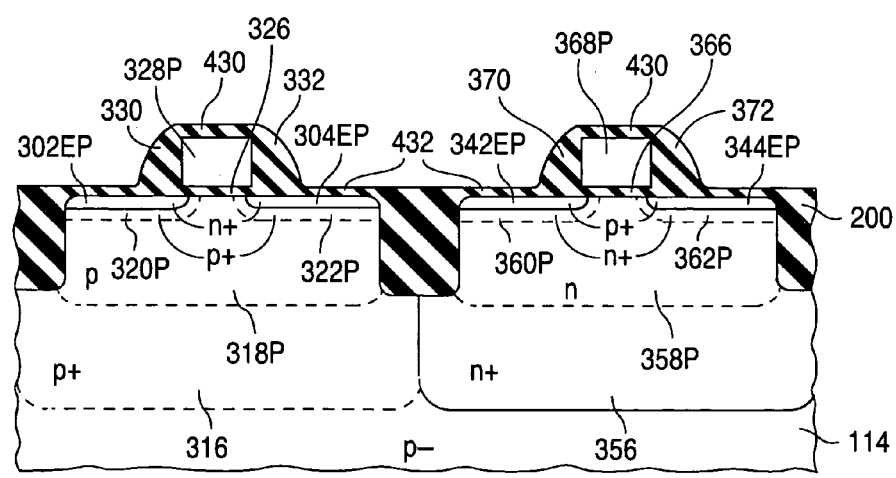
Fig. 31p.2

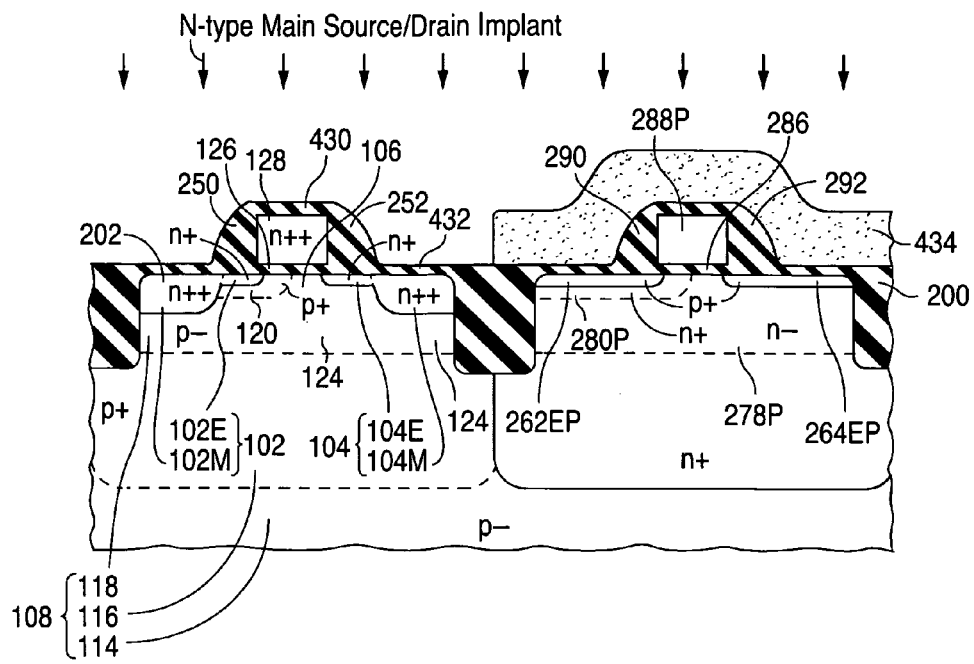
Fig. 31q.1
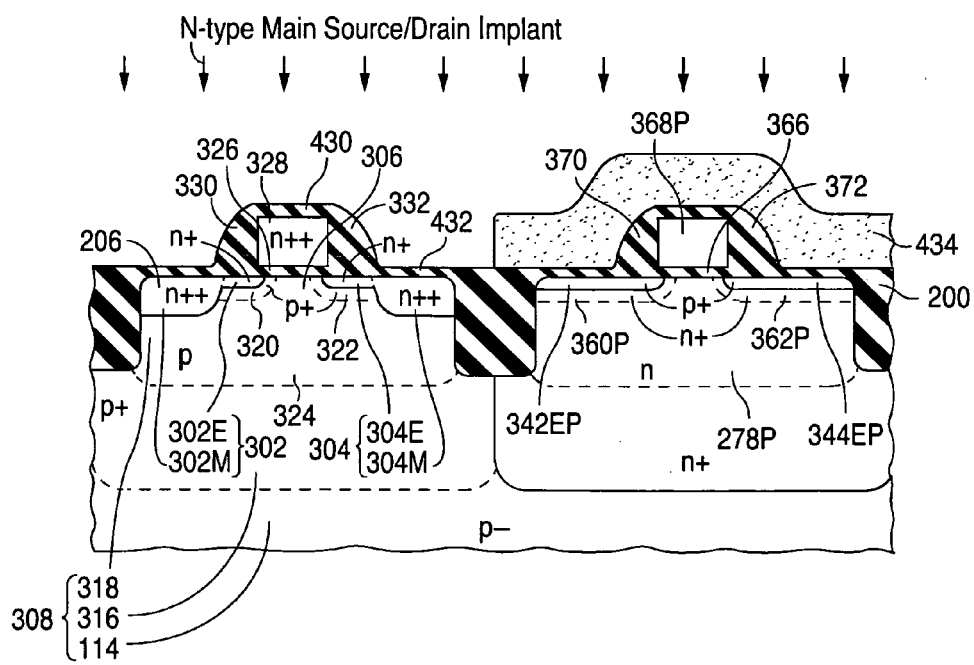
Fig. 31q.2

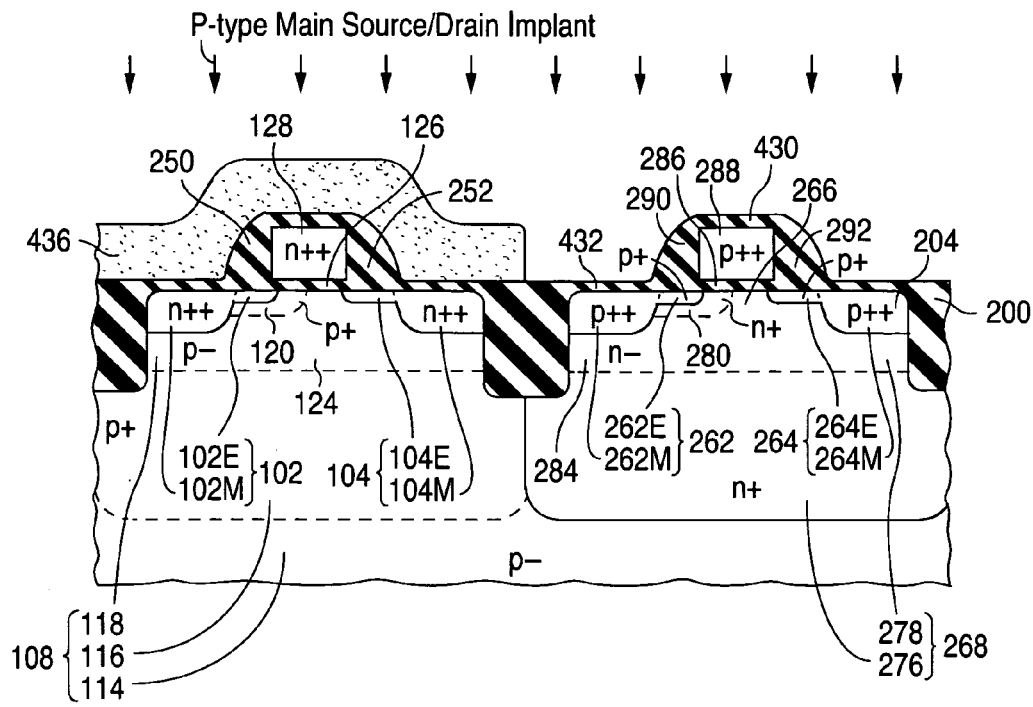
Fig. 31r.1
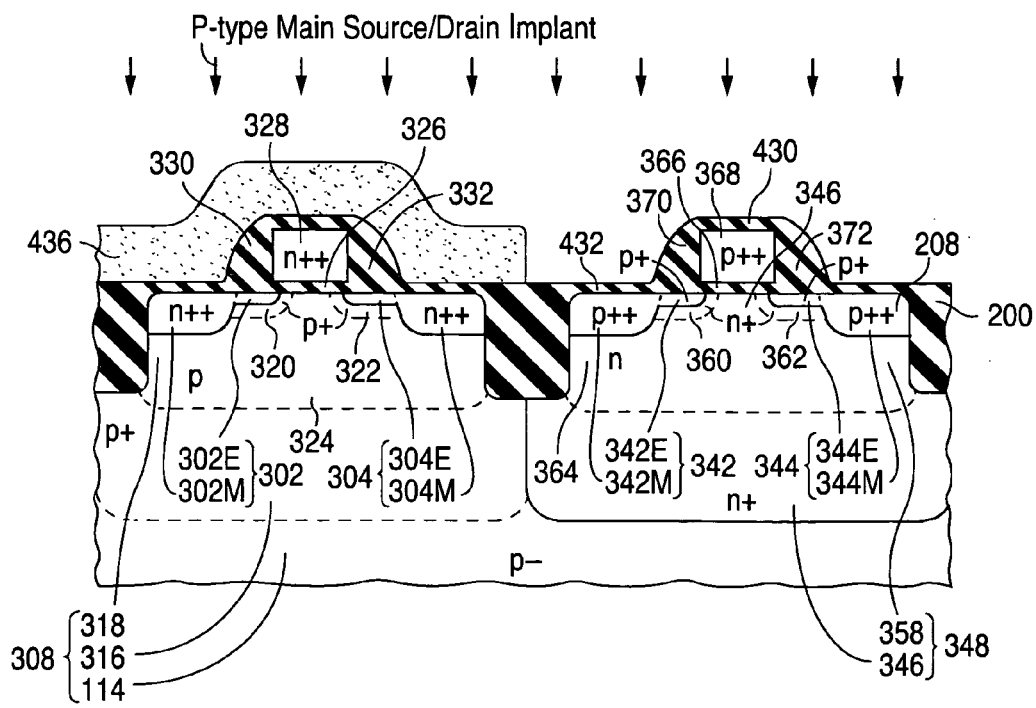
Fig. 31r.2

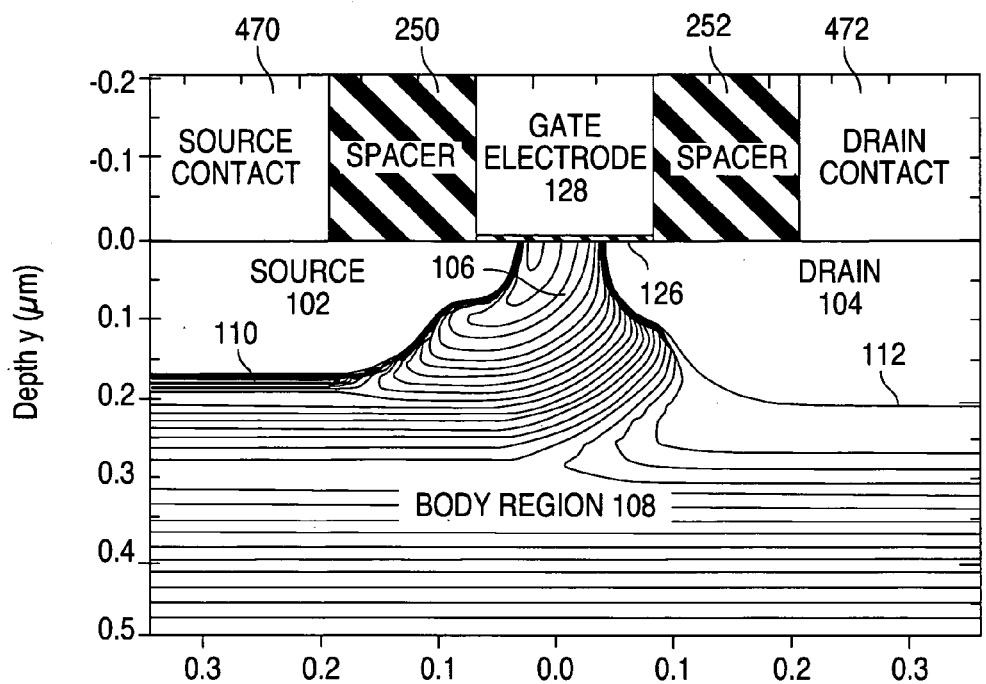
Fig. 58a  Longitudinal Distance x from Channel Center (μm)
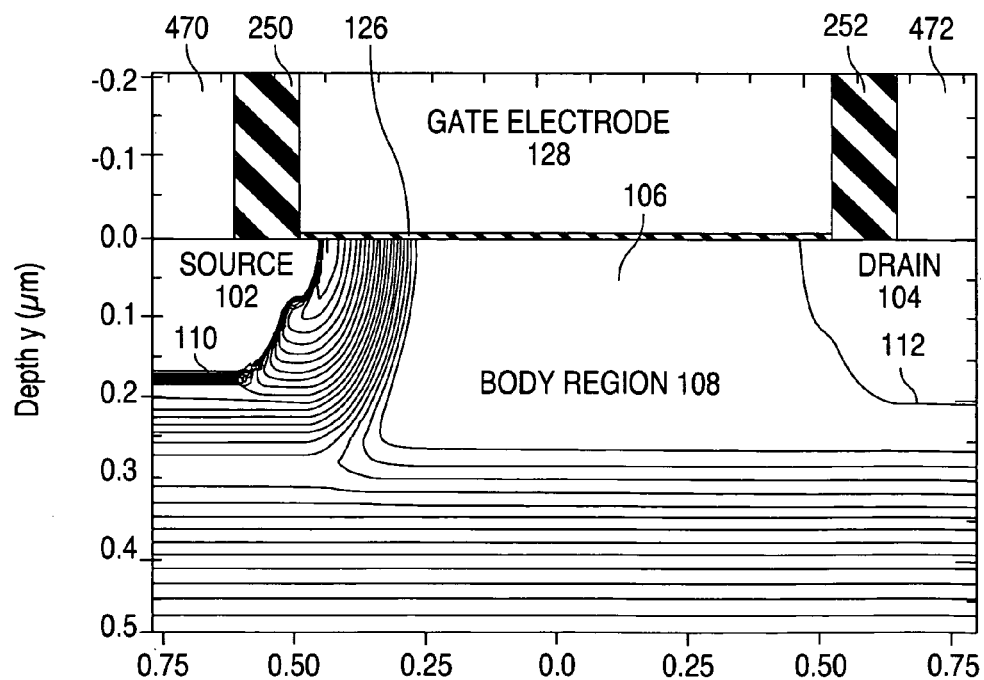
Fig. 58b  Longitudinal Distance x from Channel Center (μm)

FABRICATION OF SEMICONDUCTOR ARCHITECTURE HAVING FIELD-EFFECT TRANSISTORS ESPECIALLY SUITABLE FOR ANALOG APPLICATIONS

CROSS-REFERENCE TO RELATED APPLICATIONS

This is a continuation-in-part of U.S. patent application Ser. No. 11/215,537, filed 29 Aug. 2005, now U.S. Pat. No. 7,419,863 B1. This is also related to co-filed U.S. patent application Ser. No. 11/981,481, now U.S. Pat. No. 7,642,574 B2. All of the material in U.S. application Ser. Nos. 11/215,537 and 11/981,481 is incorporated by reference herein to the extent not expressly repeated herein.

FIELD OF USE

This invention relates to semiconductor technology and, in particular, to field-effect transistors ("FETs") of the insulated-gate type. All of the insulated-gate FETs ("IGFETs") described below are surface-channel enhancement-mode IGFETs except as otherwise indicated.

BACKGROUND

An IGFET is a semiconductor device in which a gate dielectric layer electrically insulates a gate electrode from a channel zone extending between a source zone and a drain zone. The channel zone in an enhancement-mode IGFET is part of a body region, often termed the substrate or substrate region, that forms respective pn junctions with the source and drain. In an enhancement-mode IGFET, the channel zone consists of all the semiconductor material between the source and drain. During IGFET operation, charge carriers move from the source to the drain through a channel induced in the channel zone along the upper semiconductor surface. The threshold voltage is the value of the gate-to-source voltage at which the IGFET switches between its on and off states for given definitions of the on and off states. The channel length is the distance between the source and drain along the upper semiconductor surface.

IGFETs are employed in integrated circuits ("ICs") to perform various digital and analog functions. As IC operational capabilities have advanced over the years, IGFETs have become progressively smaller, leading to a progressive decrease in minimum channel length. An IGFET that operates in the way prescribed by the classical model for an IGFET is often characterized as a "long-channel" device. An IGFET is described as a "short-channel" device when the channel length is reduced to such an extent that the IGFET's behavior deviates significantly from the classical IGFET model. Although both short-channel and long-channel IGFETs are employed in ICs, the great majority of ICs utilized for digital functions in very large scale integration applications are laid out to have the smallest channel length reliably producible with available lithographic technology.

A depletion region extends along the junction between the source and the body region. Another depletion region extends along the junction between the drain and the body region. A high electric field is present in each depletion region. Under certain conditions, especially when the channel length is small, the drain depletion region can laterally extend to the source depletion region and merge with it below the upper semiconductor surface. This phenomenon is termed (bulk) punchthrough. When punchthrough occurs, the operation of the IGFET cannot be controlled with its gate electrode. Punchthrough needs to be avoided.

Various techniques have been employed to improve the performance of IGFETs, including those operating in the short-channel regime, as IGFET dimensions have decreased. One performance improvement technique involves providing an IGFET with a two-part drain for reducing hot-carrier injection. The IGFET is also commonly provided with a similarly configured two-part source.

FIG. 1 illustrates such a conventional long n-channel IGFET 20 as described in U.S. Pat. No. 6,548,842 B1 (Bulucea et al.). The upper surface of IGFET 20 is provided with recessed electrically insulating field-insulating region 22 that laterally surrounds active semiconductor island 24 having n-type source/drain ("S/D") zones 26 and 28. Each S/D zone 26 or 28 consists of very heavily doped main portion 26M or 28M and more lightly doped, but still heavily doped, lateral extension 26E or 28E.

S/D zones 26 and 28 are separated from each other by channel zone 30 of p-type body material 32 consisting of lightly doped lower portion 34, heavily doped intermediate well portion 36, and upper portion 38. Although most of upper body-material portion 38 is moderately doped, portion 38 includes ion-implanted heavily doped halo pocket portions 40 and 42 that respectively extend along S/D zones 26 and 28. IGFET 20 further includes gate dielectric layer 44, overlying gate electrode 46, electrically insulating gate sidewall-spacers 48 and 50, and metal silicide layers 52, 54, and 56.

S/D zones 26 and 28 are largely mirror images of each other. Halo pocket portions 40 and 42 are also largely mirror images of each other so that channel zone 30 is symmetrically longitudinally graded with respect to channel dopant concentration. As a result, IGFET 20 is a symmetric device. Either S/D zone 26 or 28 can act as source during IGFET operation while the other S/D zone 28 or 26 acts as drain. This is especially suitable for digital situations where S/D zones 26 and 28 respectively function as source and drain during certain time periods and respectively as drain and source during other time periods.

FIG. 2 illustrates how net dopant concentration $N_N$ varies as a function of longitudinal distance x for IGFET 20. Since IGFET 20 is a symmetric device, FIG. 2 presents only a half profile starting from the channel center. Curve segments 26M*, 26E*, 28M*, 28E*, 30*, 40*, and 42* in FIG. 2 respectively represent the net dopant concentrations of regions 26M, 26E, 28M, 28E, 30, 40, and 42. Dotted curve segment 40" or 42" indicates the total concentration of the p-type dopant that forms halo pocket 40 or 42, including the p-type dopant introduced into the location for S/D zone 26 or 28 in the course of forming pocket 40 or 42.

In addition to helping alleviate undesired roll off of the threshold voltage at short channel length, the presence of halo pockets 40 and 42 in IGFET 20 causes the net p-type dopant concentration in channel zone 30 to be increased along each S/D zone 26 or 28, specifically along each lateral extension 26E or 28E. The onset of punchthrough is thereby alleviated because the thickness of the channel-zone portion of the depletion region extending along the junction of source-acting S/D zone 26 or 28 is reduced.

Body material 30 is provided with an additional doping characteristic to further alleviate punchthrough. Based on the information presented in U.S. Pat. No. 6,548,842 B1, FIG. 3a roughly depicts how absolute concentrations $N_T$ of the p-type and n-type dopants vary as a function of depth y along a vertical line extending through main S/D portion 26M or 28M as a result of the additional doping characteristic. Curve segment 26M" or 28M" in FIG. 3a represent the total concentration of the n-type dopant that defines main S/D portion 26M or 28M. Curve segments 34", 36", 38", 40", and 42" together represent the total concentration of the p-type dopant that defines respective regions 34, 36, 38, 40, and 42.

The additional doping characteristic is achieved by ion implanting p-type upper body-material portion 38 with p-type anti-punchthrough ("APT") dopant that reaches a maximum concentration at a depth more than 0.1 μm below the upper semiconductor surface but no more than 0.4 μm below the upper surface. For the situation represented in FIG. 3a where main S/D portions 26M and 28M extend approximately 0.2 μm below the upper surface, the p-type APT dopant reaches a maximum concentration at a depth of approximately 0.2 μm. By locating the p-type APT dopant in this manner, the thickness of the channel-zone portion of the depletion region extending along the pn junction of source-acting S/D zone 26 or 28 is further reduced so as to further alleviate punchthrough.

Well region 36 is defined by ion implanting IGFET 20 with p-type well dopant that reaches a maximum concentration at a depth below that of the maximum concentration of the p-type APT dopant. Although, the maximum concentration of the p-type well dopant is somewhat greater than the maximum concentration of the p-type APT dopant, the vertical profile of the total p-type dopant is relatively flat from the location of the maximum well-dopant concentration up to main S/D portion 26M or 28M. In particular, $N_T$ concentration of the total p-type dopant decreases by considerably less than a factor of 5 in going from the location of the maximum well-dopant concentration up to main S/D portion 26M or 28M.

U.S. Pat. No. 6,548,842 B1 discloses that the p-type dopant profile along the above-mentioned vertical line through main S/D portion 26M or 28M can be further flattened by implanting an additional p-type dopant that reaches a maximum concentration at a depth between the depths of the maximum concentrations of APT and well dopants. This situation is illustrated in FIG. 3b for such a variation of IGFET 20 where curve segment 58" indicates the variation caused by the further p-type dopant. In FIG. 3b, the maximum concentration of the further p-type dopant lies between the maximum concentrations of the APT and well dopants. Accordingly, concentration $N_T$ of the total p-type dopant again decreases by considerably less than a factor of 5 in moving from the location of the maximum well-dopant concentration to portion 26M or 28M.

A symmetric IGFET structure is not needed in situations, especially many analog applications, where current flows in only one direction through an IGFET during device operation. As further discussed in U.S. Pat. No. 6,548,842 B1, the halo pocket portion can be deleted from the drain side. IGFET 20 thereby becomes long n-channel IGFET 60 as shown in FIG. 4a. IGFET 60 is an asymmetric device because channel zone 30 is asymmetrically longitudinally dopant graded. S/D zones 26 and 28 in IGFET 60 respectively function as source and drain. FIG. 4b illustrates asymmetric short n-channel IGFET 70 corresponding to long-channel IGFET 60. In IGFET 70, source-side halo pocket 40 closely approaches drain 28. Net dopant concentration $N_N$ as a function of longitudinal distance x along the upper semiconductor surface is shown in FIGS. 5a and 5b respectively for IGFETs 60 and 70.

Asymmetric IGFETs 60 and 70 receive the same APT and well implants as symmetric IGFET 20. Along vertical lines extending through source 26 and drain 28, IGFETs 60 and 70 thus have the dopant distributions shown in FIG. 3a except that dashed-line curve segment 62" represents the vertical dopant distribution through drain 28 due to the absence of halo pocket 42. When the IGFET structure is provided with the additional well implant to further flatten the vertical dopant profile, FIG. 3b presents the consequent vertical dopant distributions again subject to curve segment 62" representing the dopant distribution through drain 28.

U.S. Pat. Nos. 6,078,082 and 6,127,700 (both Bulucea) describe IGFETs having asymmetric channel zones but different vertical dopant characteristics than those employed in the inventive IGFETs of U.S. Pat. No. 6,548,842 B1. IGFETs having asymmetric channel zones are also examined in other prior art documents such as (a) Buti et al., "Asymmetrical Halo Source GOLD drain (HS-GOLD) Deep Sub-half Micron n-MOSFET Design for Reliability and Performance", *IEDM Tech. Dig.*, 3-6 Dec. 1989, pp. 26.2.1-26.2.4, (b) Chai et al., "A Cost-Effective 0.25 μm $L_{eff}$ BiCMOS Technology Featuring Graded-Channel CMOS (GCMOS) and a Quasi-Self-Aligned (QSA) NPN for RF Wireless Applications", *Procs. 2000 Bipolar/BiCMOS Circs. and Tech. Meeting*, 24-26 Sep. 2000, pp. 110-113, (c) Cheng et al., "Channel Engineering for High Speed Sub-1.0 V Power Supply Deep Submicron CMOS", 1999 *Symp. VLSI Tech., Dig. Tech. Paps.*, 14-16 Jun. 1999, pp. 69 and 70, (d) Deshpande et al., "Channel Engineering for Analog Device Design in Deep Submicron CMOS Technology for System on Chip Applications", *IEEE Trans. Elec. Devs.*, September 2002, pp. 1558-1565, (e) Hiroki, "A High Performance 0.1 μm MOSFET with Asymmetric Channel Profile", *IEDM Tech. Dig.*, December 1995, pp. 17.7.1-17.7.4, (f) Lamey et al., "Improving Manufacturability of an RF Graded Channel CMOS Process for Wireless Applications", *SPIE Conf. Microelec. Dev. Tech. II*, September 1998, pp. 147-155, (g) Ma et al., "Graded-Channel MOSFET (GCMOSFET) for High Performance, Low Voltage DSP Applications", *IEEE Trans. VLSI Systs. Dig.*, December 1997, pp. 352-358, (h) Matsuki et al., "Laterally-Doped Channel (LDC) Structure for Sub-Quarter Micron MOSFETs", 1991 *Symp. VLSI Tech., Dig. Tech. Paps.*, 28-30 May 1991, pp. 113 and 114, and (i) Su et al., "A High-Performance Scalable Submicron MOSFET for Mixed Analog/Digital Applications", *IEDM Tech. Dig.*, December 1991, pp. 367-370.

The term "mixed signal" refers to ICs containing both digital and analog circuitry blocks. The digital circuitry typically employs the most aggressively scaled n-channel and p-channel IGFETs for obtaining the maximum potential digital speed at given current leakage specifications. The analog circuitry utilizes IGFETs and/or bipolar transistors subjected to different performance requirements than the digital IGFETs. Requirements for the analog IGFETs commonly include high linear voltage gain, good small-signal and large-signal frequency response at high frequency, good parameter matching, low input noise, well controlled electrical parameters for active and passive components, and reduced parasitics, especially reduced parasitic capacitances. Although it would be economically attractive to utilize the same transistors for the analog and digital blocks, doing so would typically lead to weakened analog performance. Many requirements imposed on analog IGFET performance conflict with the results of digital scaling.

More particularly, the electrical parameters of analog IGFETs are subjected to more rigorous specifications than the IGFETs in digital blocks. In an analog IGFET used as an amplifier, the output resistance of the IGFET needs to be maximized in order to maximize its intrinsic gain. The output resistance is also important in setting the high-frequency performance of an analog IGFET. In contrast, the output resistance is considerably less importance in digital circuitry. Reduced values of output resistance in digital circuitry can be tolerated in exchange for higher current drive and consequent higher digital switching speed as long as the digital circuitry can distinguish its logic states, e.g., logical "0" and logical "1".

The shapes of the electrical signals passing through analog transistors are critical to circuit performance and normally have to be maintained as free of harmonic distortions and noise as reasonably possible. Harmonic distortions are caused primarily by non-linearity of transistor gain and transistor capacitances. Hence, linearity demands on analog transistors are very high. The parasitic capacitances at pn junctions have inherent voltage non-linearities that need to be alleviated in analog blocks. Conversely, signal linearity is normally of secondary importance in digital circuitry.

The small-signal analog speed performance of IGFETs used in analog amplifiers is determined at the small-signal frequency limit and involves the small-signal gain and the parasitic capacitances along the pn junctions for the source and drain. The large-signal analog speed performance of analog amplifier IGFETS is similarly determined at the large-signal frequency limit and involves the non-linearities of the IGFET characteristics.

The digital speed of logic gates is defined in terms of the large-signal switching time of the transistor/load combination, thereby involving the drive current and output capacitance. Hence, analog speed performance is determined differently than digital speed performance. Optimizations for analog and digital speeds can be different, leading to different transistor parameter requirements.

Digital circuitry blocks predominantly use the smallest IGFETs that can be fabricated. Because the resultant dimensional spreads are inherently large, parameter matching in digital circuitry is often relatively poor. In contrast, good parameter matching is usually needed in analog circuitry to achieve the requisite performance. This typically requires that analog transistors be fabricated at greater dimensions than digital IGFETs subject to making analog IGFETS as short as possible in order to have source-to-drain propagation delay as low as possible.

In view of the preceding considerations, it is desirable to have a semiconductor architecture that provides IGFETs with good analog characteristics. The analog IGFETs should have high intrinsic gain, high output resistance, high small-signal speed with reduced parasitic capacitances, especially reduced parasitic capacitances along the source and drain junctions. It is also desirable that the architecture be capable of providing high-performance digital IGFETs.

General Disclosure of the Invention

The present invention furnishes a process for fabricating such an architecture. More particularly, a semiconductor structure fabricated according to the invention contains a principal IGFET having comparatively low parasitic capacitance along at least one of the pn junctions that form source/drain boundaries. Although usable in digital applications, the principal IGFET is particularly suitable for analog applications and can achieve excellent analog performance.

The semiconductor process of the invention may provide an additional IGFET configured similar to, but of opposite polarity to, the principal IGFET. The two IGFETs thereby form a complementary-IGFET architecture especially useful for analog circuitry. The present semiconductor process may also provide a further IGFET, or two further opposite-polarity IGFETs, particularly suitable for digital circuitry. The overall architecture can then be employed in mixed-signal ICs.

Returning to the principal IGFET, it contains a channel zone, a pair of source/drain ("S/D") zones, a gate dielectric layer overlying the channel zone, and a gate electrode overlying the gate dielectric layer above the channel zone. The principal IGFET is created from a semiconductor body having body material of a first conductivity type. The channel zone is part of the body material and thus is of the first conductivity type. The S/D zones are situated in the semiconductor body along its upper surface and are laterally separated by the channel zone. Each S/D zone is of a second conductivity type opposite to the first conductivity type so as to form a pn junction with the body material.

A well portion of the body material extends below the S/D zones. The well portion is defined by semiconductor well dopant of the first conductivity type and is more heavily doped than overlying and underlying portions of the body material. Importantly, the concentration of the well dopant reaches a principal subsurface maximum along a location no more than 10 times deeper, preferably no more than 5 times deeper, below the upper semiconductor surface than a specified one of the S/D zones. This enables the concentration of all dopant of the first conductivity type in the body material to decrease by at least a factor of 10, preferably at least a factor of 20, in moving upward from the location of the subsurface maximum in the well dopant's concentration to the specified S/D zone.

Alternatively stated, the concentration of all dopant of the first conductivity type in the body material increases at least 10 times, preferably at least 20 times, in moving from the specified S/D zone downward to a body-material location no more than 10 times deeper, preferably no more than 5 times deeper, below the upper semiconductor surface than that S/D zone. This subsurface body-material location normally lies below largely all of each of the channel and S/D zones. By providing the body material with this "hypoabrupt" dopant distribution, the parasitic capacitance along the pn junction between the body material and the specified S/D zone is comparatively low. The principal IGFET can thus achieve high analog performance.

The principal IGFET is normally an asymmetric device in that the channel zone is asymmetrically longitudinally dopant graded. Specifically, the concentration of the dopant of the first conductivity type in the body material is lower where the channel zone meets the specified S/D zone along the upper semiconductor surface than where the channel zone meets the remaining one of the S/D zones along the upper surface. The specified S/D zone then normally constitutes the drain during IGFET operation while the remaining S/D zone constitutes the source. The concentration of the dopant of the first conductivity type in the body material is normally at least a factor of 10 lower, preferably at least a factor of 20 lower, where the channel zone meets the drain along the upper surface than where the channel zone meets the source along the upper surface. Alternatively stated, the concentration of the dopant of the first conductivity type in the body material is normally at least 10 times higher, preferably at least 20 times higher, where the channel zone meets the source along the upper surface than where the channel zone meets the drain along the upper surface.

The high dopant concentration along the source side of the channel zone shields the source from the comparatively high electric field in the drain because the electric field lines from the drain terminate on ionized dopant atoms which are situated in the channel zone near the source and which provide the higher channel-zone dopant concentration near the source rather than terminating on ionized dopant atoms in the depletion region along the source and detrimentally lowering the absolute value of the potential barrier for majority charge carriers coming from the source. This alleviates punch-through. The combination of the above-mentioned hypoabrupt vertical dopant profile below the specified S/D zone, i.e., the drain here, and the increased channel-zone dopant concentration at the source side can thereby achieve high analog performance without punchthrough failure.

In fabricating the principal IGFET according to the invention, semiconductor well dopant of the first conductivity type is introduced, typically by ion implantation, into the semiconductor body to define a well portion of the first conductivity type. Use of ion implantation in performing the well-doping step enables the well dopant to reach its maximum concentration at the aforementioned subsurface body-material location. The gate electrode is defined above, and separated by gate dielectric material from, semiconductor material intended to be the channel zone. Semiconductor source/drain dopant of the second conductivity type is introduced into the semiconductor body to form the S/D zones.

Additional processing is performed to complete fabrication of the preceding implementation of the principal IGFET. The well-doping step and additional processing are done at conditions which cause the vertical dopant profile below the specified S/D region to be hypoabrupt. In particular, the concentration of the well dopant decreases by at least a factor of 10 in moving from the aforementioned subsurface body-material location up to the specified S/D zone.

The body material is of the first conductivity type, at least at the end of IGFET fabrication. The semiconductor material which constitutes the body material and the S/D zones at the end of IGFET fabrication may initially be of the second conductivity type. If so, the well-doping step converts a lower part of this material to the first conductivity type. In one version of the fabrication process, compensatory doping is performed with semiconductor dopant of the first conductivity type to convert the remaining upper part of this material to the first conductivity type. In another version of the fabrication process, part of the well dopant diffuses upward into the upper part of this material during the additional processing so as to cause substantially all of the upper part of this material not significantly subjected to other doping of the first or second conductivity type subsequent to the well-doping step to be converted to the first conductivity type.

In short, the present invention provides a method for fabricating a semiconductor architecture having an IGFET, or a pair of opposite-polarity IGFETs, especially suitable for analog circuitry. A further IGFET, or a pair of opposite-polarity further IGFETs, especially suitable for digital circuitry may also be provided in the fabrication method of the invention. The resultant semiconductor architecture can handle mixed-signal applications very well. The invention thereby provides a substantial advance over the prior art.

BRIEF DESCRIPTION OF THE DRAWINGS

FIGS. 22a-22c are respective graphs of individual, absolute, and net dopant concentrations as a function of longitudinal distance along the upper semiconductor surface for the IGFET of FIG. 21 or 27a.

FIGS. 29.1 and 29.2 are front cross-sectional views of two portions of a complementary-IGFET semiconductor structure configured according to the invention.

FIGS. 30.1 and 30.2 are front cross-sectional views of two portions of another complementary-IGFET semiconductor structure configured according to the invention.

FIGS. 31p.1-31r.1 present further steps leading to the structural portion of FIG. 29.1. FIGS. 31p.2-31r.2 present further steps leading to the structural portion of FIG. 29.2.

FIGS. 32a-32c are front cross-sectional views representing steps of an alternative, in accordance with the invention, to the step of FIG. 31e in manufacturing a variation of the complementary-IGFET semiconductor structure of FIGS. 29.1 and 29.2 starting with the structure of FIG. 31d repeated as FIG. 32a.

FIGS. 33a-33f are front cross-sectional views representing steps of another alternative, in accordance with the invention, to the steps of FIGS. 31c-31f in manufacturing a variation of the complementary-IGFET semiconductor structure of FIGS. 29.1 and 29.2 starting with the structure of FIG. 31b repeated as FIG. 33a.

FIGS. 33a-33f is an implementation of the p-channel IGFET of FIG. 34.

FIGS. 58a and 58b are composite front cross-sectional views/graphs of dopant contours as a function of depth and longitudinal distance from the channel center for computer simulations of respective asymmetric short and long n-channel IGFETs configured according to the invention.

Figure 1:
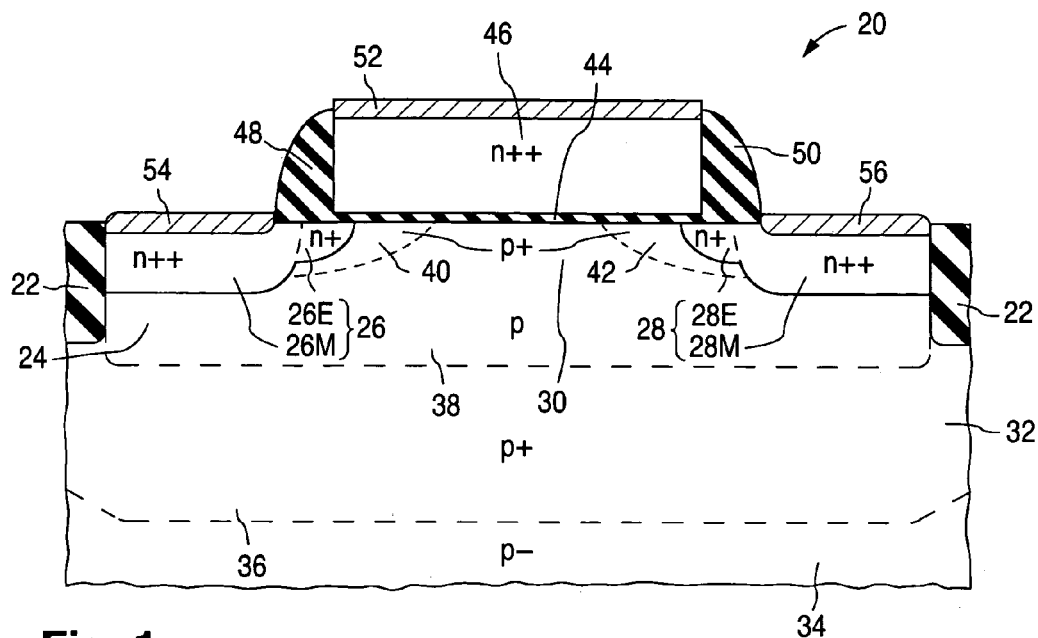
FIG. 1 is a front cross-sectional view of a prior art symmetric long n-channel IGFET.

Like reference symbols are employed in the drawings and in the description of the preferred embodiment to represent the same, or very similar, item or items. The numerical portions of reference symbols having single prime ('), double prime ("), asterisk (*), and pound (#) signs in drawings containing graphs respectively indicate like-numbered regions or zones in other drawings. The "Xs" in a cross-sectional view of an IGFET provided with a semiconductor well dopant indicate the location of the maximum concentration of the well dopant. Electrically insulating spacers (not shown) may be situated along the sidewalls of the gate electrodes of the IGFETs of FIGS. 13, 15, 18b, 18c, 25, 27b, and 34 depending on how those IGFETs are fabricated.

In the dopant-distribution graphs, "individual" dopant concentrations mean the individual concentrations of each separately introduced n-type dopant and each separately introduced p-type dopant while "absolute" dopant concentrations mean the total n-type dopant concentration and the total p-type dopant concentration. The "net" dopant concentration in the dopant-distribution graphs is the difference between the absolute (or total) n-type dopant concentration and the absolute (or total) p-type dopant concentration. The net dopant concentration is indicated as net "n-type" where the absolute n-type dopant concentration exceeds the absolute p-type dopant concentration, and as net "p-type" where the absolute p-type dopant concentration exceeds the absolute n-type dopant concentration.

DESCRIPTION OF THE PREFERRED EMBODIMENTS

Reference Notation and Other Conventions

The reference symbols employed below and in the drawings have the following meanings where the adjective "lineal" means per unit IGFET width and where the adjective "areal" means per unit lateral area:

$A_I$=current gain
$C_{da}$=areal depletion-region capacitance
$C_{d0a}$=value of areal depletion-region capacitance at zero reverse voltage
$C_{DB}$=drain-to-body capacitance
$C_{DBw}$=lineal drain-to-body capacitance
$C_{GB}$=gate-to-body capacitance
$C_{GD}$=gate-to-drain capacitance
$C_{GIa}$=areal gate dielectric capacitance
$C_{GS}$=gate-to-source capacitance
$C_L$=load capacitance
$C_{SB}$=source-to-body capacitance
$C_{SBw}$=lineal source-to-body capacitance
F=frequency
$f_T$=cut-off frequency
$f_{Tpeak}$=peak value of cut-off frequency
$g_m$=intrinsic transconductance of IGFET
$g_{mw}$=lineal transconductance of IGFET
$g_{mb}$=transconductance of body electrode $g_{meff}$=effective transconductance of IGFET in presence of source resistance
$g_{msatw}$=lineal transconductance of IGFET at saturation
$H_A$=amplifier transfer function
$I_D$=drain current
$I_{Dw}$=lineal drain current
$I_{D0w}$=leakage value of lineal drain current at zero gate-to-source voltage
$i_i$=small-signal input current
$i_o$=small-signal output current
$K_S$=relative permittivity of semiconductor material
$K$=Boltzmann's constant
$L$=length of channel
$L_G$=length of gate electrode
$L_{GDoverlap}$=longitudinal distance that gate electrode overlaps drain
$L_{GSoverlap}$=longitudinal distance that gate electrode overlaps source
$N_A$=acceptor dopant concentration
$N_B$=net dopant concentration in body material
$N_{B0}$, $N_{B0}'$=values of net dopant concentration in junction-adjoining constant-concentration portion of material on more lightly doped side of pn junction
$N_{B1}$, $N_{B1}'$=values of net dopant concentration in junction-remote constant-concentration portion of material on more lightly doped side of pn junction
$N_D$=donor dopant concentration
$N_{D0}$=value of net dopant concentration in constant-concentration material on more heavily doped side of pn junction
$N_I$=individual dopant concentration
$N_N$=net dopant concentration
$N_T$=absolute dopant concentration
$n_i$=intrinsic carrier concentration
$Q$=electronic charge
$R_D$=series resistance at drain of IGFET
$R_G$=series resistance at gate electrode of IGFET
$R_{on}$=linear-region on-resistance of IGFET
$R_S$=series resistance at source of IGFET
$S$=transform variable
$T$=Temperature
$t_d$=depletion-region thickness
$t_{d0}$=value of depletion-region thickness at zero reverse voltage
$t_{GI}$=gate dielectric thickness
$V_{BI}$=built-in voltage
$V_{BS}$=DC body-to-source voltage
$V_{DB}$=DC drain-to-body voltage
$V_{DD}$=high supply voltage
$V_{DS}$=DC drain-to-source voltage
$V_{GS}$=DC gate-to-source voltage
$V_g$=gate voltage amplitude
$V_{in}$=input voltage amplitude
$V_{out}$=output voltage amplitude
$V_R$=DC reverse voltage
$V_{Rmax}$=maximum value of DC reverse voltage
$V_{SB}$=DC source-to-body voltage
$V_{SS}$=low supply voltage
$V_T$=threshold voltage
$v_{gs}$=small-signal gate-to-source voltage
$v_{nsat}$=electron saturation velocity
$W$=channel width
$X$=longitudinal distance
$Y$=depth, vertical distance, or distance from pn junction
$y_d$=value of distance from pn junction to remote boundary of depletion region in body material
$y_{d0}$=value of distance from pn junction to remote boundary of junction-adjoining constant-concentration portion of body material having step change in uniform net dopant concentration
$y_{dmax}$=value of distance from pn junction to remote boundary of junction-remote constant-concentration portion of body material having step change in uniform net dopant concentration
$y_D$=value of depth at bottom of drain
$y_S$=value of depth at bottom of source
$y_{SI}$=value of depth at remote boundary of junction-adjoining upper body-material portion
$y_W$=value of depth at location of maximum concentration of well dopant
$\epsilon_0$=permittivity of free space (vacuum)
$\mu_n$=electron mobility
$\omega$=angular frequency
$\omega_{in}$=value of angular frequency at input pole
$\omega_{out}$=value of angular frequency at output pole
$\omega_z$=value of angular frequency at zero
$\omega_p$=value of angular frequency at pole Long-channel and short-channel n-channel IGFETs are respectively referred to here, i.e., both below and above, as long and short n-channel IGFETs. Similarly, long-channel and short-channel p-channel IGFETs are respectively referred to here as long and short p-channel IGFETs. As used below, the term "surface-adjoining" means adjoining (or extending to) the upper semiconductor surface, i.e., the upper surface of a semiconductor body consisting of monocrystalline- or largely monocrystalline, semiconductor material.

No particular channel-length value generally separates the short-channel and long-channel regimes of IGFET operation or generally distinguishes a short-channel IGFET from a long-channel IGFET. A short-channel IGFET, or an IGFET operating in the short-channel regime, is simply an IGFET whose characteristics are significantly affected by short-channel effects. A long-channel IGFET, or an IGFET operating in the long-channel regime, is the converse of a short-channel IGFET. While the channel length value of approximately 0.4 mm roughly constitutes the boundary between the short-channel and long-channel regimes for the background art in U.S. Pat. No. 6,548,842 B1, the long-channel/short-channel boundary can occur at a higher or lower value of channel length depending on various factors such as gate dielectric thickness, minimum printable feature size, channel zone dopant concentration, and source/drain-body junction depth.

Figure 6:
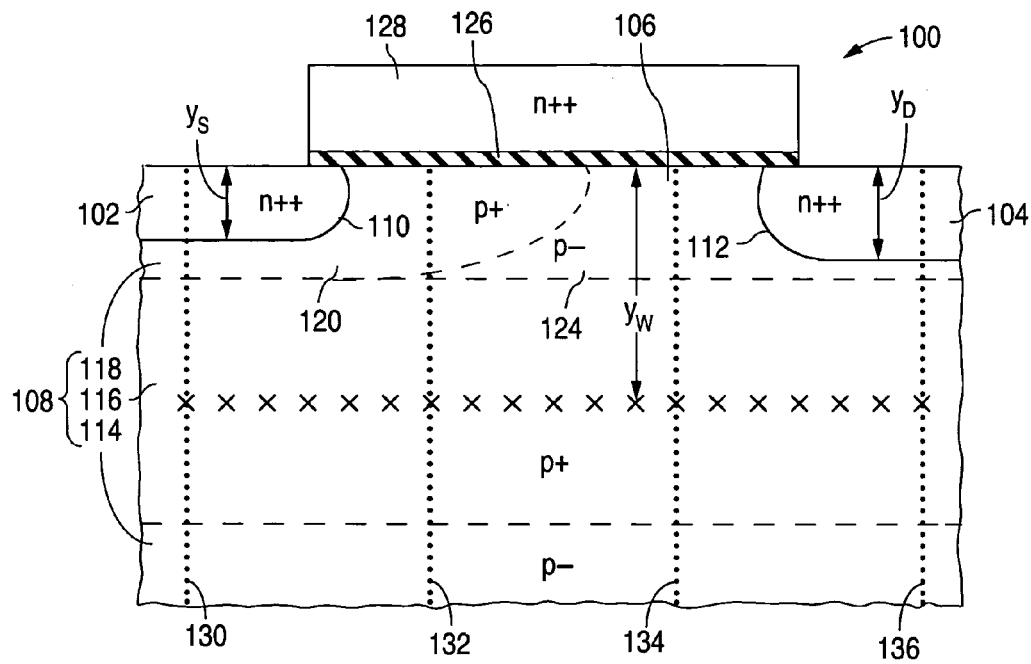
FIG. 6 is a front cross-sectional view of an asymmetric long n-channel IGFET configured according to the invention so as to have a semiconductor well portion of the same conductivity type as directly underlying semiconductor material.

IGFETs in which Vertical Body-Material Dopant Profile Below Drain is Hypoabrupt Due to Subsurface Maximum in Well Dopant Concentration FIG. 6 illustrates an asymmetric long n-channel IGFET 100 configured in accordance with the invention so as to be especially suitable for high-speed analog applications. Long-channel IGFET 100 is created from a monocrystalline silicon ("monosilicon") semiconductor body in which a pair of very heavily doped n-type source/drain (again, "S/D") zones 102 and 104 are situated along the upper semiconductor surface. S/D zones 102 and 104 are generally referred to below respectively as source 102 and drain 104 because they normally, though not necessarily, respectively function as source and drain.

Drain 104 is normally doped slightly more heavily than source 102. The maximum value of net dopant concentration $N_N$ in source 102 along the upper semiconductor surface is normally at least $1\times10^{20}$ atoms/cm$^3$, typically $4\times10^{20}$ atoms/cm$^3$. The maximum value of concentration $N_N$ in drain 104 along the upper surface is normally at least $1\times10^{20}$ atoms/ $cm^3$, typically slightly greater than $4\times10^{20}$ atoms/$cm^3$ so as to slightly exceed the maximum upper-surface $N_N$ concentration in source 102. However, as discussed below in connection with the inventive IGFET of FIG. 63, drain 104 is sometimes doped more lightly than source 102. For example, the maximum value of concentration $N_N$ in drain 104 along the upper surface can be $5\times10^{19}$ atoms/$cm^3$ and can go down to at least as little as $1\times10^{19}$ atoms/$cm^3$ when maximum upper-surface $N_N$ concentration in source 102 is at least $1\times10^{20}$ atoms/$cm^3$.

Source 102 extends to a distance $y_S$ below the upper semiconductor surface. Drain 104 extends to a depth $y_D$ below the upper semiconductor surface. Source depth $y_S$ is normally 0.1-0.2 μm, typically 0.15 μm. Drain depth $y_D$ is normally 0.15-0.3 μm, typically 0.2 μm. Drain depth $Y_D$ thus normally exceeds source depth $y_S$, typically by 0.05-0.1 μm.

Source 102 and drain 104 are laterally separated by an asymmetric channel zone 106 of p-type body material 108 that forms (a) a source-body pn junction 110 with source 102 and (b) a drain-body pn junction 112 with drain 104. P-type body material 108 consists of a lightly doped lower portion 114, a heavily doped intermediate well portion 116, and an upper portion 118 that typically extends deeper below the upper semiconductor surface than source 102 and drain 104. Upper body-material portion 118 thereby typically contains all of channel zone 106. In any event, p− lower body-material portion 114 and p+ well portion 116 extend laterally below source 102 and drain 104.

P+ well portion 116 is defined by p-type semiconductor well dopant distributed vertically in a roughly Gaussian manner so as to reach a maximum subsurface concentration at a depth $y_W$ below the upper semiconductor surface. The "Xs" in FIG. 6 generally indicate the location of the maximum subsurface concentration of the p-type well dopant. The concentration of the p-type well dopant at depth $y_W$ is normally $1\times10^{18}$-$1\times10^{19}$ atoms/$cm^3$, typically $5\times10^{18}$ atoms/$cm^3$. Maximum well-concentration depth $y_W$, which exceeds source depth $y_S$ and drain depth $Y_D$, is normally 0.5-1.0 μm, typically 0.7 μm. Additionally, depth $y_W$ is normally no more than 10 times, preferably no more than 5 times, drain depth $y_D$. That is, the location of the maximum concentration of the p-type well dopant is no more than 10 times, preferably no more than 5 times, deeper below the upper surface than drain 104.

The upper and lower boundaries of heavily doped well portion 116 are somewhat imprecise because well 116 is situated in doped semiconductor material of the same conductivity type (p type) as well 116. The semiconductor material that bounds well 116 does, as indicated below, have a low p-type background dopant concentration which is normally relatively uniform. The upper and lower boundaries of well 116 are typically defined as the locations where the concentration of the p-type well dopant equals the p-type background dopant concentration. Aside from any location where well 116 extends into other p-type material doped more heavily than well 116, the concentration of the total p-type dopant along the upper and lower boundaries of well 116 is then twice the p-type background dopant concentration. Under these boundary definitions, the upper boundary of well 116 is normally 0.2-0.5 μm, typically 0.3 μm, below the upper semiconductor surface. The lower boundary of well 116 is normally 0.9-1.3 μm, typically 1.1 μm, below the upper surface.

A depletion region (not shown) extends along the upper semiconductor surface from source-body pn junction 110 across channel zone 106 to drain-body pn junction 112 during IGFET operation. The average thickness of the surface depletion region is normally less than 0.1 um, typically in the vicinity of 0.05 um. Although the upper and lower boundaries of well portion 116 are somewhat imprecise, the concentration of the p-type well dopant normally drops to an electrically insignificant level at a depth less than 0.1 μm below the upper surface. Accordingly, well 116 is substantially located below the surface depletion region.

P-type upper body-material portion 118 includes a heavily doped pocket portion 120 that extends along source 102 up to the upper semiconductor surface and terminates at a location between source 102 and drain 104. FIG. 6 illustrates the example in which p+ pocket portion 120 extends deeper below the upper surface than source 102 and drain 104. In particular, FIG. 6 depicts the example in which pocket portion 120 extends laterally below source 102 and largely reaches p+ well portion 116. As discussed below in connection with FIGS. 18a-18c, pocket portion 120 can extend to a lesser depth below the upper surface than shown in FIG. 6. The remainder of p-type upper body-material portion 118, i.e., the part outside pocket portion 120, is indicated as item 124 in FIG. 6. Upper body-material remainder 124 is lightly doped and extends along drain 104. Channel zone 106, which consists of all the p-type semiconductor material between source 102 and drain 104, is thereby formed by part of source-side p+ pocket portion 120 and part of drain-side p− upper body-material remainder 124.

A gate dielectric layer 126 is situated on the upper semiconductor surface and extends over channel zone 106. A gate electrode 128 is situated on gate dielectric layer 126 above channel zone 106. Gate electrode 128 extends partially over source 102 and drain 104. In the example of FIG. 6, gate electrode 128 consists of polycrystalline silicon ("polysilicon") doped very heavily n type. Gate electrode 128 can be formed with other electrically conductive material such as metal or polysilicon doped sufficiently p type as to be electrically conductive.

The upper surfaces of source 102, drain 104, and n++ gate electrode 128 are typically respectively provided with thin layers (not shown in FIG. 6) of electrically conductive metal silicide to facilitate making electrical contact to regions 102, 104, and 128. In that case, gate electrode 128 and the overlying metal silicide layer form a composite gate electrode. Source 102, drain 104, and channel zone 106 are typically laterally surrounded by an electrical insulating field region (likewise not shown in FIG. 6) recessed into the upper semiconductor surface to define an active semiconductor island that contains regions 102, 104, and 106. Examples of the metal silicide layers and the field-insulating region are presented below in connection with FIGS. 29.1 and 29.2.

The presence of p+ pocket portion 120 along source 102 causes channel zone 106 to be graded longitudinally, i.e., in the direction of the channel length, with respect to channel dopant concentration. Because a substantial mirror image of source-side pocket portion 120 is not situated along drain 104, channel zone 106 is asymmetrically dopant graded in the longitudinal direction. P+ well portion 116 is situated below p− upper body-material remainder 124 that extends along drain 104. This configuration of p+ well 116 and p− upper body-material remainder 124 causes the vertical dopant profile in the portion of body material 108 underlying drain 104 to be hypoabrupt. That is, the concentration of the p-type dopant increases greatly, normally by at least a factor of 10, in going from drain-body junction 112 downward through p− upper body-material remainder 124 and into p+ well 116. The combination of the longitudinally asymmetric dopant grading in channel zone 106 and the hypoabrupt vertical dopant profile through drain 104 in the portion of body material 108 underlying drain 104 enables IGFET 100 to have very good analog characteristics while avoiding punchthrough.

Figure 8A:
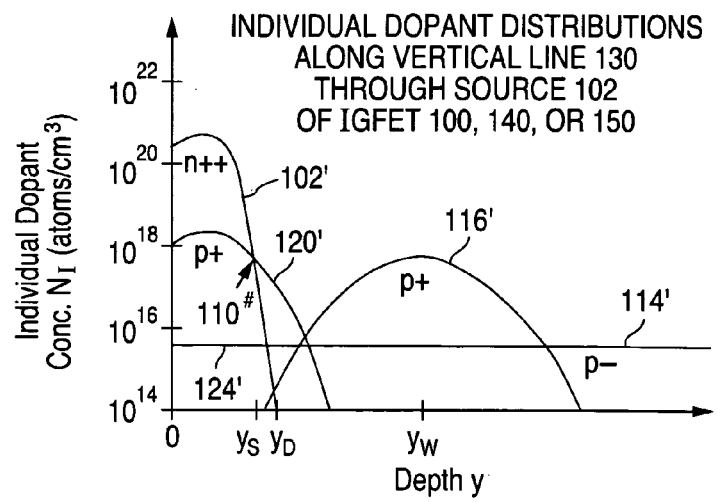
FIGS. 8a-8c are respective graphs of individual, absolute, and net dopant concentrations as a function of depth along a vertical line through the source of the IGFET of FIG. 6, 11, or 13.
Figure 8B:
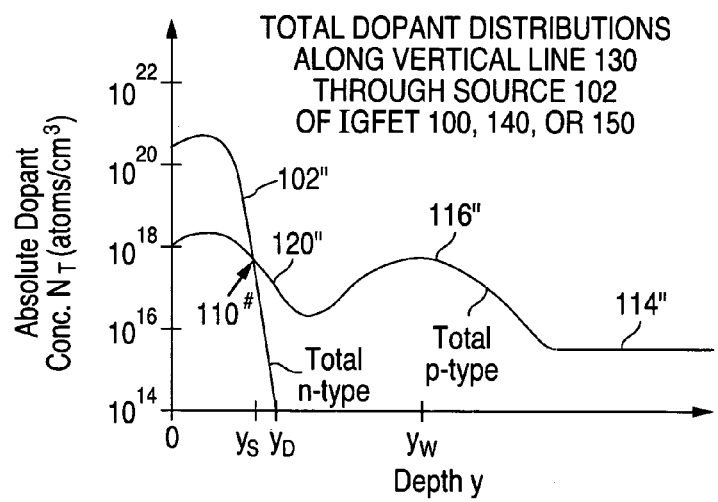
Figure 8C:
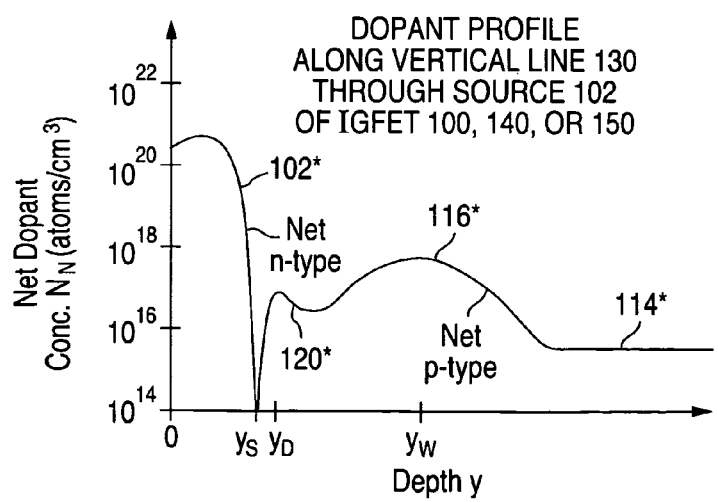
Figure 9A:
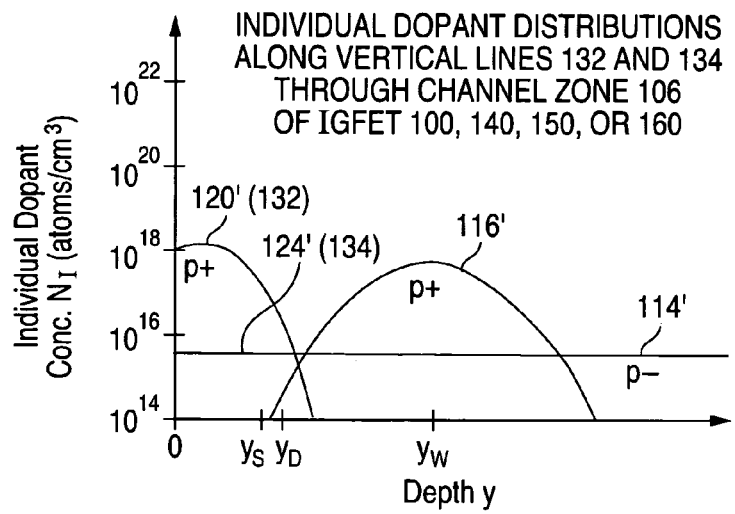
FIGS. 9a-9c are respective graphs of individual, absolute, and net dopant concentrations as a function of depth along a pair of vertical lines through the channel zone of the IGFET of FIG. 6, 11, 13, or 15.
Figure 9B:
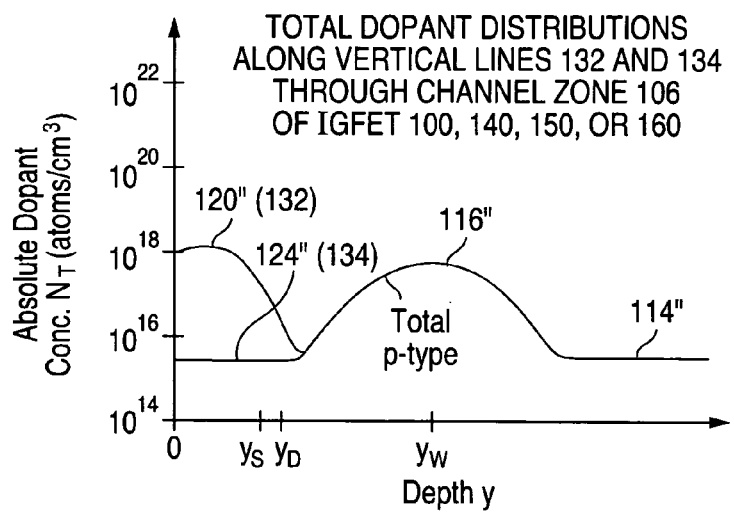
Figure 9C:
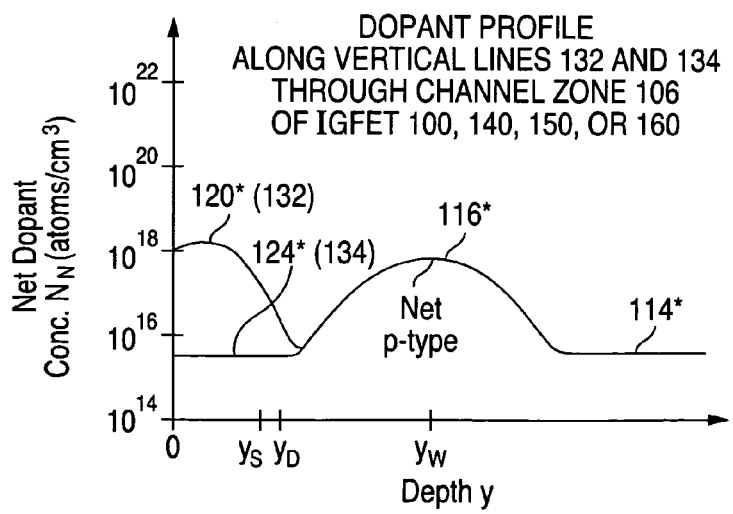
Figure 10A:
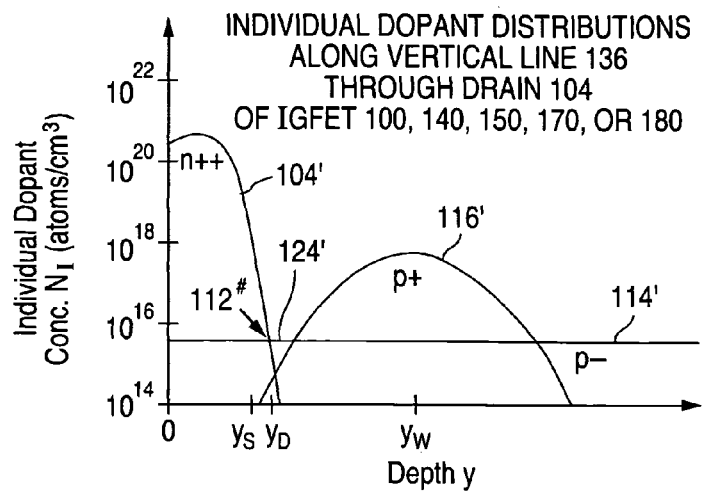
FIGS. 10a-10c are respective graphs of individual, absolute, and net dopant concentrations as a function of depth along a vertical line through the drain of the IGFET of FIG. 6, 11, 13, 18a, or 18b.
Figure 10B:
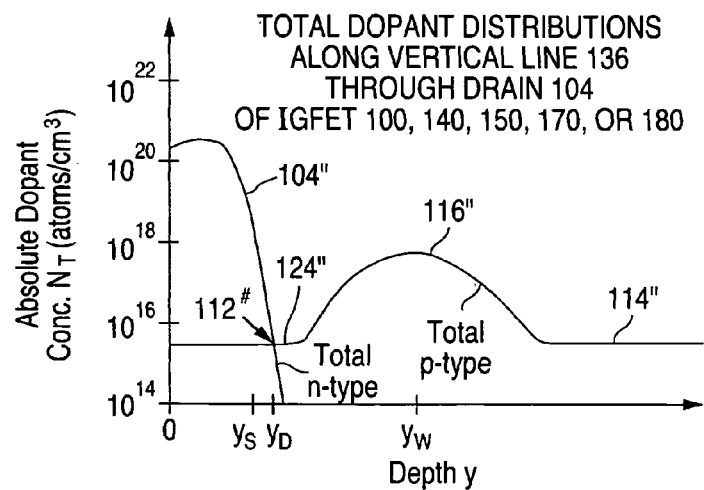
Figure 10C:
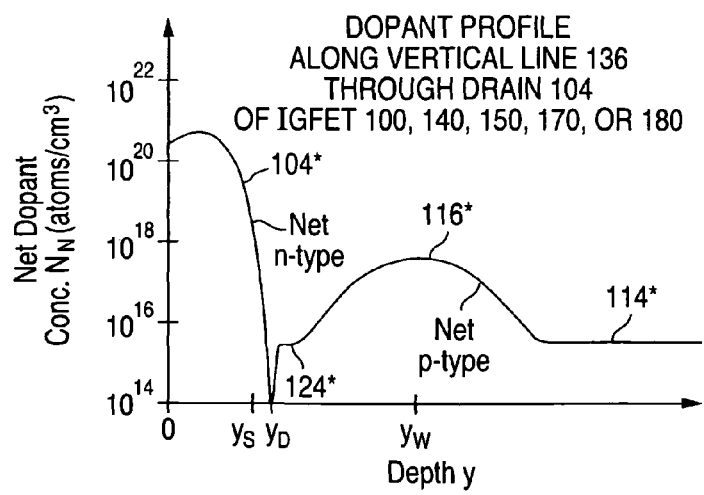

An understanding of the longitudinally asymmetric dopant grading in channel zone 106 and the hypoabrupt vertical dopant profile in the portion of body material 108 underlying drain 104 is facilitated with the assistance of FIGS. 7a-7c (collectively "FIG. 7"), FIGS. 8a-8c (collectively "FIG. 8"), FIGS. 9a-9c (collectively "FIG. 9"), and FIGS. 10a-10c (collectively "FIG. 10"). FIG. 7 presents exemplary dopant concentrations along the upper semiconductor surface as a function of longitudinal distance x. Exemplary dopant concentrations as a function of depth y along a vertical line 130 through source 102 are presented in FIG. 8. FIG. 9 presents exemplary dopant concentrations as a function of depth y along a pair of vertical lines 132 and 134 through channel zone 106. Vertical line 132 passes through source-side pocket portion 120. Vertical line 134 passes through a vertical location between pocket portion 120 and drain 104. Exemplary dopant concentrations as a function of depth y along a vertical line 136 through drain 104 are presented in FIG. 10.

Figure 7A:
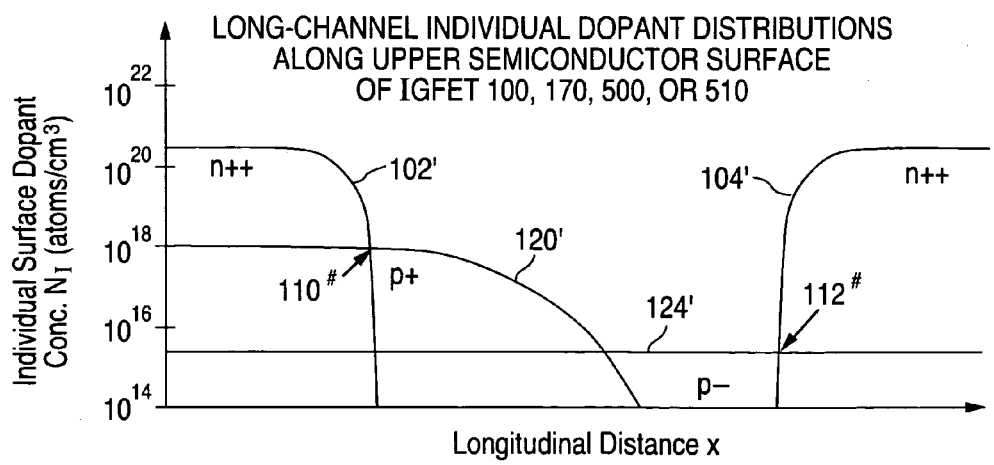
FIGS. 7a-7c are respective graphs of individual, absolute, and net dopant concentrations as a function of longitudinal distance along the upper semiconductor surface for the IGFET of FIG. 6, 18a, 68a, or 68b.

FIG. 7a specifically illustrates concentrations $N_I$, along the upper semiconductor surface, of the individual semiconductor dopants that largely define regions 102, 104, 120, and 124 and thus establish the longitudinal dopant grading of channel zone 106. FIGS. 8a, 9a, and 10a specifically illustrate concentration $N_I$, along vertical lines 130, 132, 134, and 136, of the individual semiconductor dopants that vertically define regions 102, 104, 114, 116, 120, and 124 and thus establish the hypoabrupt vertical dopant profile in the portion of body material 108 underlying drain 104. Curves 102' and 104' represent concentrations $N_I$ (surface and vertical) of the n-type dopant used to respectively form source 102 and drain 104. Curves 114', 116', 120', and 124' represent concentrations $N_I$ (surface and/or vertical) of the p-type dopants used to respectively form regions 114, 116, 120, and 124. Items 110# and 112# indicate where net dopant concentration $N_N$ goes to zero and thus respectively indicate the locations of pn junctions 110 and 112.

Figure 7B:
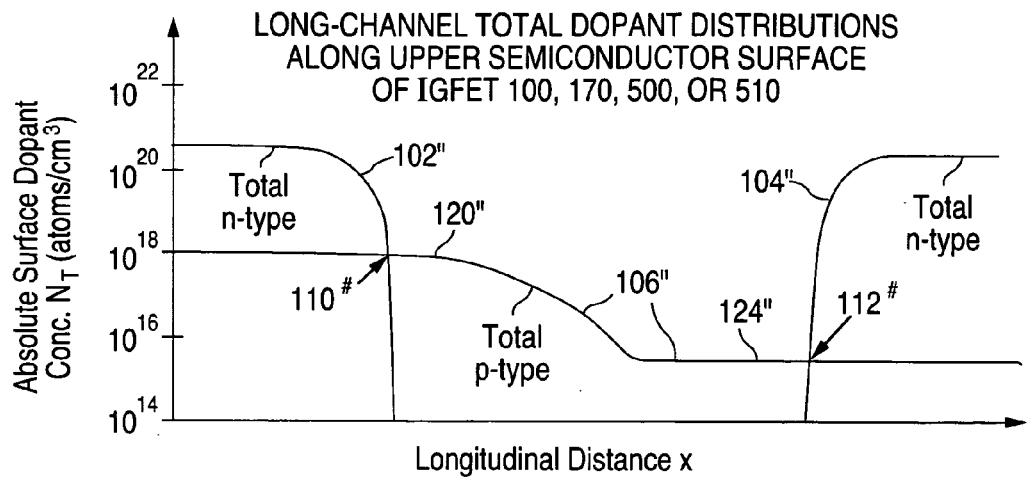

Concentrations $N_T$ of the total p-type and total n-type dopants in regions 102, 104, 120, and 124 along the upper semiconductor surface are shown in FIG. 7b. FIGS. 8b, 9b, and 10b depict, along vertical lines 130, 132, 134, and 136, concentrations $N_T$ of the total p-type and total n-type dopants in regions 102, 104, 114, 116, 120, and 124. Curve segments 114", 116", 120", and 124" respectively corresponding to regions 114, 116, 120, and 124 represent total concentrations $N_T$ of the p-type dopant. Item 106" in FIG. 7b corresponds to channel zone 106 and represents the channel-zone portions of curve segments 120" and 124". Total concentrations $N_T$ of the n-type dopant are represented by curves 102" and 104" respectively corresponding to source 102 and drain 104. Curves 102" and 104" in FIG. 7b are respectively identical to curves 102' and 104' in FIG. 7a. Curves 102" and 104" in FIGS. 8b and 10b are respectively identical to curves 102' and 104" in FIGS. 8a and 10a.

Figure 7C:
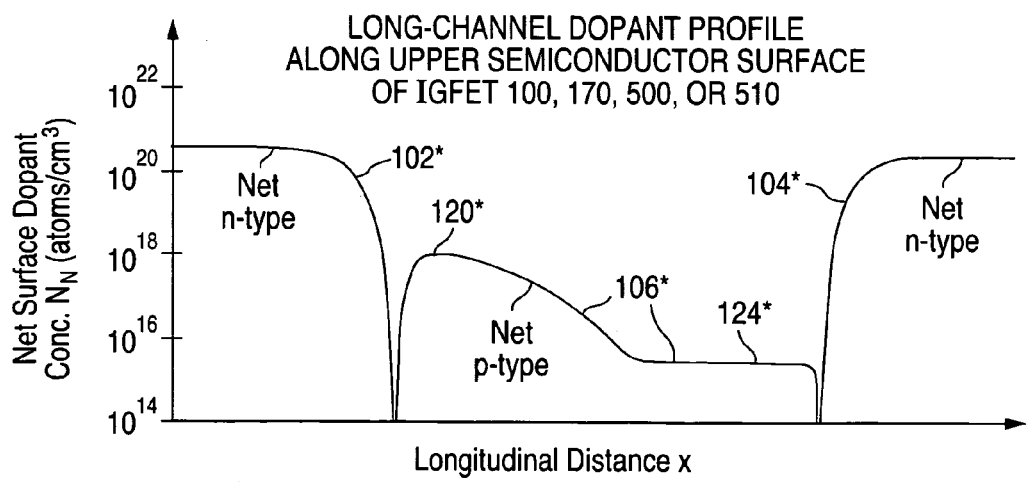

FIG. 7c illustrates net dopant concentration $N_N$ along the upper semiconductor surface. Net dopant concentration $N_N$ along vertical lines 130, 132, 134, and 136 is presented in FIGS. 8c, 9c, and 10c. Curve segments 114*, 116*, 120*, and 124* represent net concentrations $N_N$ of the p-type dopant in respective regions 114, 116, 120, and 124. Item 106* in FIG. 7c represents the combination of channel-zone curve segments 120* and 124* and thus presents concentration $N_N$ of the net p-type dopant in channel zone 106. Concentrations $N_N$ of the net n-type dopant in source 102 and drain 104 are respectively represented by curves 102* and 104*.

With the foregoing general comments about FIGS. 7-10 in mind, FIG. 7a indicates that the p-type dopant in source-side pocket portion 120 has two primary components, i.e., components provided in two separate doping operations, along the upper semiconductor surface. One of the primary components of the p-type dopant in pocket portion 120 along the upper surface is the p-type background dopant represented by curve 124' in FIG. 7a. The p-type background dopant is normally present at a low, largely uniform, concentration throughout all of the monosilicon material including regions 102, 104, 114, 116, and 120. Below pocket 120 and upper body-material remainder 124, the p-type background dopant is represented by curve segment 114' as indicated in FIGS. 8a, 9a, and 10a. The concentration of the p-type background dopant is normally $1\times10^{15}$-$1\times10^{16}$ atoms/cm$^3$, typically $5\times10^{15}$ atoms/cm$^3$.

The other primary component of the p-type dopant in source-side pocket portion 120 is the p-type pocket (or channel-grading) dopant indicated by curve 120' in FIG. 7a. The p-type pocket dopant is provided at a high upper-surface concentration, normally $5\times10^{17}$-$2\times10^{18}$ atoms/cm$^3$, typically $1\times10^{18}$ atoms/cm$^3$, to define pocket portion 120. The specific value of the upper-surface concentration of the p-type pocket dopant is critically adjusted, typically within 10% accuracy, to set the threshold voltage of IGFET 100.

The boundary of source-side pocket portion 120 consists of (a) a section of the upper semiconductor surface, (b) a pn junction section formed by source-body junction 110, and (c) a p-type section of body material 108. Although the p-type section of the boundary of pocket 120 is somewhat imprecise, the p-type pocket section is typically defined as the location where the concentration of the p-type pocket dopant equals the concentration of the p-type background dopant. To the extent that pocket 120 does not intrude into well portion 116, the p-type dopant concentration along the p-type section of the boundary of pocket 120 is then twice the background dopant concentration, including where the p-type pocket-portion boundary section meets the upper semiconductor surface.

The p-type pocket dopant is also present in source 102 as indicated by curve 120' in FIG. 7a. Concentration $N_I$ of the p-type pocket dopant in source 102 is substantially constant along its upper surface. In moving from source 102 longitudinally along the upper semiconductor surface into channel zone 106, concentration $N_I$ of the p-type pocket dopant is at the substantially constant upper-surface source level partway into zone 106 and then drops from that level essentially to zero at a location between source 102 and drain 104.

With the total p-type dopant in channel zone 106 along the upper semiconductor surface being the sum of the p-type background and pocket dopants along the upper surface, the total p-type channel-zone dopant along the upper surface is represented by curve segment 106" in FIG. 7b. The variation in curve segment 106" shows that, in moving longitudinally across channel zone 106 from source 102 to drain 104, concentration $N_T$ of the total p-type dopant in zone 106 along the upper surface is at a substantially constant high level partway into zone 106, decreases from the high level to the low p-type background level at a location between source 102 and drain 104, and then remains at the low background level for the rest of the distance to drain 104.

Concentration $N_I$ of the p-type pocket dopant in source 102 may, in some embodiments, be at the substantially constant source level along only part of the upper surface of source 102 and may then decrease in moving longitudinally along the upper semiconductor surface from a location within the upper surface of source 102 to source-body junction 110. In that case, concentration $N_I$ of the p-type pocket dopant in channel zone 106 starts decreasing immediately after crossing source-body junction 110 in moving longitudinally across zone 106 toward drain 104. Accordingly, concentration $N_T$ of the total p-type dopant in zone 106 along the upper surface similarly starts to decrease immediately after crossing junction 110 in moving longitudinally across channel zone 106 from source 102 to drain 104 rather than being at the substantially constant source level partway into zone 106.

Regardless of whether concentration $N_I$ of the p-type pocket dopant in channel zone 106 along the upper semiconductor surface is, or is not, at the substantially source level for a non-zero distance from source-body junction 110 longitudinally into zone 106, concentration $N_T$ of the total p-type dopant in zone 106 along the upper surface is lower where zone 106 meets drain 104 than where zone 106 meets source 102. In particular, concentration $N_T$ of the total p-type dopant in zone 106 is normally at least a factor of 10 lower, preferably at least a factor of 20 lower, more preferably at least a factor of 50 lower, typically a factor of 100 or more lower, at drain-body junction 112 along the upper surface than at source-body junction 110 along the upper surface.

FIG. 7c shows that, as represented by curve 106*, concentration $N_N$ of the net p-type dopant in channel zone 106 along the upper semiconductor surface varies in a similar manner to concentration $N_T$ of the total p-type dopant in zone 106 along the upper surface except that net dopant concentration $N_N$ of the net p-type dopant in zone 106 along the upper surface drops to zero at pn junctions 110 and 112. The source side of channel zone 106 thus has a high net amount of p-type dopant compared to the drain side. The high source-side amount of p-type dopant in channel zone 106 causes the thickness of the channel-side portion of the depletion region along source-body junction 110 to be reduced.

Also, the high p-type dopant concentration along the source side of channel zone 106 shields source 102 from the comparatively high electric field in drain 104. This occurs because the electric field lines from drain 104 terminate on ionized p-type dopant atoms in pocket portion 120 instead of terminating on ionized dopant atoms in the depletion region along source 102 and detrimentally lowering the potential barrier for electrons. The depletion region along source-body junction 110 is thereby inhibited from punching through to the depletion region along drain-body junction 112. By appropriately choosing the amount of the high source-side p-type dopant in channel zone 106, punchthrough is avoided in IGFET 100.

The p-type dopant in the portion of body material 108 below source 102, channel zone 106, and drain 104 has three primary components as indicated in FIGS. 8a, 9a, and 10a. One of the primary components of the p-type dopant in the body-material portion below regions 102, 104, and 106 is the p-type background dopant represented by curve segment 124' or 114' in FIGS. 8a, 9a, and 10a. The second primary component is the p-type well dopant that defines well portion 116 as indicated by curve 116' in FIGS. 8a, 9a, and 10a.

The final primary component of the p-type dopant in the body-material portion below regions 102, 104, and 106 is the p-type pocket dopant indicated by curve 120' in FIGS. 8a and 9a. The p-type pocket dopant is substantially present only in the portion of body material 108 below source 102 and an adjoining part of channel zone 106. The amount of p-type pocket dopant present in the portion of body material 108 below drain 104 is either essentially zero or is so low as to be substantially electrically insignificant. Hence, the total p-type pocket dopant in the portion of body material 108 below drain 104 consists substantially only of the p-type well and background dopants as indicated respectively by curves 116' and 124' or 114' taken along vertical line 136 in FIG. 10a.

The total p-type dopant in the portion of body material 108 below drain 104 is indicated by curve segment 116" and its extensions 124" (upward) and 114" (downward) in FIG. 10b. Curve segment 116" represents the sum of the p-type well and background dopants in well portion 116. Curve segments 114" and 124" respectively correspond to p− lower body-material portion 114 and p-upper body-material remainder 124. Because concentration $N_I$ of the p-type background dopant is relatively uniform, concentration $N_T$ of the total p-type dopant in the portion of body material 108 below drain 104 reaches a maximum value at a subsurface location substantially equal to depth $y_W$, i.e., substantially where the p-type well dopant reaches its maximum concentration.

As shown by the variation in combined curve segment 116"/124" in FIG. 10b, concentration $N_T$ of the total p-type dopant in the portion of body material 108 below drain 104 decreases hypoabruptly by at least a factor of 10 in moving upward along vertical line 136 to drain 104 from the subsurface location of the maximum concentration of the p-type dopant in well portion 116. Concentration $N_T$ of the total p-type dopant in the portion of body material 108 below drain 104 preferably decreases by at least a factor of 20, more preferably by at least a factor of 40, even more preferably by at least a factor of 80, typically by a factor in the vicinity of 100 or more, in moving from the location of the maximum p-type well concentration up to drain 104. Additionally, concentration $N_T$ of the total p-type dopant in the portion of body material 108 below drain 104 normally decreases progressively in moving from the location of the maximum p-type well concentration up to drain 104 as indicated by combined curve segment 116"/124".

The net dopant in the portion of body material 108 below drain 104 is p-type dopant. FIG. 10c shows that, as represented by the combination of curve segments 116* and 124*, concentration $N_N$ of the net dopant in the portion of body material 108 below drain 104 varies vertically in a similar manner to concentration $N_T$ of the total p-type dopant in the portion of body material 108 below drain 104 except that concentration $N_N$ in the portion of body material 108 below drain 104 drops to zero at drain-body junction 112. The hypoabrupt vertical dopant profile in the portion of body material 108 below drain 104 causes the parasitic capacitance associated with drain-body junction 112 to decrease for the reasons discussed further below. This enables IGFET 100 to have increased analog speed.

Moving to the dopant distribution along vertical line 130 through source 102, the total p-type dopant in the portion of body material 108 below source 102 consists of the p-type well, background, and pocket dopants as indicated respectively by curves 116', 124', and 120' in FIG. 8a. For the example of FIG. 6 in which source-side pocket portion 120 meets well 116 below source 102 so that concentrations $N_I$ of the p-type well and pocket dopants both exceed the p-type background concentration at the meeting location, the total p-type dopant in the portion of body material 108 below source 102 is indicated by the combination of curve segments 116" and 120" in FIG. 8b. In an embodiment where pocket 120 extends below source 102 but does not meet well portion 116, the total p-type dopant in the portion of body material 108 below source 102 would be indicated by the combination of curve segments 116" and 120" and a curve segment corresponding to p− upper body-material remainder 124.

As illustrated by combined curve segment 116"/120" in FIG. 8*b*, concentration $N_T$ of the total p-type dopant in the portion of body material 108 below source 102 initially decreases by a factor of 10, typically by a factor in the vicinity 30, in moving upward through body material 108 from the subsurface location of the maximum concentration of the p-type dopant in well portion 116. Upon reaching a local minimum below source 102, concentration $N_T$ of the total p-type dopant in the portion of body material 108 below source 102 then rises before reaching source 102.

The net dopant in the portion of body material 108 below source 102 is p-type dopant. FIG. 8*c* shows that, as represented by the combination of curve segments 116* and 120* for the example of FIG. 6 in which source-side pocket portion 120 meets well portion 116, concentration $N_N$ of the net dopant in the portion of body material 108 below source 102 varies vertically in a similar manner to concentration $N_T$ of the total p-type dopant in the portion of body material 108 below source 102 except that net dopant concentration $N_N$ in the portion of body material 108 below source 102 drops to zero at source-body junction 110. Depending on various factors such as the amount by which the depth of pocket 120 exceeds the depth of source 102, this vertical dopant profile below source 102 sometimes causes the parasitic capacitance along source-body junction 110 to be reduced, albeit normally less than the reduction in the parasitic capacitance along drain-body junction 112

Turning briefly to FIG. 9 dealing with dopant concentrations $N_I$, $N_T$, and $N_N$ along vertical lines 132 and 134 through channel zone 106, the parenthetical entry "132" after each of reference symbols 120', 120", and 120* indicates dopant concentrations along vertical line 132. The parenthetical entry "134" after each of reference symbols 124', 124", and 124* indicates dopant concentrations along vertical line 134.

Figure 11:
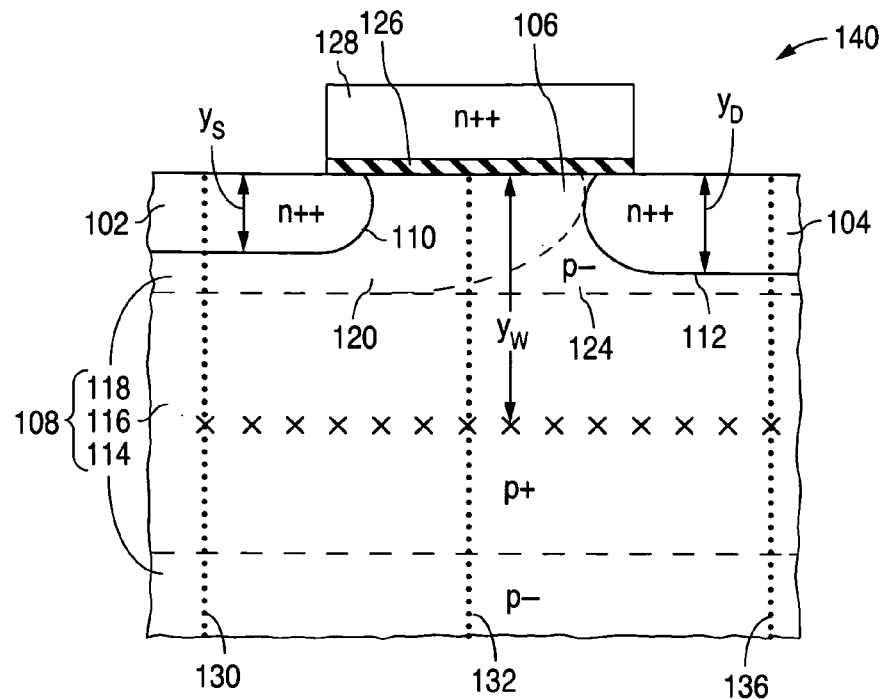
FIG. 11 is a front cross-sectional view of an asymmetric short n-channel IGFET configured according to the invention so as to have a semiconductor well portion of the same conductivity type as directly underlying semiconductor material.

FIG. 11 depicts an asymmetric short n-channel IGFET 140 configured in accordance with the invention so as to be particularly suitable for high-speed analog applications. Short-channel IGFET 140 is a variation of long-channel IGFET 100 in which the channel length is shortened to such an extent that IGFET operation occurs in the short-channel regime. The channel length is shortened by appropriately reducing the length of gate electrode 128. In the example of FIG. 11, p-type pocket portion 120 extends sufficiently far across channel zone 106 to just meet drain 104.

Figure 12A:
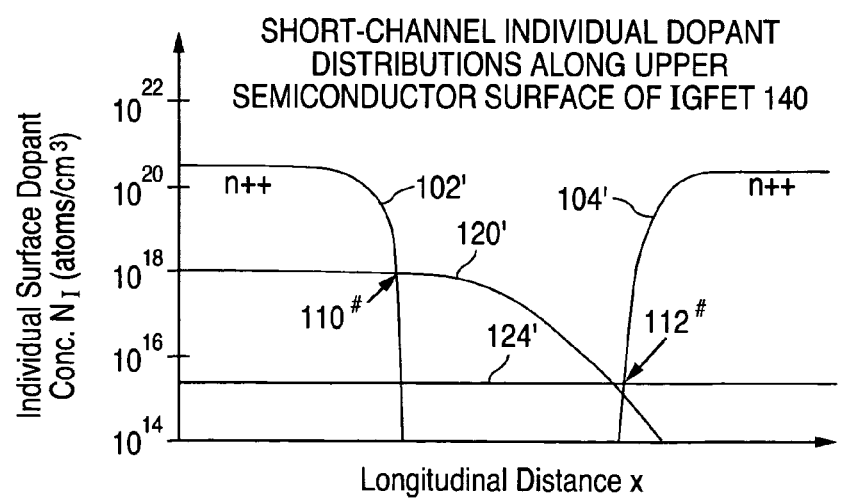
FIGS. 12a-12c are respective graphs of individual, absolute, and net dopant concentrations as a function of longitudinal distance along the upper semiconductor surface for the IGFET of FIG. 11.
Figure 12B:
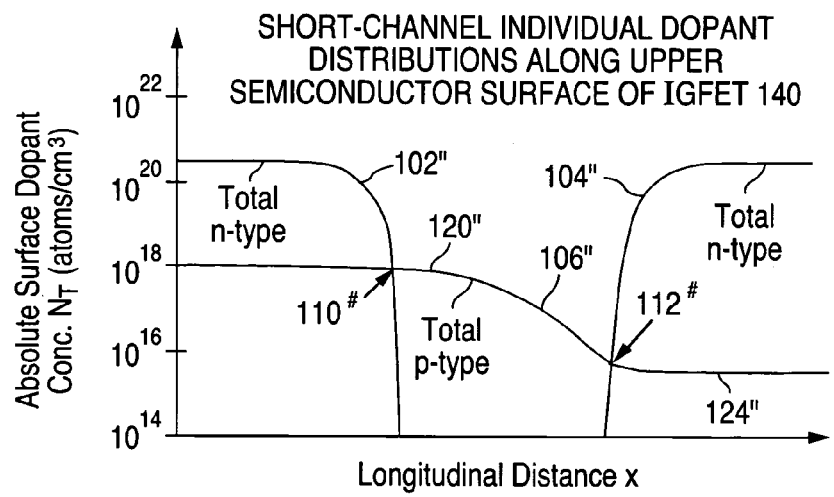
Figure 12C:
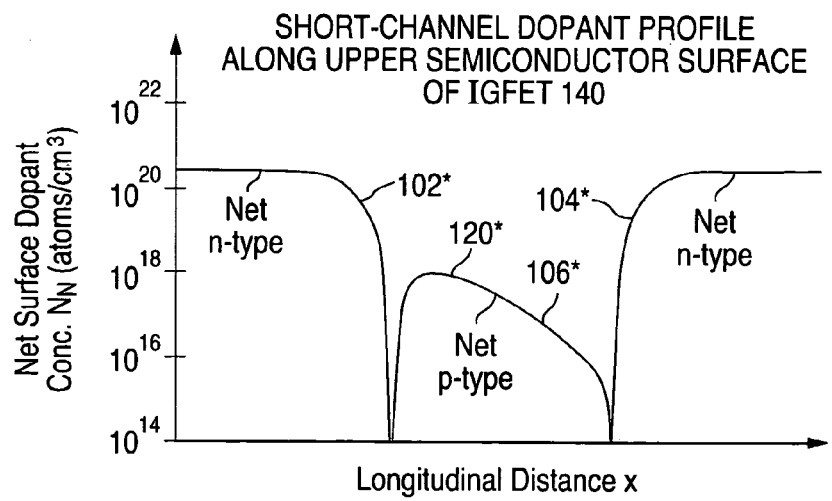

FIGS. 12*a*-12*c* (collectively "FIG. 12") respectively present exemplary dopant concentrations $N_I$, $N_T$, and $N_N$ along the upper semiconductor surface of IGFET 140 as a function of longitudinal distance x in order to facilitate understanding the asymmetric longitudinal dopant grading in channel zone 106 of IGFET 140. All of the analysis presented above for IGFET 100 in connection with FIG. 7 applies to IGFET 140 except that the shortened length of channel zone 106 in IGFET 140 causes the dopant distribution in channel zone 106 of IGFET 140 to differ from that in channel zone 106 of IGFET 100 as explained below in connection with FIG. 12.

As in FIG. 7*a*, concentration $N_I$ of the p-type pocket dopant along the upper semiconductor surface is represented by curve 120' in FIG. 12*a*. Unlike what occurs in channel zone 106 of IGFET 100, concentration $N_I$ of the p-type pocket dopant along the upper surface of channel zone 106 of IGFET 140 does not drop essentially to zero at a location between source 102 and drain 104. Instead, as illustrated by curve 120' in FIG. 12*a*, concentration $N_I$ of the p-type pocket dopant along the upper surface of channel zone 106 of IGFET 140 is greater than zero along substantially all of the channel zone's upper surface and thus is at a small finite value where channel zone 106/pocket portion 120 meets drain 104. Concentration $N_I$ of the pocket dopant in IGFET 140 is at a much greater value where zone 106/pocket 120 meets source 102 along the channel zone's upper surface.

The preceding change in concentration $N_I$ of the p-type pocket dopant along the upper surface of channel zone 106 in IGFET 140 is reflected in absolute dopant concentration $N_T$ and net dopant concentration $N_N$ along the upper semiconductor surface of IGFET 140. As in FIG. 7*b*, curve segment 106" in FIG. 12*b* represents concentration $N_T$ of the total p-type dopant in channel zone 106 along the upper semiconductor surface for which the total p-type dopant in zone 106 along the upper surface is the sum of the p-type background and pocket dopants along the upper semiconductor surface. The variation of curve segment 106" in FIG. 12*b* shows that, in moving from source 102 through channel zone 106 to drain 104 along the upper semiconductor surface, concentration $N_T$ of the total p-type dopant in zone 106 along the upper semiconductor surface of IGFET 140 is substantially constant at the high level in source 102 partway into zone 106 and then decreases from the high level to a low level slightly greater than the background concentration upon reaching drain 104. More particularly, concentration $N_T$ of the total p-type dopant in channel zone 106 of IGFET 140 increases progressively in going along the upper semiconductor surface from where zone 106 meets drain 104 partway to where zone 106 meets source 102.

Similar to what was said above about IGFET 100, concentration $N_I$ of the p-type pocket dopant along the upper semiconductor surface in IGFET 140 may start decreasing immediately after passing source-body pn junction 110 in moving longitudinally along the upper surface from source 102 across channel zone 106 to drain 104. As viewed in moving from drain 104 to source 102 rather than from source 102 to drain 104, concentration $N_T$ of the total p-type dopant in channel zone 106 in IGFET 140 then increases progressively in going along the upper semiconductor surface from where zone 106 meets drain 104 all the way to where zone 106 meets source 102. In any event, concentration $N_T$ of the total p-type dopant in zone 106 along the upper surface of IGFET 140 satisfies the specifications presented above for IGFET 100 of being lower where zone 106 meets drain 104 than where zone 106 meets source 102.

FIG. 12*c* shows that, as represented by curve 106*, concentration $N_N$ of the net p-type dopant along the upper surface of channel zone 106 of IGFET 140 varies in a similar manner to concentration $N_T$ of the total p-type dopant in zone 106 of IGFET 140 along the upper semiconductor surface except that concentration $N_N$ of the net p-type dopant in zone 106 of IGFET 140 along the upper semiconductor surface goes to zero at pn junctions 110 and 112. As in channel zone 106 of IGFET 100, the source side of channel zone 106 in IGFET 140 has a high net amount of p-type dopant compared to the drain side of IGFET 140. The high source-side p-type doping in channel zone 106 of IGFET 140 causes the thickness of the channel-side portion of the depletion region extending along source-body junction 110 to be reduced.

Source 102 and drain 104 are closer to each other in IGFET 140 than in IGFET 100. Accordingly, it is more likely that the depletion region extending along source 102 will punch through to the depletion region extending along drain 104 in IGFET 140 than in IGFET 100. However, the high amount of source-side p-type dopant in channel zone 106 of IGFET 140 reduces the likelihood of punchthrough occurring in IGFET 140 relative to an otherwise equivalent short n-channel IGFET lacking pocket portion 120.

The dopant concentrations along vertical lines 130, 132, and 136 respectively through source 102, channel zone 106, and drain 104 in IGFET 140 are substantially the same as in IGFET 100. Concentrations $N_I$, $N_T$, and $N_N$ shown in FIGS. 8-10 along vertical lines 130, 132, and 136 thus apply to IGFET 140. Accordingly, IGFET 140 has a hypoabrupt vertical dopant profile in the portion of body material 108 below drain 104. This causes the parasitic capacitance associated with drain-body pn junction 112 to decrease, as further described below, so that IGFET 140 has increased analog speed.

Source 102 can be longitudinally dopant graded to reduce its source (series) resistance $R_S$. As discussed below, reducing source resistance $R_S$ is particularly advantageous in analog IGFET applications. This longitudinal dopant grading in source 102 typically involves configuring it as a main portion and a more lightly doped lateral extension that terminates channel zone 106 along the upper semiconductor surface. Drain 104 can be provided with a similar longitudinal dopant grading to reduce hot-carrier injection. Providing both of S/D zones 102 and 104 with longitudinal dopant grading is therefore advantageous regardless of whether zones 102 and 104 respectively act as source and drain, the normal case, or respectively as drain and source.

Figure 13:
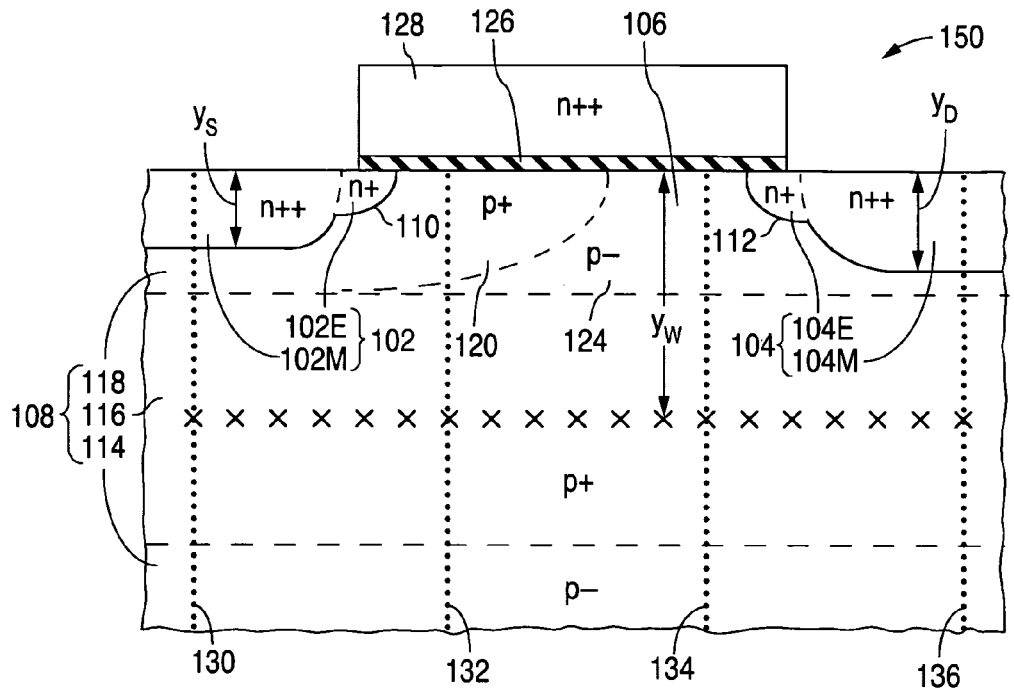
FIG. 13 is a front cross-sectional view of another asymmetric long n-channel IGFET configured according to the invention so as to have a semiconductor well portion of the same conductivity type as directly underlying semiconductor material.

FIG. 13 illustrates an asymmetric long n-channel IGFET 150 configured in accordance with the invention to be especially suitable for high-speed analog applications and, in particular, to have longitudinal source/drain dopant grading for reducing source resistance $R_S$ and drain-side hot-carrier injection. IGFET 150 is arranged the same as IGFET 100 except that (a) n-type source 102 consists of a very heavily doped main portion 102M and a more lightly doped lateral extension 102E and (b) n-type drain 104 consists of a very heavily doped main portion 104M and a more lightly doped lateral extension 104E. Although more lightly doped than n++ main S/D portions 102M and 104M, lateral extensions 102E and 104E are still heavily doped in sub-µm complementary IGFET applications such as the present one. N+ lateral extensions 102E and 104E terminate channel zone 106 along the upper semiconductor surface. Gate electrode 128 extends partially over each of n+ lateral extensions 102E and 104E but typically not over n++ main source portion 102M or n++ main drain portion 104M.

Main S/D portions 102M and 104M normally extend deeper below the upper semiconductor surface respectively than lateral extensions 102E and 104E. Consequently, source depth $y_S$ and drain depth $Y_D$ in IGFET 150 respectively are the depths of main source portion 102M and main drain portion 104M. Pocket portion 120 extends under, and partially alongside, main source portion 102M so that drain depth $y_D$ again normally exceeds source depth $y_S$. Also, pocket 120 extends under, and alongside, source extension 102E. As a result, drain extension 104E normally extends deeper below the upper surface than source extension 102E.

Maximum net dopant concentration $N_N$ in n++ main source portion 102M along the upper semiconductor surface is normally at least $1 \times 10^{20}$ atoms/cm$^3$, typically $4 \times 10^{20}$ atoms/cm$^3$. Maximum net dopant concentration $N_N$ in n++ main drain portion 104M along the upper semiconductor surface is normally at least $1 \times 10^{20}$ atoms/cm$^3$, typically slightly greater than $4 \times 10^{20}$ atoms/cm$^3$ so as to slightly exceed the maximum upper-surface $N_N$ concentration in main source portion 102M. Maximum net dopant concentration $N_N$ in n+ source extension 102E along the upper semiconductor surface is normally $1 \times 10^{18}$-$1 \times 10^{19}$ atoms/cm$^3$, typically $3 \times 10^{18}$ atoms/cm$^3$. Maximum net dopant concentration $N_N$ in n+ drain extension 104E along the upper semiconductor surface is typically slightly greater than $3 \times 10^{18}$ atoms/cm$^3$ so as to slightly exceed the maximum upper-surface $N_N$ concentration in source extension 102E.

Figure 14A:
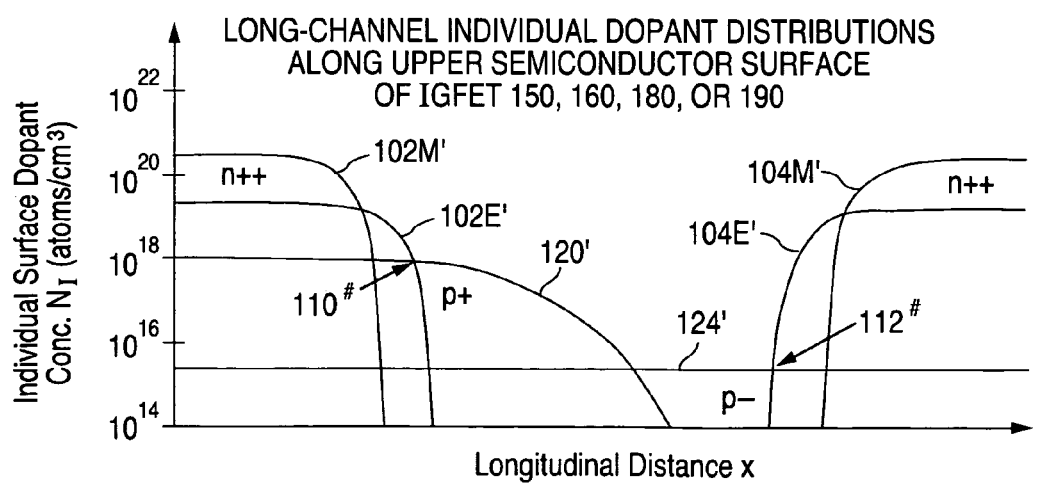
FIGS. 14a-14c are respective graphs of individual, absolute, and net dopant concentrations as a function of longitudinal distance along the upper semiconductor surface for the IGFET of FIG. 13, 15, 18b, or 18c.
Figure 14B:
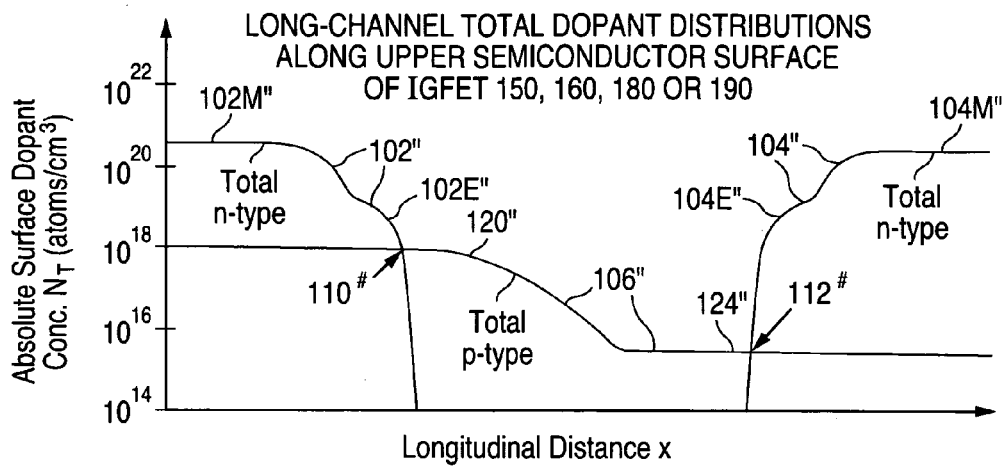
Figure 14C:
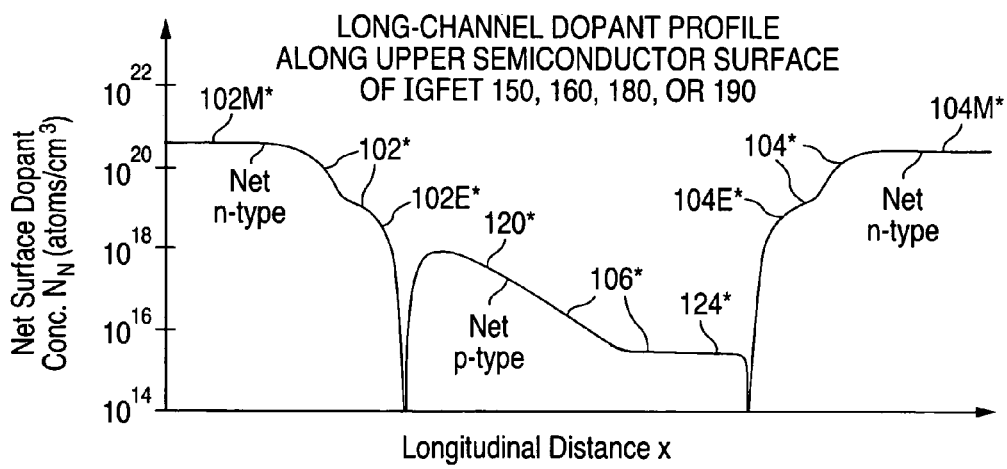

Subject to the longitudinal dopant grading in source 102 and drain 104, channel zone 106 is asymmetrically longitudinally dopant graded substantially the same in IGFET 150 as in IGFET 100. FIGS. 14a-14c (collectively "FIG. 14") present exemplary dopant concentrations along the upper semiconductor surface of IGFET 150 as a function of longitudinal distance x for use in examining the longitudinal dopant grading in source 102 and drain 104. FIG. 14a depicts concentrations $N_I$, along the upper semiconductor surface, of the individual semiconductor dopants that largely define regions 102M, 102E, 104M, 104E, 120, and 124. Concentrations $N_T$ of the total p-type and total n-type dopants of regions 102M, 102E, 104M, 104E, 120, and 124 along the upper semiconductor surface are depicted in FIG. 14b. FIG. 14c illustrates net dopant concentration $N_N$ along the upper semiconductor surface.

FIG. 14a is analogous to FIG. 7a except that curves 102M', 102E', 104M', and 104E' represent concentrations $N_I$, along the upper semiconductor surface, of the n-type dopant used to respectively form regions 102M, 102E, 104M, and 104E. FIG. 14b is similarly analogous to FIG. 7b subject to total concentrations $N_T$ of the n-type dopant along the upper semiconductor surface being represented by (a) curve 102" consisting of segments 102M" and 102E" respectively corresponding to main source portion 102M and source extension 102E and (b) curve 104" consisting of segments 104M" and 104E" respectively corresponding to main drain portion 104M and drain extension 104E. FIG. 14c is analogous to FIG. 7c subject to (a) curve 102* that represents net dopant concentration $N_N$ in source 102 along the upper semiconductor surface being formed with segments 102M* and 102E* respectively corresponding to main source portion 102M and source extension 102E and (b) curve 104* that represents net dopant concentration $N_N$ in drain 104 along the upper semiconductor surface being formed with segments 104M* and 104E* respectively corresponding to main drain portion 104M and drain extension 104E.

The longitudinal dopant grading in source 102 and drain 104 of IGFET 150 reduces source resistance $R_S$ and alleviates drain-side hot-carrier injection but does not have any significant effect on the asymmetric longitudinal dopant grading in channel zone 106. Accordingly, the asymmetric channel-zone dopant grading in IGFET 150 avoids punchthrough in largely the same way as in IGFET 100.

The configuration of well portion 116 and upper body-material remainder 124 in IGFET 150 causes the vertical dopant profile through drain 104 and into underlying body material 108 to be hypoabrupt substantially the same as in IGFET 100. With vertical lines 130 and 136 respectively going through n++ main source portion 102M and n++ main drain portion 104M, the vertical dopant concentration graphs of FIGS. 8-10 substantially apply to IGFET 150. The resulting reduced parasitic capacitance associated with drain-body pn junction 112 enables IGFET 150 to have increased analog speed. The reduction in source resistance $R_S$ further enhances the analog performance in the manner discussed below.

Drain 104 can be vertically dopant graded to further reduce the parasitic capacitance associated with drain-body junction 112. Source 102 can similarly be vertically dopant graded for reducing the parasitic capacitance associated with source-body junction 110. The vertical dopant grading typically involves configuring each S/D zone 102 or 104 as a main portion and a more lightly doped lower portion. The vertical source/drain dopant grading can be combined with the above-mentioned longitudinal dopant grading of source 102 and drain 104.

Figure 15:
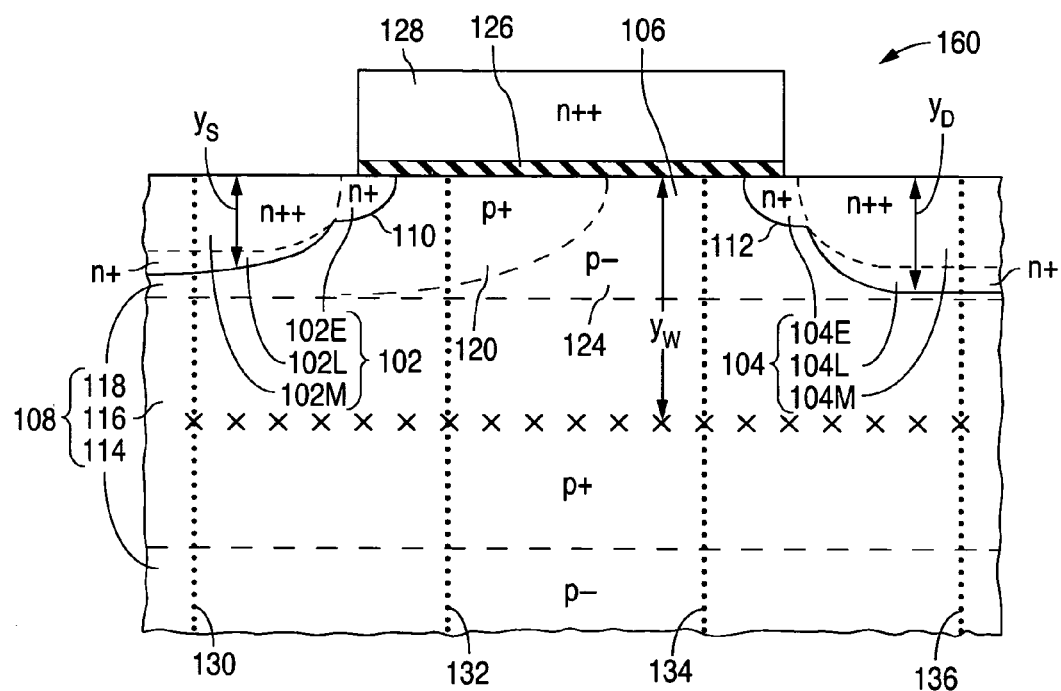
FIG. 15 is front cross-sectional view of a further asymmetric long n-channel IGFET configured according to the invention so as to have a semiconductor well portion of the same conductivity type as directly underlying semiconductor material.

In the foregoing regard, FIG. 15 illustrates an asymmetric long n-channel IGFET 160 configured in accordance with the invention to be especially suitable for high-speed analog applications. IGFET 160 is provided both with source/drain longitudinal dopant grading for reducing source resistance $R_S$ and drain-side hot-carrier injection and with source/drain vertical dopant grading for reducing source/drain parasitic capacitances. IGFET 160 is arranged the same as IGFET 150 except that (a) source 102 further includes a lower portion 102L more lightly doped than main source portion 102M and (b) drain 104 further includes a lower portion 104L more lightly doped than main drain portion 104M. Lower source portion 102L and lower drain portion 104L are heavily doped n-type.

Source depth $y_S$ and drain depth $y_D$ in IGFET 160 are respectively the depths of n+ lower source portion 102L and n+ lower drain portion 104L, since they respectively underlie n++ main source portion 102M and n++ main drain portion 104M. Pocket portion 120 extends below lower source portion 102L. Consequently, drain depth $y_D$ once again normally exceeds source depth $y_S$.

Source 102 and drain 104 of IGFET 160 respectively include n+ lateral source extension 102E and n+ lateral drain extension 104E for achieving longitudinal source-drain dopant grading. See FIG. 15. The longitudinal source/drain dopant grading in IGFET 160 has substantially the same characteristics as in IGFET 150. Accordingly, the longitudinal upper-surface dopant concentration graphs of FIG. 14 and the associated description of FIG. 14 in connection with IGFET 150 apply to IGFET 160. Since the longitudinal source/drain dopant grading in IGFET 150, and thus in IGFET 160, does not have any significant effect on the asymmetric longitudinal dopant grading in channel zone 106, the asymmetric channel-zone dopant grading in IGFET 160 avoids punchthrough in IGFET 160 in substantially the same way as in IGFET 100.

Figure 16A:
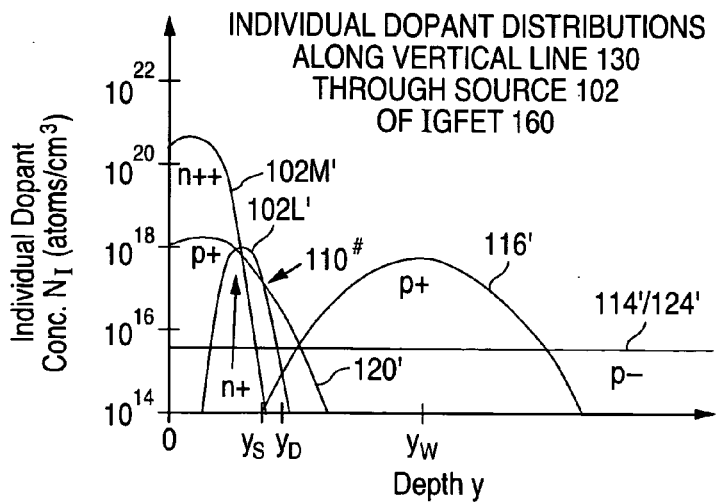
FIGS. 16a-16c are respective graphs of individual, absolute, and net dopant concentrations as a function of depth along a vertical line extending through the source of the IGFET of FIG. 15.
Figure 16B:
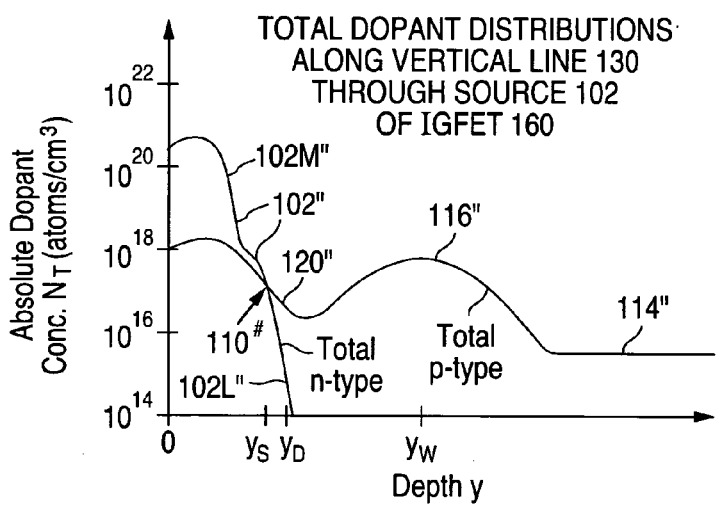
Figure 16C:
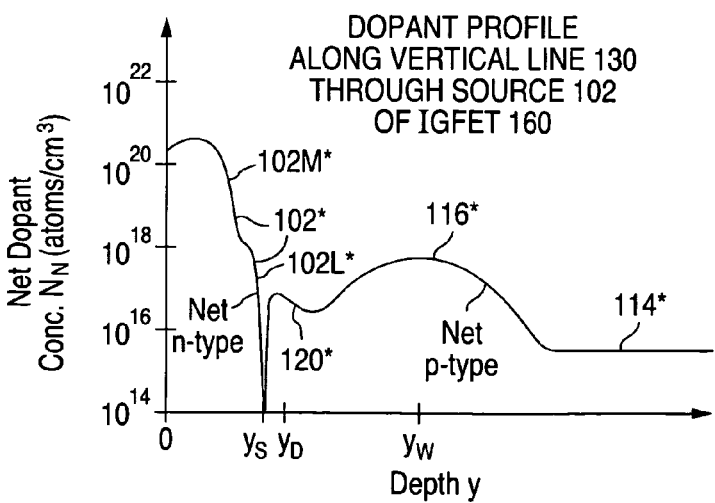
Figure 17A:
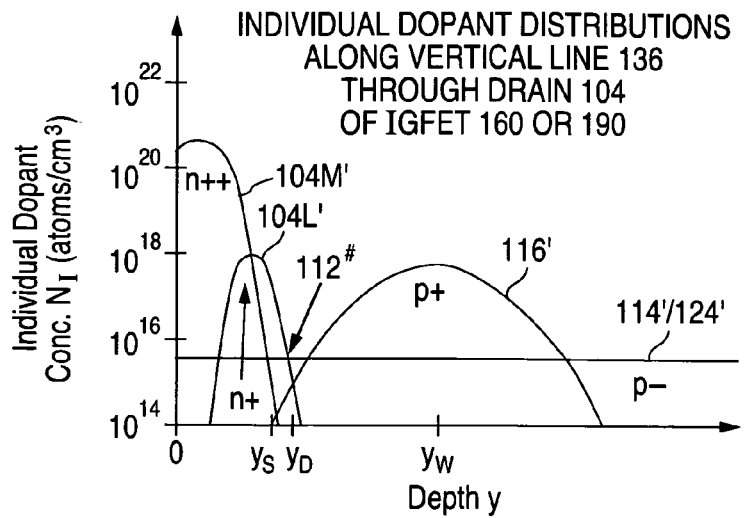
FIGS. 17a-17c are respective graphs of individual, absolute, and net dopant concentration as a function of depth along a vertical line extending through the drain of the IGFET of FIG. 15 or 18c.
Figure 17B:
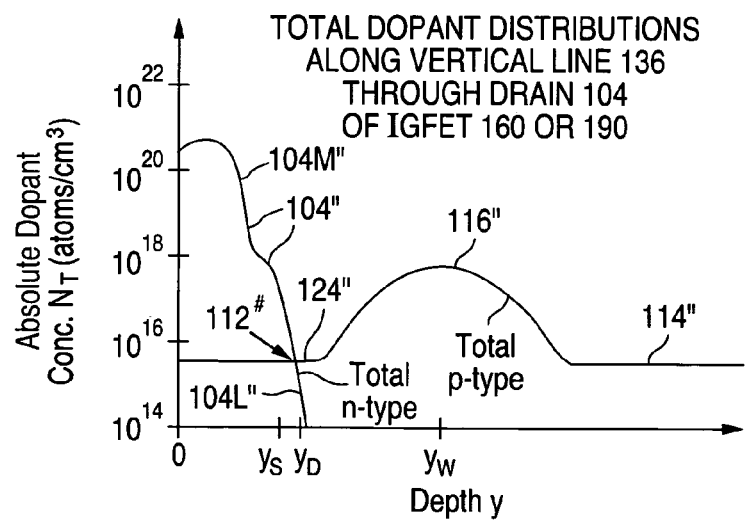
Figure 17C:
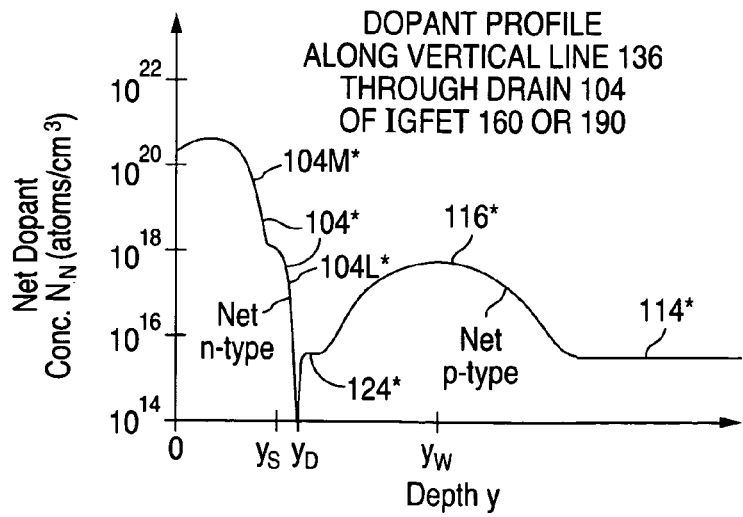

An understanding of the vertical dopant grading in IGFET 160 is facilitated with the assistance of FIGS. 16a-16c (collectively "FIG. 16") and FIGS. 17a-17c (collectively "FIG. 17") which present exemplary dopant concentrations as a function of depth y along vertical lines 130 and 136 respectively through source 102 and drain 104 including respectively through lower source portion 102L and lower drain portion 104L. FIGS. 16a and 17a specifically illustrate concentrations $N_I$, respectively along lines 130 and 136, of the individual semiconductor dopants that vertically define regions 102M, 102L, 104M, 104L, 114, 116, 120, and 124. Concentrations $N_T$ of the total p-type and total n-type dopants in regions 102M, 102L, 104M, 104L, 114, 116, 120, and 124 along lines 130 and 136 are respectively depicted in FIGS. 16b and 17b. FIGS. 16c and 17c respectively illustrate net dopant concentration $N_N$ along lines 130 and 136.

FIGS. 16a and 17a are respectively analogous to FIGS. 8a and 10a except that (a) curves 102M' and 102L' represent concentrations $N_I$ along vertical line 130 of the n-type dopant used to respectively form main source portion 102M and lower source portion 102L and (b) curves 104M' and 104L' represent concentrations $N_I$ along vertical line 136 of the n-type dopant used to respectively form main drain portion 104M and lower drain portion 104L. Similarly, FIGS. 16b and 17b are respectively analogous to FIGS. 8b and 10b subject to (a) concentration $N_T$ of the total n-type dopant along line 130 being represented by curve 102" consisting here of segments 102M" and 102L" respectively corresponding to main source portion 102M and lower source portion 102L and (b) concentration $N_T$ of the total n-type dopant along line 136 being represented by curve 104" consisting here of segments 104M" and 104L" respectively corresponding to main drain portion 104M and lower drain portion 104L.

FIGS. 16c and 17c are respectively analogous to FIGS. 8c and 10c subject to (a) curve 102* that represents net dopant concentration $N_N$ in source 102 along line 130 being formed here with segments 102M* and 102L* respectively corresponding to main source portion 102M and lower source portion 102L and (b) curve 104* that represents net dopant concentration $N_N$ in drain 104 along line 136 being formed here with segments 104M* and 104L* respectively corresponding to main drain portion 104M and lower drain portion 104L. Additionally, the dopant concentrations along vertical lines 132 and 134 through channel zone 106 of IGFET 160 are substantially the same as in IGFET 100. Hence, concentrations $N_I$, $N_T$, and $N_N$ shown in FIG. 9 along vertical lines 132 and 134 apply to IGFET 160.

Subject to the preceding comments about the vertical dopant grading in source 102 and drain 104 of IGFET 160, the configuration of well portion 116 and pocket portion 120 in IGFET 160 is substantially the same as in IGFET 100. Accordingly, the vertical dopant profile below drain 104 is substantially the same in IGFET 160 as in IGFET 100. For this reason, the parasitic capacitance associated with drain-body junction 112 is reduced in IGFET 160, thereby enabling it to have increased analog speed. The vertical dopant gradings in source 102 and drain 104 enable IGFET 160 to have even greater analog speed by reducing (or further reducing) the parasitic capacitance along source-body junction 110 and by further reducing the parasitic capacitance along drain-body junction 112. The longitudinal dopant gradings in source 102 and drain 104 of IGFET 160 reduce source resistance $R_S$ while simultaneously alleviating drain-side hot-carrier injection.

Figure 18A:
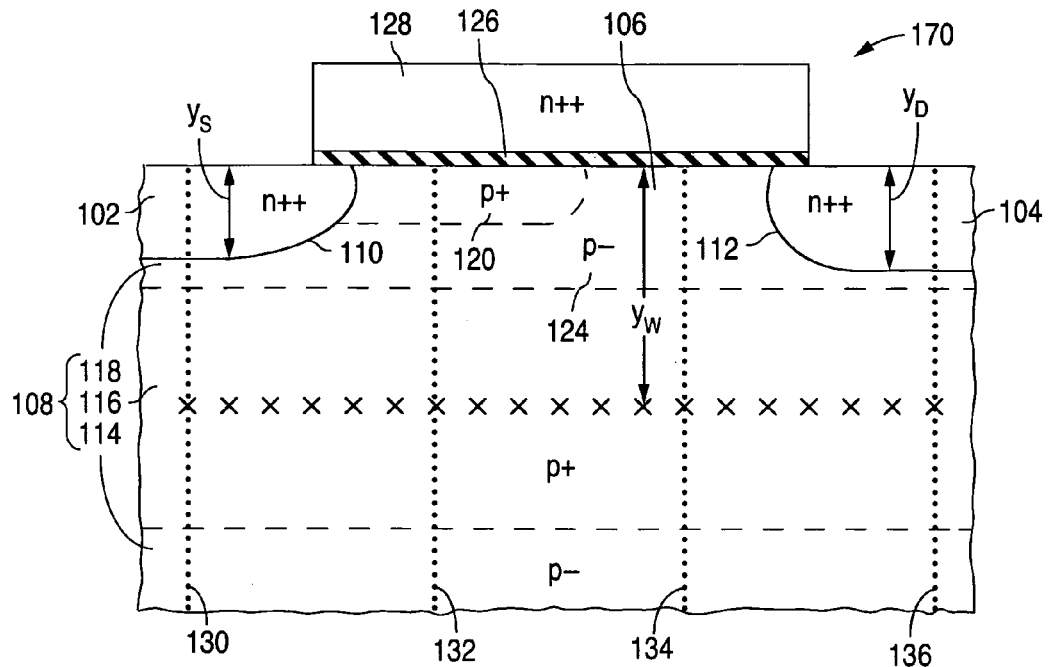
FIGS. 18a-18c are front cross-sectional views of three respective long n-channel IGFETs configured according to the invention so as to each have a semiconductor well portion of the same conductivity type as directly underlying semiconductor material.
Figure 18B:
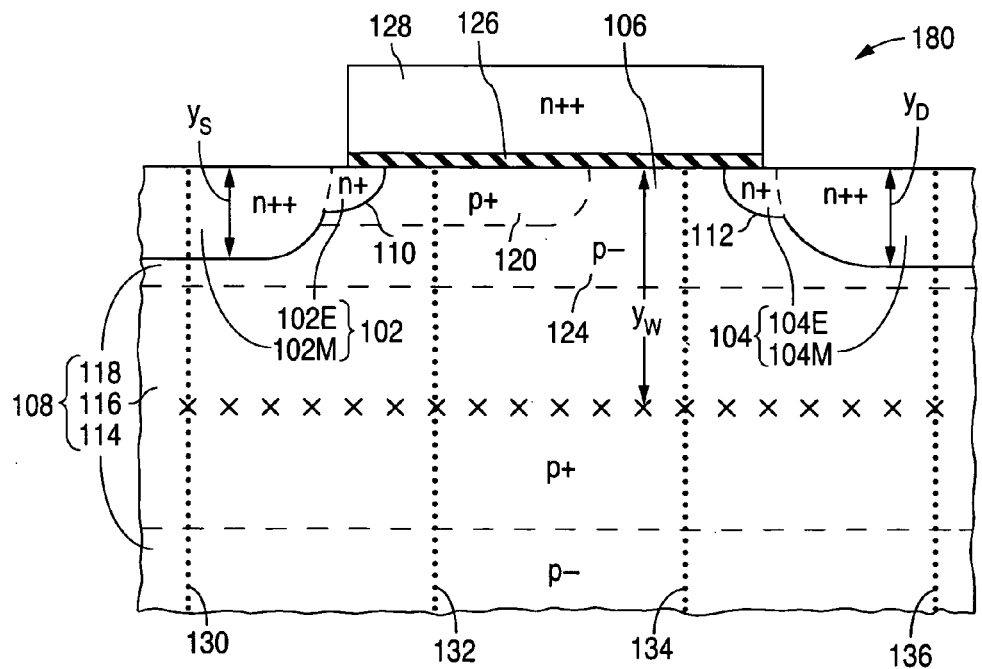
Figure 18C:
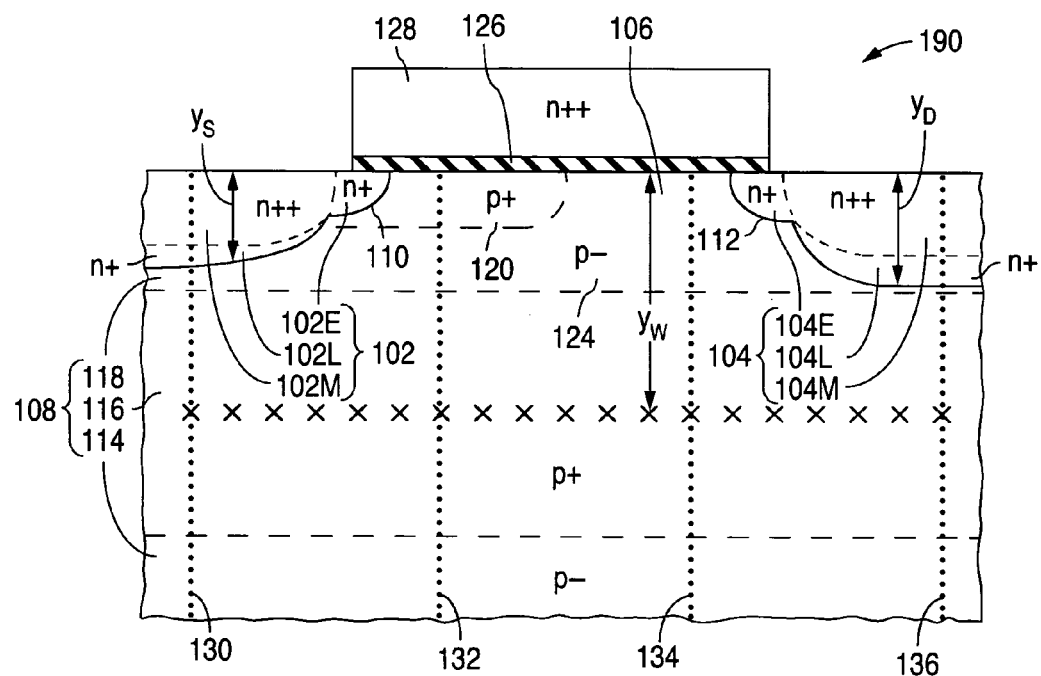

FIGS. 18a-18c illustrate versions 170, 180, and 190 of respective asymmetric long n-channel IGFETs 100, 150, and 160 in which pocket portion 120 extends to a lesser depth below the upper semiconductor surface than source 102 and drain 104. For long re-channel IGFET 180 or 190 whose source 102 and drain 104 respectively include source extension 102E and drain extension 104E, pocket portion 120 extends to a greater depth below the upper semiconductor surface than extensions 102E and 104E.

The p type section of the boundary of pocket portion 120 in each IGFET 170, 180, or 190 is, as explained above in connection with IGFET 100, defined as the location where the concentration of the p-type pocket dopant equals the concentration of the p-type background dopant. The total p-type dopant concentration along the p-type section of the boundary of pocket portion 120 is then twice the background dopant concentration in IGFET 170, 180, or 190. Hence, some of the p-type pocket dopant is present in source 102 of IGFET 170, 180, or 190 at a depth below that illustrated for pocket portion 120 in FIGS. 18a-18c. This additional p-type pocket dopant in source 102 cancels (compensates for) some of the n-type dopant that defines source 102 along its lower surface. Accordingly, drain depth $y_D$ in IGFET 170, 180, or 190 exceeds source depth $y_S$, albeit by a lesser amount than in IGFET 100.

Channel zone 106 of each of IGFETs 170, 180, and 190 is asymmetrically longitudinally dopant graded substantially as described above respectively for IGFETs 100, 150, and 160. In this regard, dopant concentrations $N_I$, $N_T$, and $N_N$ along the upper semiconductor surface for IGFET 170 are also substantially respectively represented in FIG. 7. FIG. 14 substantially presents dopant concentrations $N_I$, $N_T$, and $N_N$ along the upper surface for IGFETs 180 and 190. Punchthrough is thus avoided in IGFETs 170, 180, and 190 in the manner described above for IGFET 100.

Each of IGFETs 170, 180, and 190 has a hypoabrupt vertical dopant profile below drain 104 substantially as described above for IGFETs 100, 150, and 160. FIG. 10 respectively also substantially presents concentrations $N_I$, $N_T$, and $N_N$ along vertical line 136 through drain 104 for each of IGFETs 170 and 180. Concentrations $N_I$, $N_T$, and $N_N$ along vertical line 136 through drain 104 for IGFET 190 are substantially represented in FIG. 17. The parasitic capacitance along drain-body junction 112 in each IGFET 170, 180, or 190 is thereby reduced, as described above for IGFET 100, to enable each IGFET 170, 180, or 190 to have increased analog speed.

Figure 19A:
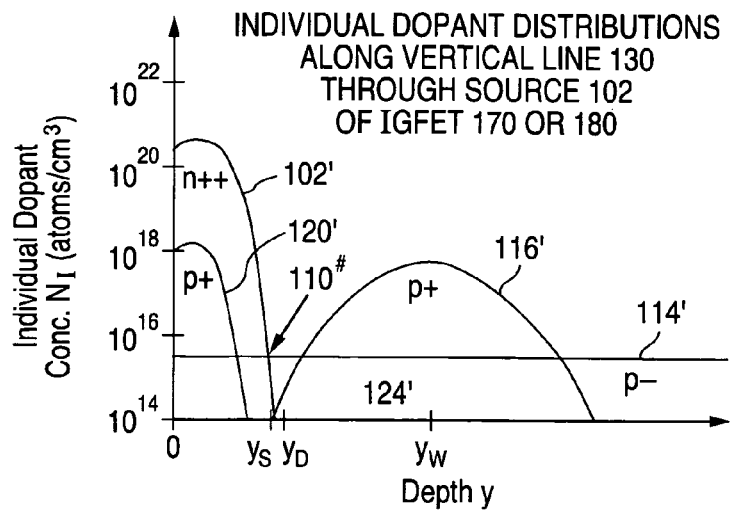
FIGS. 19a-19c are respective graphs of individual, absolute, and net dopant concentrations as a function of depth along a vertical line extending through the source of the IGFET of FIG. 18a or 18b.
Figure 19B:
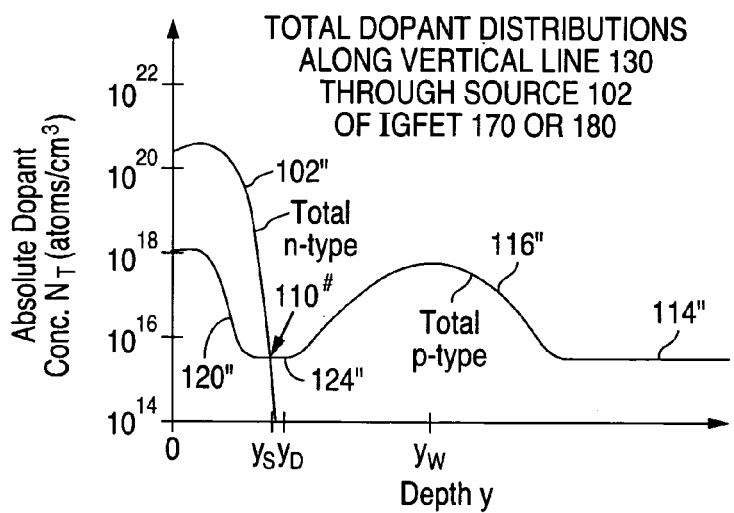
Figure 19C:
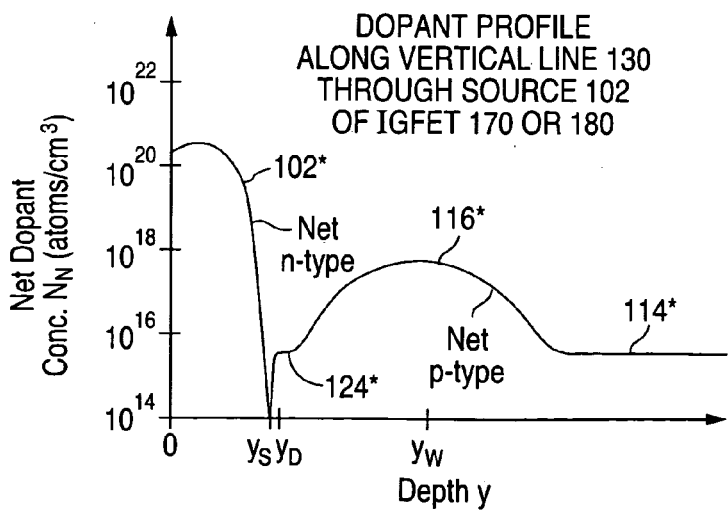
Figure 20A:
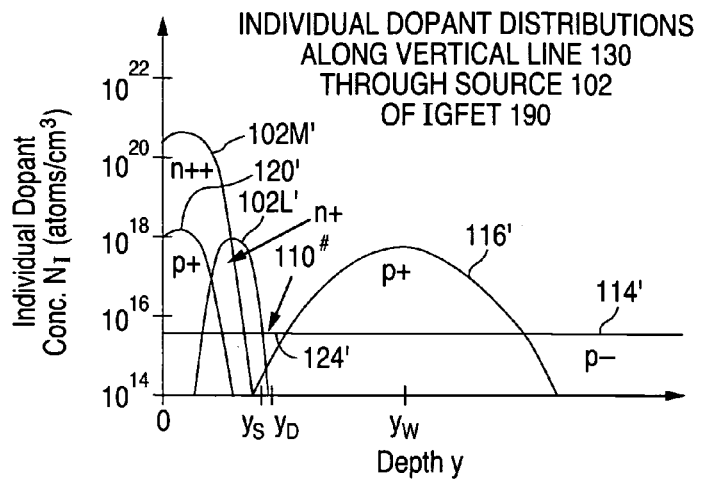
FIGS. 20a-20c are respective graphs of individual, absolute, and net dopant concentrations as a function of depth along a vertical line extending through the source of the IGFET of FIG. 18c.
Figure 20B:
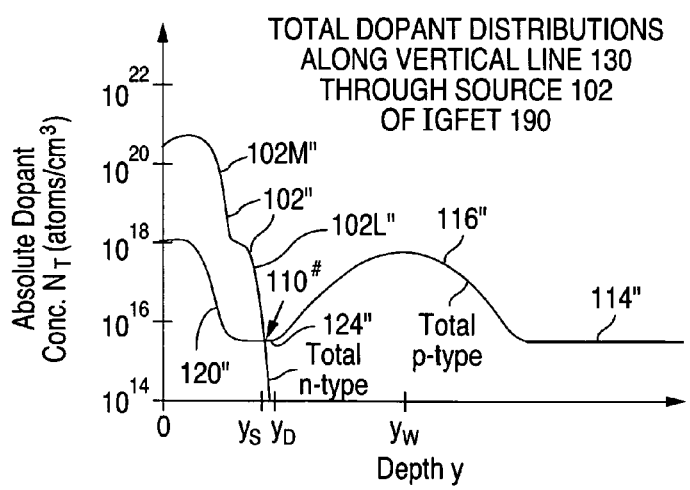
Figure 20C:
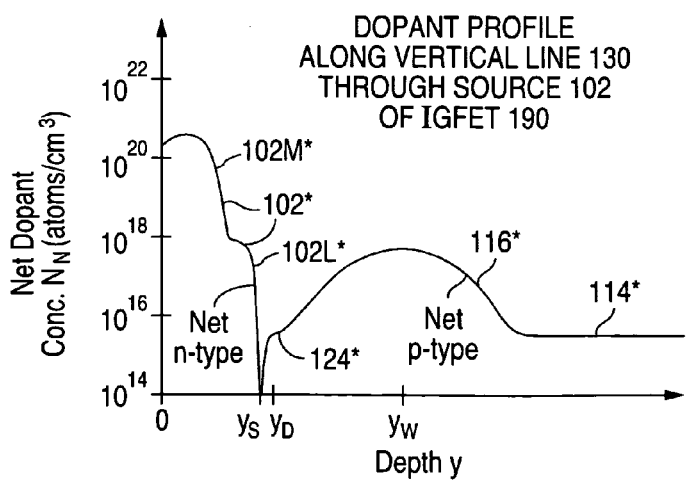

FIGS. 19*a*-19*c* (collectively "FIG. 19") and FIGS. 20*a*-20*c* (collectively "FIG. 20") present exemplary dopant concentrations as a function of depth y along vertical line 130 through source 102 for IGFETs 170, 180, and 190. FIG. 19 applies to IGFETs 170 and 180. FIG. 20 applies to IGFET 190. FIGS. 19*a* and 20*a* specifically illustrate concentrations $N_I$ of the individual semiconductor dopants that vertically define regions 102, 114, 116, and 120 along line 130. Concentrations $N_T$ of the total p-type and total n-type dopants in regions 102, 114, 116, and 120 along line 130 are depicted in FIGS. 19*b* and 20*b*. FIGS. 19*c* and 20*c* respectively illustrate net dopant concentration $N_N$ along line 130.

As indicated by the variation of curve segments 116″ and 124″ in FIGS. 19*b* and 20*b*, concentration $N_T$ of the total p-type dopant in the portion of body material 108 below source 102 decreases hypoabruptly by at least a factor of 10 in moving upward along vertical line 130 to source 102 from the subsurface location of the maximum concentration of the p-type dopant in well portion 116. Configuring pocket portion 120 to be shallower than source 102 and drain 104 thus results in a hypoabrupt vertical profile for the total p-type dopant in the portion of body material 108 below source 102. This arises because much less of the p-type dopant is situated below source 102 in IGFETs 170, 180, and 190 than in IGFETs 100, 150, and 160. Curve segment 120″ which represents concentration $N_T$ of the total p-type pocket dopant along line 130 through source 102 in FIGS. 8*b*, 16*b*, 19*b*, and 20*b* is largely located above source depth $y_S$ in FIGS. 19*b* and 20*b* but extends considerably below depth $y_S$ in FIGS. 8*b* and 16*b*.

The hypoabrupt vertical dopant profile in the portion of body material 108 below source 102 of IGFETs 170, 180, or 190 is quite similar to the hypoabrupt vertical dopant profile in the portion of body material 108 below drain 104 of IGFET 170, 180, or 190 and thus below drain 104 of IGFET 100, 150, or 160. Compare combined curve segment 116″/120″ along vertical line 130 through source 102 in FIGS. 19*b* and 20*b* with combined curve segment 116″/120″ along vertical line 136 through drain 104 in FIGS. 10*b* and 17*b*. Similar to what occurs in the portion of body material 108 below drain 104, concentration $N_T$ of the total p-type dopant in the portion of body material 108 below source 102 in each IGFET 170, 180, or 190 preferably decreases by at least a factor of 20, more preferably by at least a factor of 40, even more preferably by at least a factor of 80, typically by a factor in the vicinity of 100, in moving from the subsurface location of the maximum p-type well concentration up to the very heavily doped material of source 102. In IGFET 170, 180, or 190, the hypoabrupt vertical dopant profile in the portion of body material 108 below the very heavily doped material of source 102 causes the parasitic capacitance associated with source-body junction 110 to decrease. The analog speed of IGFET 170, 180, or 190 is further increased.

Dopant concentrations $N_I$, $N_T$, and $N_N$ along vertical line 134 through channel zone 106 of IGFET 170, 180, or 190 appear substantially as shown in FIG. 9. Dopant concentrations $N_I$, $N_T$, and $N_N$ along vertical line 132 through channel zone 106, including pocket portion 120, of IGFET 170, 180, or 190 are similar to what is illustrated in FIG. 9 except that curve 120″ for concentration $N_I$ of the p-type pocket dopant along line 132 for IGFET 170, 180, or 190 is similar to curve 120′ along line 130 in FIG. 19*a* or 20*a*.

For the purpose of simplicity in describing IGFETs 100, 140, 150, 160, 170, 180, and 190, it was assumed above that the concentration of the p-type background dopant is substantially constant throughout the semiconductor material containing any of IGFETs 100, 140, 150, 160, 170, 180, and 190. However, the concentration of the p-type background dopant can vary as long as the peak value of the p-type background dopant is relatively low compared to the concentration of the other p-type dopant.

Well portion 116 of body material 108 in each of IGFETs 100, 140, 150, 160, 170, 180, and 190 is of the same conductivity type as the directly underlying lightly doped semiconductor material (lower body-material portion 114). As indicated below in connection with the fabrication process of FIGS. 31*a*-31*o* and 31*p*.1-31*r*.2, this situation normally arises when p+ well portion 116 and p+ pocket portion 120 are created in a starting region of lightly doped p-type semiconductor material. The dopant concentration in the bulk of upper body-material remainder 124 thereby largely equals the low background dopant concentration of the p− starting region.

Alternatively, the semiconductor material directly underlying well portion 116 can be of opposite conductivity type to well 116. Since well portion 116 is p type, the semiconductor material directly underlying well 116 is then n type. This alternative typically arises when p+ well 116 and p+ pocket 120 are created in a starting region of n-type semiconductor material, normally lightly doped at a relatively uniform net background concentration. In one embodiment, the portion of the starting n-type region intended to become upper body-material portion 118, i.e., the portion of the starting n-type region situated above well portion 116 (or above the intended location for well 116), is doped with p-type compensating dopant to an absolute concentration greater than the n-type background dopant concentration of the starting n-type semiconductor region so as to cause all of upper body-material portion 118 to be p type. In another embodiment, the portion of the starting n-type region intended to become upper body-material portion 118 is converted to p-type conductivity by updiffusion of part of the p-type well dopant in well portion 116.

The minimum value of net concentration $N_N$ of the p-type compensating or well dopant in upper body-material portion 118 can be in the vicinity of n-type background dopant concentration. However, in order to ensure that all of body-material portion 118 is p type, the minimum value of concentration $N_N$ of the p-type compensating or well dopant in portion 118 is normally a significant amount greater than, e.g., at least twice as great as, the n-type background dopant concentration. The minimum value of concentration $N_N$ of the p-type compensating or well dopant in the bulk of body-material portion 118 outside pocket portion 120 is thus normally significantly greater than the n-type background dopant concentration.

Figure 21:
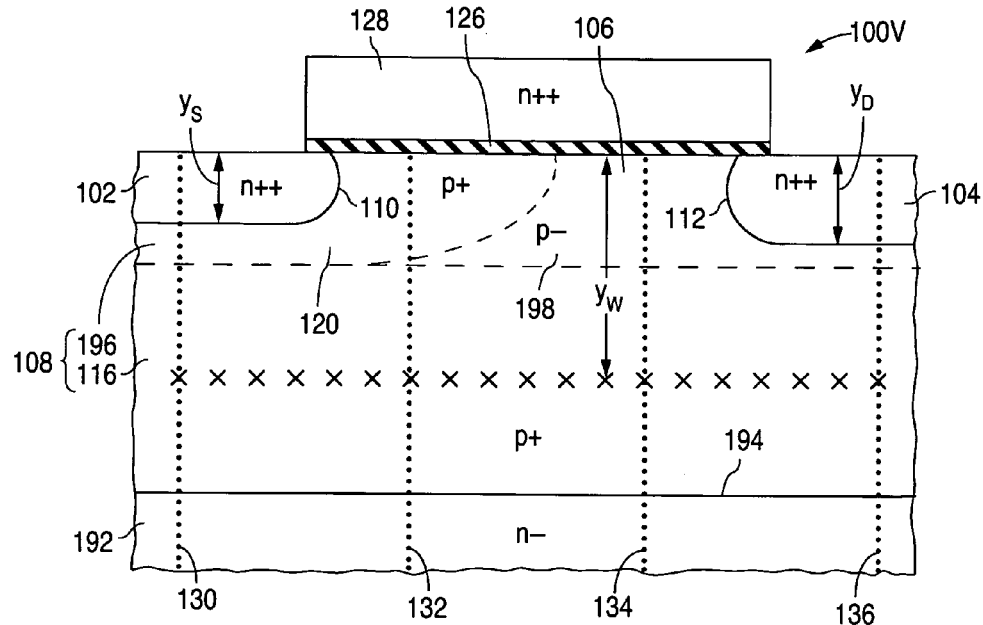
FIG. 21 is a front cross-sectional view of an asymmetric long n-channel IGFET configured according to the invention so as to have a semiconductor well portion of opposite conductivity type to directly underlying semiconductor material.

FIG. 21 illustrates, in accordance with the invention and analogous to FIG. 6, a variation 100V of asymmetric long n-channel IGFET 100 in which p– lower body-material portion 114 is replaced with a lightly doped n-type lower region 192 that forms a lower pn junction 194 with p+ well portion 116. Since lower region 192 is not of p-type conductivity, p-type body material 108 in IGFET 100V consists of well portion 116 and an upper portion 196 that replaces upper body-material portion 118 of IGFET 100. Part of upper body-material portion 196 of IGFET 100V is formed by p+ pocket portion 120. The remainder of upper body-material portion 196, i.e., the part outside pocket portion 120, is indicated as item 198 in FIG. 21. Upper body-material remainder 198 is lightly doped p type at a somewhat higher net concentration than n– lower portion 192. The light p-type doping of body-material remainder 198 is achieved with the above-mentioned p-type compensating dopant. Aside from the preceding differences and the resultant dopant concentration differences, IGFET 100V is configured and constituted substantially the same as IGFET 100.

Figure 22A:
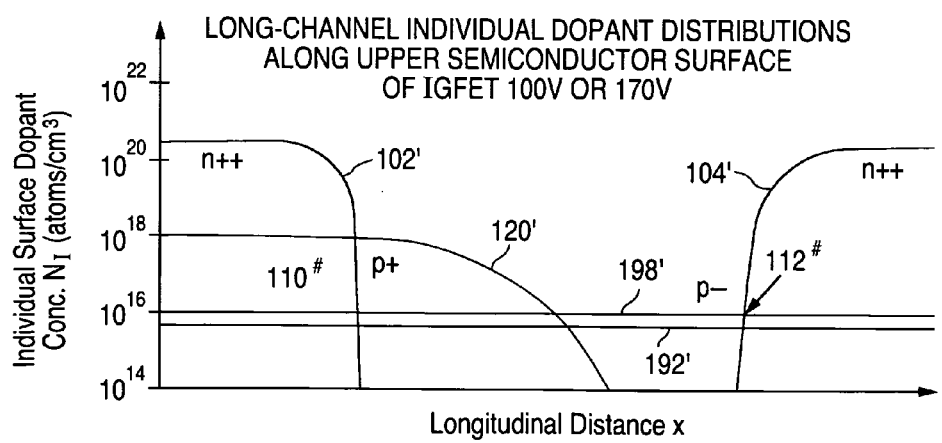
Figure 22B:
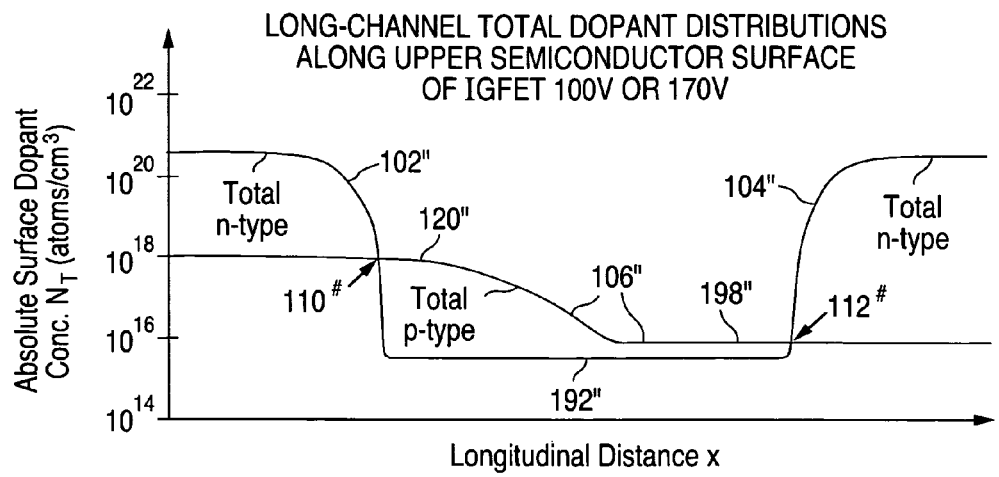
Figure 22C:
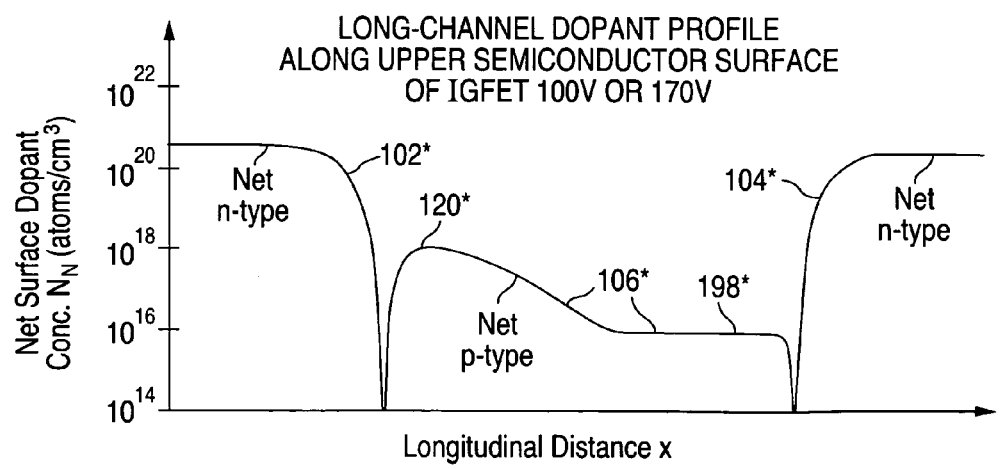

IGFET 100V has the following features similar to those of IGFET 100: (a) an asymmetric longitudinal dopant grading in channel 106 and (b) a hypoabrupt vertical dopant profile in the portion of body material 108 underlying drain 104. An understanding of these features of IGFET 100V, including how they can respectively differ somewhat from those of IGFET 100, is facilitated with the assistance of FIGS. 22a-22c (collectively "FIG. 22"), FIGS. 23a-23c (collectively "FIG. 23"), and FIGS. 24a-24c (collectively "FIG. 24"). FIG. 22 presents exemplary dopant concentrations along the upper semiconductor surface of IGFET 100V as a function of longitudinal distance x. Exemplary dopant concentrations along vertical line 130 through source 102 of IGFET 100V are presented in FIG. 23. FIG. 24 presents exemplary dopant concentrations along vertical line 136 through drain 104 of IGFET 100V.

Figure 23A:
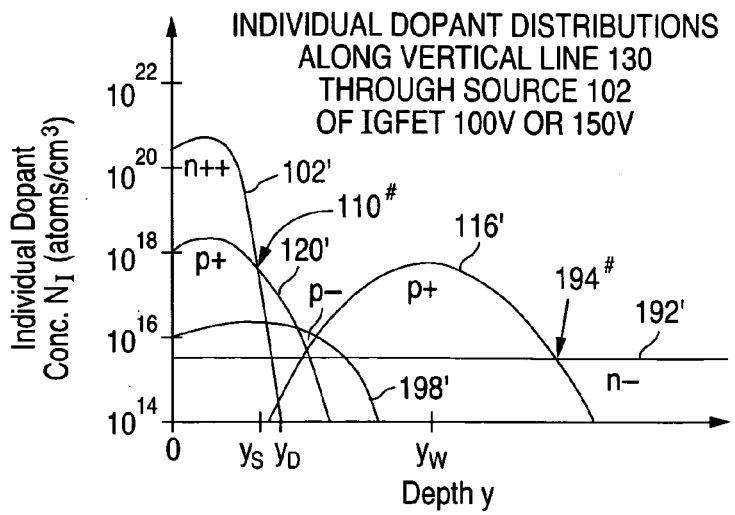
FIGS. 23a-23c are respective graphs of individual, absolute, and net dopant concentrations as a function of depth along a vertical line through the source of the IGFET of FIG. 21 or 25.
Figure 24A:
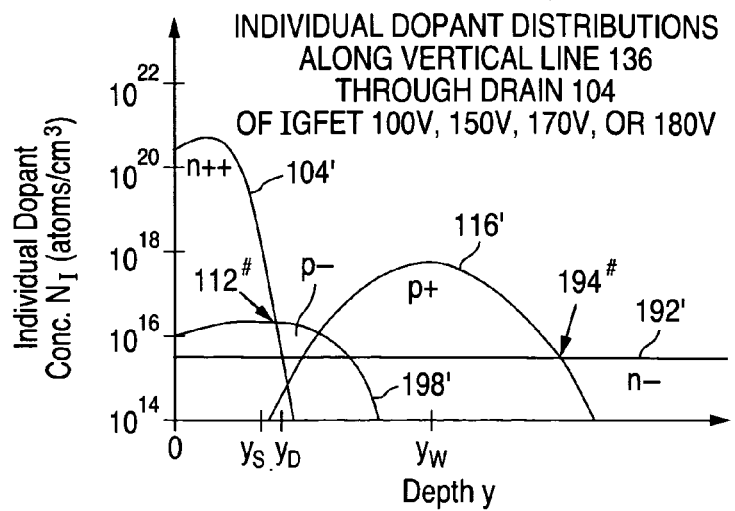
FIGS. 24a-24c are respective graphs of individual, absolute, and net dopant concentrations as a function of depth along a vertical line through the drain of the IGFET of FIG. 21, 25, 27a, or 27b.
Figure 24B:
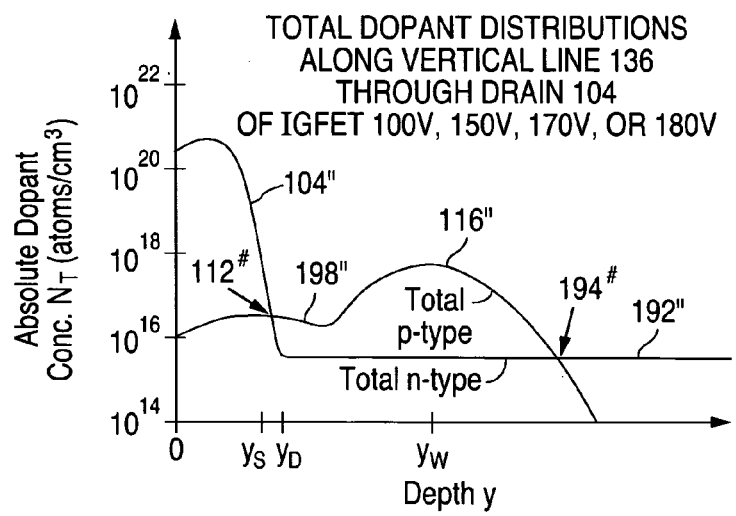
Figure 24C:
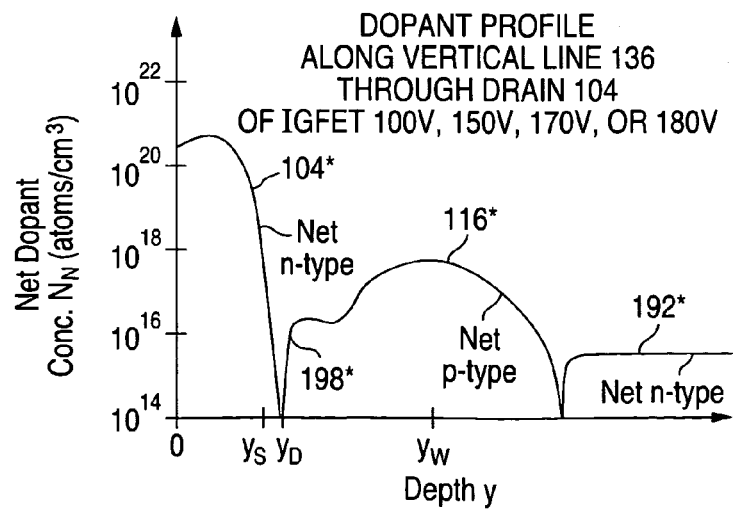

FIGS. 22a, 23a, and 24a illustrate concentrations $N_I$ of the individual semiconductor dopants that define regions 102, 104, 116, 120, 192, 196, and 198. Curves 192' and 198' specifically respectively represent concentrations $N_I$ of the n-type background dopant and the p-type compensating dopant that respectively define n– lower region 192 and p– upper body-material remainder 198. Item 194# indicates where net dopant concentration $N_N$ goes to zero below well portion 116 and thus indicates the location of lower pn junction 194.

Figure 23B:
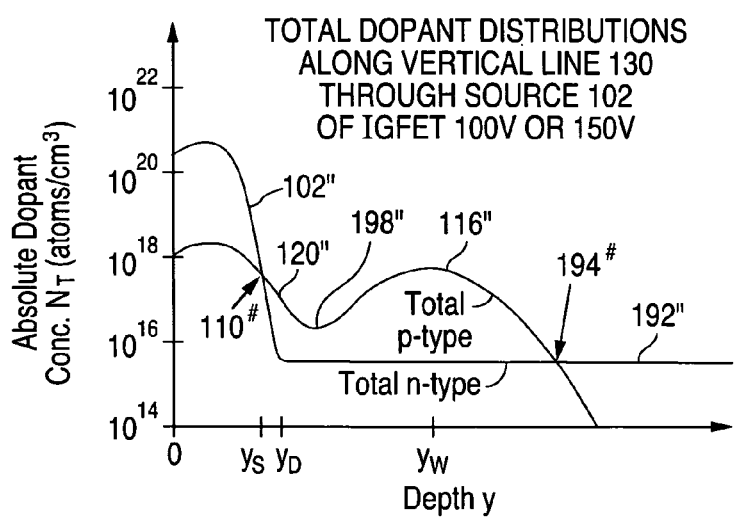
Figure 23C:
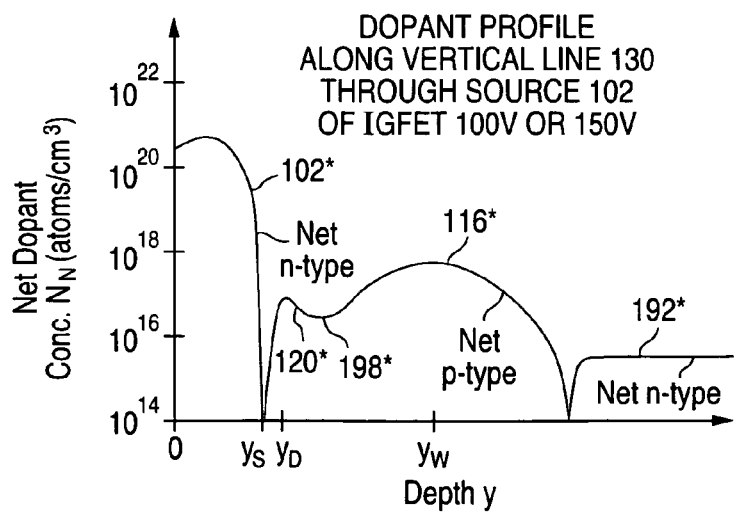

Concentrations $N_T$ of the total p-type and total n-type dopants in regions 102, 104, 116, 120, 192, 196, and 198 are depicted in FIGS. 22b, 23b, and 24b. Curve segments 192" and 198" in FIGS. 22b, 23b, and 24b respectively correspond to n– lower region 192 and p– upper body-material remainder 198. FIGS. 22c, 23c, and 24c illustrate concentrations $N_N$ of the net p-type dopant and net n-type dopant variously in regions 102, 104, 116, 120, 192, 196, and 198. Curve segments 192\* and 198\* in FIGS. 22c, 23c, and 24c respectively correspond to n– lower region 192 and p– upper body-material remainder 198.

FIGS. 22-24 represent an example in which (a) concentration $N_I$ of the n-type background dopant in IGFET 100V approximately equals concentration $N_I$ of the p-type background dopant in IGFET 100, (b) concentration $N_I$ of the p-type compensating dopant along the upper semiconductor surface of IGFET 100V is 2-3 times concentration $N_I$ of the n-type background dopant in IGFET 100V, and (c) the maximum value of concentration $N_I$ of the p-type compensating dopant is 2-3 times concentration $N_I$ of the p-type compensating dopant along the upper semiconductor surface and thus is 4-9 times concentration $N_I$ of the n-type background dopant. Aside from these differences, concentrations $N_I$ of the other dopants in IGFET 100V are respectively largely the same as in IGFET 100.

More particularly, concentration $N_I$ of the p-type pocket dopant in IGFET 100V varies longitudinally in substantially the same way as in IGFET 100. The variation of curve segment 120' in FIG. 22a shows that, in moving longitudinally from source 102 along the upper semiconductor surface of IGFET 100V into channel zone 106, concentration $N_I$ of the p-type pocket dopant is at an approximately constant upper-surface level partway into zone 106 and then drops from that level essentially to zero at a location between source 102 and drain 104.

The total p-type dopant in channel zone 106 along the upper semiconductor surface of IGFET 100V is the sum of the pocket and compensating dopants. This differs from IGFET 100 where the total p-type dopant in channel zone 106 along the upper semiconductor surface is the sum of the pocket and background dopants. Since concentration $N_I$ of the p-type compensating dopant in the illustrated example is 2-3 times concentration $N_I$ of the n-type background dopant and thus is 2-3 times concentration $N_I$ of the p-type background dopant in IGFET 100, the minimum value of concentration $N_T$ of the total p-type dopant along the upper surface of IGFET 100V in the illustrated example is 2-3 times the minimum value of concentration $N_T$ of the total p-type dopant along the upper surface of IGFET 100.

Item 106" in FIG. 22b represents the channel-zone portions of curve segments 120" and 198". Similar to what occurs in IGFET 100, the variation in curve 106" here shows that concentration $N_T$ of the total p-type dopant in channel zone 106 along the upper semiconductor surface of IGFET 100V is lower where zone 106 meets drain 104 than where zone 106 meets source 102. Concentration $N_T$ of the total p-type dopant in channel zone 106 of IGFET 100V is normally at least a factor of 10 lower, preferably at least a factor of 20 lower, more preferably at least a factor of 50 lower, typically a factor in the vicinity of 100 lower, at drain-body junction 112 along the upper surface than at source-body junction 110 along the upper surface. The reason why the typical value for this concentration difference is a factor in the vicinity of 100 in IGFET 100V, rather than a factor of more than 100 as can arise in IGFET 100, is that the minimum value of concentration $N_T$ of the total p-type dopant along the upper surface is 2-3 times higher in the illustrated example of IGFET 100V than in IGFET 100.

Referring to FIG. 22c, item 106\* represents the combination of channel-zone curve segments 120\* and 198\* here. Subject to segment 198\* of curve 106\* for IGFET 100V being slightly higher than segment 124\* of curve 106\* for IGFET 100 in FIG. 7a, curves 106\* in FIGS. 7a and 22a are quite similar. Accordingly, the source side of channel zone 106 in IGFET 100V has a high net amount of p-type dopant compared to the drain side. The thickness of the channel-side portion of the depletion region along source-body junction 110 is thereby reduced in IGFET 100V. In addition, the high p-type dopant concentration along the source side of channel zone 106 in IGFET 100V shields source 102 from the comparatively high electric field in drain 104 for the (field-line termination) reasons described above in connection with IGFET 100. Punchthrough is avoided in IGFET 100V.

The p-type dopant in the portions of body material 108 below source 102 and drain 104 of IGFET 100V consists of the well and compensating dopants as indicated respectively by curves 116' and 198' in FIGS. 23a and 24a and, for source, 102, also the pocket dopant as indicated by curve 120' in FIG. 23a. The variation of curve 198' in FIGS. 23a and 24a shows that concentration $N_I$ of the p-type compensating dopant reaches a maximum value close to the bottoms of source 102 and drain 104. This maximum value is 4-9 times concentration $N_I$ of the n-type background dopant in the particular example of FIGS. 23a and 24a. Concentration $N_I$ of the p-type compensating dopant in the example of FIGS. 23a and 24a drops essentially to zero at a depth less than depth $y_W$ of the maximum p-type dopant concentration in well portion 116.

The total p-type dopant in the portion of body material 108 below drain 104 of IGFET 100V is indicated by curve segment 116" and its (upward) extension 198" in FIG. 24b. Because concentration $N_I$ of the p-type compensating dopant drops essentially to zero at a depth less than depth $y_W$, concentration $N_T$ of the total p-type dopant in the body-material portion below drain 104 reaches a maximum value at a subsurface location substantially equal to $y_W$. As occurs in IGFET 100, the variation in combined curve segment 116"/198" in FIG. 24b shows that concentration $N_T$ of the total p-type dopant in the portion of body material 108 below drain 104 of IGFET 100V decreases hypoabruptly by at least a factor of 10 in moving upward to drain 104 from the subsurface location of the maximum concentration of the total p-type dopant in well portion 116.

Concentration $N_T$ of the total p-type dopant in the portion of body material 108 below drain 104 of IGFET 100V in the particular example of FIG. 24b typically decreases by a factor in the vicinity of 15 in moving from the location of the maximum p-type well concentration up to drain 104. The reason why the typical value for this hypoabrupt concentration decrease is in the vicinity of a factor of 15 in IGFET 100V rather than in the vicinity of a factor 100 as arises in IGFET 100 is that concentration $N_I$ of the p-type compensating dopant at the bottom of drain 104 in IGFET 100V in the example of FIG. 24a is 4-9 times concentration $N_I$ of the p-type background dopant at the bottom of drain 104 in IGFET 100. However, the vertical dopant profile for the p-type compensating dopant can be lowered to reduce the value of concentration $N_I$ of the p-type compensating dopant at the bottom of drain 104 while still ensuring that all of upper body-material portion 196 is p type. Concentration $N_T$ of the total p-type dopant in the body material portion below drain 104 in IGFET 100V can readily decrease by at least a factor of 20, and typically by at least a factor of 40, in moving upward to drain 104 from the location of the maximum concentration of the total p-type dopant in well portion 116.

As represented by the combination of curve segments 116* and 198*, FIG. 24c shows that concentration $N_N$ of the net p-type dopant in the portion of body material 108 below drain 104 in IGFET 100V varies vertically in a similar manner to concentration $N_T$ of the total p-type dopant in the body-material portion below drain 104 except that concentration $N_N$ in the body-material portion below drain 104 drops to zero at pn junctions 112 and 194. Due to the hypoabrupt vertical dopant profile in the body-material portion below drain 104 of IGFET 100V, the parasitic capacitance associated with drain-body junction 112 is again decreased for the reasons discussed further below. Although the decrease in the parasitic capacitance along junction 104 may be less in IGFET 100V than in IGFET 100, IGFET 100V still has increased analog speed.

The presence of the p-type compensating dopant at a concentration greater than that of the p-type background dopant in IGFET 100 has considerably lesser effect on the vertical dopant profile through source 102 of IGFET 100V than along the vertical dopant profile through drain 104 of IGFET 100V because the p-type pocket dopant is also present below source 102 in IGFET 100V. As is evident from comparing FIG. 23 to FIG. 24, the comments made above about the vertical dopant profile through source 102 of IGFET 100 apply generally to the vertical dopant profile through source 102 of IGFET 100V.

Figure 25:
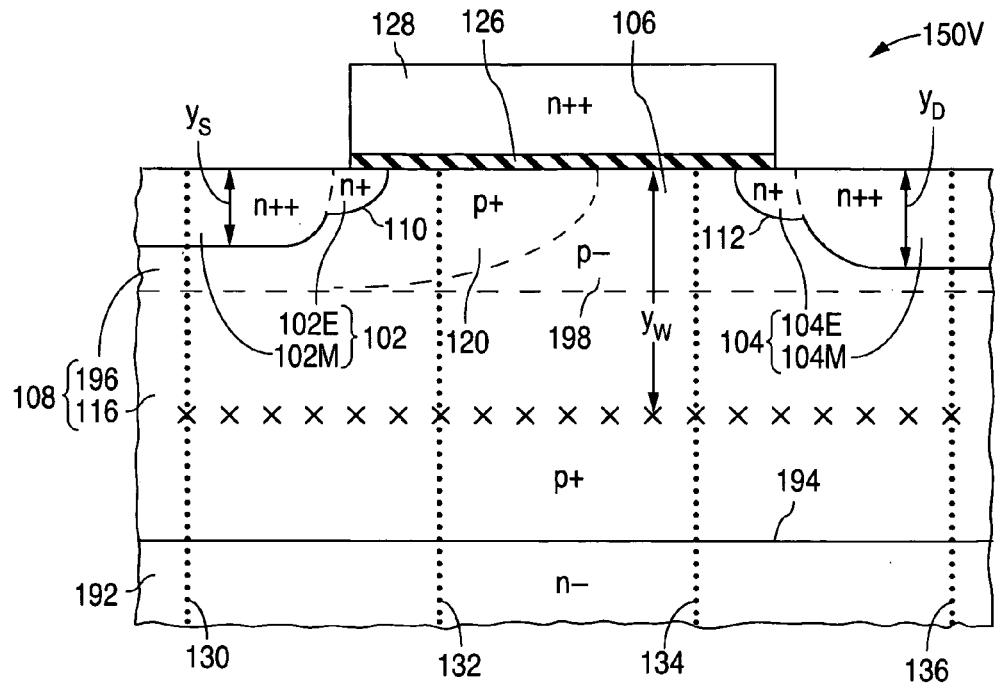
FIG. 25 is a front cross-sectional view of another asymmetric long n-channel IGFET configured according to the invention so as to have a semiconductor well portion of opposite conductivity type to directly underlying semiconductor material.

FIG. 25 illustrates, in accordance with the invention and analogous to FIG. 13, a variation 150V of asymmetric long n-channel IGFET 150 in which n− lower portion 192 again replaces p-lower body-material portion 114. IGFET 150V likewise contains p-type upper body-material portion 196 that replaces upper body-material portion 118 of IGFET 150. P− remainder 198 of upper body-material portion 196 is again at a slightly higher net dopant concentration than n− lower portion 192. As with IGFET 100V, the light p-type doping of upper body-material remainder 198 in IGFET 150V is achieved with the p-type compensating dopant. Subject to the presence of n− lower portion 192 and p− upper body-material remainder 198, IGFET 150V is configured substantially the same as IGFET 150 so as to have longitudinal source/drain dopant grading for reducing source resistance $R_S$ and drain-side hot-carrier injection.

Figure 26A:
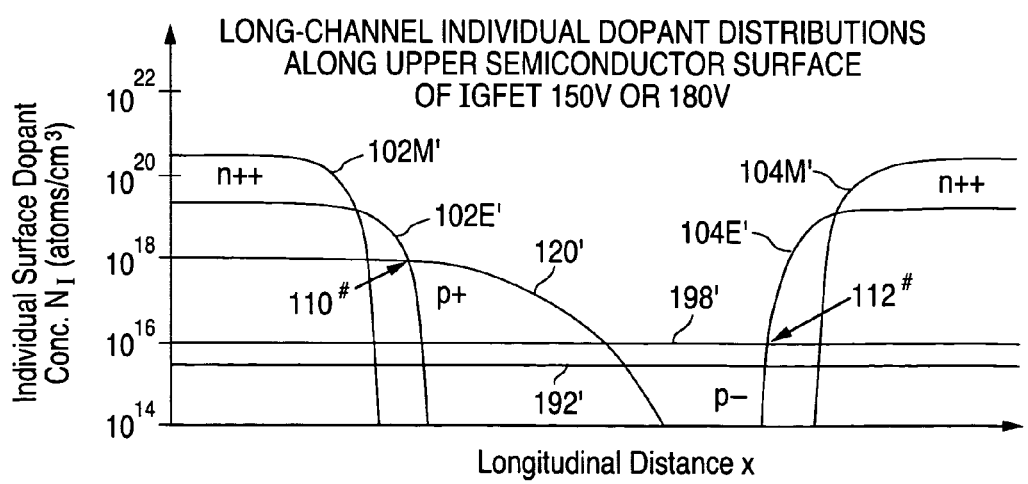
FIGS. 26a-26c are respective graphs of individual, absolute, and net dopant concentrations as a function of longitudinal distance along the upper semiconductor surface for the IGFET of FIG. 25 or 27b.
Figure 26B:
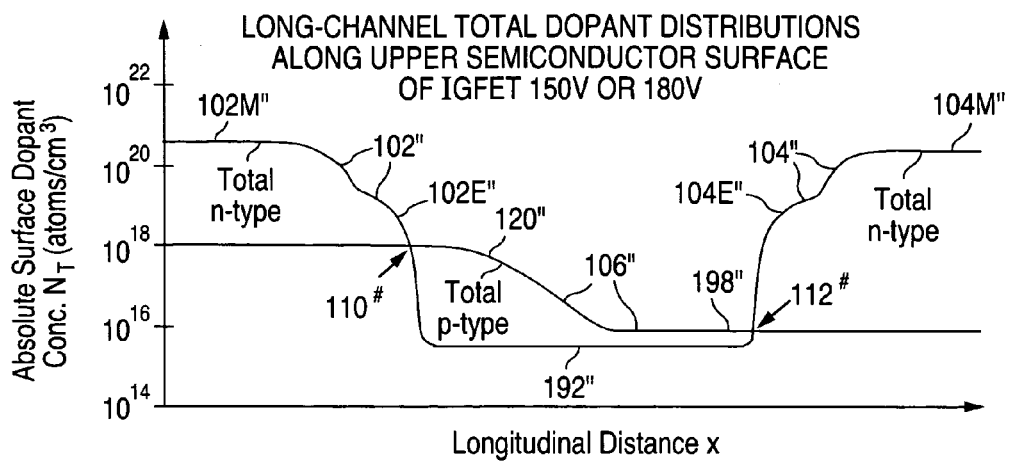
Figure 26C:
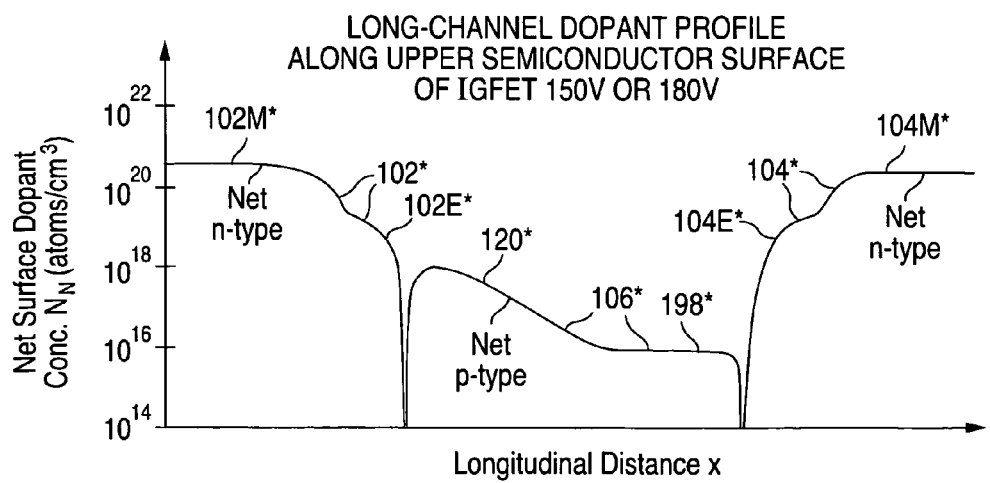

FIGS. 26a-26c (collectively "FIG. 26") present exemplary dopant concentrations along the upper semiconductor surface of IGFET 150V for use in examining the longitudinal dopant grading in source 102 and drain 104. Concentrations $N_I$, along the upper surface, of the individual semiconductor dopants that largely define regions 102M, 102E, 104M, 104E, 120, 192, and 198 are depicted in FIG. 26a. FIG. 26b illustrates concentrations $N_T$ of the total p-type and n-type dopants of regions 102M, 102E, 104M, 104E, 120, 192, and 198 along the upper surface. Net concentration $N_N$ along the upper surface is illustrated in FIG. 26c.

FIG. 26 repeats FIG. 14 subject to the respective modifications presented in FIG. 22 to account for n− lower portion 192 and p− upper body-material remainder 198. The longitudinal dopant grading in source 102 and drain 104 of IGFET 150V does not have any significant effect on the asymmetric longitudinal dopant grading in channel zone 106. The asymmetric channel-zone dopant grading in IGFET 150V avoids punchthrough in largely the same way as in IGFET 150 and thus in largely the same way as in IGFET 100.

The configuration of p+ well portion 116 and p− upper body-material remainder 198 in IGFET 150V causes the vertical dopant profile through drain 104 and into underlying body material 108 to be hypoabrupt substantially the same as in IGFET 150. The vertical dopant concentration graphs of FIGS. 23 and 24 along vertical lines 130 and 136 substantially apply to IGFET 150V. Drain-body junction 112 in IGFET 150V has reduced parasitic capacitance which, although typically not reduced as much as in IGFET 150, enables IGFET 150V to have increased analog switching speed.

Figure 27A:
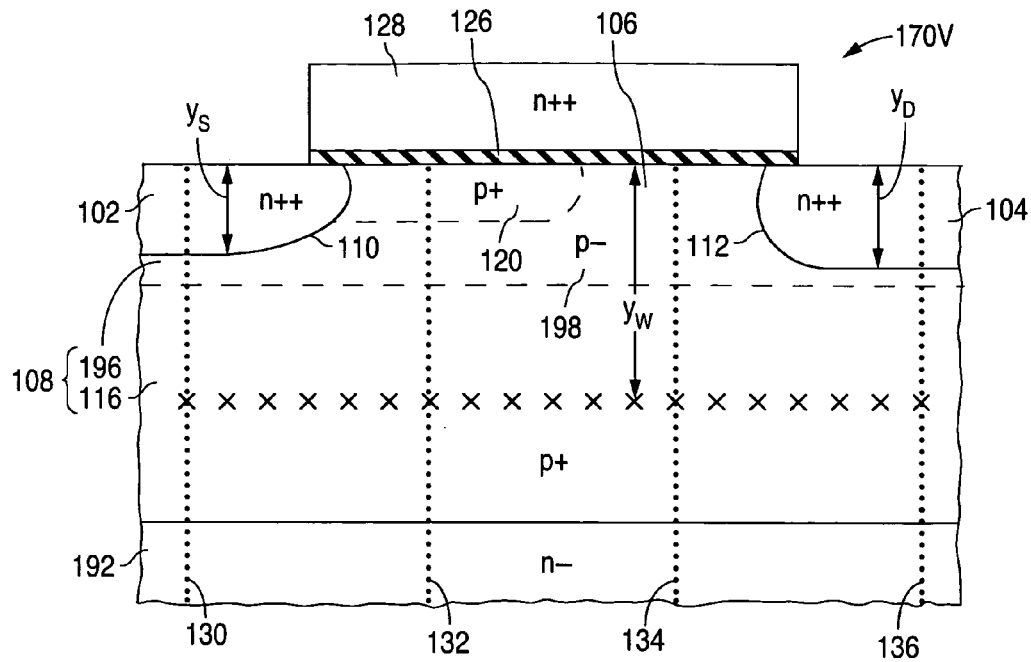
FIGS. 27a and 27b are front cross-sectional views of two respective long n-channel IGFETs configured according to the invention so as to each have a semiconductor well portion of opposite conductivity type to directly underlying semiconductor material.
Figure 27B:
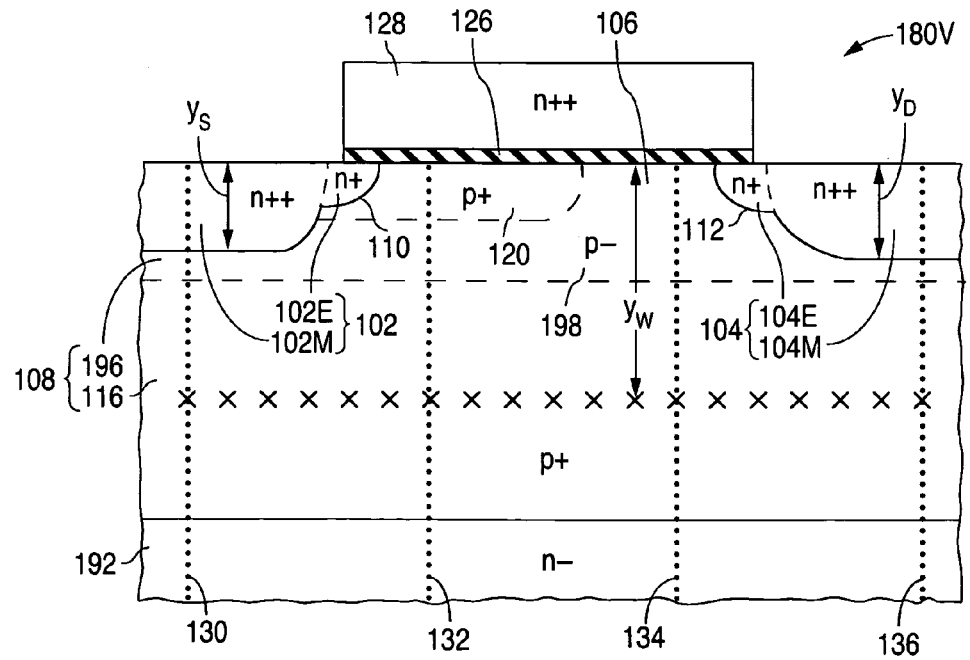

FIGS. 27a and 27b illustrate, in accordance with the invention and respectively analogous to FIGS. 18a and 18b, variations 170V and 180V of respective asymmetric long n-channel IGFETs 170 and 180 in which n− lower portion 192 replaces p− lower body-material portion 114. Each IGFET 170V or 180V likewise contains p-type upper body-material portion 196 that replaces upper body-material portion 118 of IGFET 170 or 180. P− remainder 198 of upper body-material portion 196 is once again at a slightly higher net dopant concentration than n− lower portion 192. As with IGFETs 100V and 150V, the light p-type doping of upper body-material remainder 198 in each IGFET 170V or 180V is achieved with the p-type compensating dopant. Subject to the presence of n− lower portion 192 and p− upper body-material remainder 198, pocket portion 120 of each IGFET 170V or 180V extends to a lesser depth below the upper semiconductor surface than source 102 or drain 104. IGFET 180V also has the longitudinal source/drain dopant grading of IGFET 150V for reducing source resistance $R_S$ and drain-side hot-carrier injection.

Channel zone 106 of each of IGFETs 170V and 180V is asymmetrically longitudinally dopant graded substantially as described above respectively for IGFETs 100V and 150V. FIG. 22 substantially presents concentrations $N_I$, $N_T$, and $N_N$ along the upper semiconductor surface for IGFET 170V. Punchthrough is thus avoided in IGFET 170V for the reasons described above in connection with IGFET 100V. Concentrations $N_I$, $N_T$, and $N_N$ along the upper semiconductor surface of IGFET 180V are substantially respectively represented in FIG. 26. IGFET 180V avoids punchthrough as described above for IGFET 170V and thus as described above for IGFET 100V.

Each of IGFETs 170V and 180V has a hypoabrupt vertical dopant profile through drain 104 as described above for IGFET 100V. FIG. 24 also presents concentrations $N_I$, $N_T$, and $N_N$ along vertical line 136 through drain 104 for each IGFET 170V or 180V. As a result, the parasitic capacitance along drain-body junction 112 in each IGFET 170V or 180V is reduced for the reasons described above in connection with IGFET 100V. IGFETs 170V and 180V thereby have increased analog speed.

Figure 28A:
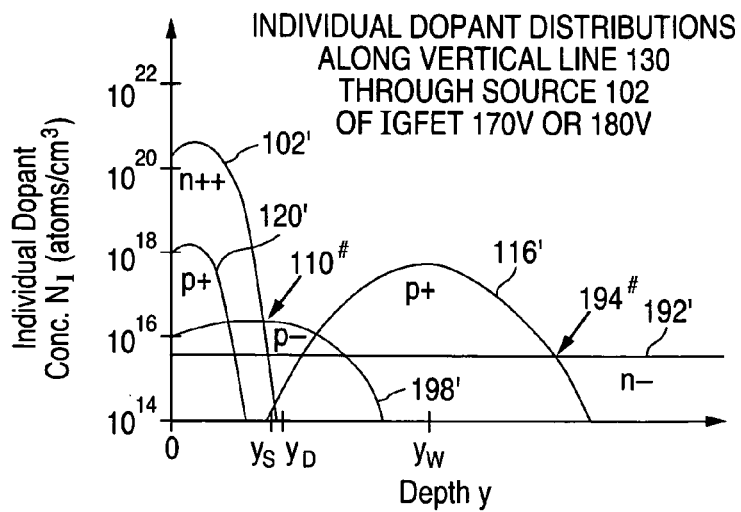
FIGS. 28a-28c are respective graphs of individual, absolute, and net dopant concentrations as a function of depth along a vertical line extending through the source of the IGFET of FIG. 27a or 27b.
Figure 28B:
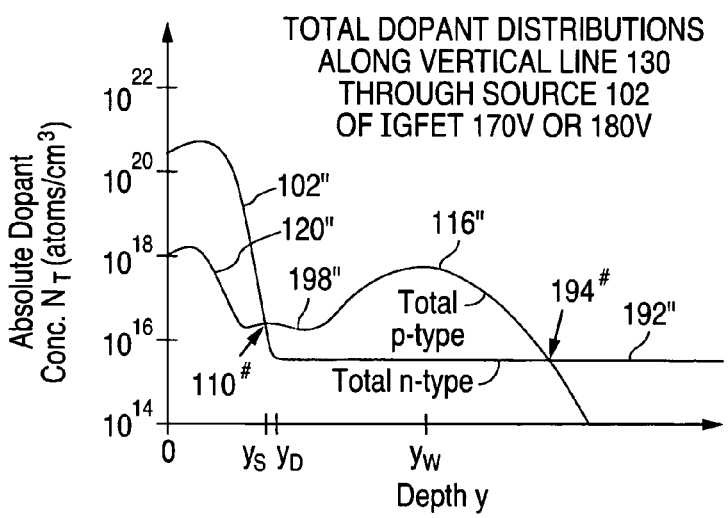
Figure 28C:
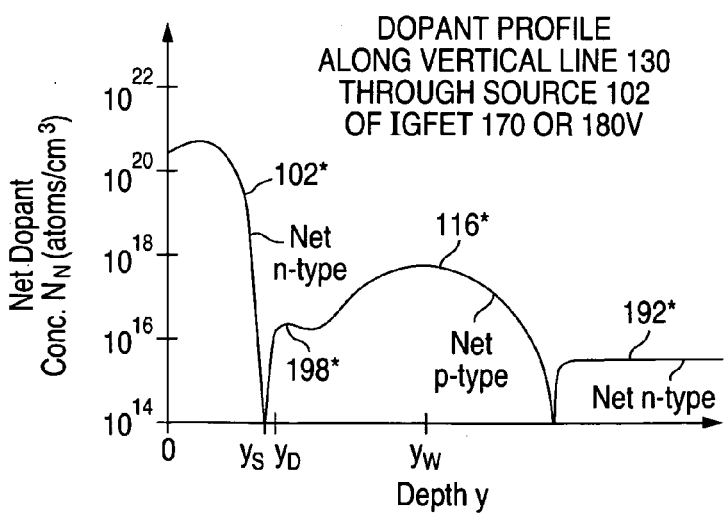

FIGS. 28a-28c (collectively "FIG. 28") respectively present concentrations $N_I$, $N_T$, and $N_N$ along vertical line 130 through source 102 for each IGFET 170V or 180V. As indicated by the variation of curve segments 116" and 198" in FIG. 28b, concentration $N_T$ of the total p-type dopant in the portion of body material 108 below source 102 decreases hypoabruptly by at least a factor of 10 in moving upward along line 130 to source 102 from the subsurface location of the maximum concentration of the p-type dopant in well portion 116. As occurs in IGFETs 170 and 180, configuring pocket portion 120 to be shallower than source 102 and drain 104 in IGFETs 170V and 180V results in a hypoabrupt vertical profile for the p-type dopant in the body-material portion below source 102.

The hypoabrupt vertical dopant profile in the portion of body material 108 below source 102 for each IGFET 170V or 180V is quite similar to the hypoabrupt vertical dopant profile in the portion of body material 108 below drain 104. In the particular example of FIG. 28, concentration $N_T$ of the total p-type dopant in the body-material portion below source 102 of IGFET 170V or 180V decreases by a typical factor in the vicinity of 15 in moving from the location of the maximum p-type well concentration up to source 102. Although this typical factor of 15 is considerably less than the corresponding typical factor of 100 which occurs in IGFET 170 or 180, the vertical dopant profile for the p-type compensating dopant can be lowered. Similar to what was said above about the vertical dopant profile through drain 104 of IGFET 100V, concentration $N_T$ of the total p-type dopant in the body-material portion below source 102 of IGFET 170V or 180V can readily decrease by at least a factor of 20, typically by at least a factor of 40, in moving upward to source 102 from the location of the maximum concentration of the total p-type dopant in well portion 116.

The hypoabrupt vertical dopant profile in the portion of body material 108 below source 102 of IGFET 170V or 180V causes the parasitic capacitance associated with source-body junction 110 to decrease, albeit by typically a smaller amount than in IGFET 170 or 180. Consequently, the analog speed of each IGFET 170V or 180V is further increased.

Variations of IGFETs 140, 160, and 190 can be provided with n− lower region 192 and p-upper body-material remainder 198 (or p-type upper body-material portion 196) in the same way that regions 192 and 198 (or 196) are provided in IGFETs 100V, 150V, 170V, and 180V. These asymmetric long n-channel variations of IGFETs 140, 160, and 190 are respectively referred to below as IGFETS 140V, 160V and 190V.

Complementary IGFET Structures Suitable for Mixed-Signal Applications

Short-channel versions of long-channel IGFETs 150, 160, 170, 180, 190, 100V, 150V, 160V, 170V, 180V, and 190V can be produced in accordance with the invention by appropriately reducing the channel length. P-channel IGFETs can likewise be produced in accordance with the invention by reversing the conductivity types of the semiconductor regions of IGFETs 100, 140, 150, 160, 170, 180, 190, 100V, 140V, 150V, 160V, 170V, 180V, and 190V, including the short-channel variations of IGFETs 150, 160, 170, 180, 190, 150V, 160V, 170V, 180V, and 190V.

N-channel IGFETs 100, 140, 150, 160, 170, 180, 190, 100V, 140V, 150V, 160V, 170V, 180V, and 190V, including the short-channel variations of IGFETs 150, 160, 170, 180, 190, 150V, 160V, 170V, 180V, and 190V, and the p-channel IGFETs can be variously provided in the same semiconductor structure to produce a complementary-IGFET semiconductor architecture especially suitable for high-speed analog applications. For instance, one or more of n-channel IGFETs 100, 140, 150, 160, 170, 180, and 190 can be combined with one or more p-channel variations of IGFETs 100V, 140V, 150V, 160V 170V, 180V, and 190V. The complementary-IGFET structure is then created from lightly doped p-type semiconductor material using p− lower body-material portion 114 as the p-type equivalent of n− lower portion 192 for each p-channel variation of IGFET 100V, 140V, 150V, 160V 170V, 180V, or 190V. Alternatively, one or more of n-channel IGFETs 100V, 140V, 150V, 160V 170V, 180V, and 190V can be combined with one or more p-channel variations of IGFETs 100, 140, 150, 160, 170, 180, and 190 fabricated from lightly doped n-type semiconductor material using n− lower portion 192 as the n-type equivalent of p− lower body-material portion 114 for each p-channel variation of IGFET 100, 140, 150, 160, 170, 180, or 190.

IGFETs, both n-channel and p-channel, particularly suitable for digital circuitry can also be provided in the semiconductor structure. Bipolar transistors, npn and/or pnp, can be variously provided in the semiconductor structure. The resulting semiconductor architecture is thus suitable for mixed signal applications.

FIGS. 29.1 and 29.2 (collectively "FIG. 29") depict two portions of a complementary-IGFET semiconductor structure configured according to the invention so as to be especially suitable for mixed-signal applications. The complementary-IGFET structure of FIG. 29 is created from a doped monosilicon semiconductor body having lower p− body-material portion 114. A patterned field region 200 of electrically insulating material, typically consisting primarily of silicon oxide, is recessed into the upper surface of the semiconductor body to define a group of laterally separated active semiconductor islands. Four such islands 202, 204, 206, and 208 appear in FIG. 29.

Four long-channel IGFETs 210, 220, 230, and 240 are formed along the upper semiconductor surface respectively at the locations of islands 202, 204, 206, and 208. IGFETs 210 and 220 in FIG. 29.1 are asymmetric devices primarily intended for high-speed analog applications. IGFETs 230 and 240 in FIG. 29.2 are symmetric devices primarily intended for digital applications. IGFETs 210 and 230 are n-channel devices. IGFETs 220 and 240 are p-channel devices.

Asymmetric n-channel IGFET 210 is an implementation of long n-channel IGFET 180 of FIG. 18*b* and contains all the regions of IGFET 180. Accordingly, IGFET 210 has a hypoabrupt vertical dopant profile below drain 104 substantially as described above for IGFET 180 and thus as described above for IGFET 100. Similarly, channel zone 106 of IGFET 210 is asymmetrically longitudinally dopant graded as described above for IGFET 180 and therefore substantially as described above for IGFET 150.

Source 102, drain 104, and channel zone 106 of n-channel IGFET 210 are situated in island 202. In addition to the regions depicted in FIG. 18*b*, IGFET 210 contains a pair of electrically insulating sidewall spacers 250 and 252 situated along the opposite transverse sidewalls of gate electrode 128. Metal silicide layers 254, 256, and 258 are respectively situated along the tops of source 102, drain 104, and gate electrode 128.

Asymmetric p-channel IGFET 220 is an implementation of a p-channel version of long n-channel IGFET 180V in which n− lower portion 192 is replaced with p− lower body-material portion 114. IGFET 220 has a p-type source 262 and a p-type drain 264 separated by an n-type channel zone 266 of n-type body material 268 consisting of a heavily doped well portion 276 and an upper portion 278. As an implementation of a p-channel version of n-channel IGFET 180V, p-channel IGFET 220 has a hypoabrupt vertical dopant profile below drain 264 substantially the same, subject to reversal, of the conductivity types, as that described above for n-channel IGFET 180V and thus as that described above for n-channel IGFET 100V. Similarly, channel zone 106 of p-channel IGFET 210 is asymmetrically longitudinally dopant graded substantially the same, again subject to reversal of the conductivity types, as that described above for n-channel IGFET 180V and therefore as that described above for n-channel IGFET 150V.

Source 262, drain 264, and channel zone 266 of p-channel IGFET 220 are situated in island 204. Each p-type S/D zone 262 or 264 consists of a very heavily doped main portion 262M or 264M and a more lightly doped, but still heavily doped, lateral extension 262E or 264E for reducing source resistance $R_S$ and drain-side hot-carrier injection. P+ lateral extensions 262E and 264E terminate channel zone 266 along the upper semiconductor surface.

A heavily doped pocket portion 280 of n-type upper body-material portion 278 extends along source 262, primarily source extension 262E. As with pocket portion 120 in IGFET 210, n+ pocket portion 280 extends deeper below the upper semiconductor surface than p+ source extension 262E but not as deep as p++ main source portion 262M. The remainder 284 of n-type upper body-material portion 278 is lightly doped and extends along drain 264. N+ well portion 276, n+pocket portion 280, and n− upper body-material remainder 284 in IGFET 220 typically have largely the same longitudinal and vertical doping characteristics respectively as p+ well portion 116, p+ pocket portion 120, and p− upper body-material remainder 198 in IGFET 180V with the conductivity types reversed. IGFET 220 thereby avoids punchthrough and has reduced parasitic capacitances along the source-body and drain-body pn junctions.

In a variation of IGFET 220 described below in connection with FIGS. 32*a*-32*c* and 33*a*-33*f*, n− upper body-material remainder 284 is essentially simply an extension of n+ well portion 276. The light n-type doping of n− upper body-material remainder 284 in this variation is produced by updiffusion of part of the n-type dopant used to form n+ well 276 in order to avoid a separate dopant-introduction step for causing remainder 284 to be lightly doped n-type.

A gate dielectric layer 286 overlies channel zone 266 of IGFET 220. A gate electrode 288 is situated on gate dielectric layer 286 above channel zone 266. Gate electrode 288 extends partially over each lateral S/D extension 262E or 264E. In the example of FIG. 29, gate electrode 288 consists of very heavily doped p-type polysilicon. A pair of electrically insulating sidewalls spacers 290 and 292 are situated along the opposite transverse sidewalls of p++ gate electrode 288. Metal silicide layers 294, 296, and 298 are respectively situated along the tops of source 262, drain 264, and gate electrode 288.

Symmetric n-channel IGFET 230 has a pair of n-type S/D zones 302 and 304 separated by a p-type channel zone 306 of p-type body material 308 consisting of lower p− portion 114, a heavily doped immediate well portion 316, and an upper portion 318. S/D zones 302 and 304 and channel zone 306 are situated in island 206. Each n-type S/D zone 302 or 304 consists of a very heavily doped main portion 302M or 304M and a heavily doped, and thus more lightly doped, lateral extension 302E or 304E for reducing drain-side hot-carrier injection. N+ lateral extensions 302E and 304E terminate channel zone 306 along the upper semiconductor surface.

A pair of heavily doped halo pocket portions 320 and 322 of p-type upper body-material portion 318 respectively extend along S/D zones 302 and 304 in a symmetric manner. P+ halo pocket portions 320 and 322 extend primarily along n+ S/D extensions 302E and 304E. In the example of FIG. 29, p+ pocket portions 320 and 322 extend deeper below the upper semiconductor surface than n+ extensions 302E and 304E but not as deep as n++ main drain portions 302M and 304M. Item 324 is the moderately doped p-type remainder of upper body-material portion 318.

A gate dielectric layer 326 overlies channel zone 306. A gate electrode 328 is situated on gate dielectric layer 326 above channel zone 306. Gate electrode 328 extends partially over each lateral S/D extension 302E or 304E. Gate electrode 328 consists of very heavily doped n-type polysilicon in the example of FIG. 29. A pair of electrically insulating sidewalls spacers 330 and 332 are situated along the opposite transverse sidewalls of n++ gate electrode 328. Metal silicide layers 334, 336, and 338 are respectively situated along the tops of S/D zones 302 and 304 and gate electrode 328.

Subject to being formed over p− lower body-material portion 214, symmetric p-channel IGFET 240 is a long-channel device configured substantially the same as IGFET 230 with the conductivity types reversed. IGFET 240 thus has a pair of p-type S/D zones 342 and 344 separated by an n-type channel zone 346 of n-type body-material 348 consisting of a heavily doped well portion 356 and an upper portion 358. S/D zones 342 and 344 and channel zone 346 are situated in island 208. Each p-type S/D zone 342 or 344 consists of a very heavily doped main portion 342M or 344M and a more lightly doped, but still heavily doped, lateral extension 342E or 344E for reducing drain-side hot-carrier injection. P+ lateral extensions 342E and 344E terminate channel zone 346 along the upper semiconductor surface.

A pair of heavily doped halo pocket portions 360 and 362 of n-type upper body-material portion 358 respectively extend along S/D zones 342 and 344 in a symmetric manner. N+ halo pocket portions 360 and 362 respectively extend primarily along S/D) extensions 342E and 344E. In the example of FIG. 29, n+ pocket portions 360 and 362 extend deeper below the upper semiconductor surface than n+ extensions 342E and 344E but not as deep as n++ main S/D portions 342M and 344M. Item 364 is the moderately doped n-type remainder of upper body-material portion 358.

A gate dielectric layer 366 overlies channel zone 346. A gate electrode 368 is situated on gate dielectric layer 366 above channel zone 346. Gate electrode 368 extends partially over each S/D extension 342E or 344E. In the example of FIG. 29, gate electrode 368 consists of very heavily doped p-type polysilicon. A pair of electrically insulating sidewall spacers 370 and 372 are situated along the opposite transverse sidewalls of p++ gate electrode 368. Metal silicide layers 374, 376, and 378 are respectively situated along the tops of S/D zones 342 and 344 and gate electrode 368.

Gate dielectric layers 126, 286, 326, and 366 of IGFETs 210, 220, 230, and 240 typically consist primarily of silicon oxide but may consist of silicon oxynitride or/and other high permittivity dielectric material. The thickness of dielectric layers 126, 286, 326, and 366 is normally 2-8 nm, preferably 3-5 nm, typically 3.5 nm for operation across a 1.8-V range. The dielectric layer thickness is suitably increased for operation across a higher voltage range or suitably decreased for operation across a lower voltage range. Sidewall spacers 250, 252, 290, 292, 330, 332, 370, and 372 are illustrated in FIG. 29 as shaped roughly like right triangles with convex hypotenuses but can have other shapes. Silicide layers 254, 256, 258, 294, 296, 298, 334, 336, 338, 374, 376, and 378 typically consist of cobalt silicide.

Figure 2:
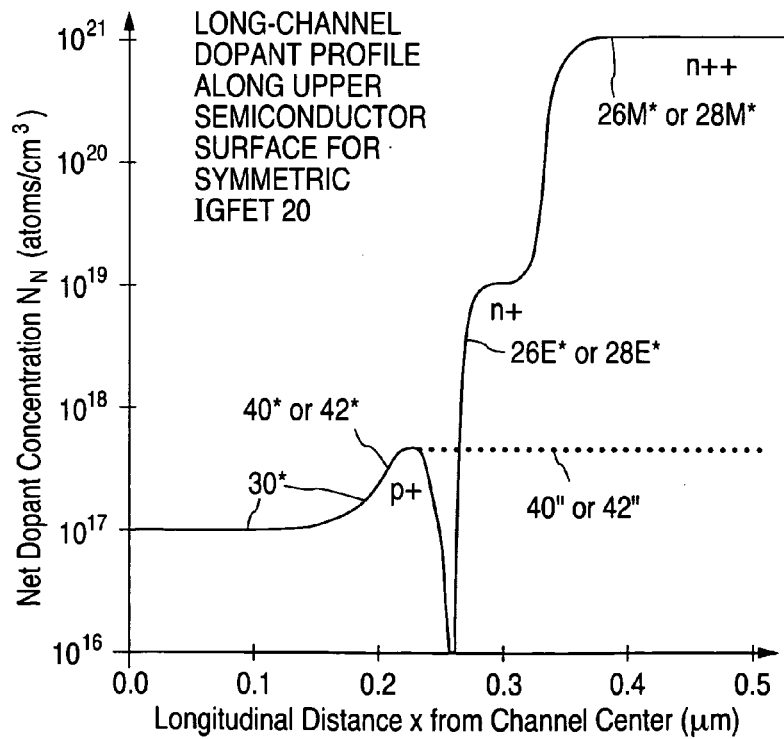
FIG. 2 is a graph of net dopant concentration along the upper semiconductor surface as a function of longitudinal distance from the channel center for the IGFET of FIG. 1.

Channel zones 306 and 346 of IGFETs 230 and 240 have symmetric longitudinal dopant profiles similar to that illustrated in FIG. 2 for symmetric IGFET 20 of FIG. 1. The presence of p+ halo pocket portions 320 and 322 in channel zone 306 alleviates threshold voltage roll-off and helps avoid punchthrough in IGFET 230. The presence of n+ halo pocket portions 360 and 362 in channel zone 346 similarly alleviates threshold voltage roll-off and helps avoid punchthrough in IGFET 240.

Figure 3A:
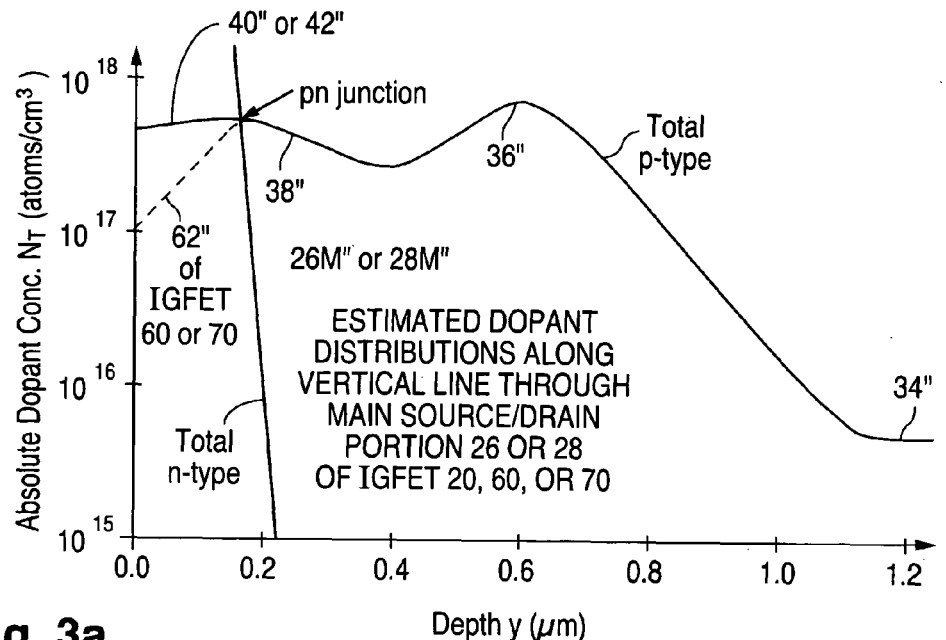
FIGS. 3a and 3b are graphs of absolute dopant concentration as a function of depth along vertical lines through the source/drain zones at two respective different well-doping conditions for the IGFETs of FIGS. 1, 4a, and 4b.
Figure 3B:
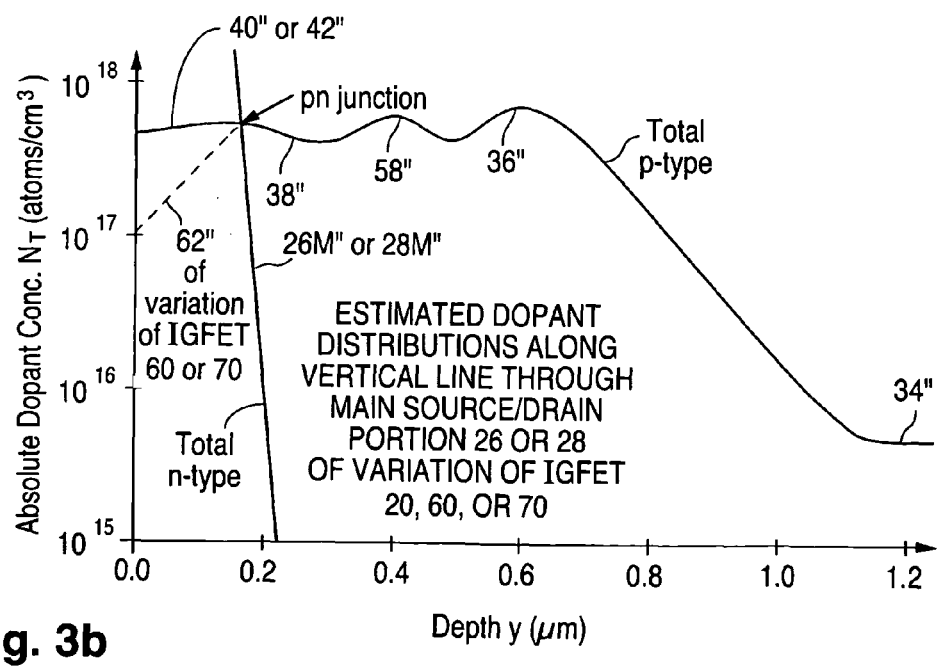
Figure 4A:
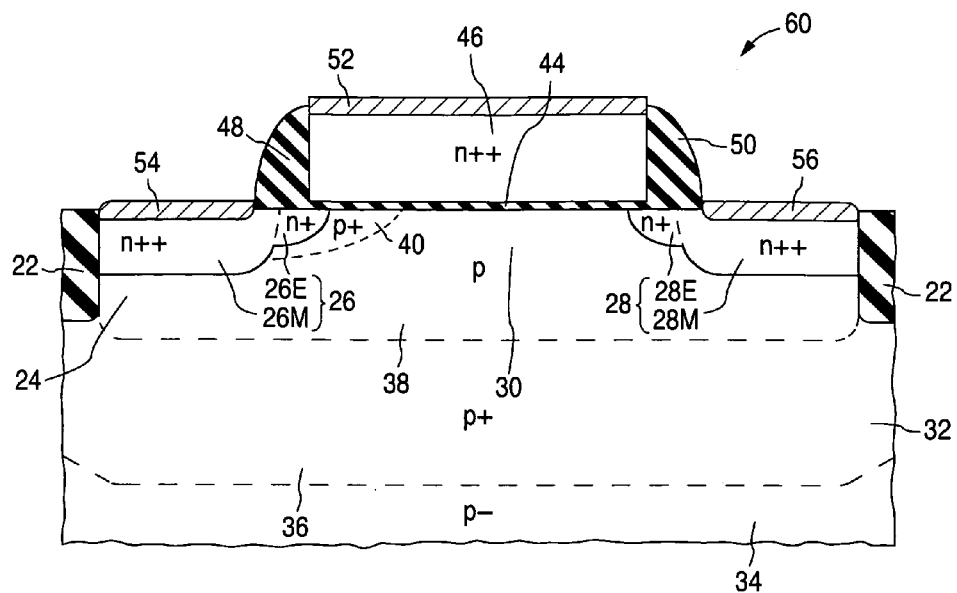
FIGS. 4a and 4b are front cross-sectional views of respective prior art asymmetric long and short n-channel IGFETs.
Figure 4B:
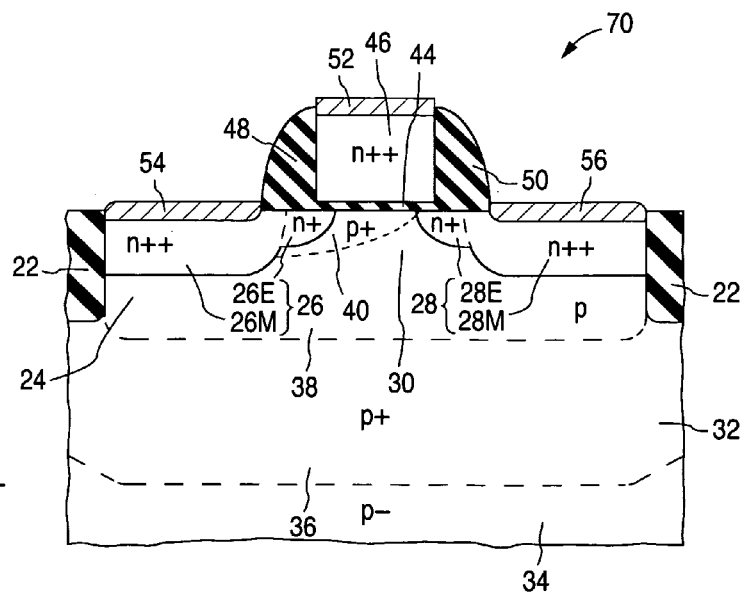
Figure 5A:
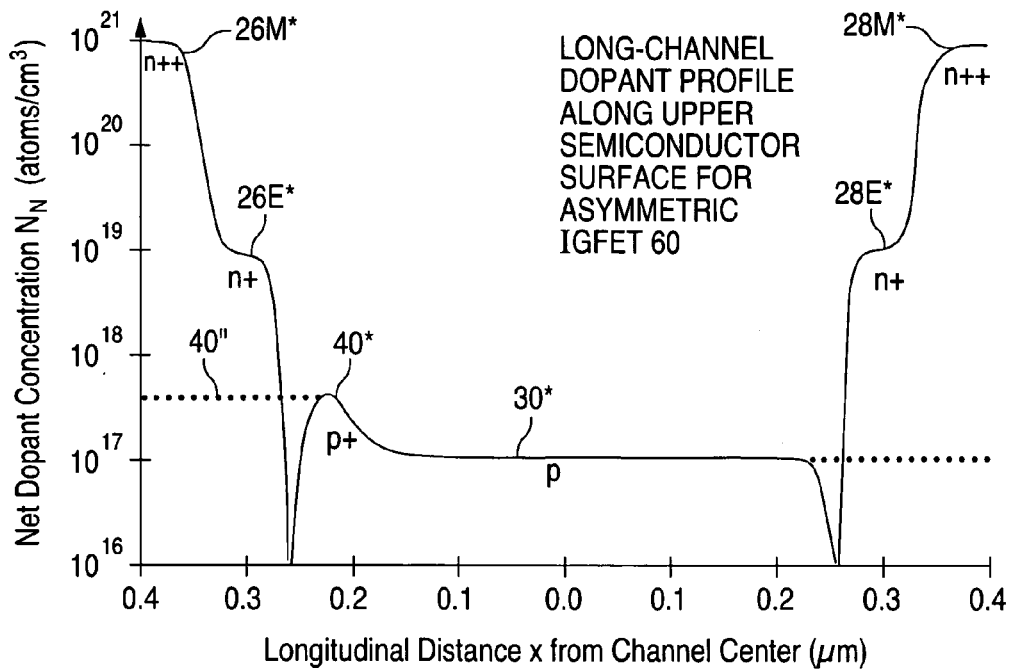
FIGS. 5a and 5b are graphs net dopant concentration along the upper semiconductor surface as a function of longitudinal distance from the channel center for the respective IGFETs of FIGS. 4a and 4b.
Figure 5B:
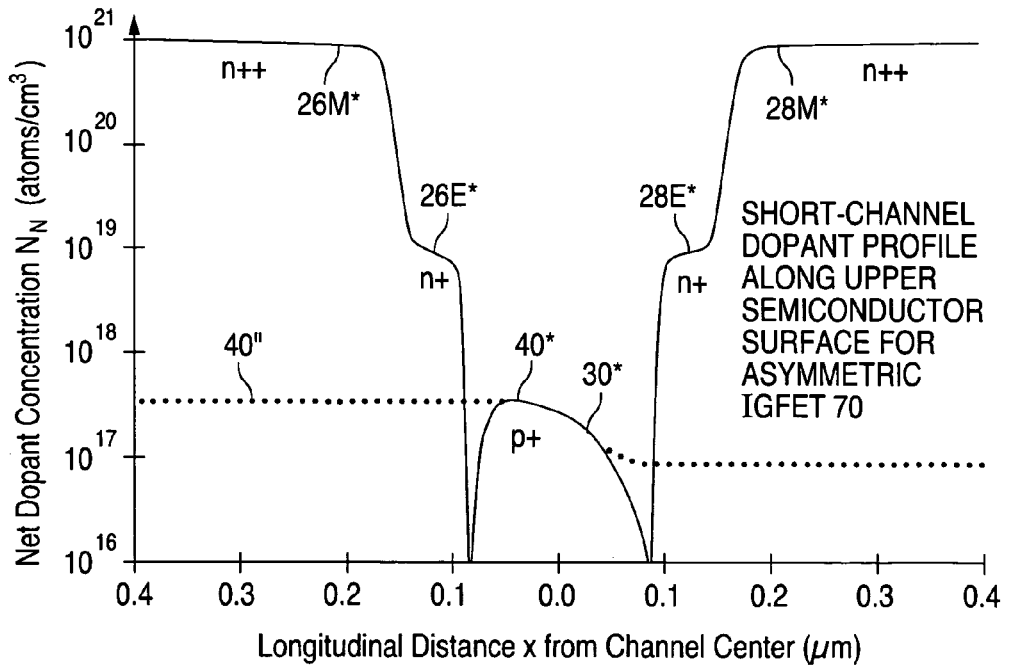

The vertical dopant profile through each n++ main S/D portion 302M or 304M of IGFET 230 and into underlying p-type body material 308 is similar to that shown in FIG. 3a for IGFET 20 and also to the computer-simulated reference dopant profiles shown in FIGS. 40, 44a, and 44b discussed below. The same applies to the vertical dopant profile through each p++ main S/D portion 342M or 344M of IGFET 240 and into underlying n-type body material 348 subject to body material 348 forming a pn junction with p– lower portion 114 instead of merging into underlying lightly doped n-type monosilicon. The moderate, but elevated, concentration of the p-type dopant in upper body-material portion 324 of IGFET 230 cooperates with the heavy p-type dopant concentration provided by halo pocket portions 320 and 322 to inhibit punchthrough from occurring in IGFET 230. The corresponding dopings in upper body-material portion 364 and halo pocket portions 360 and 362 of IGFET 240 similarly enable it to avoid punchthrough.

The p-type well dopant that defines well portion 316 of IGFET 230 typically reaches a maximum concentration at approximately the same depth below the upper semiconductor surface as the maximum concentration of the p-type well dopant that defines well portion 116 of IGFET 210. Because concentration $N_I$ of the p-type background dopant is relatively uniform, the maximum concentration of the total p-type dopant in well portion 316 of IGFET 230 typically occurs at approximately the same depth below the upper surface as the maximum concentration of the total p-type dopant in well portion 116 of IGFET 210. Upper body-material portion 318 of IGFET 230 is provided with p-type anti-punchthrough (again "APT") dopant to raise upper portion 318 to a moderate p-type doping level. The p-type APT dopant in upper body-material portion 318 reaches a maximum concentration at a lesser depth below the upper semiconductor surface than the maximum concentration of the p-type well dopant of well portion 316.

The combination of the total p-type dopant, i.e., the p-type well, APT, and background dopants, in the portion of body material 308 below n++ main S/D portion 302M or 304M causes concentration $N_T$ of the total p-type dopant in that body-material portion to be relatively flat along a vertical line extending from the subsurface location of the maximum p-type dopant concentration in well 316 up to main S/D portion 302M or 304M. In particular, concentration $N_T$ of the total p-type dopant in the portion of body material 308 below main S/D portion 302M or 304M normally changes (decreases) by less than a factor of 10, typically by less than a factor of 5, in moving from the location of the maximum p-type dopant concentration in well 316 up to portion 302M or 304M.

The same arises with IGFET 240. The n-type well dopant that defines well portion 356 of IGFET 240 typically reaches a maximum concentration at approximately the same depth below the upper semiconductor surface as the maximum concentration of the n-type well dopant that defines well portion 276 of IGFET 220. The maximum concentration of the total n-type dopant in well portion 356 of IGFET 240 thus typically occurs at approximately the same depth below the upper surface as the maximum concentration of the total n-type dopant in well portion 276 of IGFET 220. Upper body-material portion 358 of IGFET 240 is provided with n-type APT dopant to raise upper portion 358 to a moderate n-type doping level. The n-type APT dopant in upper body-material portion 358 reaches a maximum concentration at a lesser depth below the upper semiconductor surface than the maximum concentration of the n-type well dopant of well portion 356.

The combination of the total n-type dopant, i.e., primarily the n-type well and APT dopants, in the portion of body material 348 below S/D zone 342M or 344M causes concentration $N_T$ of the total n-type dopant in that body-material portion to be relatively flat along a vertical line extending from the subsurface location of the maximum n-type dopant concentration in well portion 356 up to main S/D portion 342M or 344M. Specifically, concentration $N_T$ of the total n-type dopant in the portion of body material 348 below main S/D portion 342M or 344M normally changes by less than a factor of 10, typically by less than a factor of 5, in moving from the location of the maximum n-type dopant concentration in well 356 up to portion 342M or 344M.

Halo pocket portions 120 and 280 of respective IGFETs 210 and 220 may, of course, alternatively extend deeper below the upper semiconductor surface than respective sources 102 and 262. IGFET 210 then implements IGFET 150 of FIG. 13 while IGFET 220 implements a p-channel version of IGFET 150V. Halo pocket portions 320 and 322 of re-channel IGFET 230 may extend deeper below the upper semiconductor surface than S/D zones 302 and 304 as occurs below in computer-simulated reference short-channel structure B of FIG. 40. Halo pocket portions 360 and 362 of p-channel IGFET 240 may likewise extend deeper below the upper semiconductor surface than S/D zones 340 and 342.

FIGS. 30.1 and 30.2 (collectively "FIG. 30") depict two portions of another complementary-IGFET semiconductor structure configured according to the invention so as to be particularly suitable for mixed-signal applications. The complementary-IGFET structure of FIG. 30 contains asymmetric p-channel IGFET 220 and an asymmetric long n-channel IGFET 380 configured the same as asymmetric n-channel IGFET 210 except that a heavily doped n-type subsurface layer 382 lies between p+ well portion 116 and p− lower portion 114 for isolating p+ well portion 116 and p-type upper body-material portion 118 from p− portion 114. Consequently, p-type body material 108 for IGFET 380 does not include p− lower portion 114 but instead consists only of p+ well portion 116 and p-type upper body-material portion 118.

The complementary-IGFET structure of FIG. 30 further includes symmetric p-channel IGFET 240 and a symmetric long n-channel IGFET 390 configured the same as symmetric n-channel IGFET 230 except that a heavily doped n-type subsurface layer 392 lies between p+ well portion 316 and p− lower portion 114 for isolating p+ well portion 316 and p-type upper body-material portion 318 from p− portion 114. P-type body material 308 for IGFET 390 thereby does not include p− lower portion 114 but instead consists only of p+ well portion 316 and p-type upper body-material portion 318. Aside from n+ subsurface layers 382 and 392, n-channel IGFETs 380 and 390 operate respectively the same as n-channel IGFETs 210 and 230.

Circuit elements other than IGFETs 210, 220, 230, 240, 380, and 390 may be provided in other parts (not shown) of the complementary-IGFET structure of FIG. 29 or 30. For instance, short-channel versions of IGFETs 210, 220, 230, 240, 380, and 390 may be present in either complementary-IGFET structure. Bipolar transistors along with various types of resistors, capacitors, and/or inductors may be provided in the complementary-IGFET structure of FIG. 29 or 30. Depending on the characteristics of the additional circuit elements, suitable electrical isolation is also provided in either complementary-IGFET structure for the additional elements. IGFETs 240 and 230 or 390 can, of course, be deleted in some purely analog complementary-IGFET applications.

Figure 31A:
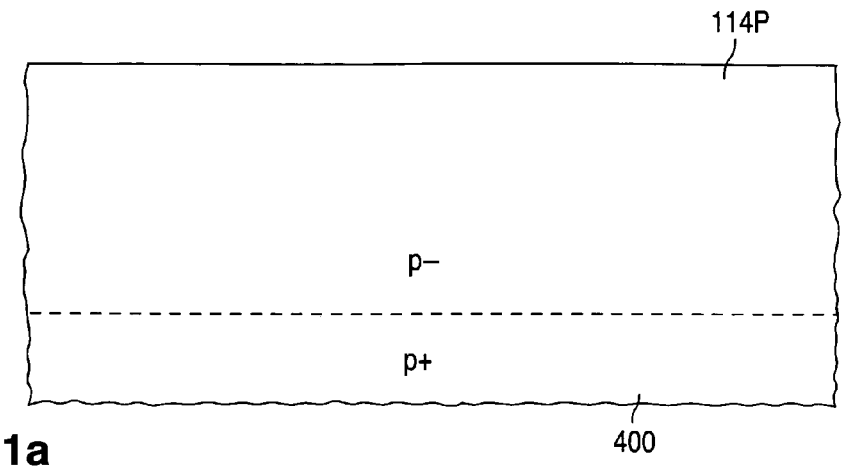
FIGS. 31a-31o, 31p.1-31r.1, and 31p.2-31r.2 are front cross-sectional views representing steps in manufacturing the complementary-IGFET semiconductor structure of FIGS. 29.1 and 29.2. The steps of FIGS. 31a-31o apply to the structural portions illustrated in both of FIGS. 29.1 and 29.2.
Figure 31B:
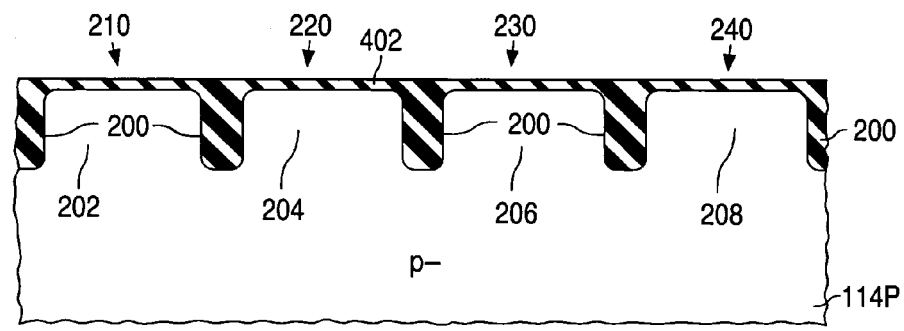
Figure 31C:
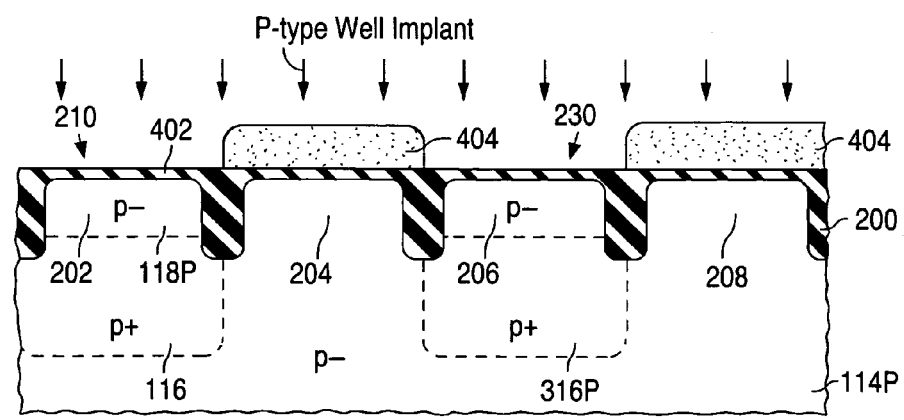
Figure 31D:
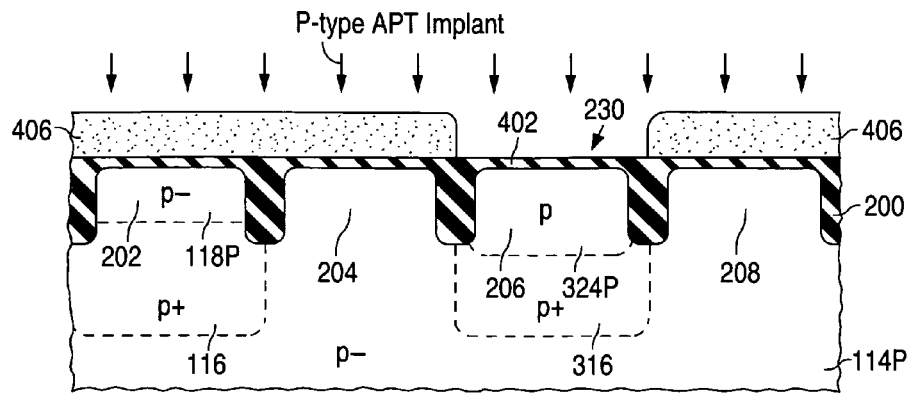
Figure 31E:
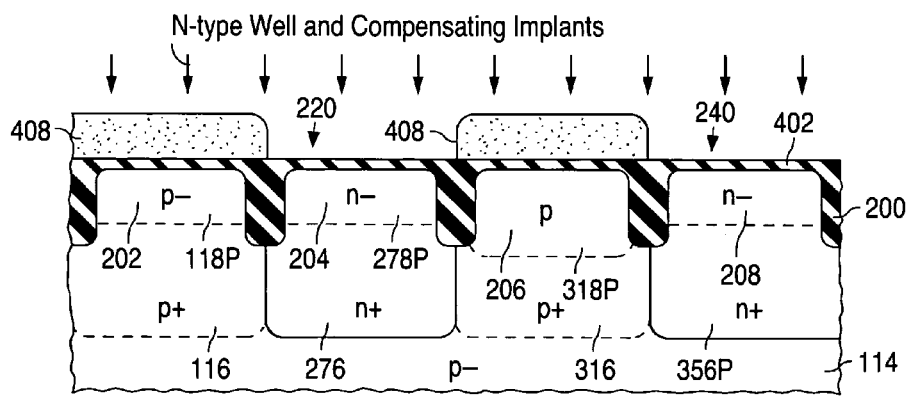
Figure 31F:
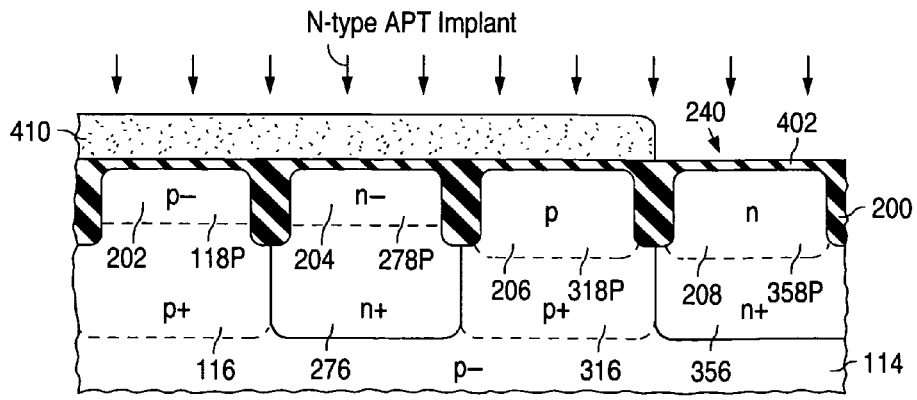
Figure 31G:
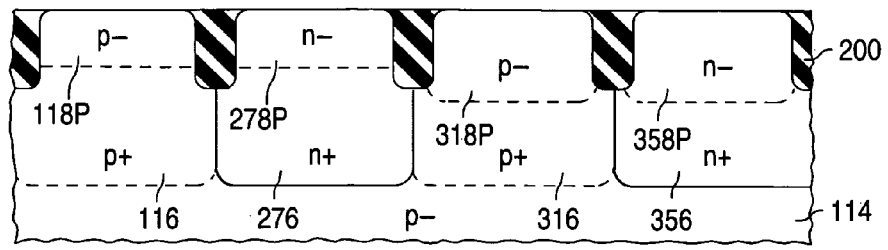
Figure 31H:
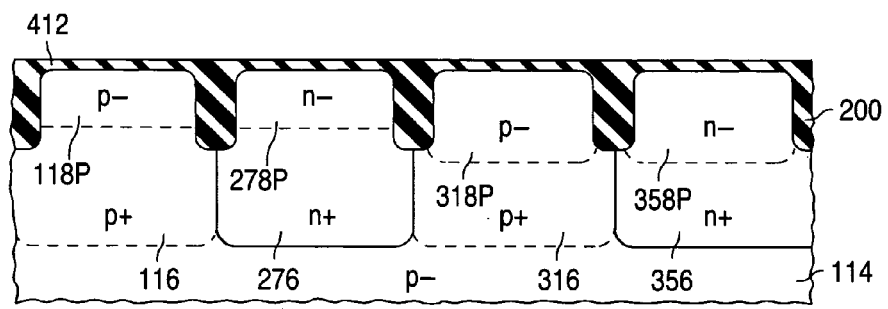
Figure 31I:
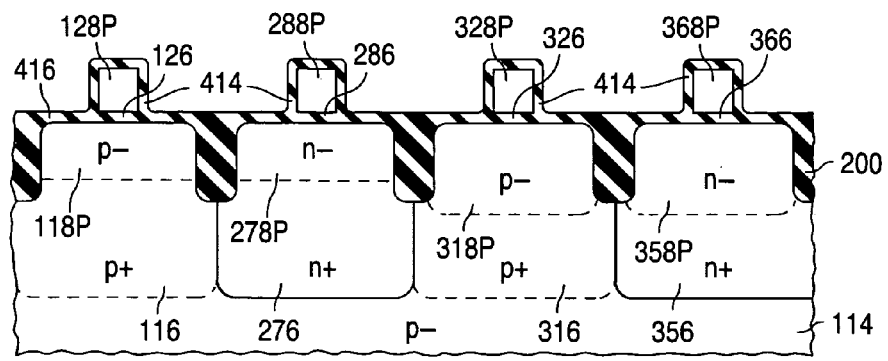
Figure 31J:
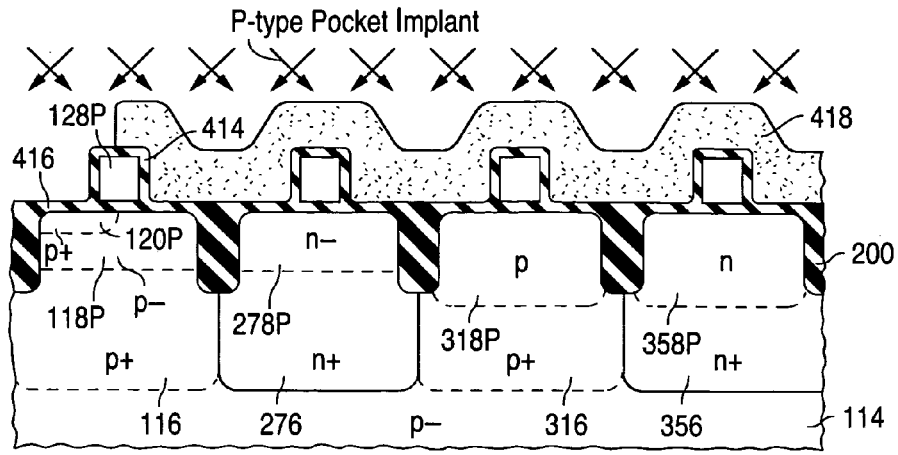
Figure 31K:
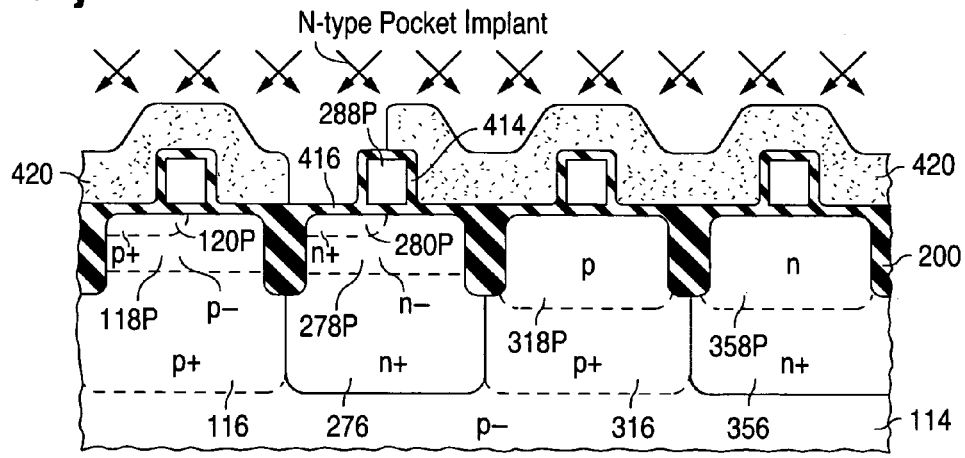
Figure 31L:
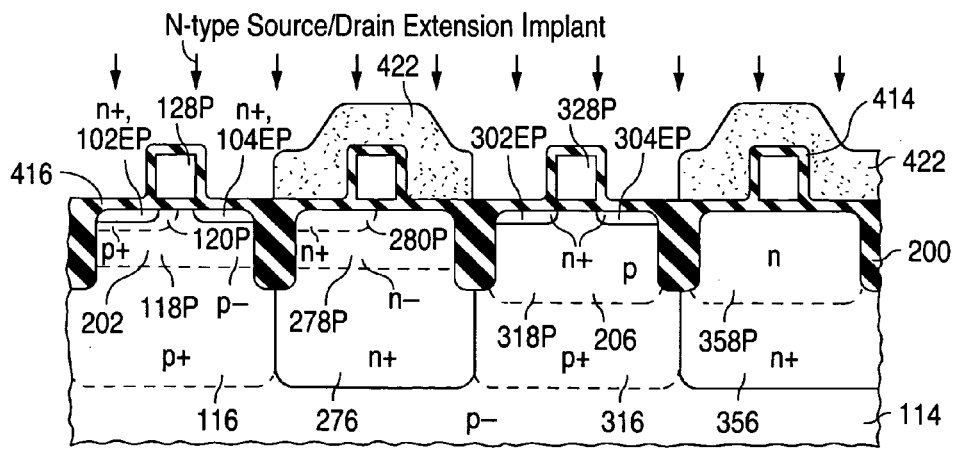
Figure 31M:
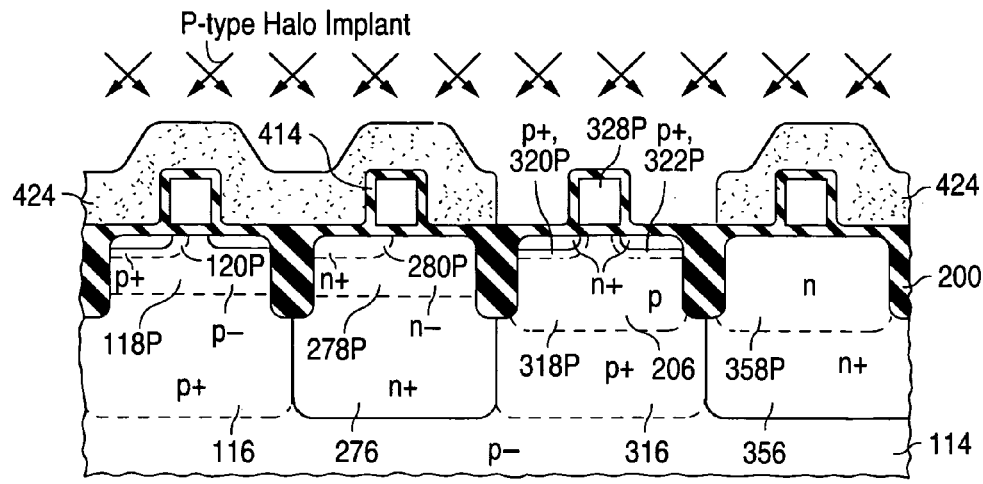
Figure 31N:
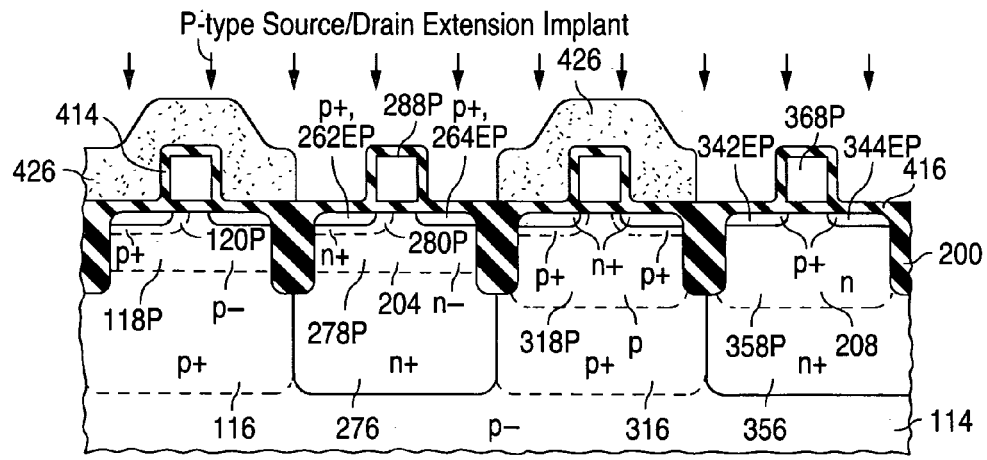
Figure 31O:
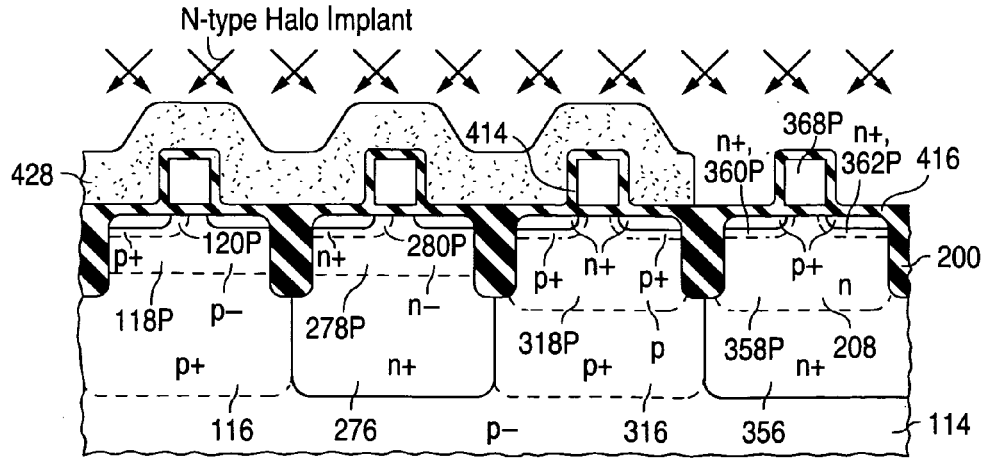

Fabrication of Complementary-IGFET Structure Suitable for Mixed-Signal Applications FIGS. 31a-31o, 31p.1-31r.1, and 31p.2-31r.2 (collectively "FIG. 31") illustrate a semiconductor process in accordance with the invention for manufacturing a complementary-IGFET semiconductor structure containing long-channel IGFETs 210, 220, 230, and 240 as generally shown in FIG. 29. The steps involved in the fabrication of IGFETs 210, 220, 230, and 240 up through the stage just before the creation of gate sidewall spacers 250, 252, 290, 292, 330, 332, 370, and 372 are shown in FIGS. 31a-31o. FIGS. 31p.1-31r.1 illustrate the fabrication of spacers 250, 252, 290, and 292 and later steps leading to IGFETs 210 and 220 as depicted in FIG. 29.1. FIGS. 31p.2-31r.2 illustrate the fabrication of spacers 330, 332, 370, and 372 and later steps leading to IGFETs 230 and 240 as shown in FIG. 29.2.

Short-channel versions of IGFETs 210, 220, 230, and 240 may be manufactured simultaneously according to the fabrication steps employed in manufacturing long-channel IGFETs 210, 220, 230, and 240. The short-channel IGFETs are of lesser channel length than long-channel IGFETs 210, 220, 230, and 240 but otherwise are of generally the same intermediate IGFET appearances as shown in FIG. 31. The simultaneous fabrication of long-channel IGFETs 210, 220, 230, and 240 and their short-channel versions is implemented with masking plates (reticles) having patterns for both the long-channel and short-channel IGFETs.

Aside from the pocket (including halo pocket) ion implantation steps and the source/drain extension ion implantation steps, all of the ion implantation steps in the present fabrication process are performed roughly perpendicular to the lower semiconductor surface and thus roughly perpendicular to the upper semiconductor surface. More particularly, all of the implantation steps except the pocket and source/drain extension ion implantation steps are performed at a small angle, typically 7°, to the vertical. This small deviation from perpendicularity is used to avoid undesirable ion channeling effects. For simplicity, the small deviation from perpendicularity is not indicated in FIG. 31.

Unless otherwise indicated, the species of n-type dopant utilized in each of the n-type ion implantations in the fabrication process of FIG. 31 consists of the specified n-type dopant in elemental form. That is, each n-type ion implantation is performed with ions of the specified n-type dopant element rather than with ions of a chemical compound that contains the n-type dopant. The species of p-type dopant employed in each of the p-type ion implantations variously consists of the p-type dopant, normally boron, in elemental or compound form. Hence, each p-type ion implantation is normally performed with boron ions or with ions of a boron-containing compound such as boron difluoride.

In some of the fabrication steps in FIG. 31, openings extend (substantially) through a photoresist mask above the active semiconductor regions for two IGFETs. When the two IGFETs are formed laterally adjacent to each other in the exemplary cross sections of FIG. 31, the two photoresist openings are illustrated as a single opening in FIG. 31 even though they may be described below as separate openings.

The letter "P" at the end of a reference symbol appearing in the drawings of FIG. 31 indicates a precursor to a region which is shown in FIG. 29 and which is identified there by the portion of the reference symbol preceding "P". The letter "P" is dropped from the reference symbol in the drawings of FIG. 31 when the precursor has evolved sufficiently to largely constitute the corresponding region in FIG. 29.

The starting point for the fabrication process of FIG. 31 is a monosilicon semiconductor body typically consisting of a heavily doped p-type substrate 400 and an overlying lightly doped p-type epitaxial layer 114P. See FIG. 31a. P+ substrate 400 is a semiconductor wafer formed with <100> monosilicon doped with boron to a concentration of approximately $5 \times 10^{18}$ atoms/cm$^3$ for achieving a typical resistivity of 0.015 ohm-cm. For simplicity, substrate 400 is not shown in the remainder of FIG. 31. Alternatively, the starting point can simply be a p-type substrate lightly doped substantially the same as p− epitaxial layer 114P.

Epitaxial layer 114P consists of epitaxially grown <100> monosilicon lightly doped p type with boron to a concentration of approximately $5 \times 10^{15}$ atoms/cm$^3$ for achieving a typical resistivity of 5 ohm-cm. The thickness of epitaxial layer 114P is typically 5.5 μm. When the starting point for the fabrication process of FIG. 31 is a lightly doped p-type substrate, item 114P is the p− substrate.

Field-insulating region 200 is provided along the upper surface of p− epitaxial layer (or p-substrate) 114P as shown in FIG. 31b so as to define active semiconductor islands 202, 204, 206, and 208 respectively for IGFETs 210, 220, 230, and 240 going from left to right in FIG. 31b. Field insulation 200 is preferably created according to a trench-oxide technique but can be created according to a local-oxidation technique. In providing field insulation 200, a thin screen insulating layer 402 of silicon oxide is thermally grown along the upper surface of epitaxial layer 114P.

A photoresist mask 404 having openings above islands 202 and 206 is formed on screen oxide layer 402 as shown in FIG. 31c. P-type well dopant consisting of a boron species is ion implanted at a heavy dosage and a high energy through the uncovered sections of screen oxide 402 and into the underlying monosilicon to define (a) p+ well portion 116 for IGFET 210 and (b) a p+ precursor well portion 316P for IGFET 230. The portion of epitaxial layer 114P above well portion 116 constitutes a p− precursor upper body-material portion 118P for IGFET 210. Photoresist 404 is removed.

A photoresist mask 406 having an opening above island 206 is formed on screen oxide 402. See FIG. 31d. P-type APT dopant consisting of a boron species is ion implanted at a moderate dosage through the uncovered section of screen oxide 402 and into the underlying monosilicon to define a p precursor upper body-material portion 324P for IGFET 230. Photoresist 406 is removed.

A photoresist mask 408 having openings above islands 204 and 208 is formed on screen oxide 402 as shown in FIG. 31e. N-type well dopant consisting of phosphorus or arsenic is ion implanted at a heavy dosage and a high energy through the uncovered sections of screen oxide 402 and into the underlying monosilicon to define (a) n+ well portion 276 for IGFET 220 and (b) an n+ precursor well portion 356P for IGFET 240.

With photoresist mask 408 in place, n-type compensating dopant likewise consisting of phosphorus or arsenic is ion implanted at a light dosage and a moderate energy through the uncovered section of oxide 402 above island 204 and into the underlying monosilicon to define an n-precursor upper body-material portion 278P for IGFET 220. N− precursor body-material portion 278P overlies n+ well portion 276 as it exists at the stage of FIG. 31e. The dosage and implant energy of the n-type compensating dopant implant are normally sufficient to cause all of precursor body-material portion 278P to be of n-type conductivity.

The n-type compensating dopant also passes through the uncovered section of oxide 402 above island 208 and into the underlying monosilicon for IGFET 240. Either of the two n-type doping operations that utilize photoresist 408 can be performed first. Photoresist 408 is removed. If it is desired that the monosilicon for IGFET 240 not receive any of the n-type compensating dopant, the n-type compensating doping operation can be performed with an additional photoresist mask having an opening above island 204 but not above island 208 (and also not above islands 202 and 206) after which the additional photoresist is removed.

During subsequent fabrication steps, some of the n-type well dopant used to define precursor n+ well portion 276 for IGFET 220 diffuses upward into the semiconductor material above n+ well portion 276 as it exists at this point in the fabrication process of FIG. 29. That is, part of the n-type well dopant subsequently diffuses upward into overlying material of island 204 initially doped lightly p-type. The upward diffusion of part of the n-type well dopant that defines n+ well portion 276 occurs primarily during subsequent fabrication steps performed at elevated temperature, i.e., temperature significantly greater than room temperature.

Depending on various factors, primarily the summation effects of (a) the times at the elevated temperatures of subsequent fabrication steps and (b) temperature parameters that favor increased diffusion of dopants with those elevated temperatures, the upward-diffused part of the n-type well dopant that defines n+ well portion 276 may becomes distributed throughout island 204 for IGFET 220 in such a manner as to counterdope all of the p-type dopant now in island 204. Ignoring any other dopants subsequently introduced into island 204, this upward-diffused part of the n-type well dopant may thus cause all of island 204 to be converted to n-type conductivity. In that case, the step of implanting the n-type compensating dopant can sometimes be deleted to simplify the fabrication process and reduce manufacturing cost. FIGS. 32a-32c and 33a-33c, discussed below, describe two variations of the fabrication process of FIG. 31 in which the step of implanting the n-type compensating dopant is deleted.

During subsequent fabrication, some of the n-type well dopant used to define n+ well portion 356P for IGFET 240 also diffuses upward into the semiconductor material above n+ well portion 356P as it exists at this point in the fabrication process of FIG. 29. However, as discussed below, all of island 208 for IGFET 240 is of n-type conductivity at the end of the ion implantation, and associated activation, of the n-type APT dopant introduced into island 208. Consequently, the decision to retain or delete the n-type compensating implant is determined by the conditions of the subsequent fabrication steps applied to island 204 for IGFET 220.

A photoresist mask 410 having an opening above island 208 is formed on screen oxide 402. See FIG. 31f. N-type APT dopant consisting of phosphorus or arsenic is ion implanted at a moderate dosage through the uncovered section of screen oxide 402 and into the underlying monosilicon to define an n precursor upper body-material portion 358P for IGFET 240. Photoresist 410 is removed.

A thermal anneal, such as a rapid thermal anneal ("RTA"), may now be performed on the resultant semiconductor structure to repair lattice damage and place the implanted p-type and n-type dopants in energetically more stable states. See FIG. 31g. The upper semiconductor surface is cleaned. A gate-dielectric-containing dielectric layer 412 is provided along the upper semiconductor surface as shown in FIG. 31h. Dielectric layer 412 is created by a thermal growth technique.

Precursor gate electrodes 128P, 288P, 328P, and 368P are formed on gate-dielectric-containing dielectric layer 412 respectively above segments of upper body-material portions 118P, 278P, 318P, and 358P. See FIG. 31i. Precursor gate electrodes 128P, 288P, 328P, and 368P are created by depositing a layer of largely undoped (intrinsic) polysilicon on dielectric layer 412 and then patterning the polysilicon layer. The portions of dielectric layer 412 underlying precursor gate electrodes 128P, 288P, 328P, and 368P respectively constitute gate dielectric layers 126, 286, 326, and 366. The gate dielectric material formed with gate dielectric layers 126, 286, 326, and 366 generally respectively separates gate electrodes 128P, 288P, 328P, and 368P from the body-material segments intended to be respective channel zones 106, 266, 306, and 346.

A dielectric sealing layer 414 is thermally grown along the exposed surfaces of precursor gate electrodes 128P, 288P, 328P, and 368P. Again see FIG. 31i. In the course of forming dielectric sealing layer 414, the portions of dielectric layer 412 situated to the sides of gate dielectric layers 126, 286, 326, and 366 thicken somewhat to become composite surface dielectric layer 416.

A photoresist mask 418 having an opening generally above the intended location for p+ pocket portion 120 of IGFET 210 is formed on dielectric layers 414 and 416. See FIG. 31j. Photoresist mask 418 is critically aligned to precursor gate electrode 128P. P-type pocket dopant consisting of a boron species is ion implanted at a moderate dosage in an angled manner through the uncovered portion of surface dielectric layer 416 and into the underlying monosilicon to define a p+ precursor pocket portion 120P for IGFET 210. The p-type pocket implantation is normally performed at two opposite tilt angles to the vertical. Alternatively, the p-type pocket implantation can be performed at a single tilt angle. Photoresist 418 is removed.

A photoresist mask 420 having an opening generally above the intended location for n+ pocket portion 280 of IGFET 220 is formed on dielectric layers 414 and 416. See FIG. 31k. Photoresist mask 420 is critically aligned to precursor gate electrode 288P. N-type pocket dopant consisting of phosphorus or arsenic is ion implanted at a heavy dosage in an angled manner through the uncovered portion of surface dielectric 416 and into the underlying monosilicon to define an n+ precursor pocket portion 280P for IGFET 220. The n-type pocket implantation is normally performed at two opposite tilt angles but can be done at a single tilt angle. Photoresist 420 is removed.

A photoresist mask 422 having openings above islands 202 and 206 is formed on dielectric layers 414 and 416 as shown in FIG. 31*l*. N-type source/drain extension dopant consisting of arsenic or phosphorus is ion implanted at a heavy dosage through the uncovered section of surface dielectric 416 and into the underlying monosilicon to define (a) an n+ precursor source extension 102EP for IGFET 210, (b) a separate n+ precursor drain extension 104EP for IGFET 210, and (c) a pair of laterally separated n+ precursor S/D extensions 302EP and 304EP for IGFET 230. Photoresist 422 is removed.

A photoresist mask 424 having an opening above island 206 is formed on dielectric layers 414 and 416. See FIG. 31*m*. P-type halo dopant consisting of a boron species is ion implanted at a heavy dosage in an angled manner through the uncovered section of surface dielectric 416 and into the underlying monosilicon to define a pair of laterally separated p-type precursor halo pocket portions 320P and 322P for IGFET 230. Photoresist 424 is removed.

A photoresist mask 426 having openings above islands 204 and 208 is formed on dielectric layers 414 and 416 as shown in FIG. 31*n*. P-type source/drain extension dopant consisting of a boron species is ion implanted at a heavy dosage through the uncovered section of surface dielectric 416 and into the underlying monosilicon to define (a) a p+ precursor source extension 262EP for IGFET 220, (b) a separate p+ precursor drain extension 264EP for IGFET 220, and (c) a pair of laterally separated p+ S/D extensions 342EP and 344EP for IGFET 240. Photoresist 426 is removed.

A photoresist mask 428 having an opening above island 208 is formed on dielectric layers 414 and 416. See FIG. 31*o*. N+ halo dopant consisting of phosphorus or arsenic is ion implanted at a heavy dosage in an angled manner through the uncovered section of surface dielectric 416 and into the underlying monosilicon to define a pair of laterally separated n+ precursor halo pocket portions 360P and 362P for IGFET 240. Photoresist 428 is removed.

A low-temperature furnace anneal may be performed at this point to remove defects caused by the heavy dosages of the source/drain extension implants.

In the remainder of the process of FIG. 31, the complementary-IGFET structure at each processing stage is illustrated with a pair of FIGS. "31*z*.1" and "31*z*.2" where "z" is a letter varying from "p" to "r". Each FIG. "31*z*.1" illustrates the processing done to create asymmetric IGFETs 210 and 220 while each FIG. 31*z*.2 illustrates the processing simultaneously done to create symmetric IGFETs 230 and 240. Each pair of FIGS. 31*z*.1 and 31*z*.2 is, for convenience, collectively referred to below as "FIG. 31*z*" where "z" varies from "p" to "r". For instance, FIGS. 31*p*.1 and 31*p*.2 are collectively referred to as "FIG. 31*p*".

Gate sidewall spacers 250, 252, 290, 292, 330, 332, 370, and 372 are formed along the transverse sidewalls of precursor gate electrodes 128P, 288P, 328P, and 368P as shown in FIG. 31*p*. The formation of sidewall spacers 250, 252, 290, 292, 330, 332, 370, and 372 is performed by depositing dielectric material on top of the structure and then removing, primarily by anisotropic etching conducted generally perpendicular to the upper semiconductor surface, the dielectric material not intended to constitute spacers 250, 252, 290, 292, 330, 332, 370, and 372. Portions of dielectric layers 414 and 416 are also partially, but not totally, removed. Items 430 and 432 in FIG. 31*p* respectively indicate the remainders of dielectric layers 414 and 416 not covered by spacers 250, 252, 290, 292, 330, 332, 370 and 372.

A photoresist mask 434 having openings above islands 202 and 206 is formed on dielectric layers 430 and 432 and spacers 290, 292, 370, and 372. See FIG. 31*q*. N-type main source/drain dopant consisting of arsenic or antimony is ion implanted at a very heavy dosage through the uncovered sections of surface dielectric layer 432 and into the underlying monosilicon to define (a) n++ main source portion 102M and n++ main drain portion 104M for IGFET 210 and (b) n++ main S/D portions 302M and 304M for IGFET 230. The n-type main source/drain dopant also enters precursor electrodes 128P and 328P and converts them respectively into n++ gate electrodes 128 and 328. Photoresist 434 is removed.

The portions of regions 102EP, 104EP, and 120P outside main S/D portions 102M and 104M now respectively constitute n+ source extension 102E, n+ drain extension 104E, and p+ pocket portion 120 for IGFET 210. P-upper body-material remainder 124 is the remaining lightly doped material of precursor upper body-material portion 118P, now p-type upper body-material portion 118. The portions of regions 302EP, 304EP, 320P, and 322P outside main S/D portions 302M and 304M now respectively constitute n+ S/D extensions 302E and 304E and p+ halo pocket portions 320 and 322 for IGFET 230. P-upper body-material remainder 324 is the remaining lightly doped p-type material of precursor upper body-material portion 318P, now p-type upper body-material portion 318.

When the main source/drain dopant consists of arsenic, a thermal anneal may now be performed to repair lattice damage, activate the main n-type source/drain dopant, and cause it to diffuse outward. This anneal, normally an RTA, also activates the pocket and source/drain extension dopants.

A photoresist mask 436 having openings above islands 204 and 208 is formed on dielectric layers 430 and 432 and spacers 250, 252, 330, and 332 as shown in FIG. 31*r*. P-type main source/drain dopant consisting of a boron species is ion implanted at a very heavy dosage through the uncovered section of surface dielectric 432 and into the underlying monosilicon to define (a) p++ main source portion 262M and p++ main drain portion 264M for IGFET 220 and (b) p++ main S/D portions 342M and 344M for IGFET 240. The p-type main source/drain dopant also enters precursor electrodes 288P and 368P and converts them respectively into p++ gate electrodes 288 and 368. Photoresist 436 is removed.

The portions of regions 262EP, 264EP, and 280P outside main S/D portions 262M and 264M now respectively constitute p+ source extension 262E, p+ drain extension 264E, and n+ pocket portion 280 for IGFET 220. N− upper body-material remainder 284 is the remaining lightly doped n-type material of n− upper body-material portion 278P, now n-type upper body-material portion 278. The portions of regions 342EP, 344EP, 360P, and 362P outside main S/D portions 342M and 344M now respectively constitute p+ S/D extensions 342E and 344E and n+ halo pocket portions 360 and 362 for IGFET 240. N− upper body-material remainder 364 is the remaining lightly doped n-type material of n− precursor upper body-material portion 358P, now n-type upper body-material portion 358.

A capping layer (not shown) of dielectric material, typically silicon oxide, is formed on top of the structure. The semiconductor structure is then thermally annealed to repair lattice damage and activate the implanted main p-type source/drain dopant. If the earlier anneal for activating the main n-type source/drain dopant is not performed, this final anneal activates the pocket dopants and all the source/drain dopants. The final anneal is typically an RTA.

The thin layers of dielectric material, including dielectric layers 430 and 432, are removed along the upper semiconductor surface and along the top surfaces of gate electrodes 128, 288, 328, and 368. Metal silicide layers 254, 256, 258, 294, 296, 298, 334, 336, 338, 374, 376, and 378 are respectively formed along the upper surfaces of regions 102M, 104M, 128, 262M, 264M, 288, 302M, 304M, 328, 342M, 344M, and 368. This typically entails depositing a thin layer of suitable metal, typically cobalt, on the upper surface of the structure and performing a low-temperature step to react the metal with underlying silicon. The unreacted metal is removed. A second low-temperature step is performed to complete the reaction of the metal with the underlying silicon and thereby form silicide layers 254, 256, 258, 294, 296, 298, 334, 336, 338, 374, 376, and 378. The metal silicide formation completes the basic fabrication of IGFETs 210, 220, 230, and 240. The resultant complementary-IGFET structure appears as shown in FIG. 29.

The p-type-well, p-type APT, n-type well, n-type compensating, and n-type APT implantations of FIGS. 31c-31f can generally be performed in any order. The p-type pocket, n-type pocket, n-type source/drain extension, p-type halo, p-type source/drain extension, and n-type halo implantations of FIGS. 31j-31o can generally be performed in any order. The n-type main source/drain implantation of FIG. 31q is normally performed before the p-type main source/drain implantation of FIG. 31r, particularly when the main source/drain dopant consists of arsenic. However, the p-type main source/drain implantation can sometimes be performed before the n-type main source/drain implantation.

The tilt angles for the p-type pocket, n-type pocket, p-type halo, and n-type halo implantations of FIGS. 31j, 31k, 31m, and 31o are normally at least 15°. Although typically varying from one of the angled implantations to another, the tilt angle for each angled implantation is typically 25-45°.

The complementary-IGFET structure of FIG. 30 is, except for n+ isolation layers 382 and 392 that convert IGFETs 210 and 230 respectively into IGFETs 380 and 390, typically fabricated according to substantially the same steps as the complementary-IGFET structure of FIG. 29. Isolation layers 382 and 392 are normally formed between the stages of FIGS. 31b and 31c using an additional photoresist mask having openings above islands 202 and 206. The additional photoresist mask also has openings for use in creating heavily doped n-type regions that connect isolation layers 382 and 392 to the upper semiconductor surface for receiving a suitable isolation voltage. Isolation dopant consisting of arsenic or phosphorus is ion implanted at a heavy dosage through the uncovered sections of screen oxide 402 and into the underlying monosilicon to define (a) n+ isolation layers 382 and 392 respectively for IGFETs 380 and 390 and (b) the n+ isolation-layer connection regions.

The fabrication process of FIG. 31 can be modified as described below to change asymmetric n-channel IGFET 210 from an implementation of IGFET 180 to an implementation of asymmetric n-channel IGFET 190 of FIG. 18c in which n-type S/D zones 102 and 104 respectively further include n+ lower S/D portions 102L and 104L that respectively underlie n++ main S/D portions 102M and 104M. Because lower S/D portions 102L and 104L are more lightly doped n-type than main S/D portions 102M and 104M, lower S/D portions 102L and 104L provide source/drain vertical dopant grading to further reduce source/drain parasitic capacitances as described above for IGFET 160 of FIG. 15.

This process modification begins at the stage of FIG. 31q with photoresist mask 434 in place for use in ion implanting n++ main S/D portions 102M and 104M. N-type lower source/drain dopant consisting of phosphorus or arsenic is ion implanted at a heavy dosage through the uncovered sections of surface dielectric layer 432 and into the underlying monosilicon to define n+ lower S/D portions 102L and 104L. The implantation of n+ lower S/D portions 102L and 104L can be performed before or after the implantation of n++ main S/D portions 102M and 104M.

The implantation energies for the n-type main and lower source/drain dopants are chosen such that the n-type lower source/drain dopant is of greater implantation range than the n-type main source/drain dopant. Inasmuch as both the n-type main source/drain implantation and the n-type lower source/drain implantation are performed solely through surface dielectric layer 432, the n-type lower source/drain dopant is implanted to a greater average depth below the upper semiconductor surface than the n-type main source/drain dopant With the n-type main source/drain dopant being implanted at a very heavy dosage and thus at a greater dosage than the n-type lower source/drain dopant, n+ lower S/D portions 102L and 104L are more lightly doped than, and extend deeper below the upper semiconductor surface than, n++ main S/D portions 102M and 104M.

Symmetric n-channel IGFET 230 is simultaneously converted into a variation in which n-type S/D zones 302 and 304 respectively further include a pair of lower S/D portions more lightly doped than main S/D portions 302M and 304M. As with n+ lower S/D portions 102L and 104L for the preceding variation of IGFET 210, the lower S/D portions for the variation of IGFET 230 are heavily doped n-type. If it is desired that IGFET 230 not be converted into a variation having the n+ lower S/D portions, the implantation of the n-type lower source/drain dopant can be performed with an additional photoresist mask having an opening above island 202 but not above island 206 (and also not above islands 204 and 208) after which the additional photoresist is removed.

The fabrication process of FIG. 31 can be similarly modified to change asymmetric p-channel IGFET 220 from an implementation of a p-channel version of re-channel IGFET 180V to an implementation of a p-channel version of n-channel IGFET 190V for which p-type S/D zones 262 and 264 respectively further include a pair of heavily doped p-type lower S/D portions that respectively underlie p++ main S/D portions 262M and 264M. The p+ lower S/D portions provide source/drain vertical dopant grading to further reduce source/drain parasitic capacitances analogous to that described above for IGFET 160 of FIG. 15.

This additional process modification begins at the stage of FIG. 31r with photoresist mask 436 in place for use in ion implanting p++ main S/D portions 262M and 264M. P-type lower source/drain dopant consisting of a boron species is ion implanted at a heavy dosage through the uncovered sections of surface dielectric layer 432 and into the underlying monosilicon to define the two p+ lower S/D portions for the variation of IGFET 220. The p+ lower source/drain implantation can be performed before or after the p++ main source/drain implantation. In one example, the p-type lower source/drain dopant consists of elemental boron while the p-type main source/drain dopant consists of boron difluoride.

The implantation energies for the p-type main and lower source/drain dopants are chosen such that the p-type lower source/drain dopant is of greater implantation range than the p-type main source/drain dopant. With both the p-type main source/drain implantation and the p-type lower source/drain implantation being performed solely through surface dielectric layer 432, the p-type lower source/drain dopant is implanted to a greater average depth below the upper semiconductor surface than the p-type main source/drain dopant Since the p-type main source/drain dopant is implanted at a very heavy dosage and thus a greater dosage than the p-type lower source/drain dopant, the p+ lower S/D portions for the variation of IGFET 220 are more lightly doped than, and extend deeper below the upper semiconductor surface than, p++ main S/D portions 262M and 264M.

Symmetric p-channel IGFET 240 is simultaneously converted into a variation in which p-type S/D zones 362 and 364 respectively further include a pair of lower S/D portions more lightly doped than main S/D portions 362M and 364M. As with the p+ lower S/D portions for the variation of IGFET 220, the lower S/D portions for the variation of IGFET 240 are heavily doped p-type. If IGFET 240 is not to be converted into a variation having the lower S/D portions, the p-type lower source/drain implantation can be performed with an additional photoresist mask having an opening above island 204 but not above island 208 (and also not above islands 202 and 206) after which the additional photoresist is removed.

Fabrication Process Variations that Avoid N-Type Compensating Implant

Figure 32A:
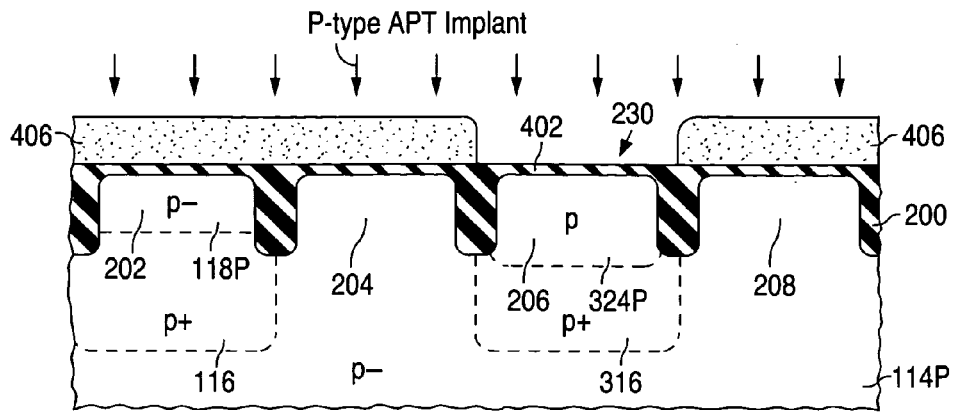
Figure 32B:
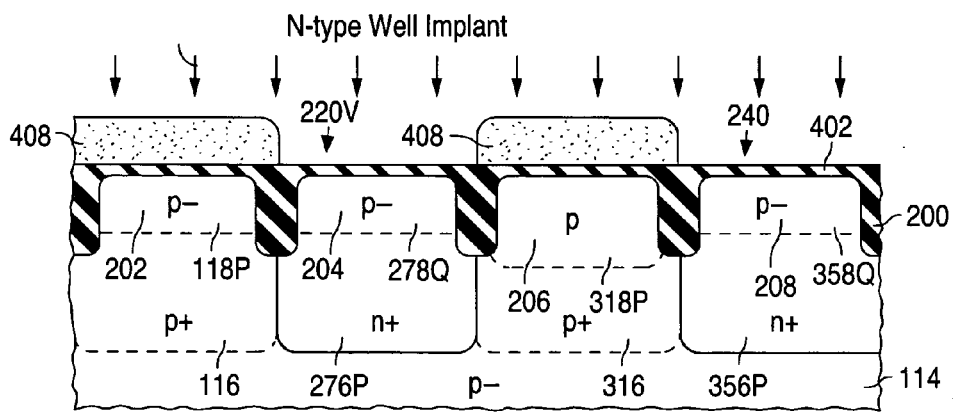
Figure 32C:
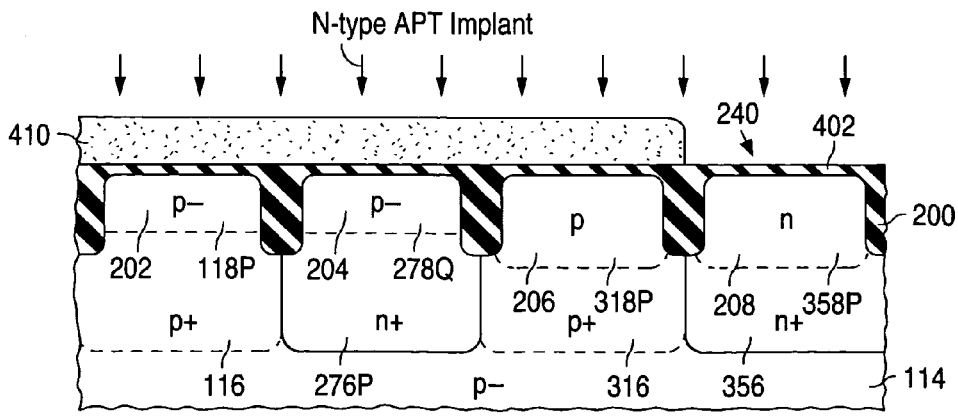

FIGS. 32a-32c (collectively "FIG. 32") illustrate an alternative, in accordance with the invention, to the step of FIG. 31e for manufacturing a variation of the complementary-IGFET semiconductor structure of FIG. 29. The use of an n-type compensating implant into island 204 (and island 208) is avoided in the fabrication process of FIG. 31 as modified to incorporate the alternative of FIG. 32. As a result, the complementary-IGFET structure fabricated by using the alternative of FIG. 32 contains a variation 220V of asymmetric p-channel IGFET 220.

The process alternative of FIG. 32 begins with the structure of FIG. 31d repeated here as FIG. 32a. The n-type well doping step described above in connection with FIG. 31e is performed on the structure of FIG. 32a. In particular, photoresist mask 408 is formed on screen oxide 402 as shown in FIG. 32b. Photoresist mask 408 again has openings above islands 204 and 208. The n-type well dopant, again consisting of phosphorus or arsenic, is ion implanted at a heavy dosage and a high energy through the uncovered sections of screen oxide 402 and into the underlying monosilicon to define (a) a precursor n+ well portion 276P for asymmetric p-channel IGFET 220V and (b) n+ precursor well portion 356P for symmetric p-channel IGFET 240.

The n-type compensating implantation into island 204 (and island 208) with photoresist 408 in place is not performed at this point. Instead, photoresist 408 is simply removed. After removal of photoresist 408, a lightly doped p-type portion 278Q of island 204 for IGFET 220V is present above precursor n+ well portion 276P. A lightly doped p-type portion 358Q of island 208 for IGFET 240 is similarly present above precursor n+ well portion 356P.

The alternative of FIG. 32 continues with the formation of photoresist mask 410 on screen oxide 402. See FIG. 32c. Photoresist 410 again has an opening above island 208. The n-type APT dopant, again consisting of phosphorus or arsenic, is ion implanted at a moderate dosage through the uncovered section of screen oxide 402 and into the underlying monosilicon to define n precursor upper body-material portion 358P for IGFET 240. Photoresist 410 is removed.

The n-type APT dopant implanted into island 208 converts all of p– portion 358Q of island 208 to n-type conductivity. Consequently, p– portion 358Q disappears. Inasmuch as no significant amount of the n-type APT dopant enters island 204, p– portion 278Q of island 204 is still present at this stage of fabrication.

The structure of FIG. 32c is further processed according to the fabrication steps described above in connection with FIGS. 31g-31o, 31p.1-31r.1, and 31p.2-31r.2, including the associated annealing operations. Some of these further steps are performed at elevated temperatures, again temperatures significantly greater than room temperature. During the elevated-temperature steps, part of the n-type well dopant used to define precursor n+ well portion 276P for IGFET 220V diffuses upward into p– portion 278Q. The upward-diffused part of the n-type well dopant becomes distributed throughout island 204 in such a manner that all of its p– material not significantly subjected to p-type or/and n-type doping subsequent to the n-type well doping step is converted to n-type conductivity by the end of the fabrication. Subject to being doped n-type somewhat more lightly than n-type upper body-material portion 278 fabricated fully according to the basic fabrication process of FIG. 31, p– portion 278Q largely becomes n-type upper body-material portion 278 in the complementary-IGFET structure made according to the fabrication process of FIG. 31 as modified to employ the alternative of FIG. 32. N– upper body-material remainder 284 is again the remaining lightly doped n-type material of n-type body-material portion 278.

Figure 34:
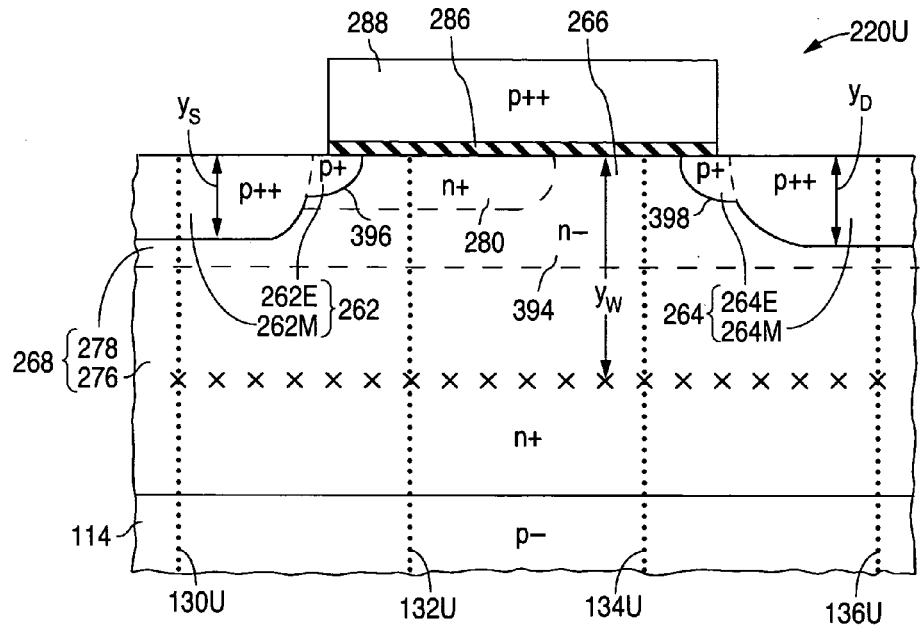
FIG. 34 is a front cross-sectional view of an asymmetric long p-channel IGFET configured according to the invention so as to have a semiconductor well portion of opposite conductivity type to directly underlying semiconductor material and fabricated according to the invention without using a compensatory n-type dopant implantation into semiconductor material above the well portion as initially defined. The asymmetric p-channel IGFET fabricated according to the process of FIGS. 31a-31o, 31p.1-31r.1, and 31p.2-31r.2 using the alternative steps of FIGS. 32a-32c

The complementary-IGFET structure made according to the fabrication process of FIG. 31 as modified to incorporate the alternative of FIG. 32 appears largely as shown in FIG. 29. A generalized version of asymmetric p-channel IGFET 220V made by using the alternative of FIG. 32 is depicted in FIG. 34 discussed below.

FIGS. 33a-33f (collectively "FIG. 33") illustrate an alternative, in accordance with the invention, to the steps of FIGS. 31c-31f for manufacturing a variation of the complementary-IGFET semiconductor structure of FIG. 29. As with the alternative of FIG. 32, the alternative of FIG. 33 avoids the use of an n-type compensating implant into island 204 (and island 208). Consequently, the complementary-IGFET structure fabricated according to the process of FIG. 31 as modified to incorporate the alternative of FIG. 33 contains asymmetric p-channel IGFET 220V in place of IGFET 220.

Figure 33A:
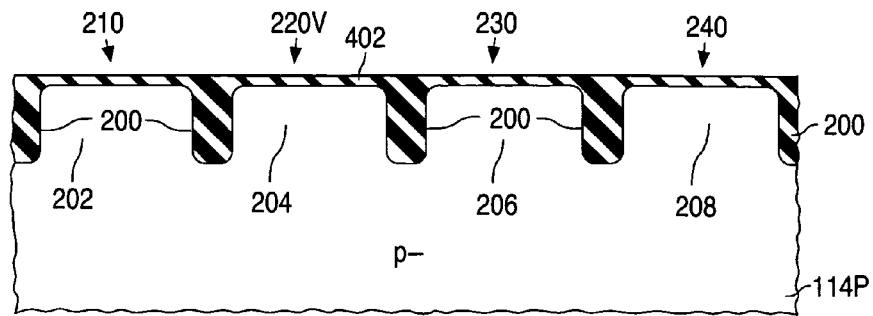

The process alternative of FIG. 33 begins with the structure of FIG. 31b repeated as FIG. 33a. Screen oxide layer 402 has been formed along the upper surface of epitaxial layer 114P at the stage of FIG. 33a. However, no ion implantation into any of islands 202, 204, 206, and 208 has yet been made.

Figure 33B:
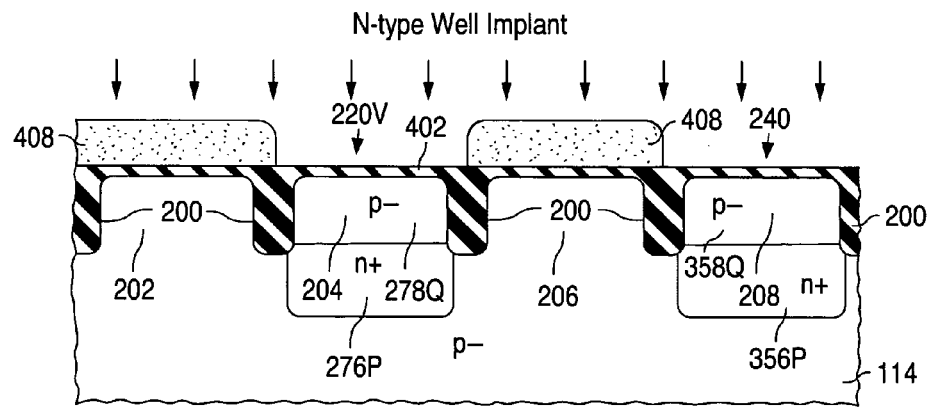

Photoresist mask 408 having openings above islands 204 and 208 is formed on screen oxide 402 as shown in FIG. 33b. The n-type well dopant, once again consisting of phosphorus or arsenic, is ion implanted at a heavy dosage and a high energy through the uncovered sections of screen oxide 402 and into the underlying monosilicon to define (a) precursor n+ well portion 276P for IGFET 220V and (b) n+ precursor well portion 356P for IGFET 240. Photoresist 408 is removed. After removal of photoresist 408, p– portion 278Q of island 204 for IGFET 220V is present above precursor n+ well portion 276P. P– portion 358Q of island 208 for IGFET 240 is similarly present above precursor n+ well portion 356P.

Figure 33C:
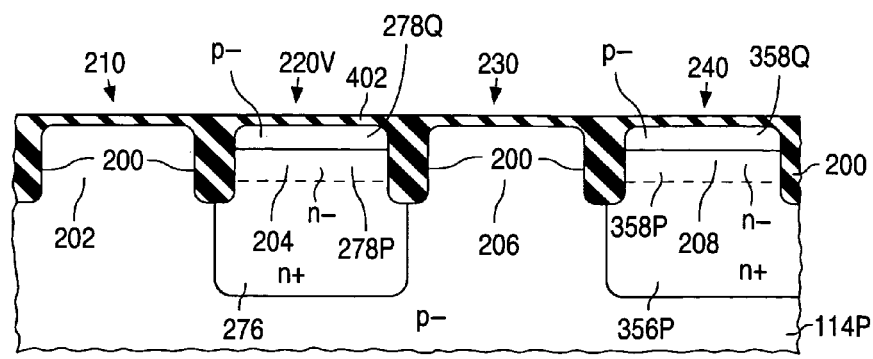
Figure 33D:
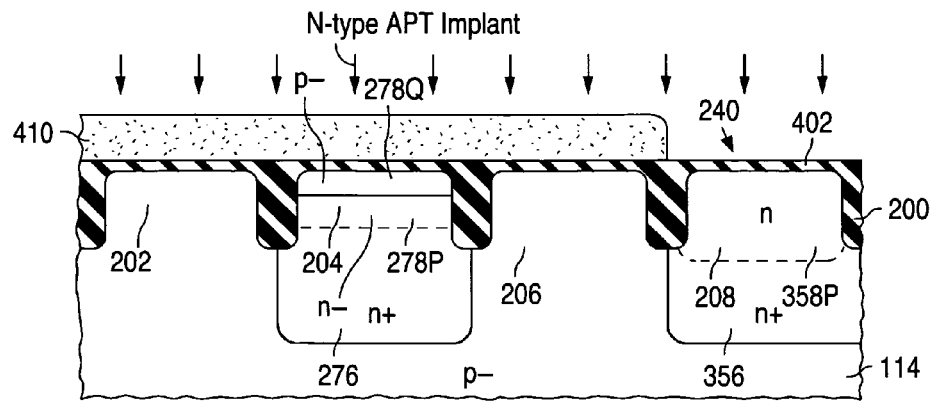

A thermal anneal, preferably an RTA, is normally performed on the resultant semiconductor structure at this point to repair lattice damage and place the atoms of the implanted n-type well dopant in energetically more stable states. See FIG. 33c. During the anneal, part of the n-type well dopant used to define precursor n+ well portion 276P for IGFET 220V diffuses upward into p– portion 278Q. Part of the n-type well dopant used to define precursor n+ well portion 356P for IGFET 240 similarly diffuses upward into p− portion 358Q. The upward diffusion of these parts of the n-type well dopant is typically sufficient to convert respective lower parts of p− portions 278Q and 358Q to n-type conductivity. The so-converted lower parts of p− portions 278Q and 358Q are respectively labeled as precursor n− upper body-material portions 278P and 358P in FIG. 33c. Due to the formation of precursor n− body-material portions 278P and 358P, p− portions 278Q and 358Q shrink vertically in size as generally indicated in FIG. 33c.

As described further below, more of the n-type well dopant used to define precursor n+ well portion 276P diffuses upward into p− portion 278Q during later steps in the fabrication process of FIG. 31 as modified to employ the alternative of FIG. 33. Similar to what occurs in the alternative of FIG. 32, the total upward-diffused part of the n-type well dopant in the alternative of FIG. 33 becomes distributed throughout island 204 in such a manner that all of its p− material not significantly subjected to p-type or/and n-type doping subsequent to the n-type well doping step is converted to n-type conductivity by the end of the fabrication. Importantly, the partial upward diffusion of the n-type well dopant to define precursor n− upper body-material portion 278P as it exists at the stage of FIG. 33c occurs without affecting the p-type well dopant or any of the APT, pocket, halo, and source/drain dopants because the steps for introducing those dopants into the semiconductor structure have not yet been performed. Hence, performing the n-type well implantation at this point in the fabrication process helps ensure that all of the p− material of island 204 not subjected to other (later) p-type or/and n-type doping is eventually converted to n-type conductivity without causing undesirable diffusion of the p-type well dopant or any of the APT, pocket, halo, and source/drain dopants.

Photoresist mask 410 is formed on screen oxide 402. See FIG. 33d. Photoresist 410 once again has an opening above island 208. The n-type APT dopant, which consists of phosphorus or arsenic, is ion implanted at a moderate dosage through the uncovered section of screen oxide 402 and into the underlying monosilicon to define precursor upper body-material portion 358P for IGFET 240. The n-type APT dopant implanted into island 208 converts all of p− portion 358Q of island 208 to n-type conductivity, thereby causing p− portion 358Q to disappear. Photoresist 410 is removed.

Figure 33E:
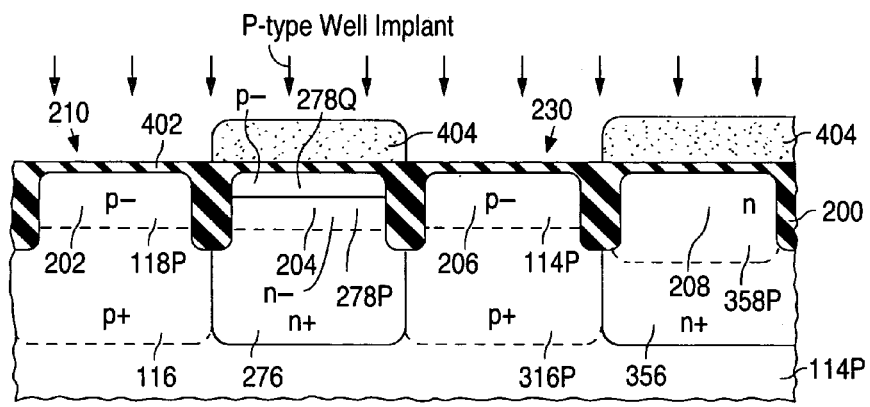

Photoresist mask 404 is formed on screen oxide layer 402 as shown in FIG. 33e. Photoresist 404 again has openings above islands 202 and 206. The p-type well dopant, which consists of a boron species, is ion implanted at a heavy dosage and a high energy through the uncovered sections of screen oxide 402 and into the underlying monosilicon to define (a) p+ well portion 116 for IGFET 210 and (b) p+ precursor well portion 316P for IGFET 230. The portion of epitaxial layer 114P above well portion 116 again constitutes p− precursor upper body-material portion 118P for IGFET 210. Photoresist 404 is removed.

Photoresist mask 406 is formed on screen oxide 402. See FIG. 33f. Photoresist 406 again has an opening above island 206. The p-type APT dopant, which consists of a boron species, is ion implanted at a moderate dosage through the uncovered section of screen oxide 402 and into the underlying monosilicon to define p precursor upper body-material portion 324P for IGFET 230. Photoresist 406 is removed.

Figure 33F:
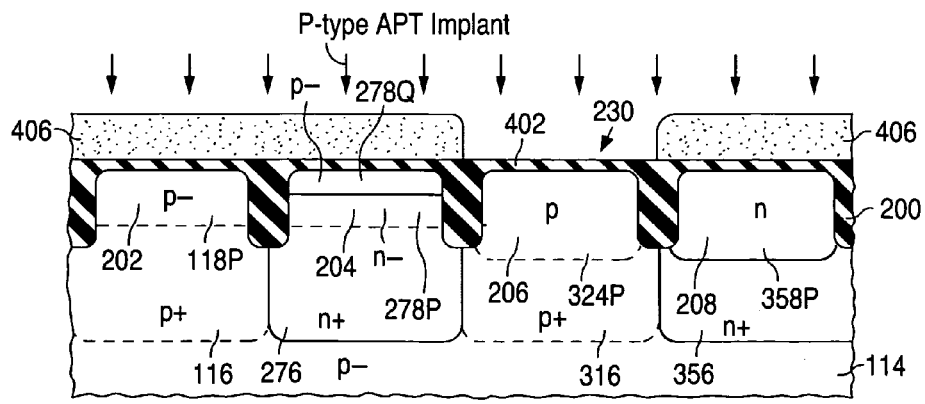

The structure of FIG. 33f is further processed according to the fabrication steps described above in connection with FIGS. 31g-31o, 31p.1-31r.1, and 31p.2-31r.2, including the associated annealing operations. During later elevated-temperature steps, more of the n-type well dopant used to define precursor n+ well portion 276P for IGFET 220V diffuses upward into p− portion 278Q of island 204 until all of the island's p− material not subjected to other p-type or/and n-type doping during the fabrication process is converted to n-type conductivity. Subject to being doped n-type somewhat more lightly than n-type upper body-material portion 278 fabricated fully according to the basic fabrication process of FIG. 31, p− portion 278Q largely becomes n-type upper body-material portion 278 in the complementary-IGFET structure made according to the fabrication process of FIG. 31 as modified to utilize the alternative of FIG. 33. N− upper body-material remainder 284 once again is the remaining lightly doped n-type material of n-type body-material portion 278.

The complementary-IGFET structure made according to the fabrication process of FIG. 31 using the alternative of FIG. 33 appears largely as shown in FIG. 29. The p-channel IGFET depicted in FIG. 34 discussed below is also a generalized version of IGFET 220V made by using the alternative of FIG. 33.

The semiconductor portions of p-channel IGFET 220V are, as described above, created from the lightly doped p-type material of island 204. In order to assure that all of the island's p− material not subjected to p-type or/and n-type doping other than the n-type well doping during the fabrication process is converted to n-type conductivity by the end of the fabrication, the concentration of the n-type well dopant along the upper surface of island 204 at the end of the fabrication must exceed the initial concentration of the p-type dopant in island 204. Since island 204 is formed from part of p− epitaxial layer 114P (or a p-type substrate lightly doped substantially the same as epitaxial layer 114P), the upper-surface concentration of the n-type well dopant in island 204 at the end of fabrication must exceed the p-type background dopant concentration in epitaxial layer 114P.

The doping and thermal processing conditions in one implementation of the fabrication process of FIG. 31 as modified to incorporate the alternative of FIG. 32 or 33 are chosen such that the concentration of the n-type well dopant along the upper surface of island 204 at the end of fabrication is expected to be at least twice the p-type background dopant concentration in epitaxial layer 114P. Choosing the doping and thermal processing conditions in this way makes it highly probable that the upper-surface concentration of the n-type well dopant in island 204 at the end of fabrication will actually exceed the p-type background dopant concentration in epitaxial layer 114P in view of typical fabrication process variations. So choosing the doping and thermal processing conditions may entail changing the p-type background dopant concentration in epitaxial layer 114P from what is described above or/and changing the n-type well doping conditions from what is described above. Such changes are further dealt with below in connection with FIGS. 35a-35c, 36a-36c, 37a-37c, and 38a-38c.

Channel zone 266 of p-channel IGFET 220V is normally asymmetrically longitudinally dopant graded similar to, and typically somewhat stronger (greater) than, that described above for p-channel IGFET 220. Subject to reversal of the conductivity types, the asymmetric longitudinal grading in channel zone 266 of IGFET 220V is thus similar to, and typically somewhat stronger than, that described above for IGFETs 180V and 150V.

P-channel IGFET 220V typically has a hypoabrupt vertical dopant profile below drain 264 similar to, but somewhat weaker than, that described above for p-channel IGFET 220. In particular, the concentration of the total n-type dopant in the portion of body material 268 below drain 264 of IGFET 220V decreases by at least a factor of 10, typically a factor in the vicinity of 15, in moving from the subsurface location of the maximum concentration of the n-type dopant in well portion 276 vertically up to drain 264 with the location of the maximum concentration of the n-type dopant in well portion 276 being no more than 10 times, normally no more than 5 times, deeper below the upper semiconductor surface than drain 264. Again subject to reversal of the conductivity types, the hypoabrupt vertical dopant profile below drain 262 of IGFET 220V is therefore typically similar to, but somewhat weaker than, that described above for n-channel IGFETs 180V and 100V. For the reasons discussed below in connection with FIGS. 38a-38c, the hypoabrupt vertical dopant profile below drain 264 of IGFET 220V enables it to have increased analog speed.

In an alternative process embodiment, the p-type background dopant concentration in epitaxial layer 114P, the n-type well doping conditions, and the subsequent thermal processing conditions are adjusted such that the concentration of the total n-type dopant in the portion of body material 268 below drain 264 of IGFET 220V decreases by less than a factor of 10 in moving from the subsurface location of the maximum concentration of the n-type dopant in well portion 276 vertically up to drain 264. Although the resulting analog speed may not be as great as when the vertical dopant profile below drain 264 of IGFET 220V is hypoabrupt, fabricating IGFET 220V according to this process embodiment still simplifies the fabrication process and reduces manufacturing cost.

Asymmetric p-channel IGFET 220V can replace IGFET 220 in the complementary-IGFET semiconductor structure of FIG. 30. Except for n+ isolation layers 382 and 392 that convert IGFETs 210 and 230 respectively into IGFETs 380 and 390, the so-modified version of the complementary-IGFET structure of FIG. 30 is typically fabricated substantially according to the process of FIG. 31 as modified to incorporate the alternative of FIG. 32 or 33. In employing the alternative of FIG. 32, isolation layers 382 and 392 are again normally formed between the stages of FIGS. 31b and 31c using the above-mentioned additional photoresist mask having openings above islands 202 and 206. When the alternative of FIG. 33 is employed, isolation layers 382 and 392 are formed between the stages of FIGS. 33a and 33b in the same way as in the alternative of FIG. 32. Isolation dopant diffusion which occurs during the thermal anneal performed directly after the n-type well implantation in using the alternative of FIG. 33 normally has substantially no damaging effect on the resultant complementary-IGFET structure.

In using the alternative of FIG. 32 or 33, the additional photoresist mask again also has openings for use in creating heavily doped n-type regions that connect isolation layers 382 and 392 to the upper semiconductor surface for receiving the isolation voltage. The isolation dopant, which consists of arsenic or phosphorus, is ion implanted at a heavy dosage through the uncovered sections of screen oxide 402 and into the underlying monosilicon to define (a) n+ isolation layers 382 and 392 respectively for IGFETs 380 and 390 and (b) the n+ isolation-layer connection regions.

P-Channel IGFETs Having Hypoabrupt Vertical Body-Material Dopant Profile Below Drain Due to Subsurface Maximum in Well Dopant Concentration but Avoiding N-Type Compensating Implant FIG. 34 illustrates, in accordance with the invention, a generalized version 220U of asymmetric p-channel IGFET 220V in which n+ well portion 276 is of opposite conductivity type to directly underlying p– semiconductor-material portion 114. Asymmetric p-channel IGFET 220U is of IGFET characteristics that arise from being fabricated according to the invention without using the compensatory n-type dopant implantation into the p-type portion of island 204 situated directly above n+ well portion 276 as initially defined by ion implantation of the n-type well dopant. In essence, IGFET 220V fabricated according to the process of FIG. 31 as modified to incorporate the alternative of FIG. 32 or 33 is an implementation of IGFET 220U.

P-channel IGFET 220U consists of two-part p-type source 262, two-part p-type drain 264, n-type body material 268, gate dielectric layer 286, and gate electrode 288. N-type body material 268 is again formed with n+ well portion 276 and n-type upper body-material portion 278 consisting of n+ source-side pocket portion 280 and an n-type body-material remainder 394. N-type channel zone 266 of n-type upper body-material portion 278 similarly again laterally separates n-type S/D zones 262 and 264. Components 262, 264, 266, 268, 276, 278, 280, 286, and 288 of IGFET 220U are configured and doped largely the same as in IGFET 220V.

Item 396 in FIG. 34 indicates the pn junction between source 262 and body material 268. Item 398 indicates the pn junction between drain 264 and body material 268. Analogous to the n-channel IGFETs, items $y_S$ and $y_D$ indicate the depths to which source 262 and drain 264 of p-channel IGFET 220U respectively extend below the upper semiconductor surface.

N-type upper body-material remainder 394 of IGFET 220U is, for simplicity, labeled "n–" in FIG. 34 analogous to how n-type upper body-material remainder 284 of IGFET 220 is identified by the label "n–" herein. In fabricating IGFET 220U according to the process of FIG. 31 as modified to incorporate the alternative of FIG. 32 or 33, upper body-material remainder 394 normally receives n-type dopant substantially only by updiffusion from underlying n+ well portion 276. As explained further below in connection with FIGS. 37a-37c, the n-type dopant concentration in body-material remainder 394 normally progressively decreases in going from well portion 276 up to the upper semiconductor surface. Since well portion 276 is heavily doped n-type, body-material remainder 394 can alternatively be pictorially viewed as consisting of a lightly doped n-type surface-adjoining part and a moderately doped n-type intermediate part situated between n+ well portion 276 and the lightly doped n-type surface-adjoining part.

Figure 36A:
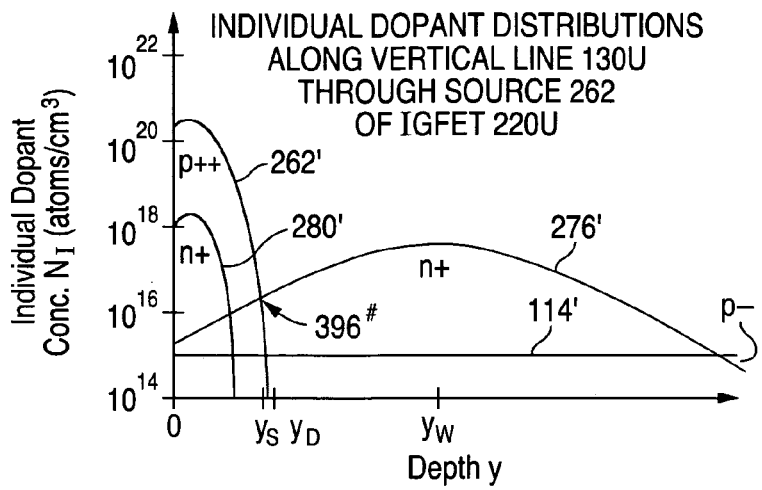
FIGS. 36a-36c are respective graphs of individual, absolute, and net dopant concentrations as a function of depth along a vertical line through the source of the IGFET of FIG. 34.
Figure 36B:
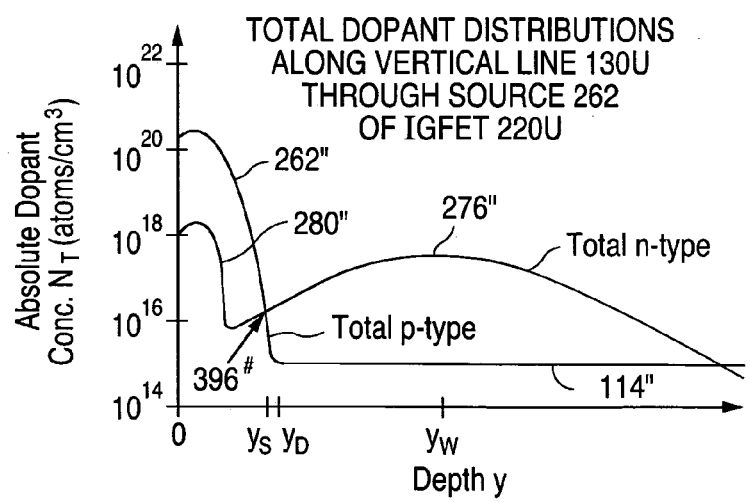
Figure 36C:
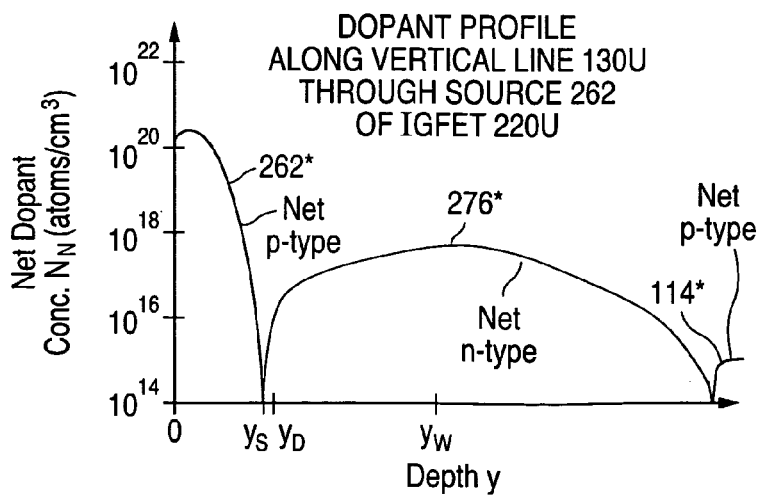
Figure 37A:
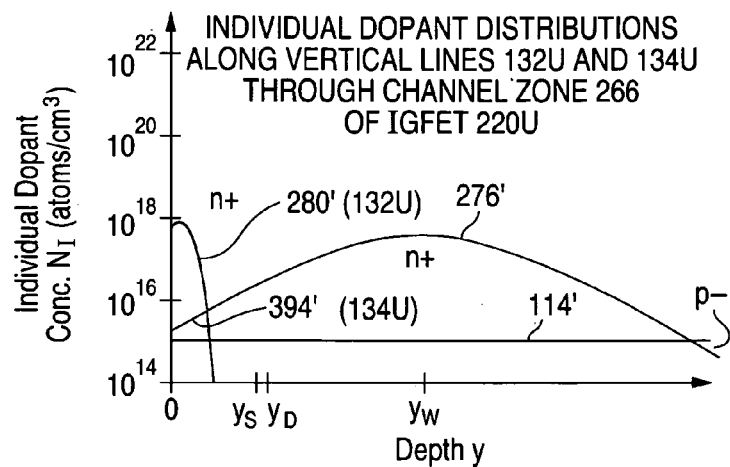
FIGS. 37a-37c are respective graphs of individual, absolute, and net dopant concentrations as a function of depth along a pair of vertical lines through the channel zone of the IGFET of FIG. 34.
Figure 37B:
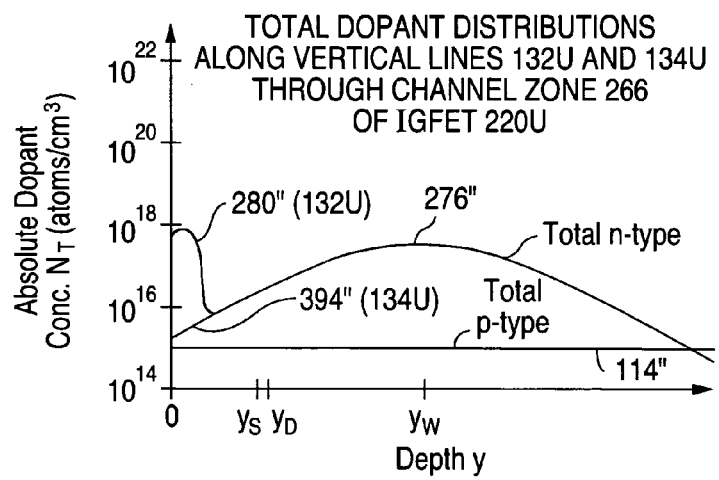
Figure 37C:
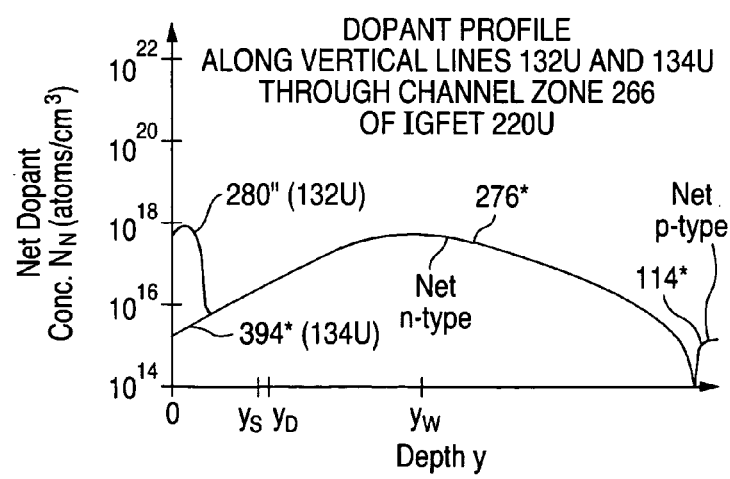
Figure 38A:
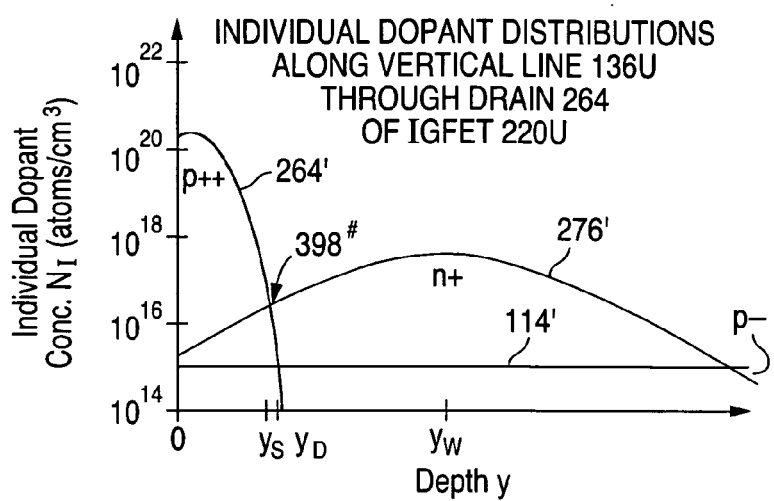
FIGS. 38a-38c are respective graphs of individual, absolute, and net dopant concentrations as a function of depth along a vertical line through the drain of the IGFET of FIG. 34.
Figure 38B:
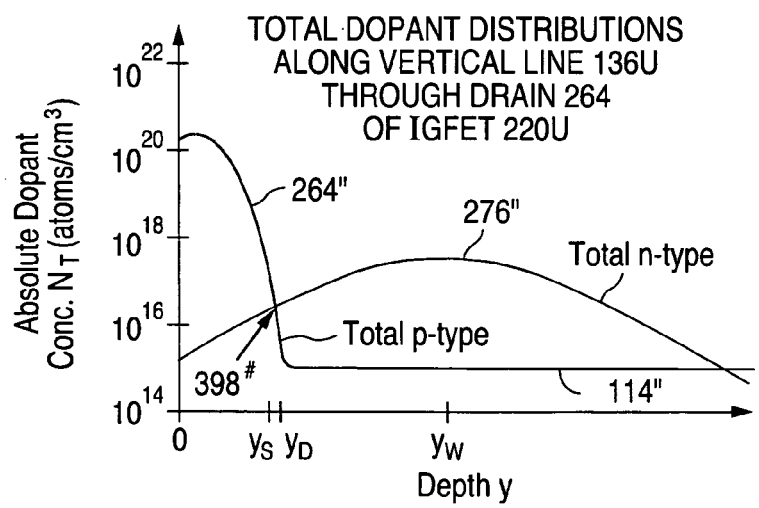
Figure 38C:
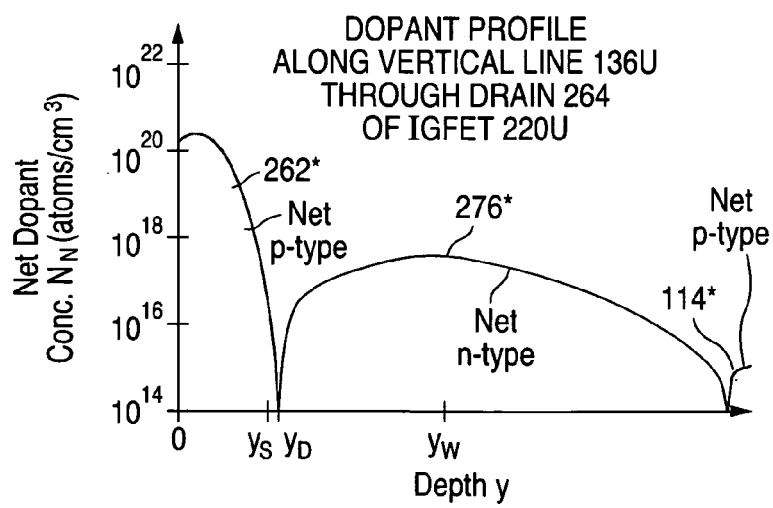

An understanding of the doping characteristics of IGFET 220U is facilitated with the assistance of FIGS. 35a-35c (collectively "FIG. 35"), FIGS. 36a-36c (collectively "FIG. 36"), FIGS. 37a-37c (collectively "FIG. 37"), and FIGS. 38a-38c (collectively "FIG. 38"). FIG. 35 presents exemplary dopant concentrations along the upper semiconductor surface as a function of longitudinal distance x. Exemplary dopant concentrations as a function of depth y along a vertical line 130U through source 262 are presented in FIG. 36. FIG. 37 presents exemplary dopant concentrations as a function of depth y along a pair of vertical lines 132U and 134U through channel zone 266. Vertical line 132U passes through source-side pocket portion 280. Vertical line 134U passes through a vertical location between pocket portion 280 and drain 264. Exemplary dopant concentrations as a function of depth y along a vertical line 136U through drain 264 are presented in FIG. 38. Vertical lines 130U, 132U, 134U, and 136U for p-channel IGFET 220U respectively correspond to vertical lines 130, 132, 134, and 136 for the n-channel IGFETs of the invention.

Figure 35A:
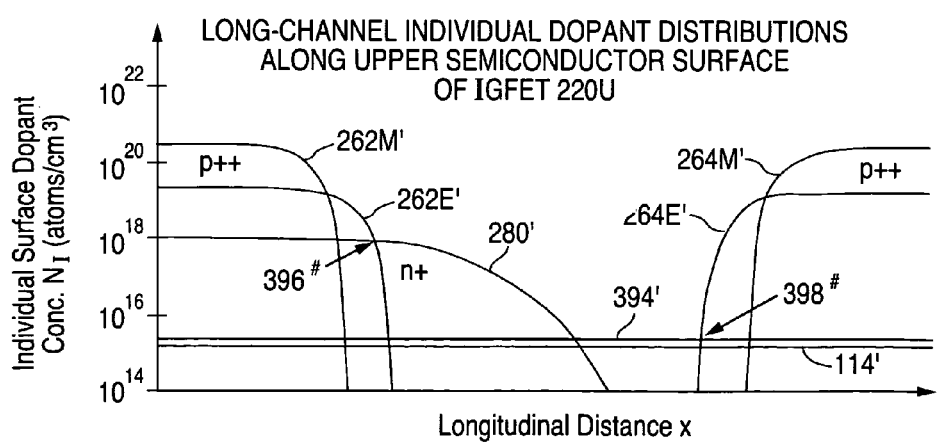
FIGS. 35a-35c are respective graphs of individual, absolute, and net dopant concentrations as a function of longitudinal distance along the upper semiconductor surface for the IGFET of FIG. 34.

FIG. 35a illustrates concentrations $N_I$, along the upper semiconductor surface, of the individual semiconductor dopants that largely define regions 262, 264, 280, and 394 and thus establish the longitudinal dopant grading of channel zone 266. FIGS. 36a, 37a, and 38a illustrate concentrations $N_I$, along vertical lines 130U, 132U, 134U, and 136U, of the individual semiconductor dopants that vertically define regions 114, 262, 264, 276, 280, and 394 and thus establish a hypoabrupt vertical dopant profile in the portion of body material 268 underlying drain 264. Curves 262' and 264' represent concentrations $N_I$ (surface and vertical) of the p-type dopant used to respectively form source 262 and drain 264. Curves 276', 280', and 394' represent concentrations $N_I$ (surface and/or vertical,) of the n-type dopants used to respectively form regions 276, 280, and 394. Items 396$^\#$ and 398$^\#$ indicate where net dopant concentration $N_N$ goes to zero and thus respectively indicate the locations of pn junctions 396 and 398.

Figure 35B:
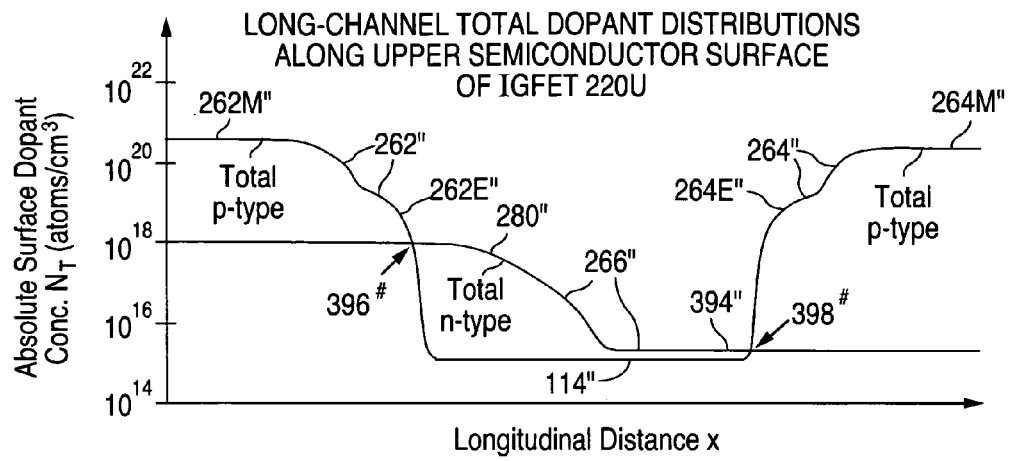

Concentrations $N_T$ of the total p-type and total n-type dopants in regions 262, 264, 280, and 394 along the upper semiconductor surface are shown in FIG. 35b. FIGS. 36b, 37b, and 38b depict, along vertical lines 130U, 132U, 134U, and 136U, concentrations $N_T$ of the total p-type and total n-type-dopants in regions 114, 262, 264, 276, 280, and 394. Curve segments 276", 280", and 394" respectively corresponding to regions 276, 280, and 394 represent total concentrations $N_T$ of the n-type dopant. Item 266" in FIG. 35b corresponds to channel zone 266 and represents the channel-zone portions of curve segments 280" and 394". Total concentrations $N_T$ of the p-type dopant are represented by curves 262" and 264" respectively corresponding to source 262 and drain 264.

Figure 35C:
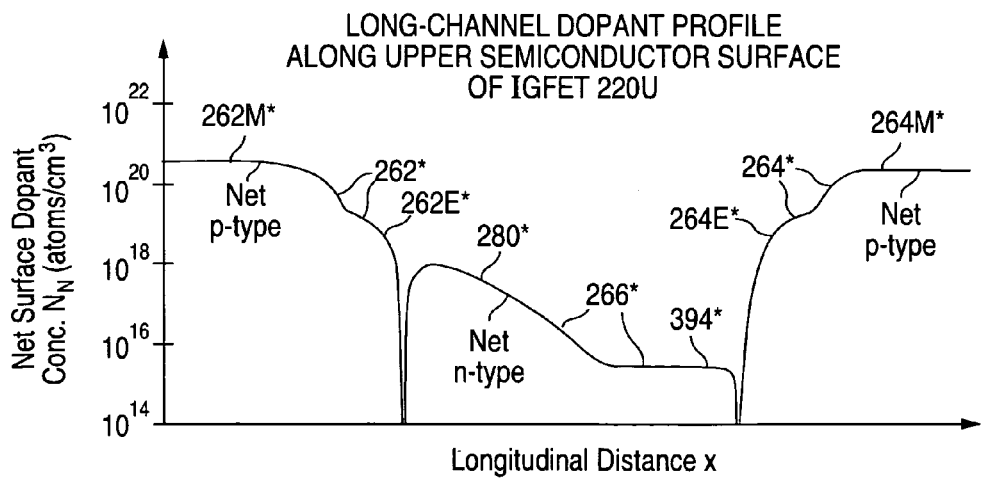

FIG. 35c illustrates net dopant concentration $N_N$ along the upper semiconductor surface. Net dopant concentration $N_N$ along vertical lines 130U, 132U, 134U, and 136U is presented in FIGS. 36c, 37c, and 38c. Curve segments 276*, 280*, and 394* represent net concentrations $N_N$ of the n-type dopant in respective regions 276, 280, and 394. Item 266* in FIG. 35c represents the combination of channel-zone curve segments 280* and 394* and thus presents concentration $N_N$ of the net n-type dopant in channel zone 266. Concentrations $N_N$ of the net p-type dopant in source 262 and drain 264 are respectively represented by curves 262* and 264*.

The upper-surface dopant distributions shown in FIG. 35 for p-channel IGFET 220U are respectively substantially the same as the upper-surface dopant distributions shown in FIG. 26 for n-channel IGFET 180V except that (a) the background p-type dopant concentration for p– lower portion 114, as indicated by curve 114' in FIG. 35a, is less than the background n-type dopant concentration for n– lower portion 192, as indicated by item 192' in FIG. 26a, and (b) the upper-surface dopant concentration for n– upper body-material remainder 394, as indicated by items 394', 394", and 394* in FIG. 35, is less than the upper-surface dopant concentration for p– upper body-material remainder 198, as indicated by items 198', 198", and 198* in FIG. 26. P-channel IGFET 220U is, nonetheless, configured similarly to n-channel IGFET 180V. Hence, the comments made above about the upper-surface dopant distributions shown in FIG. 26 for n-channel IGFET 180V apply largely to the upper-surface dopant distributions shown in FIG. 35 for p-channel IGFET 220U subject to changing regions 102, 102M, 102E, 104, 104M, 104E, 106, 120, 192, and 198 for IGFET 180V respectively to regions 262, 262M, 262E, 264, 264M, 264E, 266, 280, 114, and 394 for IGFET 220U and subject to the indicated dopant concentration differences.

Next consider FIG. 37 dealing with dopant concentrations $N_I$, $N_T$, and $N_N$ along vertical lines 132U and 134U through channel zone 266 of p-channel IGFET 220U. The parenthetical entry "132U" after each of reference symbols 280', 280", and 280* indicates dopant concentrations along vertical line 132U. The parenthetical entry "134U" after each of reference symbols 394', 394", and 394* indicates dopant concentrations along vertical line 134U. The n-type dopant in n+ pocket portion 280 consists of (a) a major portion constituted by the n-type pocket dopant, indicated by dopant concentration curve 280' in FIG. 37a, and (b) a minor portion constituted by an updiffused part of the n-type well dopant, indicated by dopant concentration curve 276' in FIG. 37a. The n-type dopant in n– upper body-material remainder 394 consists substantially solely of an updiffused part of the n-type well dopant. Concentration $N_I$ of the updiffused part of the n-type well dopant in n– body-material remainder 394 is indicated by portion 394' of n-type well dopant concentration curve 276' in FIG. 37a. Portions 394" and 394* of respective dopant concentration curves 276" and 276* in FIGS. 37b and 37c similarly respectively indicate total dopant concentration $N_T$ and net dopant concentration $N_N$ in n– body-material remainder 394.

With source-side pocket portion 280 of IGFET 220U being heavily doped n-type and with the n-type doping of n– upper body-material remainder 394 being provided substantially only by updiffusion from n+ well portion 276, the lowest n-type dopant concentration in channel zone 266 occurs in n– body-material remainder 394 along or close to its upper surface depending on whether any significant amount of the undiffused portion of the n-type well dopant piles up along the upper surface of remainder 394. FIG. 37 illustrates an example in which there is no significant n-type well dopant pile-up along the upper surface of n– body-material remainder 394.

As mentioned above in connection with the fabrication of p-channel IGFET 220V whose semiconductor portions are created in island 204 formed from part of p– epitaxial layer 114P (or a p-type substrate lightly doped substantially the same as epitaxial layer 114P), the concentration of the n-type well dopant along the upper surface of island 204 at the end of fabrication must exceed the p-type background dopant concentration in epitaxial layer 114P. Upon being applied to IGFET 220U, this fabrication doping requirement converts into the structural doping requirement that concentration $N_I$ of the n-type well dopant along the upper surface of channel zone 266, specifically the upper surface of n– upper body-material remainder 394, exceed concentration $N_I$ of the p-type background dopant in p-lower portion 114. The desirable fabrication objective that the doping and thermal processing conditions be chosen such that the upper-surface concentration of the n-type well dopant in island 204 at the end of fabrication of IGFET 220V is expected to be at least twice the p-type background dopant concentration in epitaxial layer 114P similarly converts into the structural doping requirement that concentration $N_I$ of the n-type well dopant along the upper surface of n-body-material remainder 394 be at least twice concentration $N_I$ of the p-type background dopant.

FIGS. 35-38 depict an example in which n-type well dopant concentration $N_I$, as indicated by curve segment 394' in FIGS. 35a and 37a, along the upper surface of n-body-material remainder 394 is approximately twice p-type background dopant concentration $N_I$, as indicated by curve 114' in FIGS. 35a and 37a, of p– lower region 114. Hence, the example of FIGS. 35-38 satisfies the specific structural doping requirement that concentration $N_I$ of the n-type well dopant along the upper surface of n-body-material remainder 394 be at least twice concentration $N_I$ of the p-type background dopant.

Concentration $N_I$ of the p-type background dopant is approximately $1 \times 10^{15}$ atoms/cm$^3$ in the example of FIGS. 35-38. This is the lower limit of the range of $1 \times 10^{15}$-$1 \times 10^{16}$ atoms/cm$^3$ given above for the p-type background dopant concentration. However, in using the alternative of FIG. 32 or 33 to implement IGFET 220U as IGFET 220V, the lower limit of the range for the p-type background dopant concentration is shifted downward to $5 \times 10^{14}$ atoms/cm$^3$ or less. For island 204 used to create IGFET 220V, this provides more flexibility in assuring that that all of the island's p− material not subjected to p-type or/and n-type doping other than the n-type well doping during the fabrication process is converted to n-type conductivity by the end of fabrication.

Concentration $N_I$ of the n-type well dopant in IGFET 220U reaches a maximum value at depth $y_W$ below the upper semiconductor surface. The total n-type dopant in the portions of body material 268 below source 262 and drain 264 of IGFET 220U consists solely of the n-type well dopant as indicated by curve 276' in FIGS. 36a and 38a. Consequently, concentration $N_T$ of the total n-type dopant in the portions of p-body material 268 below source 262 and drain 264 of IGFET 220U reaches a maximum value at depth $y_W$ as indicated by curve 276" in FIGS. 36b and 38b.

As shown by the variation in curve 276" in FIG. 38b, concentration $N_T$ of the total n-type dopant in the portion of body material 268 below drain 264 of IGFET 220U decreases by at least a factor of 10, typically a factor in the vicinity of 15, in moving from the subsurface location of the maximum concentration of the n-type dopant in well portion 276 along vertical line 136U up to drain 264. Also, the location of the maximum concentration of the total n-type dopant in well portion 276 is no more than 10 times, normally no more than 5 times, deeper below the upper semiconductor surface than drain 264. Hence, the vertical dopant profile below drain 264 of IGFET 220U is hypoabrupt. Furthermore, concentration $N_T$ of the total n-type dopant in the portion of body material 268 below drain 264 of IGFET 220U normally decreases progressively in moving from the location of the maximum n-type well concentration up to drain 264 as indicated by the portion of curve 276' extending from depth $y_W$ of the maximum concentration of the total n-type dopant in the portion of body material 268 below drain 264 up to item 398# representing drain-body junction 398.

The net dopant in the portion of body material 268 below drain 264 of IGFET 220U is n-type dopant. FIG. 38c shows that, as represented by curve 276*, concentration $N_N$ of the net dopant, in the portion of body material 268 below drain 264 of IGFET 220U varies vertically in a similar manner to concentration $N_T$ of the total n-type dopant in the portion of body material 268 below drain 264 except that concentration $N_N$ in the portion of body material 268 below drain 264 drops to zero at drain-body junction 398. The hypoabrupt vertical dopant profile in the portion of body material 268 below drain 264 of IGFET 220U causes the parasitic capacitance associated with drain-body junction 398 to decrease for the reasons discussed above in connection with p-channel IGFET 220 and the asymmetric n-channel IGFETs of the invention. Although the hypoabrupt vertical dopant profile in the portion of body material 268 below drain 264 is not as strong in IGFET 220U, which avoids the n-type compensating implant, as in IGFET 220, which uses the n-type compensating implant, the hypoabrupt vertical dopant profile in the portion of body material 268 below drain 264 of IGFET 220U causes drain-body junction 398 to have reduced parasitic capacitance. IGFET 220U thereby has increased analog speed.

Concentrations $N_I$ and $N_T$ of the total n-type dopant in the portion of body material 268 below source 262 of IGFET 220U vary vertically largely the same as concentrations $N_I$ and $N_T$ of the total n-type dopant in the portion of body material 268 below drain 264. Compare curves 276' and 276" in FIGS. 36a and 36b taken along vertical line 130U through source 262 to curves 276' and 276" in FIGS. 38a and 38b taken along vertical line 136U through drain 264. Taking note of the fact that the net dopant in the portion of body material 268 below source 262 of IGFET 220U is n-type dopant, concentration $N_N$ of the net dopant in the portion of body material 268 below source 262 varies vertically largely the same as concentration $N_N$ of the net dopant in the portion of body material 268 below drain 264. As represented by curve 276* in FIG. 36c, concentration $N_N$ of the net dopant in the portion of body material 268 below source 262 of IGFET 220U therefore varies vertically in a similar manner to concentration $N_T$ of the total n-type dopant in the portion of body material 268 below source 262 except that concentration $N_N$ in the portion of body material 268 below source 262 drops to zero at source-body junction 396. This vertical dopant profile below source 262 of IGFET 220U normally causes the parasitic capacitance along source-body junction 396 to be reduced.

General Computer Simulations

Computer simulations were conducted to check the device characteristics and performance advantages, especially for analog applications, of IGFETs configured according to the invention. The simulations were performed with (a) the MicroTec two-dimensional device simulator furnished by Siborg Systems and (b) the Medici two-dimensional device simulator furnished by Avant! Corp. The MicroTec simulator was utilized primarily for large-signal (DC) simulations. The Medici simulator was employed primarily for small-signal simulations.

Two types of n-channel IGFETs were computer simulated at the device level: (a) asymmetric n-channel IGFETs configured according to the invention and (b) symmetric reference n-channel IGFETs generally corresponding to (but different inventively from) the computer-simulated inventive n-channel IGFETs. The inventive computer-simulated asymmetric IGFETs are generally indicated below as being of structure "A". The computer-simulated inventive asymmetric IGFETs of structure A generally correspond to long n-channel IGFET 150 of FIG. 13 or to a short-channel version of IGFET 150. The reference computer-simulated symmetric IGFETs are generally identified below as being of structure "B". The computer-simulated reference IGFETs of structure B generally correspond to long n-channel IGFET 230 of FIG. 29 or to a short-channel version of IGFET 230 for the situation in which halo pocket portions 320 and 322 of IGFET 230 extend respectively below S/D zones 302 and 304.

Structures A and B were based on analytical-profile models generally using Gaussian dopant profiles. It was assumed that each set of structures A and B under comparison was manufactured according to the same process flow such as that of FIG. 31. Aside from variations that produce the body-material doping features of the invention and except as otherwise indicated below, structures A and B in each set under comparison had substantially the same dopant distributions. Structures A and B in each set under comparison also had basically the same geometrical dimensions, e.g., gate length, gate stack height, and source/drain length. The computer simulations on structures A and B represented devices manufactured at the 0.18-μm technology node, i.e., IGFETs manufactured with design rules for which the minimum printable feature size was 0.18 μm.

The computer simulations were generally directed toward enhancing analog performance. Structure B was thus computer simulated at parameter values expected to yield enhanced analog performance for structure A. Inasmuch as the basic architecture of structure B is for digital applications, the values for certain of the parameters used in computer simulating structure B to achieve enhanced analog performance differed from the parameter values that would yield enhanced digital performance.

It was assumed that the structures A and B were arranged in multiple-IGFET structures and that insulation-filled trenches were used to implement a field-insulating region, such as field-insulating region 200 in FIG. 29, for laterally isolating the IGFETs in the multiple-IGFET structures. The trenches, which had the same dimensions for structures A and B, were up to 50% deeper and up to 20% wider than that needed to optimize digital performance for reference structure B in the multiple-IGFET structures. The IGFET wells, corresponding to p+ well portions 116 and 316 respectively for asymmetric n-channel IGFET 150 in FIG. 13 and symmetric n-channel IGFET 230 in FIG. 29, were up to 20% deeper than that needed to optimize the digital performance of structure B. It appears that inventive structure A may need the wider/deeper trenches in order to maintain good inter-IGFET isolation in the presence of a well whose average dopant concentration is lower than that of structure B optimized for digital performance.

Structures A and B both had the same threshold voltage $V_T$ and the same background p-type dopant concentration, namely 0.4 V and $5 \times 10^{15}$ atoms/cm$^3$. For a given value of the p-type background dopant concentration, the p-type implants which define the pocket portions along the upper semiconductor surfaces of structures A and B control their threshold voltages $V_T$. In light of this, the peak upper-surface concentration of the p-type pocket dopant in the single pocket portion of inventive structure A was appropriately adjusted to achieve the same threshold voltage that arose from the peak upper-surface concentrations of the p-type halo dopant in the two halo pocket portions of reference structure B. More specifically, inventive asymmetric structure A received a heavier dosage of the pocket dopant than reference symmetric structure B to accommodate the fact that reference structure B had twice as many pocket portions as inventive structure A. The higher doping in the single pocket portion of inventive asymmetric structure A increases its punchthrough resistance compared to an asymmetric IGFET structure identical to structure A except that the pocket portion in the comparison asymmetric structure has the same doping as either pocket portion of reference symmetric structure B.

Figure 39:
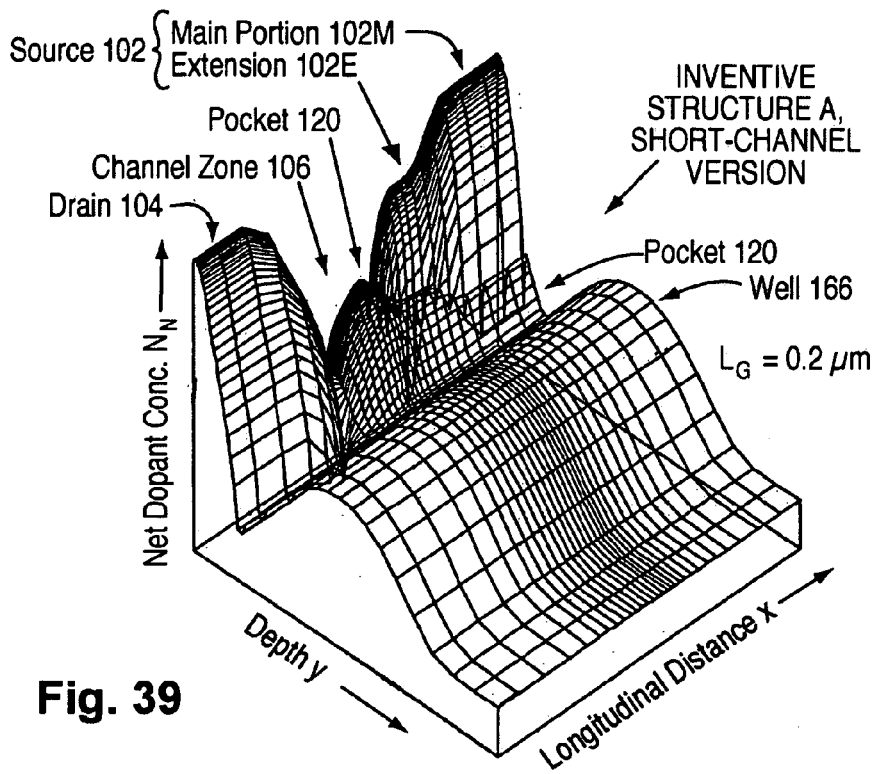
FIGS. 39 and 40 are three-dimensional graphs of net dopant concentration as a function of depth and longitudinal distance for respective computer simulations of (i) an asymmetric short n-channel IGFET configured according to the invention and (ii) a reference symmetric short n-channel IGFET.

FIG. 39 presents a three-dimensional dopant profile for an implementation of a short-channel version of inventive asymmetric structure A. A three-dimensional dopant profile for an implementation of a corresponding short-channel version of reference symmetric structure B is presented in FIG. 40. FIGS. 39 and 40 specifically illustrate net dopant concentration $N_N$ as a function of longitudinal distance x and depth y. Only the monosilicon portions of the implementations of structures A and B are presented in FIGS. 39 and 40. Although both of structures A and B were assumed to be fabricated at the 0.18-μm technology node, the implementations of structures A and B in FIGS. 39 and 40 of the computer simulations both had a gate length $L_G$ of 0.2 μm leading to a channel length L of 0.12-0.14 μm due to lithography alignment.

Figure 40:
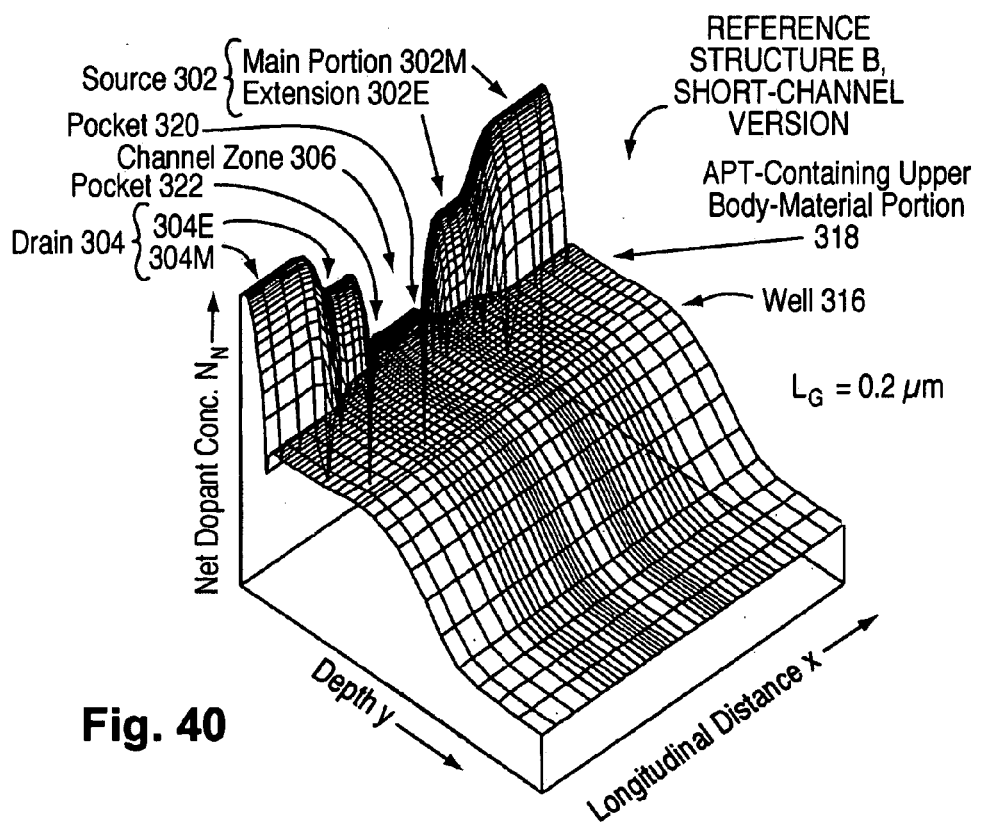

The implementation of inventive structure A in FIG. 40 basically corresponds to a short-channel version of IGFET 150. The implementation of reference structure B in FIG. 40 basically corresponds to a short-channel version of IGFET 230 subject to the implementation of structure B in FIG. 40 being simulated generally at the parameter values which enhance the analog performance of the implementation of structure A and again subject to halo pocket portions 320 and 322 of IGFET 230 extending respectively below S/D zones 302 and 304. For convenience, the implementations of short-channel structures A and B in FIGS. 39 and 40 are labeled with the reference symbols employed to identify the monosilicon regions of IGFETs 150 and 230. Since structure B was simulated for analog applications, S/D zones 302 and 304 are respectively labeled as source 302 and drain 304 in FIG. 40. Except as indicated below, all references to the short-channel versions of structures A and B, or to short-channel structures A and B, mean the implementations respectively shown in FIGS. 39 and 40.

Each S/D zone of each structure A or B consisted of a very heavily doped main portion and a more lightly doped, but still heavily doped, lateral extension. Drain 104 of the short-channel version of structure A thus consisted of main portion 104M and lateral extension 104E. However, regions 104M and 104E of drain 104 are difficult to distinguish in FIG. 39 and are therefore not separately labeled in FIG. 39.

Figure 41:
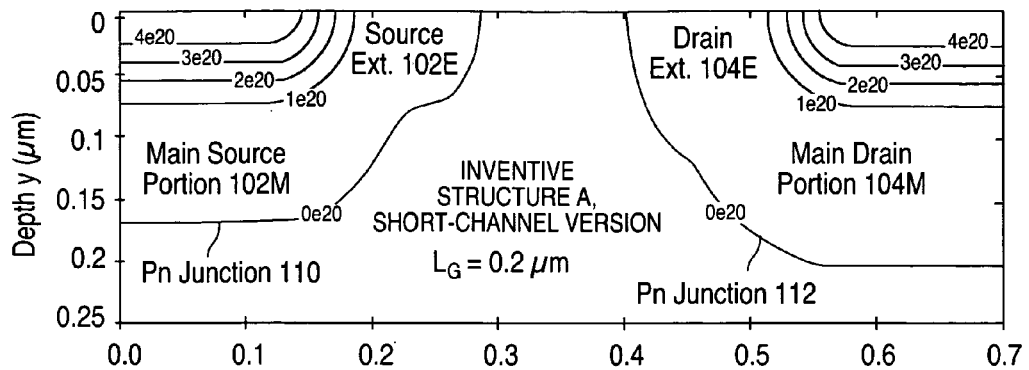
FIGS. 41 and 42 are graphs presenting dopant contours as a function of depth and longitudinal distance from a source location for the respective computer-simulated IGFETs of FIGS. 39 and 40.
Figure 42:
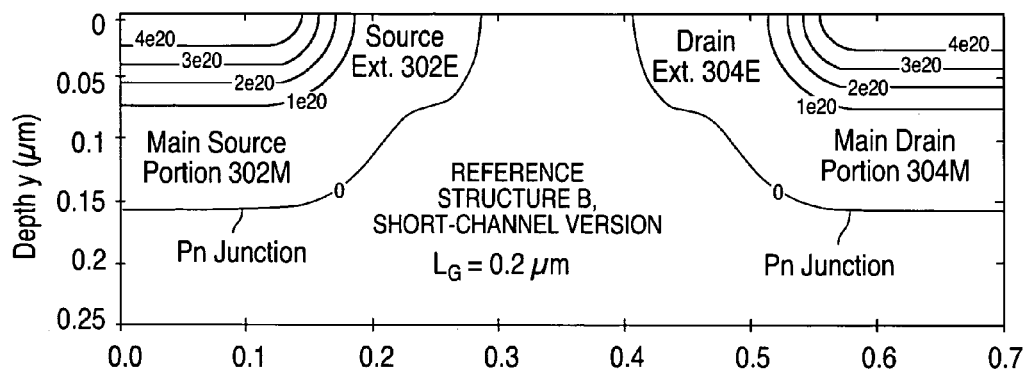

FIGS. 41 and 42 present two-dimensional dopant contours for the respective short-channel versions of structures A and B. The dopant contours are taken along vertical planes through short-channel structures A and B. Regions 104M and 104E of short-channel structure A can be clearly distinguished in FIG. 41 and are so labeled there. As shown by the locations of pn junctions 110 and 112 in FIG. 41, main drain portion 104M of short-channel structure A extends deeper below the upper semiconductor surface than main source portion 102M. That is, drain depth $y_D$ is greater than source depth $y_S$ for inventive asymmetric structure A. In contrast, an examination of FIG. 42 shows that main source portion 302M and main drain portion 304M in reference symmetric structure B extend to virtually the same depth below the upper semiconductor surface.

Figure 43:
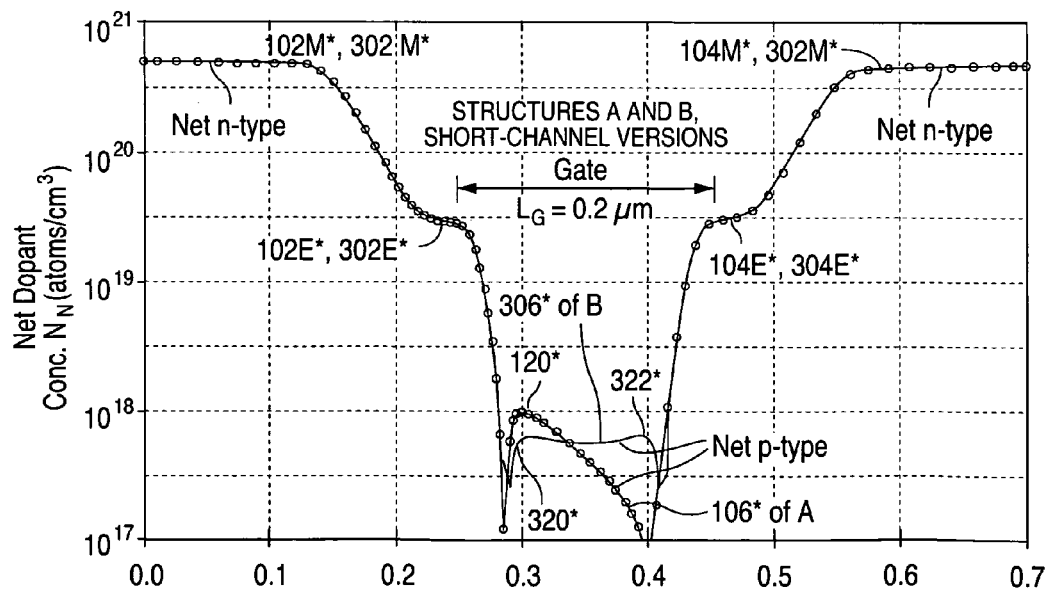
FIG. 43 is a graph of net dopant concentration as a function of longitudinal distance from a source location for the computer-simulated IGFETs of FIGS. 39 and 40.

FIG. 43 presents net dopant concentration $N_N$ along the upper semiconductor surface as a function of longitudinal distance x from a measurement-reference S/D zone location for the short-channel versions of structures A and B. The measurement-reference S/D zone location is approximately 3.5 μm from the channel-zone center. In FIG. 43 and in the later graphs which present computer-simulated data for both of structures A and B, curves representing data for inventive structure A are marked with small empty circles to distinguish that data from the data for reference structure B whose data curves are not additionally marked. At locations where structures A and B have substantially identical data, the curve segments for structures A and B are not visually distinguishable from each other.

Analogous to the curve segments in FIG. 14c, curve segments 102M*, 104M*, 102E*, and 104E* in FIG. 43 represent concentrations $N_N$ of the net n-type dopant respectively in regions 102M, 104M, 102E, and 104E along the upper semiconductor surface of inventive short-channel structure A. Curve segments 106* and 120* in FIG. 43 represent concentrations $N_N$ of the net p-type dopant respectively in regions 106 and 120 along the upper semiconductor surface of short-channel structure A. Curve segments 302M*, 304M*, 302E*, and 304E* represent concentrations $N_N$ of the net p-type dopant respectively in regions 302M, 304M, 302E, and 304E along the upper semiconductor surface of reference short-channel structure B. Curve segments 306\*, 320\*, and 322\* represent concentrations of the net p-type dopant respectively in regions 306, 320, and 322 along the upper semiconductor surface of short-channel structure B.

Curve segment 106\* in FIG. 43 illustrates the asymmetric dopant grading in channel zone 106 of inventive short-channel structure A. In particular, curve segment 106\* shows that net dopant concentration $N_N$ along the upper semiconductor surface of short-channel structure A reaches a high value at approximately $1 \times 10^{18}$ atoms/cm$^3$ near source 102 and then decreases progressively in moving from the location of that high value across channel zone 106 toward drain 104. Although not shown in the computer simulations, concentration $N_T$ of the total p-type dopant in channel zone 106 of short-channel structure A is at least a factor of 10 lower, typically a factor of more than 100 lower, where zone 106 meets source 102 along the upper surface than where zone 106 meets drain 104 along the upper surface. In contrast, the symmetric dopant grading in channel zone 316 of short-channel structure B is illustrated by curve segment 306\* which shows that concentration $N_N$ along the upper surface of short-channel structure B is at approximately equal peak values close to both source 102 and drain 104 and is at a slightly lower value in the middle of channel zone 306.

Figure 44A:
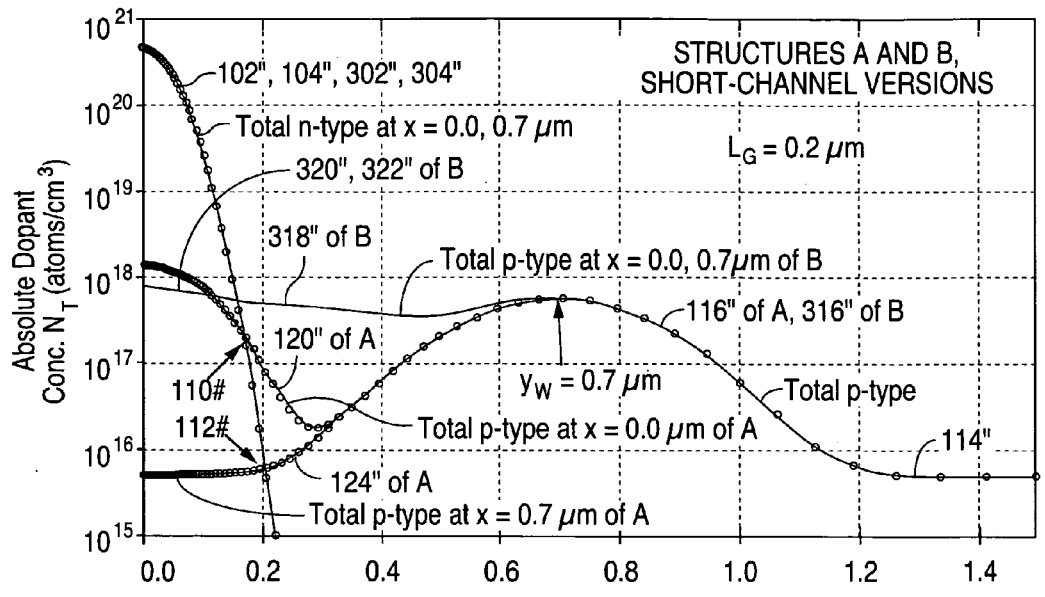
FIGS. 44a and 44b are respective graphs of absolute and net dopant concentrations as a function of depth along a pair of vertical lines respectively through the source and drain for the computer-simulated IGFETs of FIGS. 39 and 40.

FIG. 44a presents absolute (total p-type and total n-type) vertical dopant profiles through S/D locations for the short-channel versions of structures A and B. Using the same measurement-reference S/D zone location from which longitudinal distance x is measured in FIG. 43, absolute dopant concentrations $N_T$ for inventive short-channel structure A are illustrated in FIG. 44a along a vertical line (or plane) through main source portion 102M at distance x equal to 0.0 μm and along a vertical line through main drain portion 104M at distance x equal to 0.7 μm. FIG. 44a similarly depicts concentrations $N_T$ for reference short-channel structure B along a vertical line extending through main source portion 302M at distance x equal to 0.0 μm and along a vertical line extending through main drain portion 304M at distance x equal to 0.7 μm.

Analogous to the curve segments in FIGS. 8b and 10b, curve segments 102" and 104" in FIG. 44a respectively correspond to source 102 and drain 104 of inventive short-channel structure A and thus represent concentrations $N_T$ of the total n-type dopant along the vertical lines respectively at distances x of 0.0 and 0.7 μm through source 102 and drain 104, specifically main source portion 102M and main drain portion 104M. Curve segments 114", 116", 118", 120", and 124" in FIG. 44a respectively generally correspond to regions 114, 116, 118, 120, and 124 of short-channel structure A and thus variously represent concentrations $N_T$ of the total p-type dopant along the vertical lines at distances x of 0.0 and 0.7 μm through source 102 and drain 104. Items 110# and 112# respectively indicate pn junctions 110 and 112 for short-channel structure A.

The maximum concentration of the p-type well dopant in well portion 116 of inventive short-channel structure A occurs at depth $y_W$ equal to 0.7 μm as indicated by curve segment 116" in FIG. 44a. The combination of curve segments 116" and 124" illustrates the hypoabrupt nature of the vertical dopant profile below drain 104 along the vertical line at distance x equal to 0.7 μm in short-channel structure A. In particular, combined curve segment 116"/124" shows that concentration $N_T$ of the total p-type dopant in the body material portion directly below drain 104 decreases by a factor of approximately 100, and thus by a factor considerably in excess of 10, in moving from the location of the maximum p-type well dopant concentration up to pn junction 112 at the bottom of drain 104.

Depth $y_D$ of drain-body junction 112 is approximately 0.2 μm in inventive short-channel structure A dealt with in FIG. 44a. Inasmuch as depth $y_W$ of maximum concentration $N_T$ of the total p-type dopant in the body material portion below drain 104 is 0.7 μm, the location of maximum concentration $N_T$ of the total p-type dopant in the body material portion below drain 104 in short-channel structure A is approximately 3.5 times deeper below the upper semiconductor surface than drain 104. Consequently, concentration $N_T$ of the total p-type dopant in body material 108 decreases by a factor of approximately 100 in moving upward to drain 104 from the maximum p-type well dopant concentration location which is no more than 5 times deeper below the upper semiconductor surface than drain 104.

Curve segments 302" and 304" in FIG. 44a respectively correspond to source 302 and drain 304 of reference short-channel structure B and represent concentrations $N_T$ of the total n-type dopant along the vertical lines at distances x of 0.0 and 0.7 μm through source 302 and drain 304. Curve segments 114", 316", 318", 320", and 322" respectively correspond to regions 114, 316, 318, 320, and 322 of short-channel structure B and thus represent concentrations $N_T$ of the total p-type dopant along the vertical lines at distances x of 0.0 and 0.7 μm through source 302 and drain 304. In this regard, curve segment 114" is utilized for both of short-channel structures A and B.

As is the situation with well portion 116 of inventive short-channel structure A, the maximum concentration of the p-type well dopant in well portion 316 of reference short-channel structure B occurs at depth $y_W$ equal to 0.7 μm as indicated by curve segment 316" in FIG. 44a. However, the combination of curve segments 316", 318", and 322" (or 320") is relatively flat in the p-type body-material portion directly below drain 304 (or source 302) in short-channel structure B. Combined curve segments 316"/318"/322" shows that concentration $N_T$ of the total p-type dopant in the body-material portion directly below drain 304 changes considerably less than a factor of 5., and thus considerably less than a factor of 10, in moving from the location of the maximum p-type well dopant concentration up to the pn junction at the bottom of drain 304. That is, the vertical dopant profile in the body-material portion directly below drain 304 in short-channel structure B is not hypoabrupt.

Figure 44B:
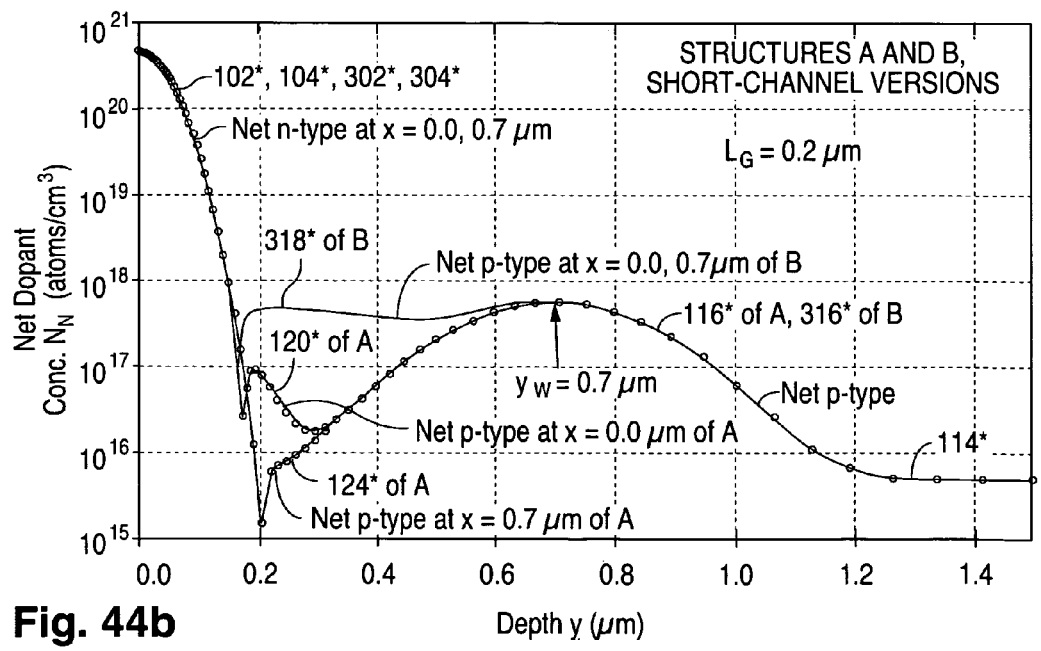

The net vertical dopant profiles corresponding to the absolute vertical dopant profiles of FIG. 44a are presented in FIG. 44b for the short-channel versions of structures A and B. Curve segments 102\* and 104\* in FIG. 44b represent concentrations $N_N$ of the net n-type dopant respectively in source 102 and drain 104 of inventive short-channel structure A along the vertical lines respectively at distances x of 0.0 and 0.7 μm through source 102 and drain 104, specifically through main source portion 102M and main drain portion 104M. Curve segments 114\*, 116\*, 120\*, and 124\* represent concentrations $N_N$ of the net p-type dopant respectively in regions 114, 116, 120, and 124 of short-channel structure A variously along the vertical lines at distances x of 0.0 and 0.7 μm through source 102 and drain 104.

Curve segments 302\* and 304\* in FIG. 44b represent concentrations $N_N$ of the net n-type dopant respectively in source 302 and drain 304 of reference short-channel structure B along the vertical lines respectively at distances x of 0.0 and 0.7 μm through source 302 and drain 304, specifically through main source portion 302M and main drain portion 304M. Curve segments 114\*, 316\*, and 318\* represent concentrations $N_N$ of the net p-type dopant respectively in regions 114, 316, and 318 of short-channel structure B along the vertical lines at distances x of 0.0 and 0.7 µm through source 302 and drain 304. Curve segment 114\* is used for both of short-channel structures A and B.

Figure 45A:
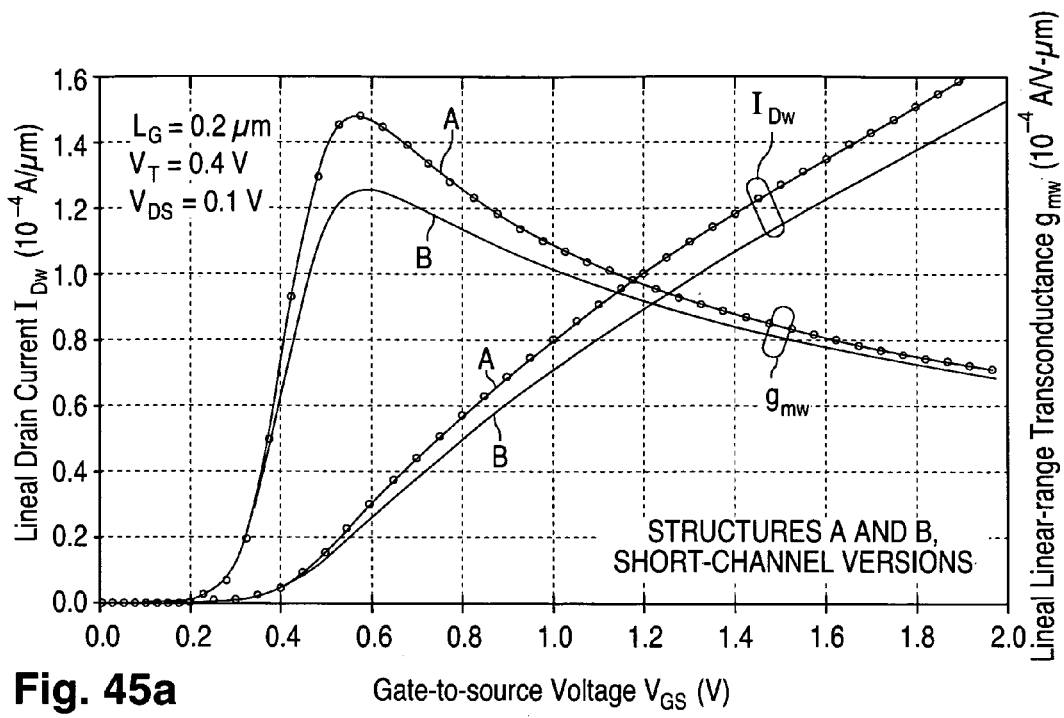
FIGS. 45a and 45b are graphs of lineal transconductance and lineal drain current as a function of gate-to-source voltage respectively at threshold and saturation conditions for the computer-simulated IGFETs of FIGS. 39 and 40.
Figure 45B:
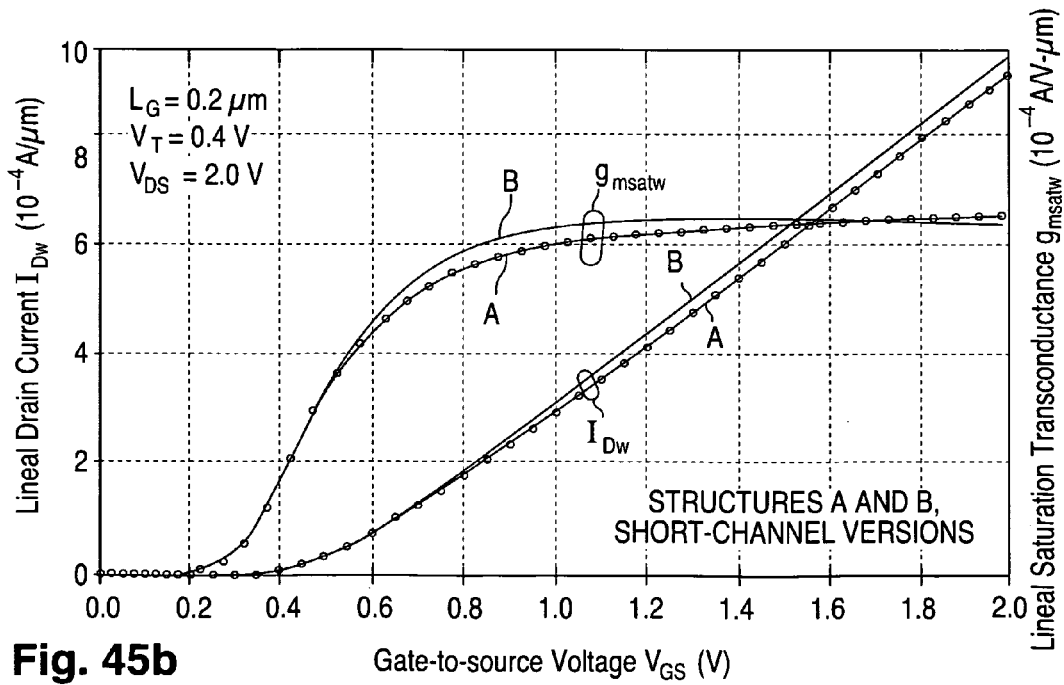
Figure 46A:
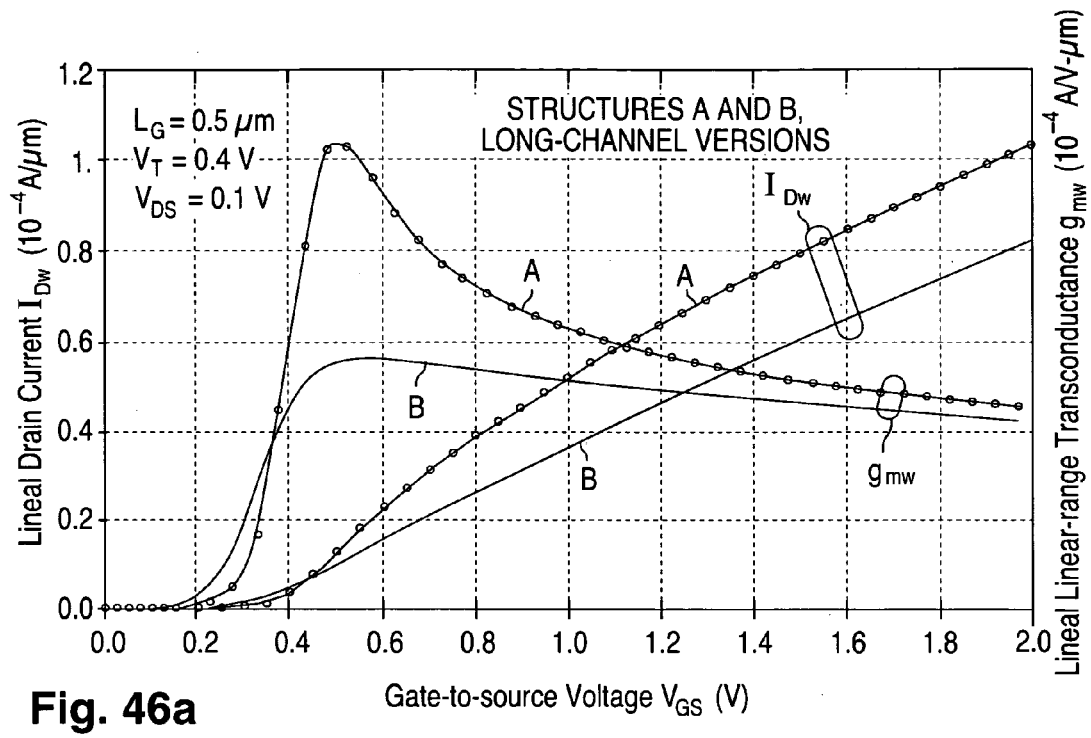
FIGS. 46a and 46b are graphs of lineal transconductance and lineal drain current as a function of gate-to-source voltage respectively at threshold and saturation conditions for computer simulations of (i) an inventive asymmetric long n-channel IGFET generally corresponding to the inventive short-channel IGFET of FIG. 39 and (ii) a reference symmetric long n-channel IGFET generally corresponding to the reference short-channel IGFET of FIG. 40.
Figure 46B:
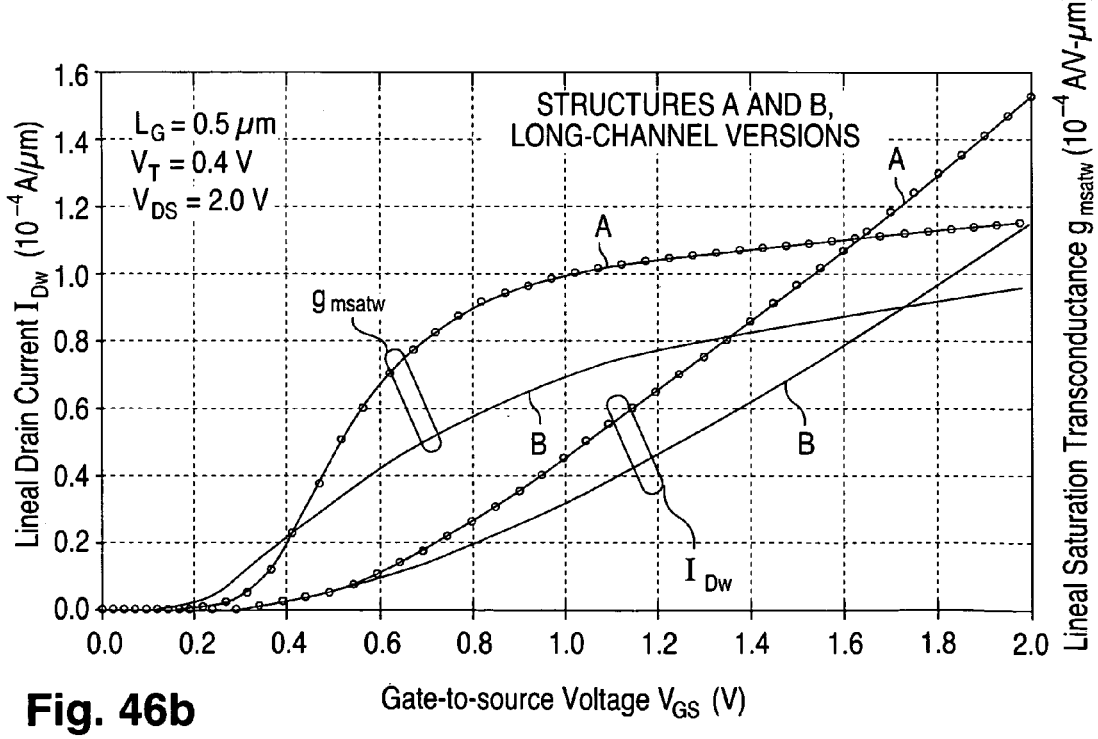

FIGS. 45a and 45b respectively illustrate lineal linear-range transconductance $g_{mw}$ and lineal saturation transconductance $g_{msatw}$ as a function of gate-to-source voltage $V_{GS}$ for the short-channel versions of structures A and B for which gate length $L_G$ was 0.2 µm. FIGS. 46a and 46b respectively illustrate lineal linear-range transconductance $g_{mw}$ and lineal saturation transconductance $g_{msatw}$ as a function of gate-to-source voltage $V_{GS}$ for long-channel versions of structures A and B configured basically the same as short-channel structures A and B except that gate length $L_G$ was 0.5 µm. Drain-to-source voltage $V_{DS}$ was 0.1 V for the linear-range $g_{mw}$ graphs of FIGS. 45a and 46a. Voltage $V_{DS}$ was 2.0 V for the saturation $g_{msatw}$ graphs of FIGS. 45b and 46b. FIGS. 45a, 45b, 46a, and 46b also indicate the variation of lineal drain current $I_{Dw}$ from which linear-range transconductance $g_{mw}$ and saturation transconductance $g_{msatw}$ were determined.

As FIGS. 46a and 46b show, the long-channel version of inventive structure A exhibited considerably higher transconductance, both linear-range transconductance $g_{mw}$ and saturation transconductance $g_{msatw}$, than the long-channel version of reference structure B. The short-channel version of structure A exhibited slightly higher, roughly 10% higher, linear-range transconductance $g_{mw}$ than the short-channel version of structure B as indicated in FIG. 45a. FIG. 45b shows that the short-channel versions of structures A and B had nearly the same $g_{msatw}$ characteristics. The generally higher values of transconductances $g_{mw}$ and $g_{msatw}$ for inventive structure A enable it to have higher voltage gain and thus improve its analog performance.

Figure 47:
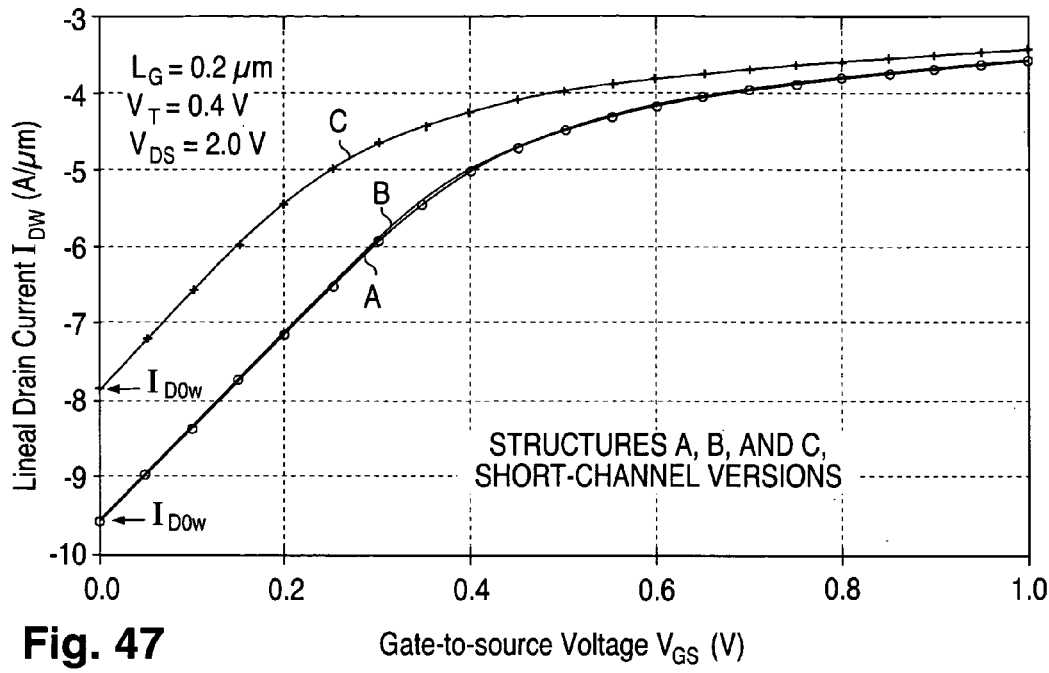
FIG. 47 is a graph of lineal drain current density as a function of gate-to-source voltage for computer simulations of (i) the inventive IGFET of FIG. 39, (ii) the reference IGFET of FIG. 40, and (iii) a further reference symmetric short n-channel IGFET lacking an anti-punchthrough implant.

FIG. 47 illustrates the current-voltage transfer characteristics, i.e., the variation of lineal drain current $I_{Dw}$ with gate-to-source voltage $V_{GS}$, for the short-channel versions of structures A and B at a drain-to-source voltage $V_{DS}$ of 2.0 V. As FIG. 47 shows, short-channel structures A and B had almost identical current-voltage characteristics. It is also expected that long-channel versions of structures A and B would have largely the same current-voltage characteristics.

Taking note of the fact that upper body-material portion 318 of reference short-channel structure B is provided with a high concentration of the p-type APT dopant for helping to avoid punchthrough in short-channel structure B, the nearly identical current-voltage characteristics for short-channel structures A and B show that the absence, in inventive structure A, of the p-type APT dopant at the location generally similar to that of the p-type APT dopant in reference structure B does not lead to punchthrough in inventive structure A. The qualitative physical explanation for this result is that the p-type pocket dopant performs the anti-punchthrough function in structure A. More particularly, the p-type pocket implant in pocket portion 120 of inventive structure A is provided at a greater doping than the p-type halo implant in either of pocket portions 320 and 322 of reference structure B in order for structure A to have the same threshold voltage $V_T$ as structure B. This difference can be seen by comparing curve segment 120\* in FIG. 43 to curve segments 320\* and 322\*. The higher doping of the p-type pocket implant in inventive structure A enables it to avoid punchthrough while simultaneously operating at low current leakage comparable to that of reference structure B.

The preceding conclusion is further supported by computer-simulated data obtained on a further reference short-channel IGFET structure C lacking the APT implant of reference short-channel structure B but otherwise identical to short-channel structure B. The current-voltage transfer characteristics for reference structure C at the $V_{DS}$ value of 2.0 V are indicated by the curve tagged C in FIG. 47. Leakage current $I_{D0w}$ is the value of drain current $I_{Dw}$ at a zero value of gate-to-source voltage $V_{GS}$. As FIG. 47 shows, drain leakage current $I_{D0w}$ is approximately 50 times higher for reference structure C than for inventive short-channel structure A. This indicates that punchthrough occurs in reference structure C.

Figure 48:
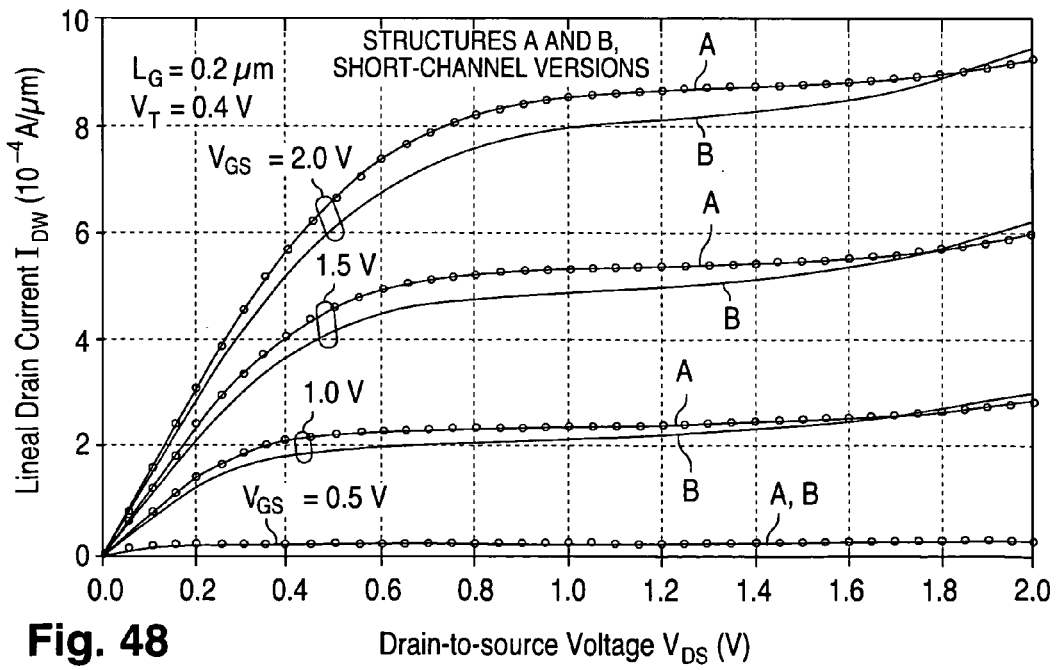
FIG. 48 is a graph of lineal drain current as a function of drain-to-source voltage for the computer-simulated IGFETs of FIGS. 39 and 40.

FIG. 48 depicts lineal drain current $I_{Dw}$ as a function of drain-to-source voltage $V_{DS}$ for the short-channel versions of structures A and B at values of gate-to-source voltage $V_{GS}$ ranging from 0.5 V to 2.0 V. As indicated in FIG. 48, inventive short-channel structure A generally achieves slightly higher values of drain current $I_{Dw}$ than reference short-channel structure B at each of the indicated $V_{GS}$ values. Inventive structure A thus has lower channel resistance than reference structure B. Also, drain current $I_{Dw}$ increases less with increasing drain-to-source voltage $V_{DS}$ at high voltage $V_{DS}$ in inventive structure A than in reference structure B. This indicates that less avalanche multiplication or/and less channel-width modulation occurs in inventive structure A than in reference structure B.

Analytical Analysis and Performance Advantages of Inventive Asymmetric IGFETs

For good analog performance, the source of an IGFET should be as shallow as reasonably possible in order to avoid roll-off of threshold voltage $V_T$ at short channel length. The source should also be doped as heavily as possible in order to maximize the IGFET's effective transconductance $g_{meff}$ in the presence of the source resistance $R_S$. Effective transconductance $g_{meff}$ is determined from the IGFET's intrinsic transconductance $g_m$ as:

$$g_{meff} = \frac{g_m}{1 + R_S g_m} \quad (1)$$

As Eq. 1 indicates, reducing source resistance $R_S$ causes effective transconductance $g_{meff}$ to increase. The voltage drop across source resistance $R_S$ also subtracts from the intrinsic gate-to-source voltage so that actual gate-to-source voltage $V_{GS}$ is at a lower value. This debiases the IGFET at its gate electrode. In short, source resistance $R_S$ should be as low as reasonably possible.

The need to minimize source resistance $R_S$ in order to maximize effective transconductance $g_{meff}$ is in addition to the need to have a lower series resistance at the source and drain of an IGFET in order to achieve a lower of value of the IGFET's on-resistance $R_{on}$. More particularly, the voltage drop across source resistance $R_S$ adds to the total source-to-drain voltage drop. This causes on-resistance $R_{on}$ to increase.

For achieving high-voltage capability and reducing hot-carrier injection, the drain of an IGFET should be as deep and lightly doped as reasonably possible. These needs should be met without causing on-resistance $R_{on}$ to increase significantly and without causing short-channel threshold voltage roll-off.

Figure 49:
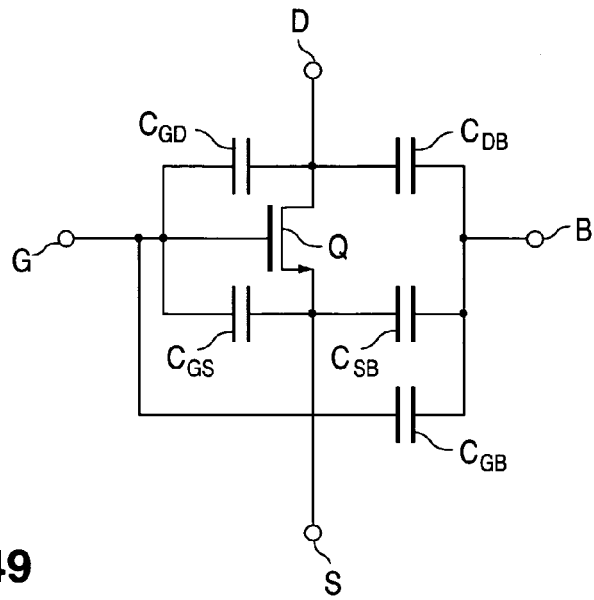
FIG. 49 is a circuit diagram of an n-channel IGFET and associated parasitic capacitances.
Figure 50:
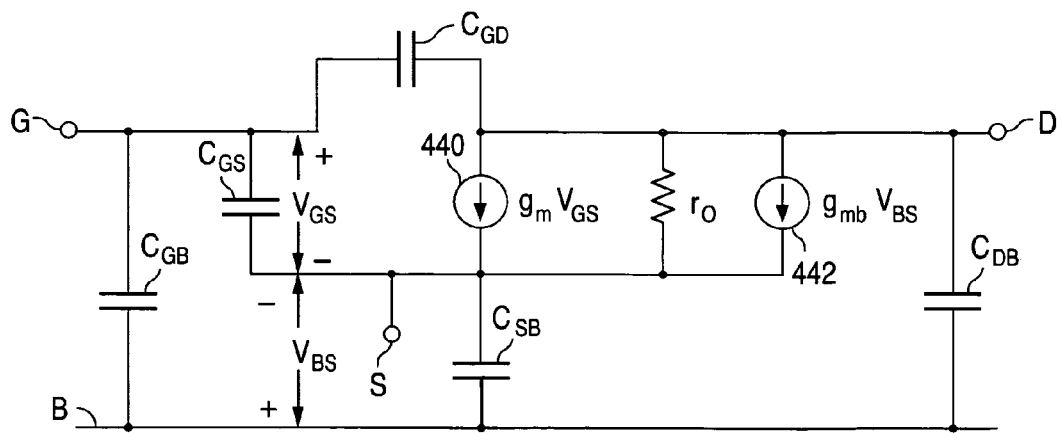
FIG. 50 is a circuit diagram of a small-signal model of the n-channel IGFET and associated parasitic capacitances of FIG. 49.

The parasitic capacitances of an IGFET play an important role in setting the speed performance of the circuit containing the IGFET, particularly in small-signal high-frequency operations. FIG. 49 illustrates parasitic capacitances $C_{DB}$, $C_{SB}$, $C_{GB}$, $C_{GD}$, and $C_{GS}$ variously associated with drain electrode D, source electrode S, gate electrode E, and body-region electrode B of an n-channel IGFET Q where $C_{DB}$ represents the drain-to-body capacitance, $C_{SB}$ represents the source-to-body capacitance, $C_{GB}$ represents the gate-to-body capacitance, $C_{GD}$ represents the gate-to-drain capacitance, and $C_{GS}$ represents the gate-to-source capacitance. A small-signal equivalent model of IGFET Q is presented in FIG. 50 where $V_{BS}$ is the body-to-source voltage, $g_{mb}$ is the transconductance of the body electrode, and items 440 and 442 are current sources.

The bandwidth of an amplifier is defined as the value of the frequency at which the amplifier's gain drops to $1/\sqrt{2}$ (approximately 0.707) of its low-frequency value. It is generally desirable that the amplifier's bandwidth be as great as possible.

IGFET Q of FIG. 49 can be arranged in three primary amplifier configurations for providing amplified output voltage $V_{out}$ as a function of input voltage $V_{in}$ according to the relationship:

$$V_{out} = H_A V_{in} \qquad (2)$$

where $H_A$ is the IGFET's complex transfer function. These three configurations are the common-source, common-gate, and common-drain configurations respectively shown in FIGS. 51a-51c where $C_L$ is the load capacitance, $V_{DD}$ is the high supply voltage, and $V_{SS}$ is the low supply voltage. Amplifier input voltage $V_{in}$ is supplied from a voltage source 444. Element 446 in FIGS. 51b and 51c is a current source, while signal $V_G$ in FIG. 51b is the gate voltage. An examination of transfer functions $H_A$ for the three configurations of FIGS. 51a-51c shows that reducing parasitic drain-to-body capacitance $C_{DB}$ and/or parasitic source-to-body capacitance $C_{SB}$ improves IGFET performance in each of these configurations.

Figure 51A:
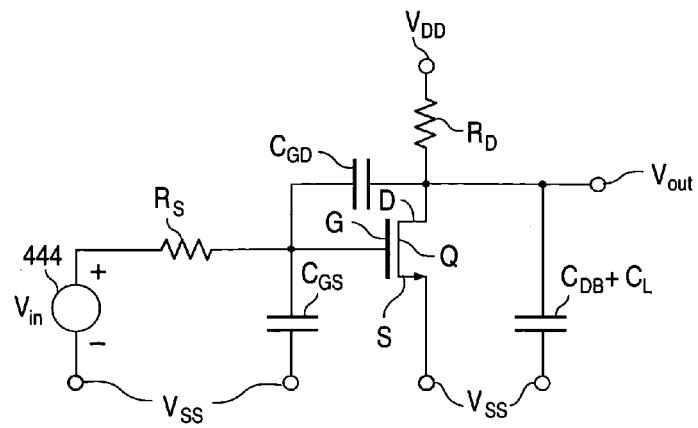
FIGS. 51a-51c are circuit diagrams of single-IGFET amplifiers arranged respectively in common-source, common-gate, and common-drain configurations.
Figure 51B:
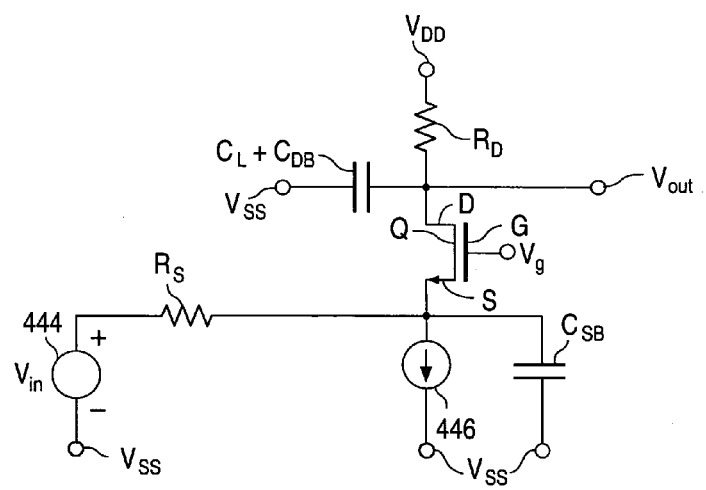
Figure 51C:
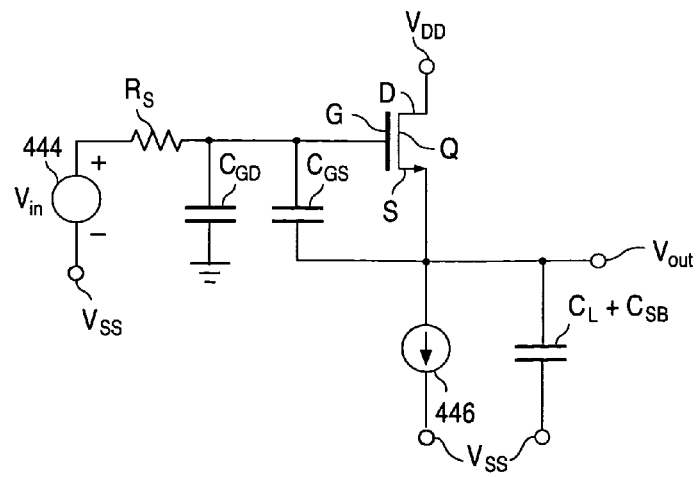

Transfer function $H_A$ for the common-source amplifier configuration of FIG. 51a is the input-pole/output-pole function:

$$H_A = \frac{-g_m R_D}{(1 + s/\omega_{in})(1 + s/\omega_{out})} \qquad (3)$$

Where $R_D$ is the drain (series) resistance, $\omega_{in}$ is the angular frequency at the input pole, $\omega_{out}$ is the angular frequency at the output pole, and s is the complex frequency operator equal to $j\omega$ for which $\omega$ is the angular frequency. The parasitic capacitances of IGFET Q in the common-source configuration enter Eq. 3 by way of pole frequencies $\omega_{in}$ and $\omega_{out}$ given respectively as:

$$\omega_{in} = \frac{1}{R_S[C_{GS} + (1 + g_m R_D)C_{GD}]} \qquad (4)$$

$$\omega_{out} = \frac{1}{R_D(C_{DB} + C_{GD} + C_L)} \qquad (5)$$

Parasitic drain-to-body capacitance $C_{DB}$ appears in output pole frequency $\omega_{out}$ of Eq. 5. For the situation in which source resistance $R_S$ is zero in the common-source configuration, input pole frequency $\omega_{in}$ is infinite in accordance with Eq. 4. The bandwidth of IGFET Q in FIG. 51a then equals $\omega_{out}$ as given by Eq. 5. Output pole frequency $\omega_{out}$ increases with decreasing drain-to-body capacitance $C_{DB}$ for given values of drain resistance $R_D$ and parasitic gate-to-drain capacitance $C_{GD}$. Reducing parasitic drain-to-body capacitance $C_{DB}$ thus desirably increases the bandwidth for the common-source configuration of IGFET Q in FIG. 51a.

Also, parasitic drain-to-body capacitance $C_{DB}$ in the common-source configuration is in parallel with load capacitance $C_L$ as shown in FIG. 51a. Reducing drain-to-body capacitance $C_{DB}$ thus advantageously reduces its output loading effect.

Transfer function $H_A$ for the common-gate amplifier configuration of FIG. 51b is the input-pole/output-pole function:

$$H_A = \frac{(g_m + g_{mb})}{[1 + (g_m + g_{mb})R_S](1 + s/\omega_{in})(1 + s/\omega_{out})} \qquad (6)$$

where input pole frequency $\omega_{in}$ for the common-gate configuration is given as:

$$\omega_{in} = \frac{1 + (g_m + g_{mb})R_S}{R_S(C_{GS} + C_{SB})} \qquad (7)$$

Reducing source-to-body capacitance $C_{SB}$ causes input pole frequency $\omega_{in}$ to increase. This enables the performance of IGFET Q to improve in the common-gate configuration of FIG. 51b.

Output pole frequency $\omega_{out}$ is given by Eq. 5 for the common-gate amplifier configuration of FIG. 51b. Reducing parasitic drain-to-body capacitance $C_{DB}$ therefore increases the bandwidth of the common-gate configuration of FIG. 51b.

Transfer function $H_A$ for the common-drain amplifier configuration of FIG. 51c is the single-zero/single-pole function:

$$H_A = \frac{(1 + s/\omega_z)}{(1 + s/\omega_p)} \qquad (8)$$

where $\omega_z$ is the angular frequency at the zero, and $\omega_p$ is the angular frequency at the pole. The parasitic capacitances enter Eq. 8 by way of zero frequency $\omega_z$ and pole frequency $\omega_p$ given respectively as:

$$\omega_z = \frac{g_m}{C_{GS}} \qquad (9)$$

$$\omega_p = \frac{g_m}{g_m R_S C_{GD} + C_{SB} + C_{GS} + C_L} \qquad (10)$$

Parasitic source-to-body capacitance $C_{SB}$ appears in pole frequency $\omega_p$ of Eq. 10. By reducing capacitance $C_{SB}$, pole frequency $\omega_p$ increases. This improves the frequency characteristics of IGFET Q in the common-drain configuration of FIG. 51c.

Similar to what occurs with drain-to-body capacitance $C_{DB}$ in the common-source configuration of FIG. 51a, parasitic source-to-body capacitance $C_{SB}$ is in parallel with load capacitance $C_L$ in the common-drain configuration as shown in FIG. 51c. Reducing source-to-body capacitance $C_{SB}$ thus beneficially reduces its loading effect in the common-drain configuration.

Figure 52:
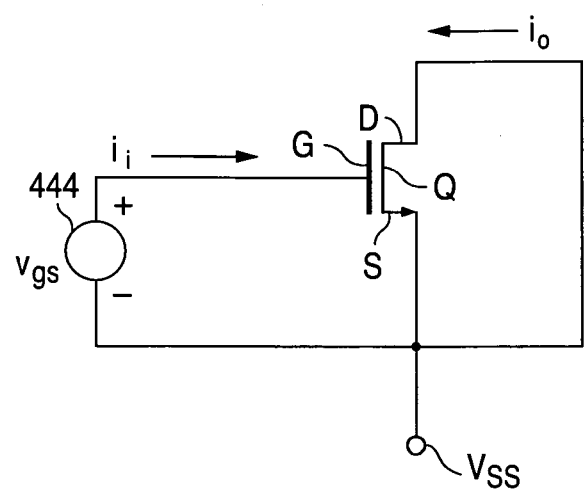
FIG. 52 is a circuit diagram of a single-IGFET amplifier arranged in a common-source shorted-output configuration.
Figure 53:
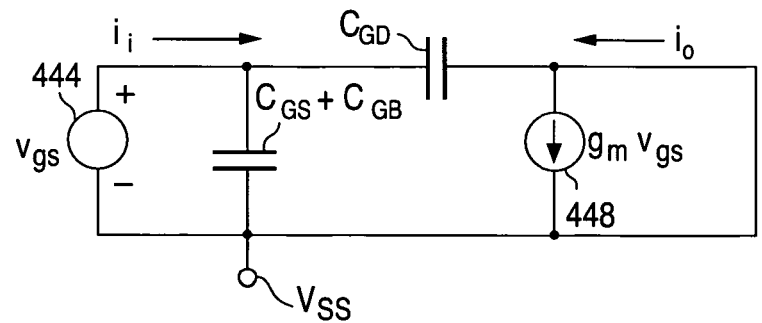
FIG. 53 is a circuit diagram of a small-signal model of the amplifier of FIG. 52.

FIG. 52 illustrates a small-signal model of the shorted-output version of the common-source amplifier configuration of FIG. 51a. In the small-signal model of FIG. 52, drain electrode D of IGFET Q is electrically shorted to source electrode S. FIG. 53 presents a small-signal equivalent circuit of the model of IGFET Q of FIG. 52. Element 448 in FIG. 53 is a voltage-controlled current source. Items $v_{gs}$, $i_i$, and $i_o$ in FIGS. 52 and 53 respectively are the small-signal gate-to-source (input) voltage, the small-signal input current, and the small-signal output current.

Cut-off frequency $f_T$ of an IGFET is defined as the value of frequency f at which the absolute value of current gain $A_I$ of the IGFET's shorted-output common-source configuration falls to 1. That is, $$|A_I(f)| = \frac{|I_{out}(f)|}{I_{in}}\bigg|_{V_{out}=0} = 1 \tag{11}$$

Cut-off frequency $f_T$ is derived from the small-signal equivalent circuit of FIG. 53 as:

$$f_T = \frac{g_m}{2\pi(C_{GS} + C_{GD} + C_{GB})} \tag{12}$$

Capacitance $C_{GB}$ in Eq. 12 is the parasitic capacitance between gate electrode G and the IGFET's body region outside the active area occupied by IGFET Q.

Increasing transconductance $g_m$ of an amplifying IGFET generally improves its performance capability because its voltage gain generally increases. Since cut-off frequency $f_T$ increases with increasing transconductance $g_m$ according to Eq. 12, an increase in cut-off frequency $f_T$ is an indicator of improved IGFET performance.

In the classical long-channel model of IGFET Q for which source resistance $R_S$ is zero, transconductance $g_m$ is:

$$g_m = \left(\frac{W}{L}\right)\mu_n C_{GIa}(V_{GS} - V_T) \tag{13}$$

where W is the IGFET width, L again is the channel length, $\mu_n$ is the electron mobility, and $C_{GIa}$ is the gate dielectric capacitance per unit area. In the short-channel velocity-saturation model of IGFET Q, transconductance $g_m$ is:

$$g_m = W v_{nsat} C_{GIa} \tag{14}$$

where $v_{nsat}$ is the electron saturation velocity since IGFET Q is an n-channel device. Examination of Eqs. 13 and 14 shows that transconductance $g_m$ is proportional to areal gate dielectric capacitance $C_{GIa}$ in both the long-channel and short-channel models.

For the classical long-channel model of IGFET Q in saturation, capacitances $C_{GS}$, $C_{GD}$, and $C_{GB}$ are:

$$C_{GS} = \left(\frac{2}{3}\right) WLC_{GIa} + WL_{GSoverlap}C_{GIa} \tag{15}$$

$$C_{GD} = WL_{GDoverlap}C_{GIa} \tag{16}$$

$$C_{GB} = WLC_{GIa} \tag{17}$$

where $L_{GSoverlap}$ and $L_{GDoverlap}$ are the longitudinal distances that the gate electrode respectively overlaps the source and drain of IGFET Q. The term $WL_{GSoverlap}C_{GIa}$ is the parasitic capacitance arising from the gate electrode overlapping the source. The term $WL_{GDoverlap}C_{GIa}$ is the parasitic capacitance arising from the gate electrode overlapping the drain. Inserting Eqs. 15-17 into Eq. 12 yields cut-off frequency $f_T$ for an ideal long-channel IGFET in saturation.

Eqs. 15 and 16 are not expected to be accurate for the asymmetric IGFETs of the invention due to the asymmetric longitudinal dopant grading in their channel zones. However, Eqs. 15 and 16 can be used as trend indicators in calculating parasitic capacitances $C_{GS}$ and $C_{GD}$ for assessing cut-off frequencies $f_T$ of the present asymmetric IGFETs. More accurate Values of capacitances $C_{GS}$ and $C_{GD}$ can be determined by computer simulation.

Cut-off frequency $f_T$ involves, by definition, the short-circuit condition at the output in the common-source configuration. As a result, frequency $f_T$ essentially obliterates the effects of parasitic drain-to-body capacitance $C_{DB}$. Also, frequency $f_T$ does not reflect the effect of parasitic source-to-body capacitance $C_{SB}$ since it utilizes the common-source configuration.

Cut-off frequency $f_T$ has a peak cut-off value $f_{Tpeak}$ dependent on the operating current, i.e., drain current $I_D$. Although peak cut-off frequency $f_{Tpeak}$ is useful in assessing high-frequency IGFET performance, circuits typically operate at frequencies one to two factors of 10 lower than peak value $f_{Tpeak}$. In addition to peak value $f_{Tpeak}$ desirably being high for an IGFET, it is generally desirable that there be reduced variation of cut-off frequency $f_T$ with decreasing operating current below operating current levels corresponding to peak value $f_{Tpeak}$.

Source-body and drain-body junctions, such as pn junctions 110 and 112 in inventive IGFETs 100, 140, 150, 160, 170, 180, 190, 210, 100V, 140V, 150V, 160V, 170V, 180V, and 190V, are normally reverse biased. When a pn junction is in reverse bias, the depletion region along the junction exhibits a small-signal areal capacitance $C_{da}$ given as:

$$C_{da} = \frac{K_S \varepsilon_0}{t_d} \tag{18}$$

where $\varepsilon_0$ is the absolute permittivity, $K_S$ is the relative permittivity of the semiconductor material, and $t_d$ is the voltage-dependent thickness of the depletion region.

For a pn junction formed along a uniformly doped substrate, thickness $t_d$ for the depletion region of such an ideal pn junction is:

$$t_d = \sqrt{\frac{2K_S \varepsilon_0 (V_R + V_{BI})}{qN_B}} \tag{19}$$

where $V_R$ is the applied reverse voltage, $V_{BI}$ is the built-in voltage of the junction, q is the electronic charge, and $N_{B0}$ is the uniform background dopant concentration in the substrate. Built-in voltage $V_{BI}$ varies with background dopant concentration $N_{B0}$ according to the relationship:

$$V_{BI} = \left(\frac{2kT}{q}\right)\ln\left(\frac{N_{B0}}{n_i}\right) \tag{20}$$

where k is Boltzmann's constant, T is the temperature, and $n_i$ is the intrinsic carrier concentration.

Figure 54:
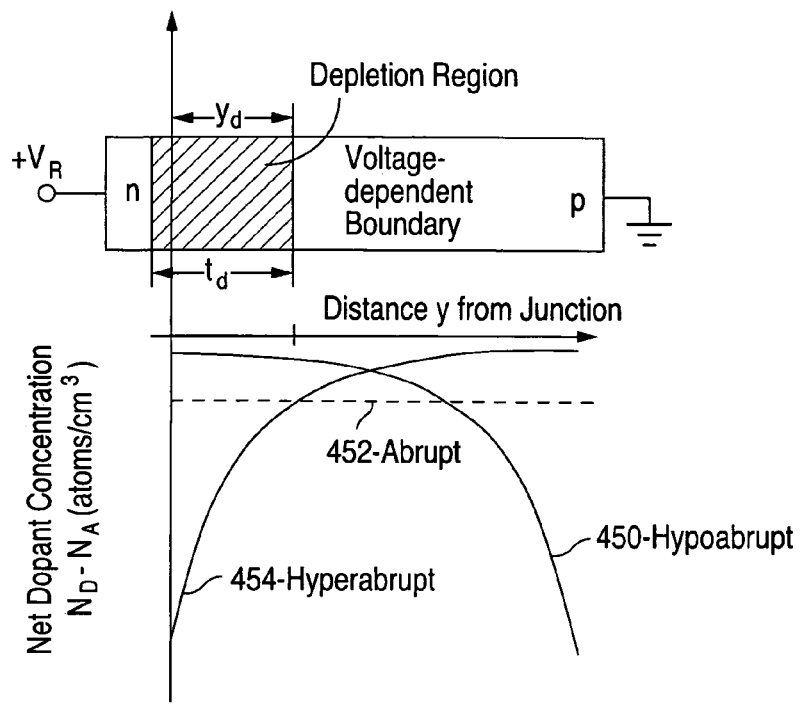
FIG. 54 is a graph of net dopant concentration as a function of distance from a pn junction for models of three different p-type dopant distributions.

FIG. 54 illustrates how net dopant concentration $N_D$-$N_A$ varies with distance y into p-type substrate material of a model of a pn junction that can have any of three basic types of dopant profiles in the p-type substrate, where $N_D$ and $N_A$ respectively are the absolute donor and acceptor dopant concentrations. The junction model is also shown in FIG. 54. As indicated by the illustrated junction model, the p-type material is thicker, and thus more lightly doped, than the junction's n-type material. Curves 450, 452, and 454 in FIG. 54 respectively indicate examples of hypoabrupt, abrupt, and hyperabrupt dopant profiles in the p-type material. Distance $y_d$ indicates the thickness of the p-type portion of the depletion region along the junction.

Hypoabrupt profile curve 450 approximately represents the vertical dopant profile below drain-body junction 112 in each of inventive n-channel IGFETs 100, 140, 150, 160, 170, 180, 190, 210, 100V, 140V, 150V, 160V, 170V, 180V, and 190V. In IGFETs 150, 160, 180, 190, 210, 150V, 160V, 180V, and 190V where drain 104 includes main drain portion 104M and lateral drain extension 104E, curve 450 specifically, represents the vertical dopant profile below the portion of drain-body junction 112 along the bottom of main portion 104M. For IGFETs 170, 180, 190, 170V, 180V, and 190V in which source 102 extends deeper below the upper semiconductor surface than pocket portion 120, curve 450 also represents the vertical dopant profile below source-body junction 110, specifically below the junction portion along the bottom of main source portion 102M for each of IGFETs 180, 190, 180V, and 190V. Subject to the conductivity types being reversed, curve 450 further represents the vertical dopant profile below the bottom of main portion 264M of drain 264 in each of inventive p-channel IGFETs 220, 220U, and 220V. Flat curve 452 represents the p-type material of the ideal abrupt pn junction covered by Eqs. 18-20.

Figure 55:
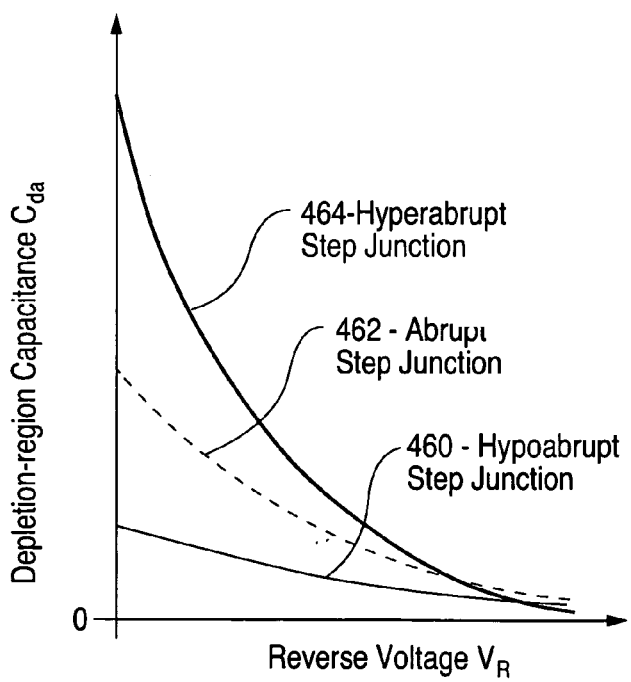
FIG. 55 is a graph of depletion-layer capacitance as a function of reverse voltage for the models of the three dopant distributions of FIG. 54.

FIG. 55 depicts how parasitic areal capacitance $C_{da}$ of the depletion region varies with reverse voltage $V_R$ across the pn junction modeled in FIG. 54. Curves 460, 462, and 464 in FIG. 55 indicate the $C_{da}$ variations respectively for curves 450, 452, and 454 in FIG. 54. In particular, curve 462 qualitatively indicates the power-law variation of capacitance $C_{da}$ for the ideal pn junction as determined from Eq. 18 using the $t_d$ data from Eq. 19 (and the $V_{BI}$ data from Eq. 20).

Parasitic drain-to-body capacitance $C_{DB}$ along drain-body junction 112 in inventive n-channel IGFET 100, 140, 150, 160, 170, 180, 190, 210, 100V, 140V, 150V, 160V, 170V, 180V, or 190V is approximately proportional to areal depletion capacitance $C_{da}$ as represented in FIG. 55 by curve 460 corresponding to hypoabrupt-function-profile curve 450 in FIG. 54. As FIG. 55 shows, depletion capacitance $C_{da}$ is lower for curve 460 than (a) for curve 462 corresponding to abrupt-junction profile (flat) curve 452 in FIG. 54 or (b) for curve 464 corresponding to hyperabrupt-junction-profile curve 454 in FIG. 54. Hence, the hypoabrupt vertical dopant profile below drain-body junction 112 in each IGFET 100, 140, 150, 160, 170, 180, 190, 210, 100V, 140V, 150V, 160V, 170V, 180V, or 190V causes its drain-to-body capacitance $C_{DB}$ to be reduced. The same applies to capacitance $C_{DB}$ along the bottom of drain 264 in inventive p-channel IGFET 220, 220U, or 220V. Parasitic source-to-body capacitance $C_{SB}$ is also normally reduced, especially in n-channel IGFETs 170, 180, 190, 170V, 180V, and 190V where source 102 extends deeper below the upper semiconductor surface than pocket portion 120.

Additionally, areal depletion capacitance $C_{da}$ for curve 460 corresponding to hypoabrupt-junction-profile curve 450 in FIG. 54 varies more slowly with reverse voltage $V_R$ than curve 462 or 464 as indicated by comparing curve 460 in FIG. 55 to curves 462 and 464. Parasitic drain-to-body capacitance $C_{DB}$ in each inventive IGFET 100, 140, 150, 160, 170, 180, 190, 210, 100V, 140V, 150V, 160V, 170V, 180V, 190V, 220, 220U, or 220V thus has reduced variance with reverse voltage $V_R$. This is advantageous because less compensation is needed to account for variations in capacitance $C_{DB}$. The same comments apply to parasitic source-to-body capacitance $C_{SB}$, particularly in IGFETs 170, 180, 190, 170V, 180V, and 190V.

In further examining the hypoabrupt dopant profile below drains 104 and 264, consider the extreme example of a hypoabrupt junction profile in which net dopant concentration $N_B$ of the semiconductor material along the more lightly doped side of the pn junction makes a step change from a first dopant-concentration value to a higher second dopant-concentration value at a selected distance sufficiently close to the junction to affect the parasitic capacitance along the junction. This example is modeled in FIG. 56 which illustrates how net dopant concentration $N_B$ varies with distance y from the junction.

Figure 56:
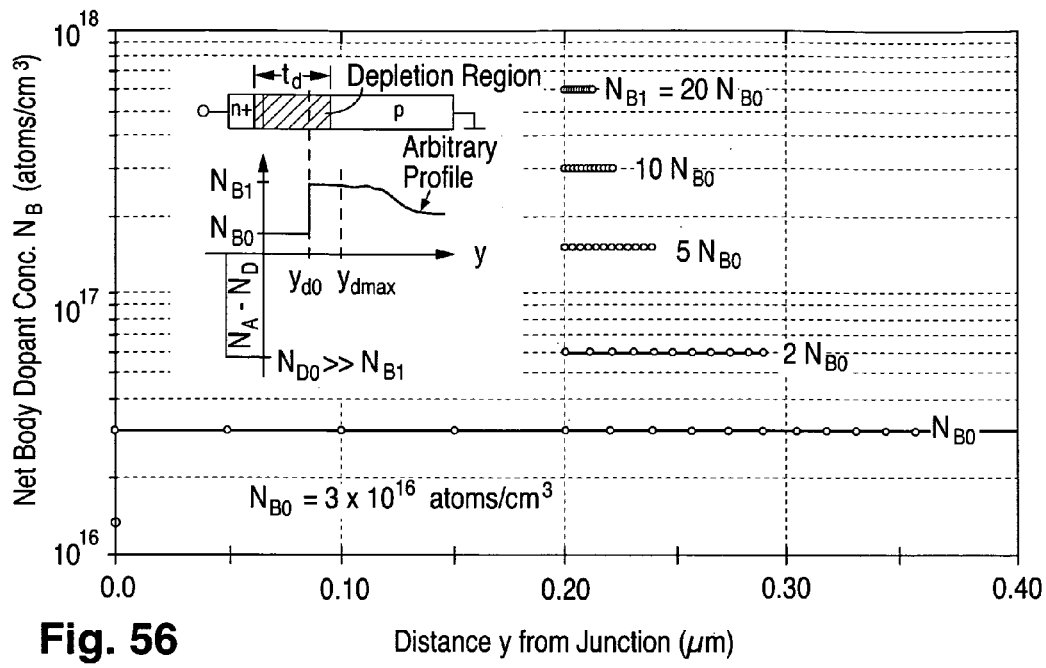
FIG. 56 is a graph of net body dopant concentration as a function of distance from a pn junction for a model of a junction capacitor whose more lightly doped side has a dopant profile that undergoes a step change in dopant concentration.

The two-step pn-junction model of FIG. 56 is configured in the following way. The more lightly doped side of the pn junction is formed with p-type material in which net dopant concentration $N_B$ is at first value $N_{B0}$ for a distance extending from the junction out to a distance $y_{d0}$ at which concentration $N_B$ makes a step increase to a second value $N_{B1}$. Distance $y_{d0}$ is the location that would constitute the p-type boundary of the depletion region at a zero value of reverse voltage $V_R$ if concentration $N_B$ in the p-type material were at low value $N_{B0}$ beyond distance $y_{d0}$ out at least to a location beyond which changes in concentration $N_B$ of the p-type material would not significantly affect the parasitic capacitance along the junction.

The depletion region along the junction in the model of FIG. 56 expands from distance $y_{d0}$ to a maximum distance $y_{dmax}$ as reverse voltage $V_R$ increases from zero to some maximum value $V_{Rmax}$. Beyond distance $y_{dmax}$, net dopant concentration $N_B$ can have an arbitrary profile in the p-type material as indicated in FIG. 56. As also indicated in FIG. 56, concentration $N_B$ of the more heavily doped n-type material along the junction is at a uniform value $N_{D0}$ much greater than $N_{B1}$.

FIG. 56 depicts the dopant profile in the p-type material as high concentration value $N_{B1}$ ranges from $N_{B0}$ (at which the step change in concentration at distance $y_{d0}$ disappears) up to 20 $N_{B0}$ at a typical $y_{d0}$ value of 0.2 μm and a typical $N_{B0}$ value of $3 \times 10^{16}$ atoms/cm$^3$. If the modeled pn junction is the drain-body junction at depth $y_D$ below the upper semiconductor surface, the step increase in concentration $N_B$ from $N_{B0}$ to $N_{B1}$ occurs at a depth $y_D + y_{d0}$ below the upper surface.

Areal depletion capacitance $C_{da}$ of the two-step pn junction of FIG. 56 is governed by the differential equation:

$$\frac{dV_R}{d(1/C_{da}^2)} = \frac{qK_S\varepsilon_0 N_B t_d(V_R)}{2} \tag{21}$$

Integrating Eq. 21 subject to the condition that the depletion region extend to distance $y_{d0}$ when reverse voltage $V_R$ is zero yields the following value for distance $y_{d0}$:

$$y_{d0} = \sqrt{\frac{2K_S\varepsilon_0 V_{BI}}{qN_{B0}}} \qquad (22)$$

Combining Eqs. 18 and 22 produces the following result for depletion capacitance $C_{da}$:

$$C_{da} = \sqrt{\frac{qK_S\varepsilon_0 N_{B0}}{2(V_{BI} + V_R N_{B0}/N_{B1})}} . \qquad (23)$$

Figure 57:
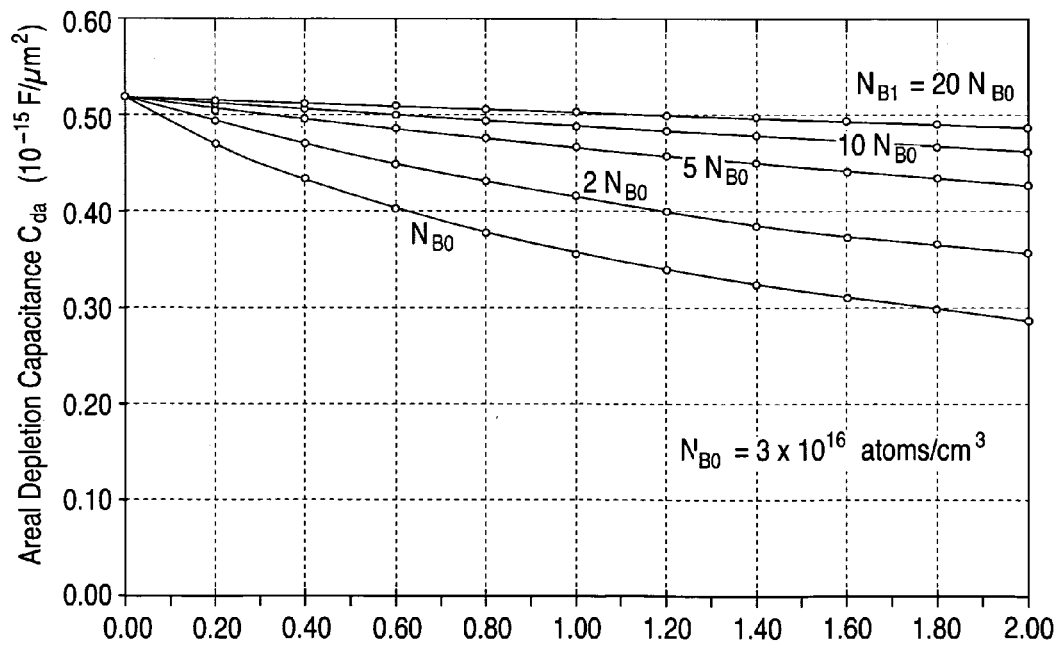
FIG. 57 is graph of areal junction capacitance as a function of reverse voltage for the junction capacitor modeled in FIG. 56.

FIG. 57 illustrates how areal depletion capacitance $C_{da}$ varies with reverse voltage $V_R$ for values of high concentration value $N_{B1}$ ranging from $N_{B0}$ (again, beyond the modeled junction) up to 20 $N_{B0}$ as determined from Eq. 23. FIG. 57 shows that increasing concentration ratio $N_{B1}/N_{B0}$ causes capacitance $C_{da}$ to vary more slowly with voltage $V_R$. For this reason, it is desirable that concentration ratio $N_{B1}/N_{B0}$ be as high as reasonably possible in order to have parasitic capacitances $C_{DB}$ and $C_{SD}$ vary slowly in the asymmetric IGFETs of the invention.

Areal depletion capacitance is at an initial value $C_{d0a}$ when reverse voltage $V_R$ is zero. Setting voltage $V_R$ to zero in Eq. 23 yields:

$$C_{da0} = \sqrt{\frac{qK_S\varepsilon_0 N_{B0}}{2V_{BI}}} \qquad (24)$$

Initial depletion capacitance value $C_{d0a}$ is, as expected, the classical value for an ideal pn junction at zero reverse voltage. In accordance with Eq. 24, capacitance value $C_{d0a}$ decreases with decreasing low concentration value $N_{B0}$ according to the square root of low value $N_{B0}$. In combination with choosing a high value of concentration ratio $N_{B1}/N_{B0}$ so as to have slow variations in parasitic capacitances $C_{DB}$ and $C_{SB}$, low concentration value $N_{B0}$ should be low in order for capacitances $C_{DB}$ and $C_{SB}$ to be low at zero reverse voltage $V_R$.

Computer Simulations Relating to Capacitance and Frequency Parameters

With the foregoing information about capacitance and frequency parameters in mind, small-signal simulations were performed with the Medici simulator to characterize the junction capacitances of inventive structure A. FIGS. 58a and 58b respectively depict short-channel and long-channel versions of structure A created by the Medici simulator for the junction capacitance characterization. Items 470 and 472 respectively indicate the source and drain contacts (or source and drain electrodes) in FIGS. 58a and 58b. Metal silicide layers 254 and 256 are respectively subsumed in contacts 470 and 472. The doping contour of p-type body material (or region) 108 in each of FIGS. 58a and 58b illustrates the graded nature of the doping in body material 108. The short-channel IGFET of FIG. 58a had a gate length $L_G$ of 0.15 µm. Gate length $L_G$ for the long-channel IGFET of FIG. 58b was 1.0 µm.

Figure 59:
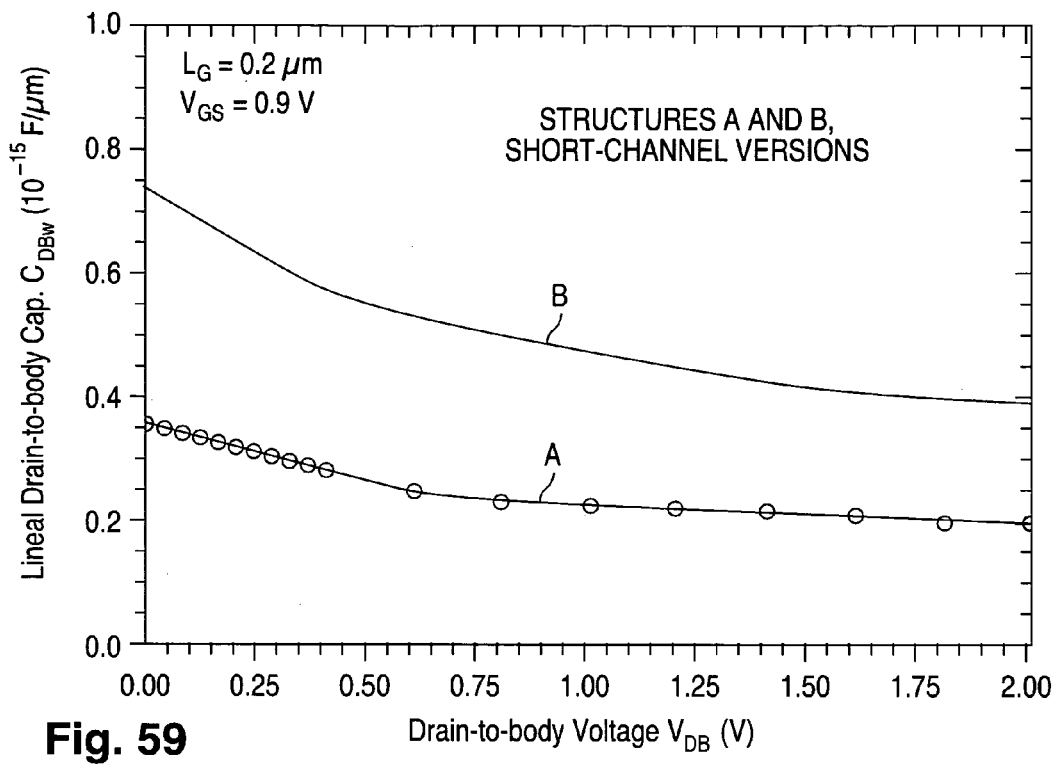
FIG. 59 is a graph of lineal drain-to-body capacitance as a function of drain-to-body voltage for the computer-simulated IGFETs of FIGS. 39 and 40.

FIG. 59 illustrates parasitic lineal drain-to-body capacitance $C_{DBw}$ as a function of drain-to-body voltage $V_{DB}$ for a short-channel implementation of inventive structure A quite similar to the short-channel implementation of structure A in FIG. 58a and for a short-channel implementation of reference structure B substantially corresponding size-wise and, except for the doping features of the invention, dopant-wise to the short-channel implementation of structure A in FIG. 59. Gate length $L_G$ is 0.2 µm in FIG. 59 rather than 0.15 µm as in FIG. 58a. Gate-to-source voltage $V_{GS}$ was 0.9 V for the $C_{DBw}$ simulations of FIG. 59. As FIG. 59 shows, drain-to-body capacitance $C_{DBw}$ is considerably lower for this short-channel version of inventive structure A than for the corresponding short-channel version of reference structure B. In particular, capacitance $C_{DBw}$ for the examined short-channel version of inventive structure A was approximately 50% of capacitance $C_{DBw}$ for the examined short-channel version of reference structure B in the $V_{DS}$ range of 0 to 2 V.

Figure 60:
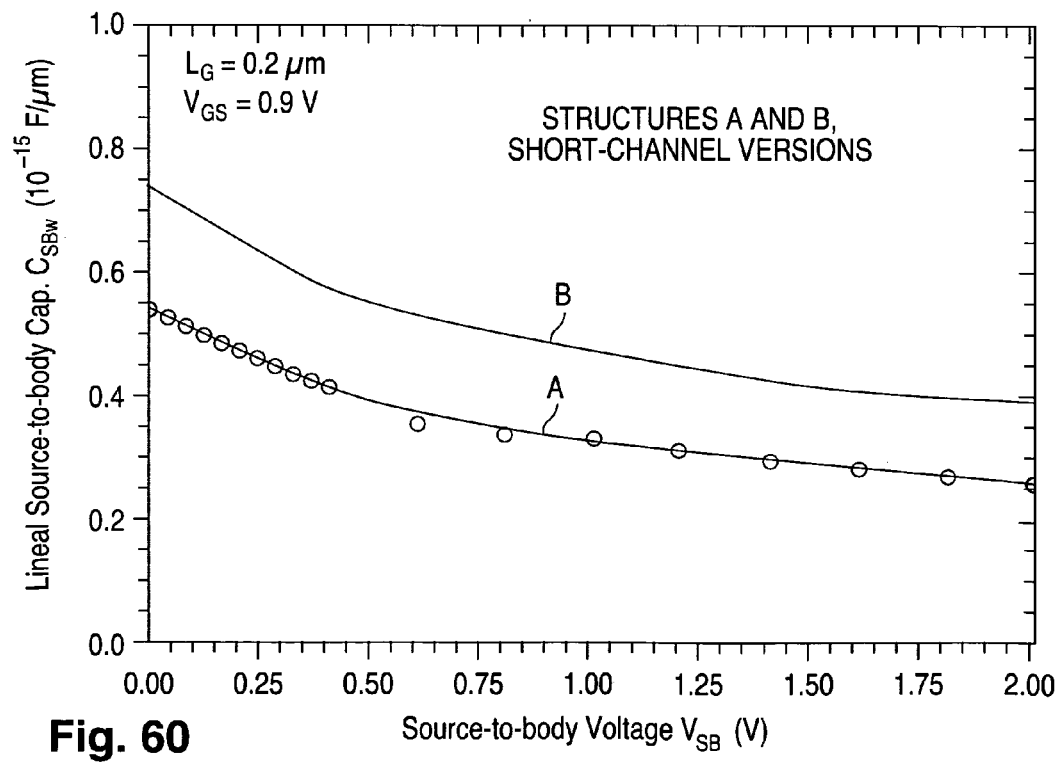
FIG. 60 is a graph of lineal source-to-body capacitance as a function of source-to-body voltage for the computer-simulated IGFETs of FIGS. 39 and 40.

FIG. 60 depicts parasitic lineal source-to-body capacitance $C_{SBw}$ as a function of source-to-body voltage $V_{SB}$ for the short-channel implementations of structures A and B examined in FIG. 59. Gate-to-source voltage $V_{GS}$ was again 0.9 V. As shown in FIG. 60, source-to-body capacitance $C_{SBw}$ was considerably lower for the examined short-channel version of inventive structure A than for the corresponding short-channel version of reference structure B. Although the $C_{SBw}$ reduction was not as great as the $C_{DBw}$ reduction, the examined short-channel version of structure A had approximately a 35-40% lower $C_{SBw}$ value than the examined short-channel version of structure B at the $V_{SB}$ value of 2.0 V, and a 25-35% lower $C_{SBw}$ value than the examined short-channel version of reference structure B at the $V_{SB}$ value of 0 V.

The somewhat lesser improvement in source-to-body capacitance $C_{SBw}$ for the short-channel version of structure A examined in FIG. 59 is expected because the total p-type dopant in source 102 is increased by the p-type pocket implant. Also, source-to-body capacitance $C_{SB}$ is less important than drain-to-body capacitance $C_{DB}$ in many applications because source 102 is shorted to body material 108. As desired, further reduction in source-to-body capacitance $C_{SB}$ for short-channel versions of structure A can be achieved by making well portion 116 deeper.

Figure 61:
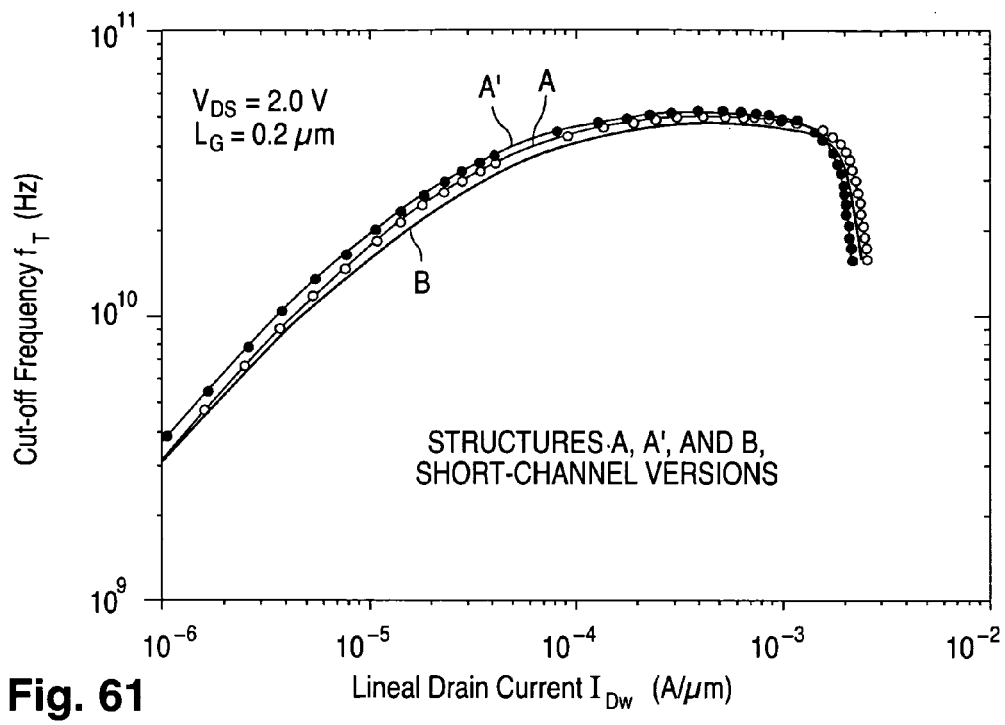
FIG. 61 is a graph of cut-off frequency as a function of lineal drain current for the computer-simulated IGFETs of FIGS. 39 and 40 and the further inventive IGFET of FIG. 63.

FIG. 61 illustrates cut-off frequency $f_T$ as a function of lineal drain current $I_{Dw}$ for the short-channel implementations of structures A and B examined in FIG. 59. FIG. 61 also illustrates the variation of cut-off frequency $f_T$ with lineal drain current $I_{Dw}$ for a variation A' of inventive short-channel structure A. In FIG. 61 and in later graphs that present computer-simulated data for inventive structures A and A', curves representing data for structure A' are marked with solid circles to distinguish that data from the data marked with empty circles for structure A. The particular characteristics of further inventive structure A' are described below in connection with FIGS. 63 and 64. As FIG. 61 indicates, cut-off frequency $f_T$ was largely the same for simulated short-channel structures A, A', and B.

Figure 62:
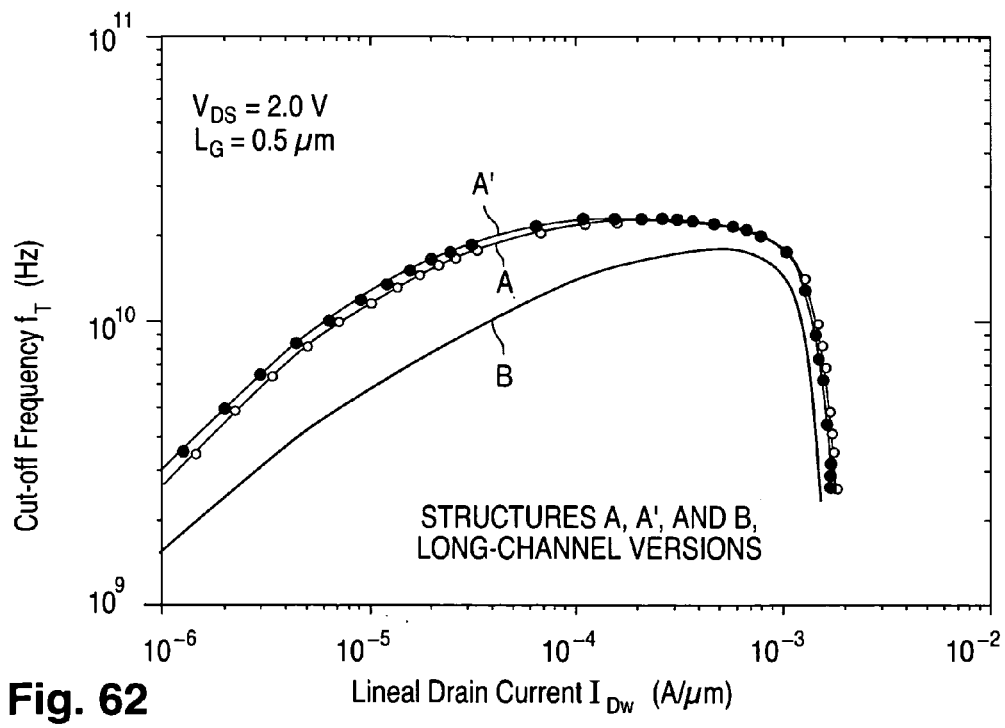
FIG. 62 is a graph of cut-off frequency as a function of lineal drain current for computer simulations of (i) an inventive asymmetric long n-channel IGFET corresponding to the inventive short-channel IGFET of FIG. 39, (ii) a reference symmetric long n-channel IGFET corresponding to the reference short-channel IGFET of FIG. 40, and (iii) a further inventive asymmetric long n-channel IGFET corresponding to the further inventive short-channel IGFET of FIG. 63.

The variation of cut-off frequency $f_T$ with lineal drain current $I_{Dw}$ is illustrated in FIG. 62 for long-channel versions of the implementations of structures A, A', and B in FIG. 61. As FIG. 62 shows, cut-off frequency $f_T$ was largely the same for the long-channel versions of inventive structures A and A'. Importantly, frequency $f_T$ for the long-channel versions of inventive structures A and A' was considerably greater than for the long-channel version of reference structure B. Accordingly, the long-channel versions of inventive structures A and A' had better performance capability than the long-channel version of reference structure B.

Figure 63:
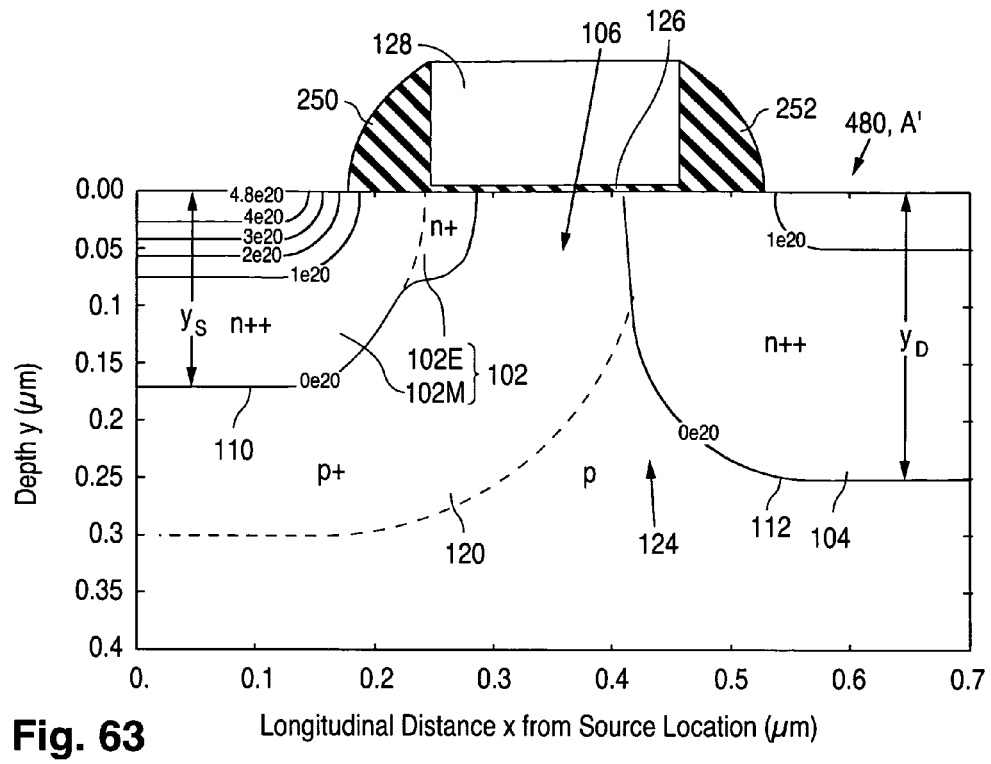
FIG. 63 is a front cross-sectional view of another computer-simulated asymmetric short n-channel IGFET configured according to the invention.

Additional IGFET in which Vertical Body-Material Dopant Profile Below Drain is Hypoabrupt Due to Subsurface Maximum in Well Dopant Concentration FIG. 63 illustrates a short n-channel implementation 480 of asymmetric IGFET structure A' according to the invention. In addition to generally showing structural details, doping contours for IGFET 480 are depicted in FIG. 63 as a function of depth y and longitudinal distance x from a source location. The source location for measuring distance x is approximately 0.35 μm from the channel-zone center.

IGFET 480 is configured generally similar to short-channel IGFET 140 of FIG. 11 except that source 102 in IGFET 480 consists of n++ main source portion 102M and n+ more lightly doped lateral extension 102E as in long-channel IGFET 150 of FIG. 13. This enables source resistance $R_S$ to be reduced in IGFET 480 and thereby improves its analog performance. As in IGFETs 140 and 150, p-type pocket portion 120 extends deeper below the upper semiconductor surface than source 102. Drain depth $y_D$ for IGFET 480 is approximately 50% greater than source depth $y_S$.

Figure 64:
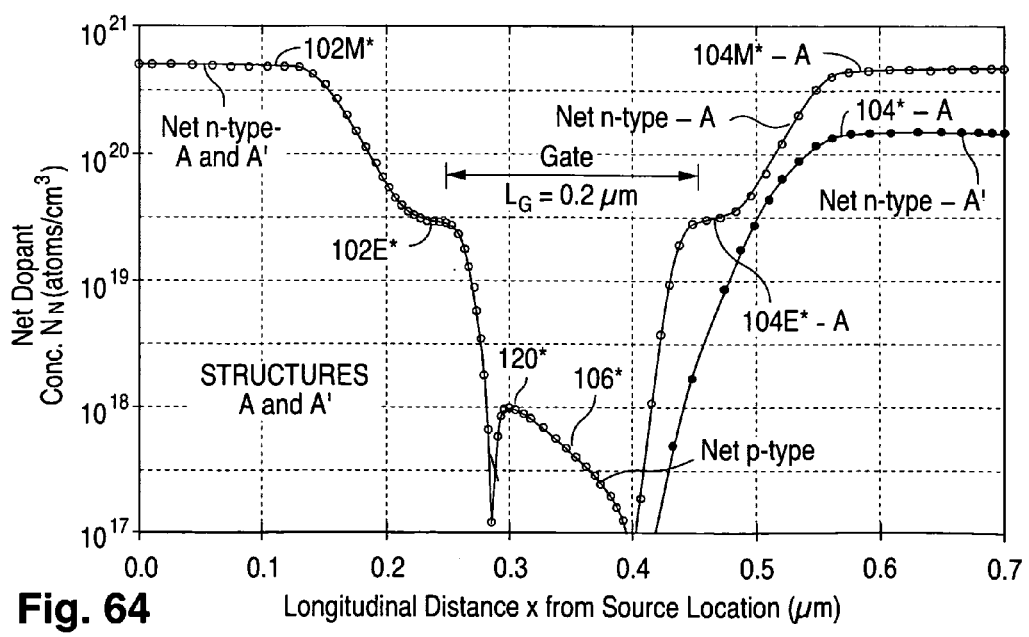
FIG. 64 is a graph of net dopant concentration as a function of longitudinal distance from a source location for the computer-simulated IGFETs of FIGS. 39 and 63.

FIG. 64 presents net dopant concentration $N_N$ along the upper semiconductor surface as a function of longitudinal distance x from the preceding source location for inventive structure A of FIG. 39 and inventive structure A', i.e., IGFET 480, of FIG. 63. As in FIGS. 12c and 14c, curve segments 106\* and 120\* here represent concentration $N_N$ of the net p-type dopant in respective regions 106 and 120 while curve segments 102M\*, 102E\*, 104M\*, 104E\*, and 104\* represent concentrations $N_N$ of the net n-type dopant in respective regions 102M, 102E, 104M, 104E, and 104. Although only marked with open circles, curve segments 102M\*, 102E\*, 106\*, and 120\* apply to both structure A and structure A'.

As curve segments 104\* and 102M\* in FIG. 64 indicate, short-channel IGFET 480 of inventive structure A' reaches a somewhat lower maximum net dopant concentration in drain 104 along the upper surface than in main source portion 102M. More particularly, the maximum value of net dopant concentration $N_N$ in drain 104 along the upper surface of IGFET 480 is normally 20-50%, typically 30-40%, of the maximum upper-surface value of concentration $N_N$ in main source portion 102M. Although FIG. 64 illustrates an example in which the maximum upper-surface value of concentration $N_N$ in drain 104 slightly exceeds $1 \times 10^{20}$ atoms/cm$^2$, the maximum upper-surface $N_N$ concentration in drain 104 of short-channel IGFET 480 can readily be considerably lower, e.g., $5 \times 10^{19}$ atoms/cm$^2$ down to $1 \times 10^{19}$ atoms/cm$^2$ or less, dependent on the maximum upper-surface $N_N$ concentration in main source portion 102M. Also, drain 104 in IGFET 480 extends somewhat deeper below the upper surface than main source portion 102M. In essence, the two-part drain formed with a main portion and a more lightly doped lateral extension in an IGFET, such as IGFET 150, whose source consists of a main portion and a more lightly doped lateral extension is replaced in IGFET 480 with a deeper more lightly doped drain. The reduced doping in drain 104 of IGFET 480 results in a lower electric field in drain 104 and enables IGFET 480 to operate away from electric-field magnitudes at which undesirable drain impact ionization occurs.

Figure 65:
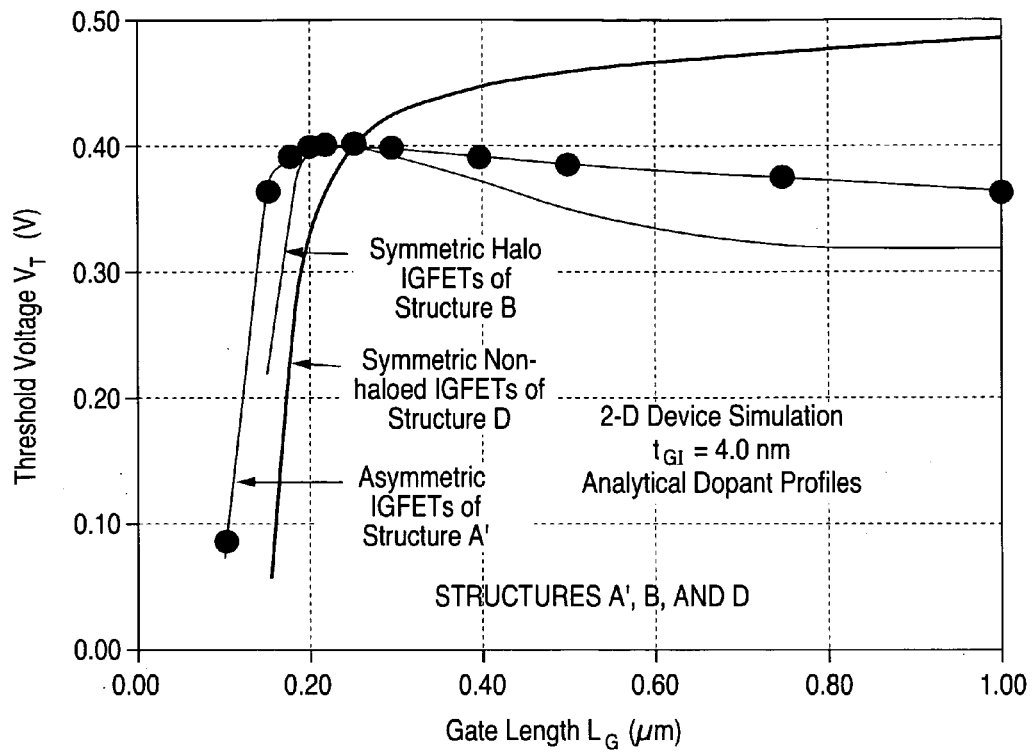
FIG. 65 is a graph of threshold voltage as a function of channel length for (i) asymmetric n-channel IGFETs configured according to the invention, (ii) reference symmetric n-channel IGFETs having halo pocket portions along each source/drain zone, and (iii) reference symmetric n-channel IGFETs lacking a halo pocket along each source/drain zone.

FIG. 65 illustrates threshold voltage $V_T$ as a function of gate length $L_G$ for computer simulations of the IGFETs of inventive structure A', reference structure B, and a further symmetric reference structure D lacking both halo pocket portions of structure B but otherwise substantially identical size-wise and dopant-wise to structure B. Gate dielectric thickness $t_{GI}$ was 4.0 nm in the simulations of FIG. 65.

As FIG. 65 shows, threshold voltage roll-off was shifted to a lower value of threshold voltage $V_T$ in inventive structure A' than in reference structure B or D. FIG. 65 also shows that inventive structure A' incurred less undesired reverse short-channel effect than reference structure B or D. That is, inventive structure A underwent less change, normally less decrease, in threshold voltage $V_T$ with increasing gate length $L_G$ in the long-channel domain than reference structure B or D. Structure A thus had better short-channel and long-channel characteristics than structure B or D.

Fabrication of Additional IGFET

N-channel IGFET 480 which implements asymmetric IGFET structure A' of FIG. 63 is typically fabricated in accordance with the invention according to the steps used to fabricate asymmetric n-channel IGFET 210 in the process of FIG. 31 subject to suitable modifications in the n-type source/drain extension and main source/drain implantation steps and subject to the use of an additional masking step and associated ion implantation operation. These differences are described below for IGFET 480 using, as appropriate, the same reference notation employed in describing the fabrication of IGFET 210.

In particular, N+ precursor source extension 102EP is defined for IGFET 480 at the stage of FIG. 31l without defining a corresponding n+ precursor drain extension for IGFET 480. This entails configuring photoresist mask 422 to extend above the location where a precursor drain extension would otherwise be formed for IGFET 480 but to have an opening above the location for precursor source extension 102EP for IGFET 480. In so doing, photoresist 422 is critically aligned to precursor gate electrode 128P for IGFET 480. The n-type source/drain extension implantation is performed as described above in connection with FIG. 31l after which photoresist 422 is removed. Because photoresist 422 masked the location for a precursor drain extension for IGFET 480, precursor source extension 102EP is formed for IGFET 480 without forming a corresponding precursor drain extension.

Later at the stage of FIG. 31q, photoresist mask 434 is configured to extend above the location for drain 104 of IGFET 480 but to have an opening above the location for main source portion 102M of IGFET 480. Photoresist 434 is critically aligned to precursor gate electrode 128P of IGFET 480. The n-type main source/drain implantation is performed as generally described above in connection with FIG. 31q after which photoresist 434 is removed. Since photoresist 422 masked the location for drain 104 of IGFET 480, main source portion 102M is defined for IGFET 480 without yet defining drain 104. The portion of precursor source extension 102EP outside main source portion 102M constitutes source extension 102E. With part of precursor gate electrode 128P of IGFET 480 uncovered during the implantation, the n-type main source/drain dopant also entered the uncovered part of that electrode 128P.

An additional photoresist mask (not shown) having an opening above the intended location for source 102 of IGFET 480 is formed on dielectric layers 430 and 432 and gate sidewall spacer 252 for IGFET 480, gate sidewall spacers 250 and 252 for IGFET 210, and gate sidewall spacers 290, 292, 330, 332, 370, and 372. The additional photoresist is critically aligned to precursor gate electrode 128P of IGFET 480. N-type drain dopant is ion implanted at a very high dosage through the uncovered portion of surface dielectric layer 432 and into the underlying monosilicon to define n++ drain 104 of IGFET 480. Although the dosage of the n-type drain dopant used to define drain 104 of IGFET 480 is very high, the dosage of the n-type drain dopant is less than the very high dosage of the n-type main source/drain dopant used to define main source zone 102M of IGFET 480. Consequently, drain 104 of IGFET 480 is more lightly doped than its main source portion 102M.

The n-type drain implantation for IGFET 480 is also performed under such conditions that its drain 104 extends deeper below the upper semiconductor surface than both its main source portion 102M and its precursor source extension 102EP. For instance, the n-type main source/drain implantation and the n-type drain implantation for IGFET 480 can be performed with the same n-type dopant, either arsenic or antimony. In this case, the n-type drain implantation for IGFET 480 is performed at a higher implant energy than the n-type main source/drain implantation. Alternatively, the two implantations can be performed using different n-type dopants with the n-type drain dopant of IGFET 480 being of lower molecular weight than the n-type main source/drain dopant. In one example, arsenic is the main source/drain dopant while phosphorus is n-type drain dopant of IGFET 480. The implantation energies are closer to each other in this alternative than in the first-mentioned case. However, the range of the n-type drain implant is greater than the range of the n-type main source/drain implant in both cases. The additional photoresist is removed after the n-type drain implantation for IGFET 480.

The part of precursor gate electrode 128P for IGFET 480 covered during the main source/drain implantation was largely uncovered during the n-type drain implantation for IGFET 480. This enabled the n-type drain dopant for IGFET 480 to enter the part of that electrode 128P covered during the n-type main source/drain implantation. As a result, substantially all of precursor gate electrode 128P of IGFET 480 is now heavily doped n-type. Precursor gate electrode 128P of IGFET 480 thereby becomes its n++ gate electrode 128.

The n-type drain implantation for IGFET 480 can be performed before, rather than after, the n-type main source/drain implantation. In either case, the remainder of the fabrication of IGFET 480 is performed as described above for IGFET 210.

If IGFET 210 is also to be present in the semiconductor structure, the configurations of photoresist masks 422 and 434 above the intended location for IGFET 210 are the same as described above respectively in connection with FIGS. 31*l* and 31*q*. The formation of IGFET 480 does not affect the formation of IGFET 210.

Further Complementary-IGFET Structure Suitable for Mixed-Signal Applications

Figure 66:
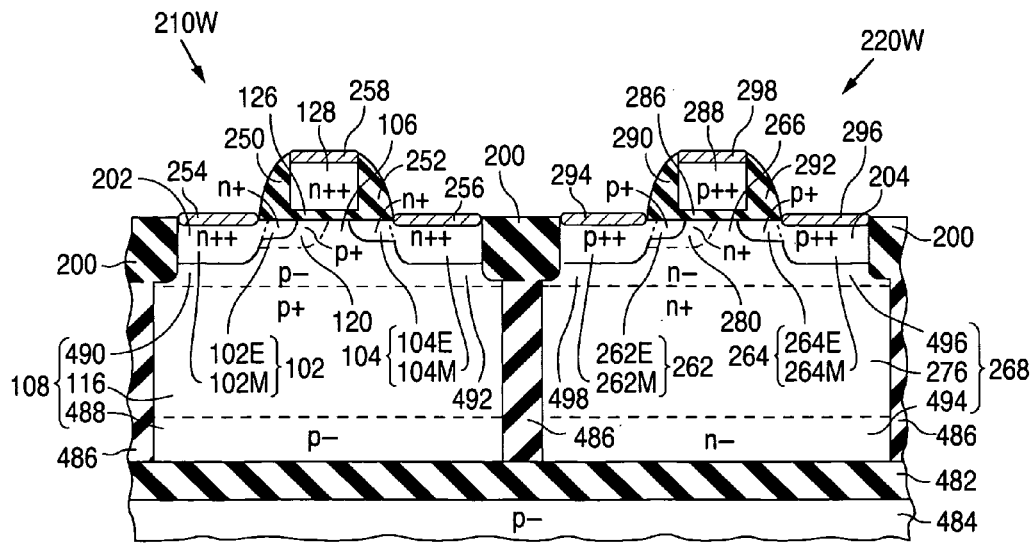
FIG. 66 is a front cross-sectional view of an additional complementary-IGFET semiconductor structure configured according to the invention.

FIG. 66 illustrates a variation, in accordance with the invention, of the complementary-IGFET structure of FIG. 29.1. The complementary-IGFET structure of FIG. 66 is especially suitable for mixed-signal applications. The principal configurational difference between the complementary-IGFET structures of FIGS. 29.1 and 66 is that the complementary-IGFET structure of FIG. 66 is created from a starting structure such as a bonded wafer.

In the complementary-IGFET structure of FIG. 66, a subsurface electrically insulating layer 482 typically consisting primarily of silicon oxide separates a lower semiconductor layer 484 from an upper semiconductor layer having islands 202 and 204 laterally separated by field-insulation region 200 along the upper semiconductor surface. Lower semiconductor layer 484 normally consists of monosilicon, either p type or n type. FIG. 66 presents an example in which lower semiconductor layer 484 is lightly doped p type. An electrically insulating extension 486, typically of the trench type and likewise typically consisting primarily of silicon oxide, extends from field-insulation region 200 to subsurface insulating layer 482. Field insulation 200 and insulating extension 486 together laterally surround islands 202 and 204 so that they are fully dielectrically isolated from each other.

Islands 202 and 204 normally consist of doped <100> monosilicon. Island 202 has a low substantially uniform n-type background dopant concentration on which is imposed a low, but slightly higher, substantially uniform p-type background concentration typically provided by the p-type semiconductor dopant aluminum. Consequently, portions of island 202 that do not receive any other dopant (p type or n type) are lightly doped p type. Island 204 simply has a low substantially uniform n-type background dopant concentration.

Island 202 provides the monosilicon for a variation 210W of long n-channel IGFET 210. Source 102 and drain 104 of long n-channel IGFET 210W are separated by a channel portion of p-type body material 108 consisting of a lightly doped lower portion 488, p+ well portion 116, and an upper portion 490. P− lower body-material portion 488 and p-type upper body-material portion 490 respectively correspond to p− lower body-material portion 114 and p-type upper body-material portion 118 of IGFET 210. Upper body-material portion 490 of IGFET 210W consists of source-contacting p+ pocket portion 120 and lightly doped p-type remainder 492 that corresponds to p− upper body-material remainder 124 of IGFET 210. Due to the imposition of the low p-type background dopant concentration on the lower n-type background concentration in island 202 of IGFET 210W, net dopant concentration $N_N$ in the bulk of each region 488 or 492 is largely the difference between the p-type and n-type background dopant concentrations.

Aside from the above-mentioned configurational differences and the presence of the two background dopant concentrations in island 202, n-channel IGFET 210W is configured and constituted substantially the same as n-channel IGFET 210. P− lower body-material portion 488 can be deleted so that p+ well portion 116 extends down to subsurface insulating layer 482.

Island 204 provides the monosilicon for a variation 220W of long p-channel IGFET 220. Source 262 and drain 264 of long p-channel IGFET 220W are separated by a channel portion of n-type body material 268 consisting of a lightly doped lower portion 494, n+ well portion 276, and an upper portion 496 corresponding to n-type upper body-material portion 278 of IGFET 220. Upper body-material portion 496 of IGFET 220W consists of source-contacting n+ pocket portion 280 and lightly doped n-type remainder 498 that corresponds to n− upper body-material remainder 284 of IGFET 220. Unlike IGFET 220, IGFET 220W does not have a low p-type background dopant concentration and does not utilize an n-type compensating dopant to ensure that all of upper body-material portion 496 is of n-type conductivity. Net dopant concentration $N_N$ in the bulk of each region 494 or 498 is simply the n-type background dopant concentration.

Aside from the above-mentioned configurational differences and the absence of an n-type compensating dopant to ensure that all of upper body-material portion 496 is n type, p-channel IGFET 220W is configured and constituted substantially the same as p-channel IGFET 220. N-lower body-material portion 494 can be deleted so that n+ well portion 276 extends down to subsurface insulating layer 482.

Fabrication of Further Complementary-IGFET Structure

The complementary-IGFET structure of FIG. 66 is manufactured in the following manner according to the invention. A structure is first provided in which subsurface insulating layer 482 is sandwiched between lower semiconductor layer 484 and an upper semiconductor region consisting of <100> n-type monosilicon at a low uniform dopant concentration. This initial structure can be created, for example, by bonding two semiconductor wafers together through electrically insulating material that forms subsurface insulating layer 482. One of the wafers provides the <100> n-type monosilicon for the upper semiconductor region. The other wafer provides lower semiconductor layer 484 again normally consisting of monosilicon, either p type as in the illustrated example or n type.

Insulating extension 486 is formed in the n− upper semiconductor region according to a deep trench-isolation technique. Field-insulating region 200 is then formed along the outside (upper) surface of the n− upper semiconductor region according to a shallow trench-isolation technique to define islands 202 and 204. Using a photoresist mask having an opening above island 202, p-type semiconductor dopant normally consisting of aluminum is introduced into island 202 at a light dosage that is sufficiently high to convert all the material of island 202 to p-type conductivity at a low net concentration. When aluminum is used to perform the p-type doping of island 202, the aluminum diffuses relatively fast throughout island 202 so that it becomes substantially uniformly doped p type in a relatively short time.

P+ well portion 116 and n+ well portion 276 are formed respectively in islands 202 and 204 in the manner described above in connection with fabrication of IGFETs 210 and 220. Part of island 202 underlies well 116 and constitutes p− lower body-material portion 488. Part of island 204 similarly underlies well 276 and constitutes n− lower body-material portion 494. Regions 102, 104, 120, 126, 128, 250, 252, 254, 256, and 258 for IGFET 210W and regions 262, 264, 280, 286, 288, 290, 292, 294, 296, and 298 for IGFET 220W are then formed as described above for IGFETs 210 and 220. The p-type monosilicon above well portion 116 constitutes p-type upper body-material portion 490 of which the part outside p+ halo pocket portion 120 constitutes p− upper body-material remainder 492. The n-type monosilicon above well portion 276 constitutes p-type upper body-material portion 496 of which the part outside n+ halo pocket portion 280 constitutes n− upper body-material remainder 498.

IGFETs in which Vertical Body-Material Dopant Profile Below Drain is Hypoabrupt Due to Step Change in Body-Material Dopant Concentration The vertical dopant profiles below the drains in the asymmetric IGFETs configured according to the invention can be made hyperabrupt in ways other than having concentration $N_T$ of the conductivity-type-defining dopant in the body material decrease progressively by at least a factor of 10 in going from the location of the maximum well dopant concentration up to the drain. In particular, the vertical dopant profile below the drain can be made hypoabrupt by arranging for the body material below the drain to include (a) a drain-adjoining portion in which the conductivity-type-defining dopant is at a largely uniform first concentration and (b) a directly underlying drain-remote portion in which the conductivity-type-defining dopant is at a largely uniform second concentration significantly greater than, normally at least 10 times greater than, the concentration of the conductivity-type-defining dopant in the drain-adjoining portion.

The concentration of the conductivity-type-defining dopant then undergoes a step decrease, normally by at least a factor of 10, in going from the drain-remote body-material portion up through the drain-adjoining body-material portion to the drain. An n-channel IGFET provided with this second type of drain-underlying hypoabrupt dopant profile, along with the asymmetric channel-zone doping characteristics of inventive structure A or A', is generally referred to here as inventive structure E.

Figure 67:
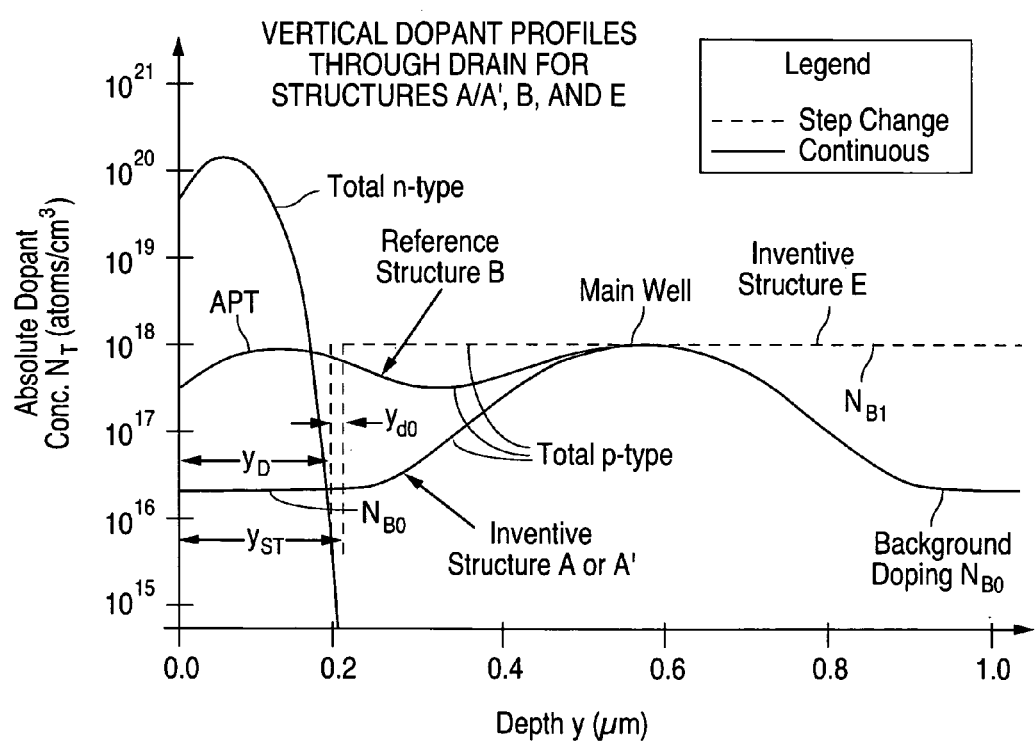
FIG. 67 is a graph of absolute dopant concentration as a function of depth for (i) two asymmetric n-channel IGFETs configured according to the invention and (ii) a reference symmetric n-channel IGFET.

FIG. 67 generally illustrates the vertical dopant profiles through the drains and into the underlying body regions for n-channel IGFETs configured as structures A/A', B, and E. More particularly, the variation of absolute dopant concentration $N_T$ as a function of depth y along a vertical line through the drain is shown in FIG. 67 for an n-channel IGFET of each of structures A/A', B, and E. Similar to what is shown in FIG. 56, concentration $N_T$ of the total p-type dopant along the vertical line through the drain of the n-channel IGFET of structure E is at uniform concentration value $N_{B0}$ from the upper semiconductor surface to a depth $y_{ST}$ equal to drain depth $y_D$ plus distance $y_{d0}$. Concentration $N_T$ of the p-type dopant in the drain-adjoining body-material portion extending distance $y_{d0}$ from depth $y_D$ to depth $y_{ST}$ is thus $N_{B0}$. Distance $y_{d0}$ is normally 0.05-1.0 μm, typically 0.1 μm.

At depth $y_{ST}$, absolute dopant concentration $N_T$ makes a step change from $N_{B0}$ up to value $N_{B1}$ greater than, normally at least a factor of 10 greater than, $N_{B0}$. Concentration $N_T$ of the p-type dopant in the drain-remote body-material portion extending downward from depth $y_{ST}$ is at value $N_{B1}$ out to some depth beyond which the concentration of the p-type dopant in the body material does not have any significant effect on the characteristics, especially drain-to-body capacitance $C_{DB}$, at the drain-body junction. Accordingly, concentration $N_T$ of the p-type dopant in the body material makes a step decrease, normally by at least a factor of 10, in crossing from the drain-remote body-material portion where concentration $N_T$ of the p-type dopant equals $N_{B1}$ up into the drain-adjoining body-material portion where concentration $N_T$ of the p-type dopant equals $N_{B0}$ and then remains at $N_{B0}$ up to the drain-body junction.

Figure 68A:
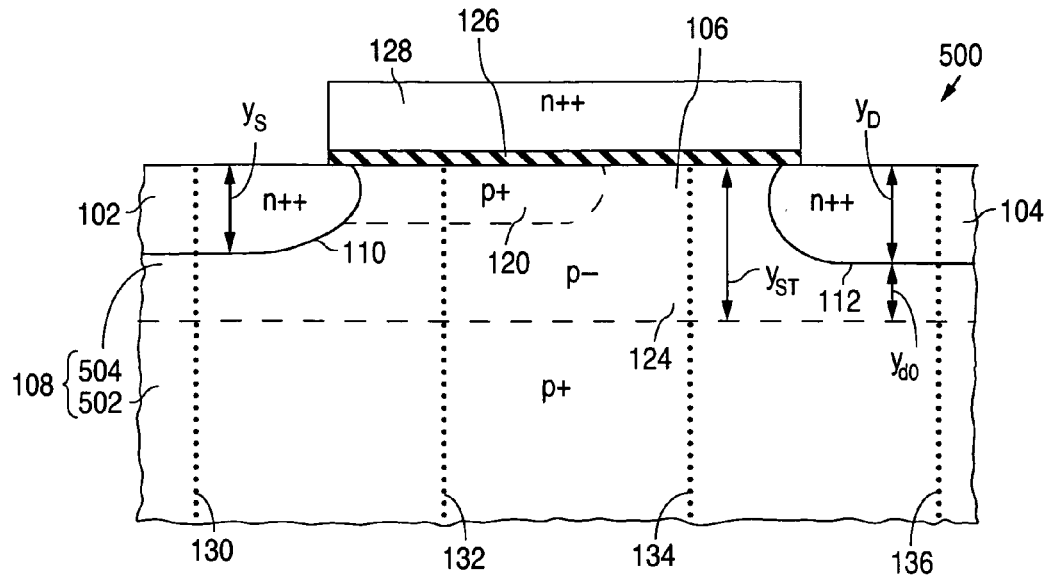
FIGS. 68a and 68b are front cross-sectional views of two respective further asymmetric long n-channel IGFETs configured according to the invention.

FIG. 68a illustrates an asymmetric long n-channel IGFET 500 configured in accordance with the invention to implement structure E so as to be particularly suitable for high-speed analog applications. IGFET 500 is arranged substantially the same as IGFET 170 of FIG. 18a except that p-type body material 108 consists of a heavily doped lower subsurface portion 502 and an upper surface-adjoining portion 504 which extends to the upper semiconductor surface. P+ subsurface body-material portion 502 underlies source 102, drain 104, and channel zone 106. The upper boundary (top) of subsurface body-material portion 502 is at depth $y_{ST}$ below the upper semiconductor surface. Depth $y_{ST}$ is normally no more than 10 times, preferably no more than 5 times, drain depth $y_D$. At its closest to source 102 and drain 104, subsurface portion 502 is thus normally no more than 10 times deeper, preferably no more than 5 times deeper, below the upper semiconductor surface than source 102 and drain 104.

P-type surface-adjoining body-material portion 504 overlies and meets p+ subsurface body-material portion 502. Channel zone 106 is part of surface-adjoining body-material portion 504. P+ pocket portion 120, which is shallower than source 102 here, is also part of surface-adjoining body-material portion 504. Item 124 in FIG. 68a is now the lightly doped material of surface-adjoining body-material portion 504, i.e., the segment of portion 504 outside pocket portion 120.

The p-type dopant in the segment of surface-adjoining body-material portion 504 below drain 104 is present at a largely uniform concentration equal to $N_{B0}$. A typical value for concentration $N_{B0}$ is $5 \times 10^{15}$ atoms/cm$^3$. The p-type dopant in the segment of subsurface body-material portion 502 below the preceding segment of surface-adjoining body-material portion 504 and thus below drain 104 is present there at a largely uniform higher concentration equal to $N_{B1}$. Value $N_{B1}$ is normally at least 10 times $N_{B0}$, preferably at least 20 times $N_{B0}$, more preferably at least 40 times $N_{B0}$, typically in the vicinity of 100 times $N_{B0}$.

Figure 68B:
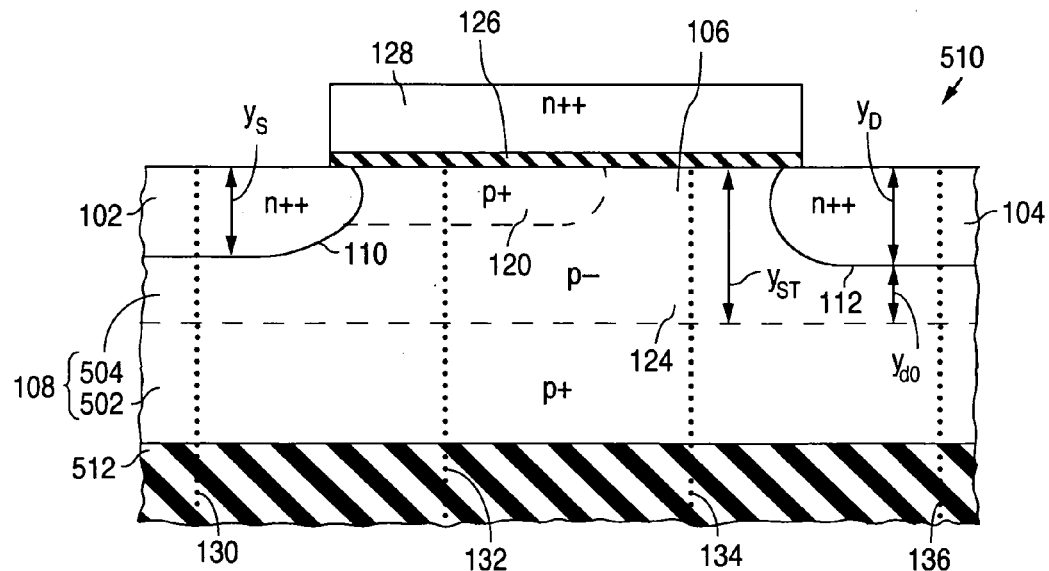

FIG. 68b illustrates another asymmetric long n-channel IGFET 510 configured in accordance with the invention to implement structure E so as to be particularly suitable for high-speed analog applications. IGFET 510 is arranged the same as IGFET 500 except that a subsurface electrically insulating layer 512 typically consisting largely of silicon oxide contacts subsurface body-material portion 502 along its bottom surface. In IGFET 510, the p-type dopant in the segment of subsurface body-material portion 502 underlying drain 104 from depth $y_{ST}$ down to subsurface insulating layer 512 is largely uniformly doped at concentration $N_{B1}$.

Figure 69A:
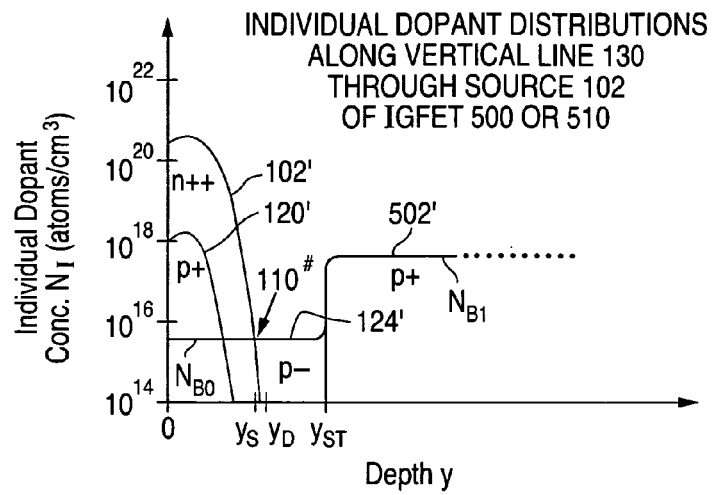
FIGS. 69a-69c are respective graphs of individual, absolute, and net dopant concentrations as a function of depth along a vertical line through the source of the IGFET of FIG. 68a or 68b.
Figure 69B:
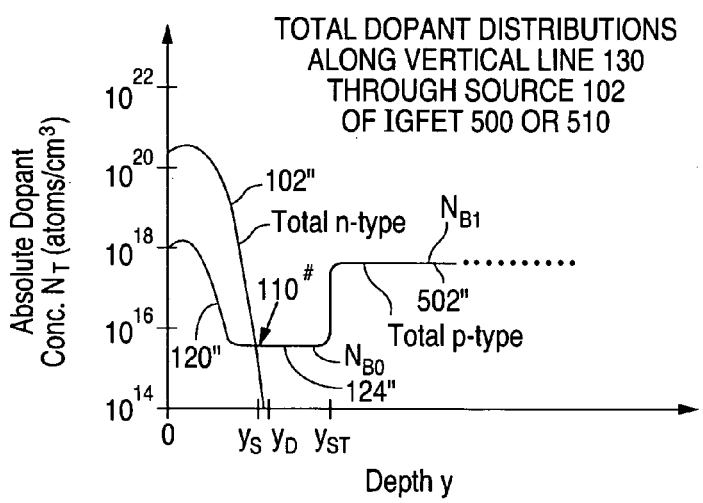
Figure 69C:
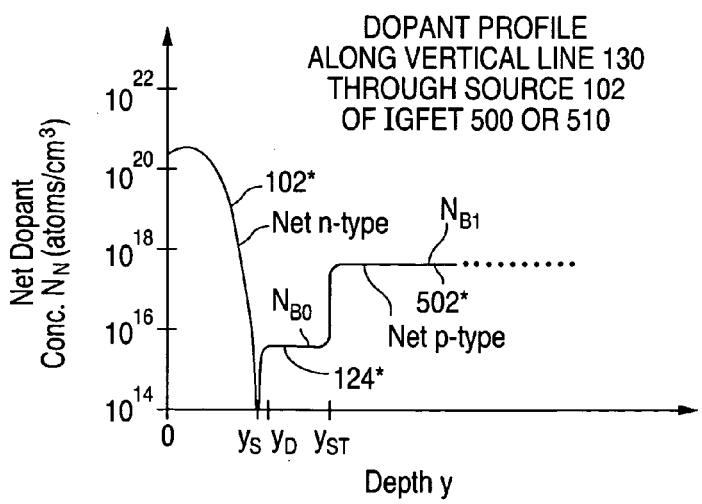

An understanding of the hypoabrupt vertical dopant profile below drain 104 in underlying body material 108 of IGFETs 500 and 510 is facilitated with the assistance of FIGS. 69a-69c (collectively "FIG. 69"), FIGS. 70a-70c (collectively "FIG. 70"), and FIGS. 71a-71c (collectively "FIG. 71"). FIG. 69, which is generally analogous to FIG. 8, presents exemplary dopant concentrations along vertical line 130 through source 102 of IGFET 500 or 510. Exemplary dopant concentrations along vertical lines 132 and 134 through channel zone 106 of IGFET 500 or 510 are presented in FIG. 70 which is generally analogous to FIG. 9. FIG. 71, which is generally analogous to FIG. 10, presents exemplary dopant concentrations along vertical line 136 through drain 104 of IGFET 500 or 510.

Figure 70A:
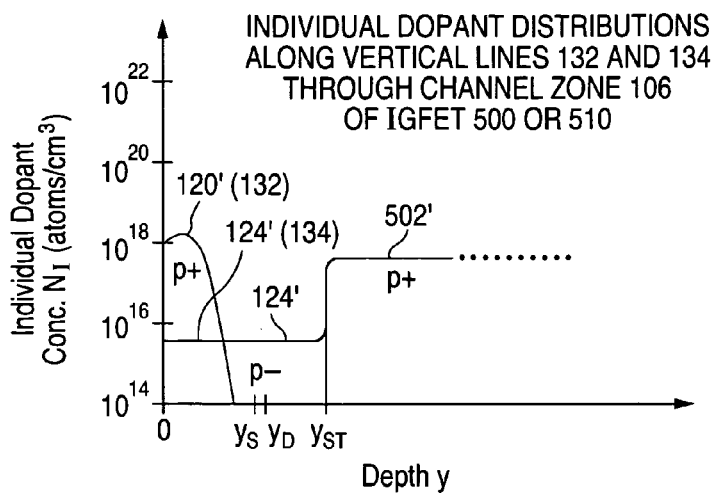
FIGS. 70a-70c are respective graphs of individual, absolute, and net dopant concentrations as a function of depth along a pair of vertical lines through the channel zone of the IGFET of FIG. 68a or 68b.
Figure 70B:
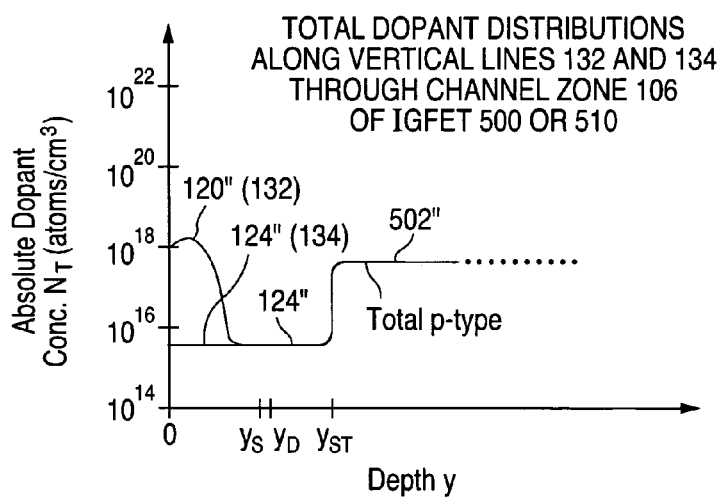
Figure 70C:
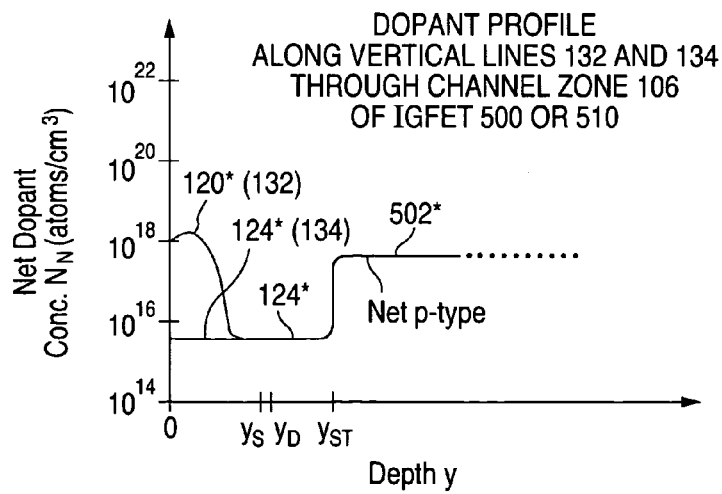
Figure 71A:
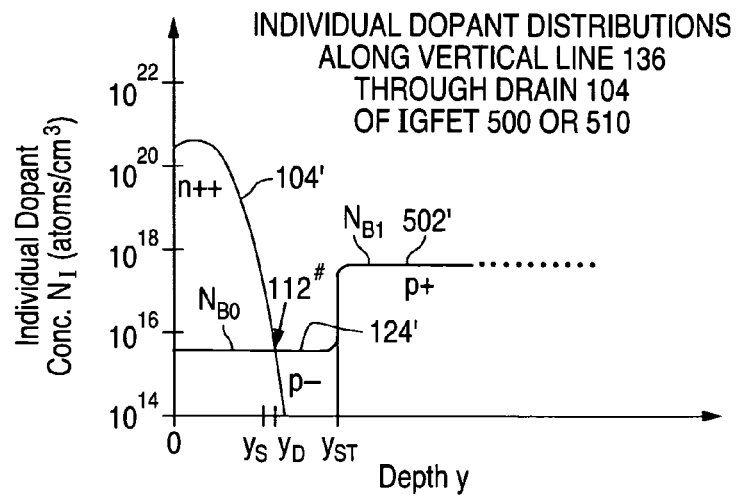
FIGS. 71a-71c are respective graphs of individual, absolute, and net dopant concentrations as a function of depth along a vertical line extending through the drain of the IGFET of FIG. 68a or 68b.
Figure 71B:
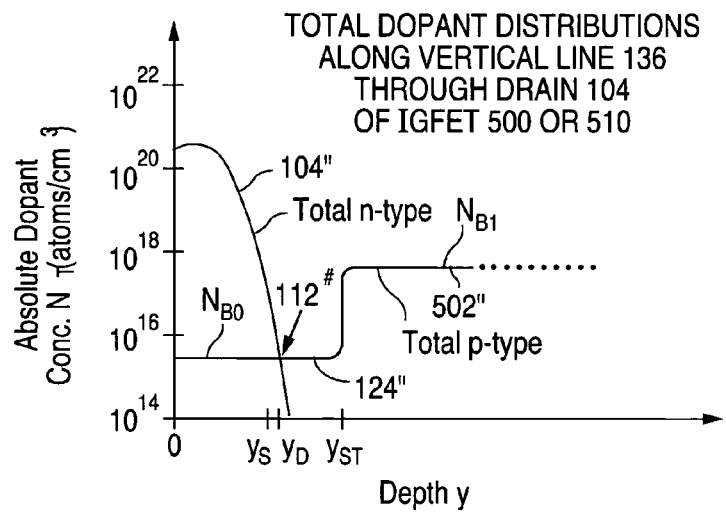
Figure 71C:
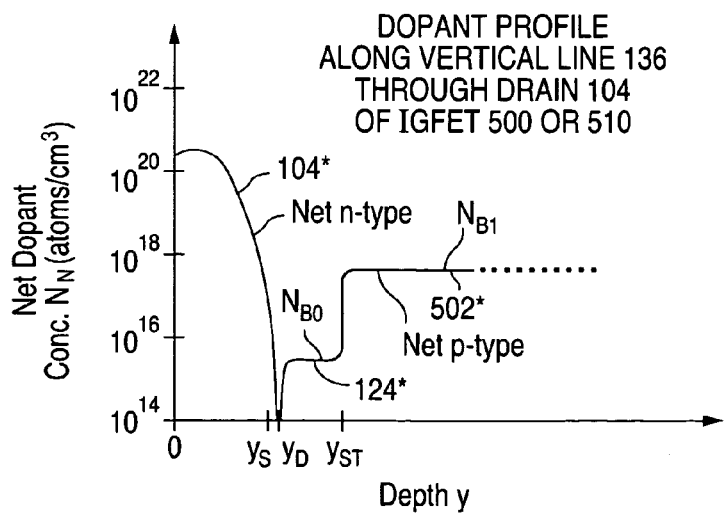

FIGS. 69a, 70a, and 71a illustrate concentrations $N_I$, along vertical lines 130, 132, 134, and 136, of the individual semiconductor dopants that form source 102, drain 104, subsurface body-material portion 502, pocket portion 120 of surface-adjoining body-material portion 504, and remainder 124 of portion 504. Concentrations $N_T$ of the total p-type dopant and total n-type dopant in regions 102, 104, 502, 120, and 124 along lines 130, 132, 134, and 136 are depicted in FIGS. 69b, 70b, and 71b. FIGS. 69c, 70c, and 71c depict net dopant concentrations $N_N$ along lines 130, 132, 134, and 136.

Curves/curve segments 102', 102", 102*, 104', 104", 104*, 120', 120", 120*, 124', 124", and 124* in FIGS. 69-71 have the meanings presented above in connection with respectively analogous FIGS. 8-10. Curves 502' in FIGS. 69a, 70a, and 71a indicate concentration $N_I$, along vertical lines 130, 132, 134, and 136, of the n-type dopant used to form subsurface body-material portion 502. Curve segments 502" in FIGS. 69b, 70b, and 71b represent concentration $N_T$, along lines 130, 132, 134, and 136, of the total n-type dopant in subsurface portion 502. Curve segments 502* in FIGS. 69c, 70c, and 71c indicate concentrations $N_N$ along lines 130, 132, 134, and 136 of the net n-type dopant in portion 502.

Referring to FIG. 71a, the p-type dopant in the portion of body material 108 below drain 104 of IGFET 500 or 510 has two primary components referred to here as the "lower" p-type dopant and the "upper" p-type dopant. The lower p-type dopant is at high fixed concentration $N_{B1}$ in subsurface body-material portion 502 as indicated by curve segment 502'. The upper p-type dopant is at low fixed concentration $N_{B0}$ in remainder 124 of surface-adjoining body-material portion 504 as indicated by curve 124'. The upper p-type dopant is also present in drain 104 as indicated by the extension of curve 124' into the area encompassed by curve 104'.

The total p-type dopant in the portion of body material 108 below drain 104 of IGFET 500 or 510 is indicated by the combination of curve segments 502" and 124" in FIG. 71b. As shown by the variation in combined curve 502"/124", concentration $N_T$ of the total p-type dopant in the portion of body material 108 below drain 104 substantially undergoes a step decrease in crossing from subsurface body-material portion 502 at concentration $N_{B1}$ into upper body-material remainder 124 at concentration $N_{B0}$ and then remains at concentration $N_{B0}$ in moving further upward to drain 104. Inasmuch as high concentration $N_{B1}$ is normally at least 10 times $N_{B0}$, concentration $N_T$ of the total p-type dopant in the portion of body material 108 below drain 104 thus decreases hypoabruptly by at least a factor of 10 in moving upward from subsurface body-material portion 502 through upper body-material remainder 124 to drain 104.

High concentration value $N_{B1}$ is, as mentioned above, preferably at least 20 times $N_{B0}$, more preferably at least 40 times $N_{B0}$. Accordingly, the hypoabrupt decrease in concentration $N_T$ of the total p-type dopant in the portion of body material 108 below drain 104 is preferably by at least a factor of 20, more preferably by at least a factor of 40.

FIG. 71c shows that, as represented by the combination of curve segments 502* and 124*, concentration $N_N$ of the net p-type dopant in the portion of body material 108 below drain 104 in IGFET 500 or 510, varies vertically in a similar manner to concentration $N_T$ of the total p-type dopant in the portion of body material 108 below drain 104 except that concentration $N_N$ of the net p-type dopant in the portion of body material 108 below drain 104 drops to zero at drain depth $y_D$, i.e., at drain-body junction 112. As in previously described IGFETs of the invention, the hypoabrupt dopant profile in the portion of body material 108 below drain 104 reduces parasitic capacitance along drain-body junction 112 of IGFET 500 or 510. Increased analog speed is thereby achieved for IGFETs 500 and 510.

Turning to the vertical dopant distribution below source 102 of IGFET 500 or 510, curve segments 502' and 124' in FIG. 69a have substantially the same shapes as in FIG. 71a. Although curve 120' appears in FIG. 69a, the total p-type dopant in the portion of body material 108 below source 102 consists of the lower and upper p-type dopants at respective concentrations $N_{B0}$ and $N_{B1}$ because p-type pocket portion 120 is shallower than source 102 in the example of FIGS. 68a and 68b. The portion of combined curve segments 502" and 124" at depth greater than source depth $y_S$ in FIG. 69b is shaped substantially the same as the portion of combined curve segments 502"/124" at depth greater than drain depth $y_D$ in FIG. 71b. Accordingly, concentration $N_T$ of the total p-type dopant in the portion of body material 108 below source 102 changes hypoabruptly in largely the same way as concentration $N_T$ of the total p-type dopant in the portion of body material 108 below drain 104. Consequently, the parasitic capacitance along source-body junction 110 is also reduced so as to further enhance the analog performance of IGFET 500 or 510.

Similar to what occurs in IGFET 100 of FIG. 6, p-type pocket portion 120 in IGFET 500 or 510 can be modified to extend deeper below the upper semiconductor surface than source 102 and drain 104. In that case, the p-type pocket dopant in pocket portion 120 causes concentration $N_T$ of the total p-type dopant in the portion of body material 108 below source 102 to rise somewhat immediately below source-body junction 110 and thus be somewhat greater than $N_{B0}$ just below the bottom of source 102. The parasitic capacitance along source-body junction 110 is higher than in the example of FIGS. 68a and 68b but, with suitable choice for the doping and depth of pocket 120, is still reduced. This again enhances the analog performance of IGFETs 500 and 510. Modifying pocket portion 120 to extend deeper below the upper semiconductor surface than source 102 and drain 104 does not have any significant effect on the drain characteristics of IGFET 500 or 510 because substantially none of the p-type pocket dopant is then located in drain 104.

Channel zone 106 of IGFET 500 or 510 is asymmetrically longitudinally doped in largely the same way as channel zone 106 of IGFET 170 in FIG. 18a. Since the dopant distributions of FIG. 7 and the associated information presented above about FIG. 7 apply to IGFET 170, this information generally applies to IGFETs 500 and 510. Punchthrough is thereby avoided in IGFETs 500 and 510. The channel length of IGFET 500 or 510 can be reduced sufficiently to convert it into a short-channel device. In that case, the surface dopant distributions of FIG. 12 and the associated information presented above about FIG. 12 generally apply to IGFETs 500 and 510.

Each S/D zone 102 or 104 of IGFET 500 or 510 can be modified to consist of main portion 102M or 104M and more lightly doped lateral extension 102E or 104E. Alternatively or additionally, each S/D zone 102 or 104 of IGFET 500 or 510 may include more lightly doped lower portion 102L or 104L. In such cases, the dopant distributions presented in FIGS. 14, 16, and 17 and the associated information about those dopant distributions generally apply to IGFETs 500 and 510 subject, in the case of FIGS. 16 and 17, to replacing curves/curve segments 116' and 114', 116" and 114", and 116* and 114* respectively with curves/curve segments 502', 502", and 502*.

Figure 72A:
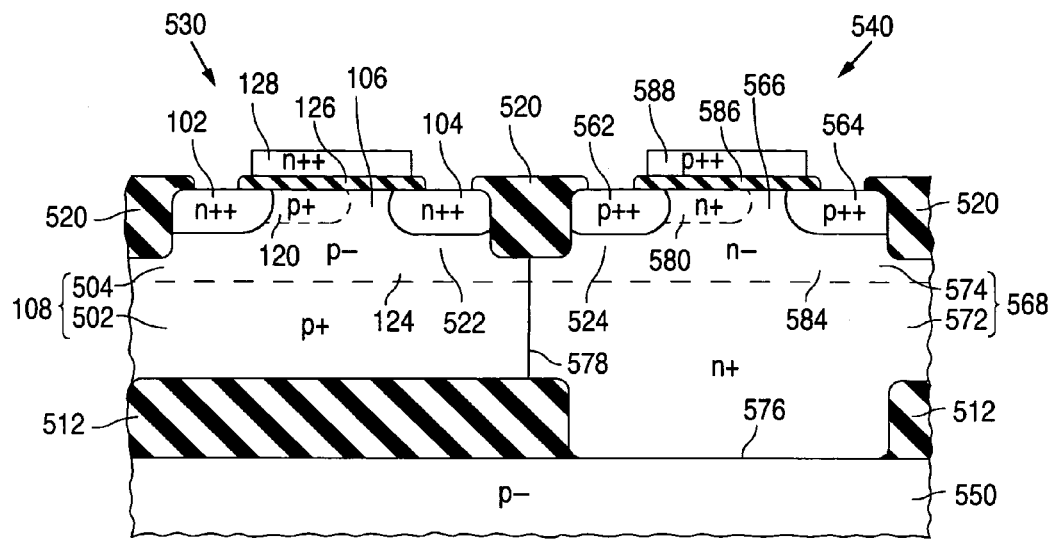
FIGS. 72a-72d are front cross-sectional views of four additional respective complementary-IGFET semiconductor structures configured according to the invention.

Further Complementary-IGFET Structures Suitable for Mixed-Signal Applications and Having Step Change in Body-Material Dopant Concentration FIG. 72a illustrates another complementary-IGFET structure configured according to the invention so as to be especially suitable for mixed-signal applications. The complementary-IGFET structure of FIG. 72a is created from doped silicon material such as that of a bonded wafer. A patterned field region 520 of electrically insulating material extends along the upper surface of the silicon material to define a group of laterally separated semiconductor islands, including islands 522 and 524. Two asymmetric long-channel IGFETs 530 and 540 are formed along the upper semiconductor surface respectively at the locations of islands 522 and 524.

IGFET 530 is an n-channel device which implements IGFET 510 of FIG. 68b. Source 102, drain 104, and channel zone 106 are situated in island 522. Body material 108 of IGFET 530 consists of <100> p-type monosilicon. A lower semiconductor layer 550 consisting of lightly doped <100> p-type monosilicon underlies and contacts insulating layer 512 so that it is a subsurface layer. Field-insulating region 520, typically of the trench type, is vertically separated from subsurface insulating layer 512.

IGFET 540 is a p-channel device configured substantially the same as n-channel IGFET 500 of FIG. 68a with the conductivity types reversed. IGFET 540 thus has a heavily doped p-type source 562 and a heavily doped p-type drain 564 separated by a channel zone 566 of n-type body material 568 consisting of a heavily doped lower subsurface portion 572 and an upper surface-adjoining portion 574 that extends to the upper semiconductor surface. Source 562, drain 564, and channel zone 566 are situated in island 524.

Body material 568 is formed with <100> n-type monosilicon. Subsurface portion 572 of n-type body material 568 extends over p− lower semiconductor layer 550 and through an opening in subsurface insulating layer 512 to form a lateral pn junction 576 with semiconductor layer 550. Subsurface body-material portion 572 also forms a vertical pn junction 578 with p+ subsurface body-material portion 502 of IGFET 530. A reverse bias is applied across pn junction 578 to isolate IGFETs 530 and 540 from each other.

A heavily doped pocket portion 580 of n-type surface-adjoining body-material portion 574 extends along source 562 of IGFET 540. N+ pocket portion 580 causes channel zone 566 to be asymmetrically longitudinally dopant graded in a similar manner to the asymmetric longitudinal dopant grading of channel zone 106 in IGFET 530. Item 584 is the lightly doped n-type remainder of surface-adjoining body-material portion 574. A gate dielectric layer 586, typically consisting primarily of silicon oxide, overlies channel zone 566. A gate electrode 588 is situated on gate dielectric layer 586 above channel zone 566. Gate electrode 588 extends partially over source 562 and drain 564. In the example of FIG. 72a, gate electrode 588 consists of very heavily doped p-type polysilicon.

The n-type dopant in subsurface body-material portion 572 is present at a largely uniform concentration $N_{B0}'$. The n-type dopant in the segment of surface-adjoining body-material portion 574 below drain 564 is present in that segment at a largely uniform concentration $N_{B1}'$ greater than $N_{B0}'$. Analogous to concentrations $N_{B1}$ and $N_{B0}$, concentration $N_{B1}'$ is normally at least 10 times $N_{B0}'$, preferably at least 20 times $N_{B0}'$, more preferably at least 40 times $N_{B0}'$, typically in the vicinity of 100 times $N_{B0}'$. In the portion of body material 568 below drain 564, IGFET 540 thus has a hypoabrupt dopant profile of generally the same nature that IGFET 530 has in the portion of body material 108 below drain 104. The vertical dopant profile in the portion of body material 568 below source 562 of IGFET 540 is likewise quite similar to the vertical dopant profile in the portion of body material 108 below source 102 of IGFET 530. Accordingly, IGFET 540 has reduced parasitic capacitance along its drain-body and source-body junctions.

Figure 72B:
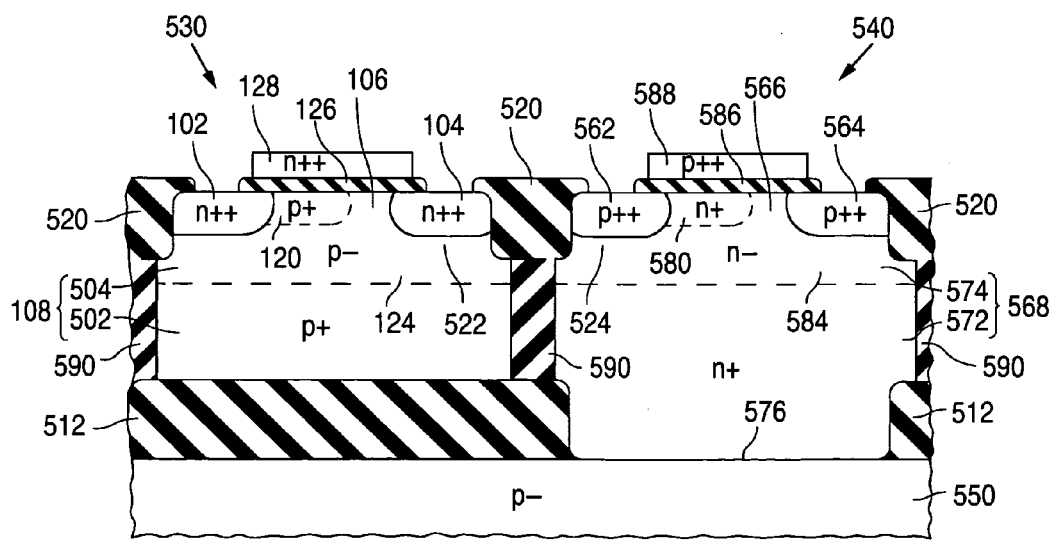

FIG. 72b illustrates a variation of the complementary-IGFET structure of FIG. 72a. In the variation of FIG. 72b, field-insulation region 520 is provided with an electrically insulating extension 590, typically of the trench type, that reaches subsurface insulating layer 512. The combination of field-insulating region 520 and insulating extension 590 laterally surrounds subsurface body-material portion 502 of IGFET 530. This dielectrically laterally isolates IGFETs 530 and 540 from each other.

The conductivity types can be reversed in the complementary-IGFET structures of FIGS. 72a and 72b. The resultant n-type body material and n− lower semiconductor layer respectively corresponding to p-type body material 108 and p− lower semiconductor layer 550 are then both <110> n-type monosilicon. The p-type body material corresponding to n-type body material 568 is <110> p-type monosilicon.

Figure 72C:
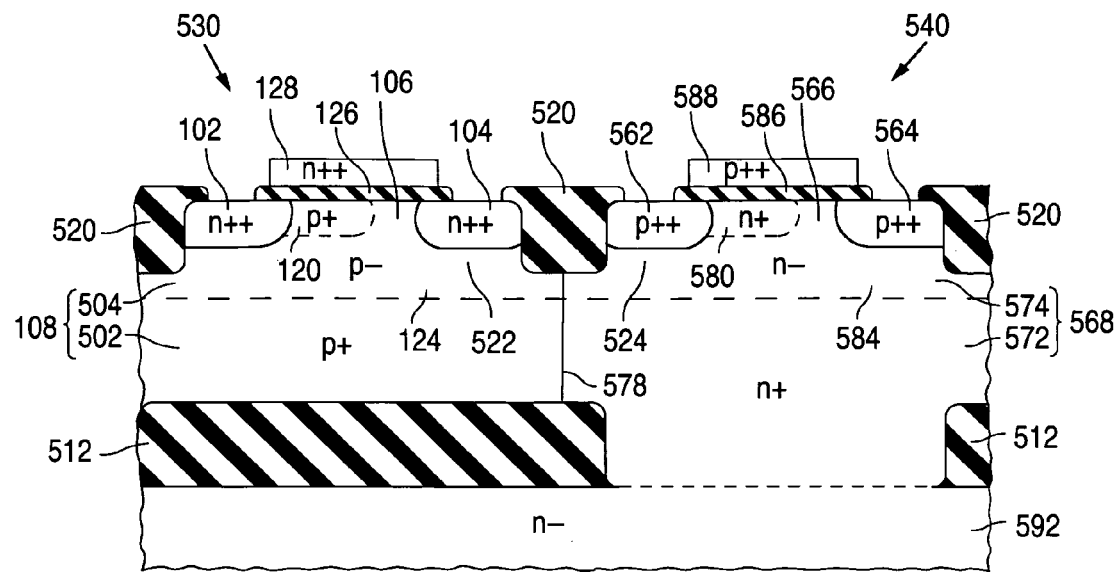
Figure 72D:
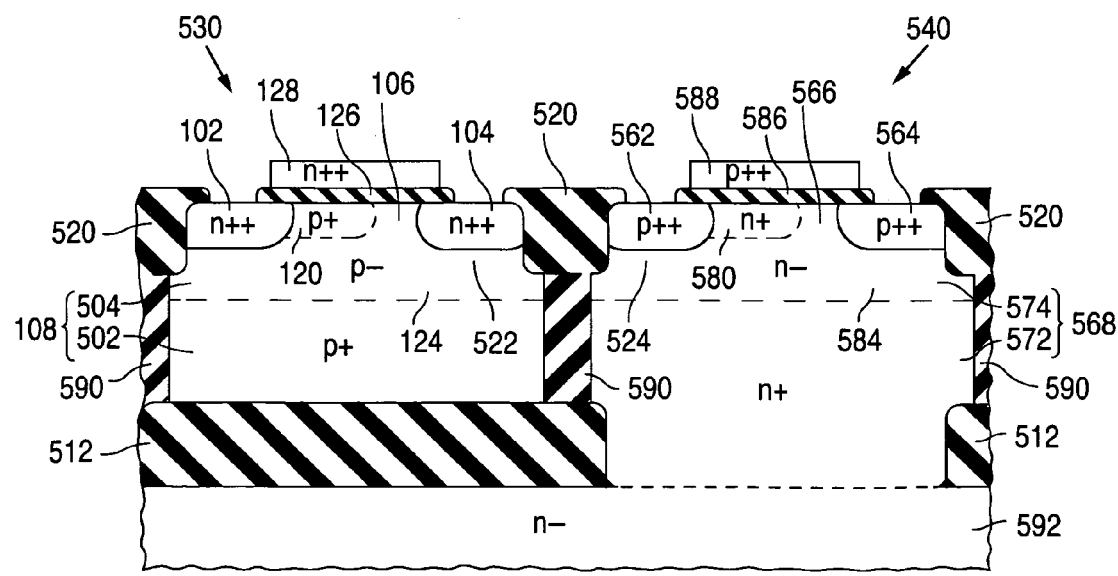

FIG. 72c depicts a further variation of the complementary-IGFET structure of FIG. 72a. FIG. 72d depicts a corresponding variation of the complementary-IGFET structure of FIG. 72b. In the variations of FIGS. 72c and 72d, a lower semiconductor layer 592 consisting of lightly doped <110> n-type monosilicon replaces p− lower semiconductor layer 550. N-type body material 568 for p-channel IGFET 540 is formed with <110> n-type monosilicon, rather than <100> n-type monosilicon, in the complementary-IGFET structures of FIGS. 72c and 72d. P-type body material 108 for n-channel IGFET 530 continues to be <100> p-type monosilicon in the complementary-IGFET structures of FIGS. 72c and 72d.

The conductivity types can be reversed in the complementary-IGFET structures of FIGS. 72c and 72d. In that case, the resultant p-type body material and p− lower semiconductor layer respectively corresponding to n-type body material 568 and n− lower semiconductor layer 592 are both <100> p-type monosilicon. The n-type body material corresponding to p-type body material 108 is <110> n-type monosilicon.

Manufacture of Further Complementary-IGFET Structures Having Step Change in Body-Material Dopant Concentration The complementary-IGFET structure of FIG. 72a is fabricated in the following manner according to the invention. A structure is first provided in which (a) a subsurface semiconductor region consisting of heavily doped <100> p-type monosilicon at high uniform concentration $N_{B1}$ adjoins a subsurface electrically insulating layer, (b) a surface-adjoining semiconductor region consisting of lightly doped <100> p-type monosilicon at low uniform concentration $N_{B0}$ adjoins and overlies the subsurface semiconductor region, and (c) a lower semiconductor layer consisting of lightly doped <100> p-type monosilicon adjoins and underlies the subsurface insulating layer. The lightly doped lower semiconductor layer constitutes p− lower semiconductor layer 550.

The initial structure can be created, for example, by bonding two semiconductor wafers together through electrically insulating material that forms the subsurface insulating layer. One of the wafers has a lightly doped <100> p-type monosilicon substrate that forms lower semiconductor layer 550. The other wafer has a heavily doped. <100> p-type monosilicon substrate and an overlying lightly doped <1.00> p-type monosilicon epitaxial layer respectively doped substantially uniformly at concentrations $N_{B1}$ and $N_{B0}$ to respectively form the subsurface semiconductor region and the surface-adjoining semiconductor region.

Field-insulating region 520 is formed along the outside (upper) surface of the p− surface-adjoining semiconductor region to define island 522 for IGFET 530 and to define the location of island 524 for IGFET 540. Field insulation 520 may extend partially through the p− surface-adjoining semiconductor region so that field insulation 520 extends deep into, but not fully through, p-type surface-adjoining body-material portion 504 in the completed complementary-IGFET structure as shown in FIG. 72a. Alternatively, field insulation 520 may extend fully through the p− surface-adjoining semiconductor region and partially into the underlying p+ subsurface semiconductor region. The portion of the p− surface-adjoining semiconductor region in island 522 constitutes a precursor to p-type surface-adjoining body-material portion 504. The underlying portion of the p+ subsurface semiconductor region substantially constitutes p+ subsurface body-material portion 502.

At the location for island 524, a cavity is formed through the p− surface-adjoining semiconductor region, through the underlying section of the p+ subsurface semiconductor region, and through the further underlying section of the subsurface insulating layer down to p− lower semiconductor layer 550. The remaining portion of the subsurface insulating layer constitutes subsurface insulating layer 512. Heavily doped <100> n-type monosilicon is epitaxially grown at uniform concentration $N_{B1}'$ on the so-exposed section of lower semiconductor layer 550 to substantially form n+ subsurface body-material portion 572. Lightly doped <100> n-type monosilicon is epitaxially grown at uniform concentration $N_{B0}'$ in the cavity on subsurface portion 572 to form a precursor to n-type surface-adjoining body-material portion 574. Body-material portion 572 and the precursor to body-material portion 574 form island 524.

Gate dielectric layers 126 and 586 are respectively formed along the exposed (upper) surfaces of the precursors to p-type surface-adjoining body-material portion 504 for IGFET 530 and n-type surface-adjoining body-material portion 574 for IGFET 540. Gate electrodes 128 and 588 are respectively formed on gate dielectric layers 126 and 586. N++ source 102, n++ drain 104, and p+ pocket portion 120 are formed in the precursor to surface-adjoining body-material portion 504. The remaining part of the p-type precursor to body-material portion 504 then substantially constitutes portion 504 for IGFET 530. P++ source 562, p++ drain 564, and n+ pocket portion 580 are similarly formed in the precursor to n-type surface-adjoining body-material portion 574. The remaining part of the precursor to n-type surface-adjoining body-material portion 574 then similarly substantially constitutes portion 574 for IGFET 540. The operations involved in forming gate electrodes 128 and 588, n++ source 102, n++ drain 104, p+ pocket portion 120, p++ S/D zones 562 and 564, and n+ pocket portion 580 can be performed in various orders.

The complementary-IGFET structure of FIG. 72b is fabricated according to the invention in the same way as the complementary-IGFET structure of FIG. 72a except that insulating extension 590 to field-insulating region 520 is formed in the p+ subsurface semiconductor region in the course of forming field insulation 520.

The complementary-IGFET structures of FIGS. 72c and 72d are fabricated according to the invention in the same respective ways as the complementary-IGFET structures of FIGS. 72a and 72b except that a lower semiconductor layer consisting of lightly doped <110> n-type monosilicon replaces p− lower semiconductor layer 550. The lightly doped lower semiconductor layer constitutes n− lower semiconductor layer 592. The initial structure used for creating the complementary-IGFET structure of FIG. 72c or 72d can be created in the same way as the initial structure used to create the complementary-IGFET structure of FIG. 72a or 72b except that the first-mentioned wafer has a lightly doped <110> n-type monosilicon substrate rather than a lightly doped <100> p-type monosilicon substrate.

Also, after forming the cavity through the p− surface-adjoining semiconductor region, through the underlying section of the p+ subsurface semiconductor region, and through the further underlying section of the subsurface insulating layer down to n− lower semiconductor layer 592, n+ subsurface body-material portion 572 is epitaxially grown on lower semiconductor layer 592 in the cavity as heavily doped <110> n-type monosilicon at concentration $N_{B1}'$. The precursor to n-surface-adjoining body-material portion 574 is then epitaxially grown on n+ subsurface portion 572 in the cavity as lightly doped <110> n-type monosilicon at concentration $N_{B0}'$.

Variations

While the invention has been described with reference to particular embodiments, this description is solely for the purpose of illustration and is not to be construed as limiting the scope of the invention claimed below. For instance silicon in the semiconductor body or/and in gate electrodes 128, 288, 328, 368, and 588 can be replaced with other semiconductor materials. Replacement candidates include germanium, a silicon-germanium alloy, and Group 3a-Group 5a alloys such as germanium arsenide.

Metal silicide layers can be provided along the upper surfaces of sources 102 and 562, drains 104 and 564, and gate electrodes 128 and 588 in IGFETs 530 and 540 of the complementary-IGFET structures of FIGS. 72a-72d. Composite gate electrodes 128/258, 288/298, 328/338, and 368/378 in IGFETs 210, 220, 230, 240, 380, and 390 of the complementary-IGFET structures of FIGS. 29 and 30 or/and gate electrodes 128 and 588 in IGFETs 530 and 540 of the complementary-IGFET structures of FIGS. 72a-72d can be replaced with gate electrodes consisting substantially fully of metal or substantially fully of metal silicide, e.g., cobalt silicide or nickel silicide with dopant provided in the silicide gate electrodes to control their work functions. Various modifications may thus be made by those skilled in the art without departing from the true scope of the invention as defined in the appended claims.

I claim:

1. A method comprising:
   introducing first semiconductor dopant of a first conductivity type into a semiconductor body to define a principal well portion of the first conductivity type for a principal field-effect transistor ("FET") such that material of the semiconductor body (a) overlies the well portion as it exists directly after the act of introducing the first dopant of the first conductivity type and (b) is then of a second conductivity type opposite to the first conductivity type;
   defining, for the FET, a principal gate electrode above, and vertically separated by principal gate dielectric material from, material of the semiconductor body intended to be a principal channel zone of the first conductivity type;
   subsequently introducing first semiconductor dopant of the second conductivity type into the semiconductor body to form, for the FET, principal first and second source/drain ("S/D") zones of the second conductivity type laterally separated by material of the semiconductor body intended to be the channel zone; and
   performing additional processing to complete fabrication of the FET such that (a) part of the first dopant of the first conductivity type diffuses upward into the material of the semiconductor body above the well portion during the act of performing additional processing so as to cause substantially all of the material of the semiconductor body above the well portion not significantly subjected to other doping of the first or second conductivity type subsequent to the act of introducing the first dopant of the first conductivity type to be converted to the first conductivity type and (b) the channel zone is at least partially constituted with at least part of the so-converted material of the semiconductor body above the well portion.

2. A method as in claim 1 wherein the act of introducing the first dopant of the first conductivity type comprises ion implanting the first dopant of the first conductivity type.

3. A method as in claim 1 wherein (a) the act of performing additional processing is at least partially done at elevated temperature and (b) the aforementioned part of the first dopant of the first conductivity type diffuses upward during at least one part of the additional processing done at elevated temperature.

4. A method as in claim 1 further including introducing additional semiconductor dopant of the first conductivity type into the semiconductor body to define a pocket portion extending largely along only the first of the S/D zones up to its then-existent upper surface such that, subsequent to the act of performing additional processing, (a) the semiconductor body has an upper semiconductor surface, (b) the channel zone and the well portion are parts of body material which is of the first conductivity type and which extends laterally below the S/D zones, (c) the pocket portion constitutes part of the body material and is more heavily doped than adjacent material of the body material, and (d) all dopant of the first conductivity type in the body material has a concentration which is lower where the channel zone meets the second S/D zone along the upper semiconductor surface than where the channel zone meets the first S/D zone along the upper semiconductor surface.

5. A method as in claim 4 wherein, subsequent to the act of performing additional processing, the concentration of all dopant of the first conductivity type in the body material is at least a factor of 10 lower where the channel zone meets the second S/D zone along the upper semiconductor surface than where the channel zone meets the first S/D zone along the upper semiconductor surface.

6. A method as in claim 1 wherein the act of introducing the first semiconductor dopant of the second conductivity type comprises:
   introducing lateral-extension semiconductor dopant of the second conductivity type through an opening in a lateral-extension mask, through the then-existent upper surface of the semiconductor body, and into a pair of laterally separated primary portions of the semiconductor body using the lateral-extension mask, the gate electrode, and any material along the gate electrode as a dopant-blocking shield;
   providing spacer material to the transverse sides of the gate electrode; and
   introducing main-portion semiconductor dopant of the second conductivity type through an opening in a main-portion mask, through the then-existent upper surface of the semiconductor body, and into a pair of laterally separated additional portions of the semiconductor body using the main-portion mask, the gate electrode, and the spacer material as a dopant-blocking shield.

7. A method as in claim 1 wherein, subsequent to the act of performing additional processing, the channel zone is substantially fully constituted with part of the so-converted material of the semiconductor body above the well portion.

8. A method as in claim 1 wherein, subsequent to the act of performing additional processing, the so-converted material of the semiconductor body above the well portion extends below at least part of each S/D zone.

9. A method as in claim 1 wherein, subsequent to the act of performing additional processing, the so-converted material of the semiconductor body above the well portion extends below substantially all of each S/D zone.

10. A method as in claim 1 wherein the first and second conductivity types respectively are n-type and p-type whereby the FET is a p-channel FET.

11. A method as in claim 1 wherein the FET is of a first polarity, the method further including processing the semiconductor body to form an additional FET of a second polarity opposite to the first polarity.

12. A method as in claim 1 wherein:
   the act of introducing the first dopant of the first conductivity type includes introducing further first semiconductor dopant of the first conductivity type into the semiconductor body to define a further well portion of the first conductivity type for a further FET of like polarity to the principal FET;
   the method further includes introducing second semiconductor dopant of the first conductivity type into the semiconductor body to define, for the further FET, an additional well portion of the first conductivity type situated above the further well portion while substantially preventing the second dopant of the first conductivity type from being simultaneously introduced into the material of the semiconductor body above the principal well portion;
   the gate-electrode defining act includes defining, for the further FET, a further gate electrode above, and vertically separated by further gate dielectric material from, material of the semiconductor body intended to be a further channel zone of the first conductivity type; and
   the act of introducing the first dopant of the second conductivity type includes introducing further first semiconductor dopant of the second conductivity type into the semiconductor body to form, for the further FET, a pair of further S/D zones of the second conductivity type laterally separated by the further channel zone such that the further channel zone is at least partially constituted with at least part of the additional well portion.

13. A method as in claim 12 wherein the act of introducing the first dopant of the first conductivity type comprises ion implanting the first dopant of the first conductivity type.

14. A method as in claim 12 wherein the act of introducing the second dopant of the first conductivity type is performed prior to the gate-electrode defining act.

15. A method as in claim 14 wherein the act of introducing the second dopant of the first conductivity type is performed such that, prior to the gate-electrode defining act, the additional well portion extends from the further well portion upward substantially to the then-existent upper surface of the semiconductor body.

16. A method as in claim 12 wherein, subsequent to the act of performing additional processing, (a) the principal channel zone is substantially fully constituted with part of the so-converted material of the semiconductor body above the principal well portion and (b) the further channel zone is substantially fully constituted with part of the additional well portion.

17. A method as in claim 12 wherein, subsequent to the act of performing additional processing, (a) the so-converted material of the semiconductor body above the principal well portion extends below at least part of each S/D zone of the principal FET and (b) the additional well portion extends below at least part of each S/D zone of the further FET.

18. A method as in claim 12 wherein, subsequent to the act of performing additional processing, (a) the so-converted material of the semiconductor body above the principal well portion extends below substantially all of each S/D zone of the principal FET and (b) the additional well portion extends below substantially all of each S/D zone of the further FET.

19. A method as in claim 12 wherein the first and second conductivity types respectively are n-type and p-type whereby the FETs are p-channel FETs.

20. A method as in claim 12 further including introducing additional semiconductor dopant of the first conductivity type into the semiconductor body to define, for the principal FET, a principal pocket portion of the first conductivity type extending largely along only the first of the S/D zones of the principal FET and to define, for the further FET, a pair of further pocket portions of the first conductivity type extending respectively along the S/D zones of the further FET such that, subsequent to the act of performing additional processing, (a) the channel zones and the well portions are parts of body material which is of the first conductivity type and which extends laterally below at least part of each S/D zone and (b) each pocket portion constitutes part of the body material and is more heavily doped than adjoining material of the body material.

21. A method as in claim 20 wherein the act of introducing the additional dopant of the first conductivity type comprises separately introducing (i) principal additional semiconductor dopant of the first conductivity type into the semiconductor body to define the principal pocket portion and (ii) further additional semiconductor dopant of the first conductivity type into the semiconductor body to define the further pocket portions.

22. A method as in claim 20 wherein the act of introducing the additional dopant of the first conductivity type is performed subsequent to the gate-electrode-defining act using at least the gate electrodes as dopant blocking shields.

23. A method as in claim 12 wherein the act of introducing the first semiconductor dopant of the second conductivity type comprises:

introducing lateral-extension semiconductor dopant of the second conductivity type through at least one opening in a lateral-extension mask, through the then-existent upper surface of the semiconductor body, and into (i) a pair of laterally separated primary portions of the semiconductor body using the lateral-extension mask, the principal gate electrode, and any material along the principal gate electrode as a dopant-blocking shield and (ii) a pair of laterally separated primary portions of the semiconductor body using the lateral-extension mask, the further gate electrode, and any material along the further gate electrode as a dopant-blocking shield;

providing spacer material (i) to the transverse sides of the principal gate electrode and (ii) to the transverse sides of the further gate electrode; and introducing main-portion semiconductor dopant of the second conductivity type through at least one opening in a main-portion mask, through the then-existent upper surface of the semiconductor body, and into (i) a pair of laterally separated additional portions of the semiconductor body using the main-portion mask, the principal gate electrode, and the spacer material along the transverse sides of the principal gate electrode as a dopant-blocking shield and (ii) a pair of laterally separated additional portions of the semiconductor body using the main-portion mask, the further gate electrode, and the spacer material along the transverse sides of the further gate electrode as a dopant-blocking shield.

24. A method as in claim 12 wherein the FETs are of a first polarity, the method further including processing the semiconductor body to form at least one additional FET of a second polarity opposite to the first polarity.

25. A method as in claim 1 wherein:

the act of introducing the first dopant of the first conductivity type entails introducing the first dopant of the first conductivity type through an opening in a well-portion mask; and the method further includes removing the well-portion mask such that material of the semiconductor body (a) overlies the well portion immediately after removal of the well-portion mask and (b) is then of the second conductivity type.

26. A method as in claim 12 wherein:

the act of introducing the first dopant of the first conductivity type entails introducing the first dopant of the first conductivity type into the semiconductor body through at least one opening in a first well-portion mask;

the method further includes removing the first well-portion mask such that material of the semiconductor body (a) overlies the principal well portion immediately after removal of the well-portion mask and (b) is then of the second conductivity type;

the act of introducing the second dopant of the first conductivity type entails introducing the second dopant of the first conductivity type into the semiconductor body through an opening in a second well-portion mask, the opening in the second well-portion mask overlying where the further well portion is formed, the second well-portion mask substantially blocking the second dopant of the first conductivity type from being simultaneously introduced into the material of the semiconductor body above the principal well portion.

* * * * *